US012733392B2

(12) United States Patent
Lee et al.

(10) Patent No.: US 12,733,392 B2
(45) Date of Patent: Sep. 8, 2026

(54) ORGANOMETALLIC COMPOUND, LIGHT-EMITTING DEVICE INCLUDING THE SAME, ELECTRONIC APPARATUS INCLUDING THE LIGHT-EMITTING DEVICE, AND ELECTRONIC DEVICE INCLUDING THE LIGHT-EMITTING DEVICE

(71) Applicant: Samsung Display Co., Ltd., Yongin-si (KR)

(72) Inventors: Jaesung Lee, Yongin-si (KR); Soobyung Ko, Yongin-si (KR); Eunsoo Ahn, Yongin-si (KR); Hyunjung Lee, Yongin-si (KR); Jinhee Ju, Yongin-si (KR); Junghoon Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 854 days.

(21) Appl. No.: 18/105,417

(22) Filed: Feb. 3, 2023

(65) Prior Publication Data

US 2023/0354694 A1 Nov. 2, 2023

(30) Foreign Application Priority Data

Apr. 29, 2022 (KR) ........................ 10-2022-0053810

(51) Int. Cl.

| | |
|---|---|
| ***H10K 85/30*** | (2023.01) |
| ***C07F 15/00*** | (2006.01) |
| ***C09K 11/06*** | (2006.01) |
| *H10K 50/12* | (2023.01) |
| *H10K 59/12* | (2023.01) |

(52) U.S. Cl.

CPC ....... *H10K 85/361* (2023.02); *C07F 15/0086* (2013.01); *C09K 11/06* (2013.01); *C09K 2211/1044* (2013.01); *C09K 2211/1059* (2013.01); *C09K 2211/185* (2013.01); *H10K 50/12* (2023.02); *H10K 59/12* (2023.02)

(58) Field of Classification Search

None

See application file for complete search history.

(56) References Cited

U.S. PATENT DOCUMENTS

| | | | | |
|---|---|---|---|---|
| 7,442,797 | B2 * | 10/2008 | Itoh | C09K 11/06 546/14 |
| 9,735,378 | B2 * | 8/2017 | Xia | C09K 11/06 |
| 9,923,155 | B2 | 3/2018 | Li et al. | |
| 10,008,673 | B2 | 6/2018 | Brocke et al. | |
| 10,374,166 | B2 | 8/2019 | Hatakeyama et al. | |
| 11,985,888 | B2 * | 5/2024 | Forrest | H10K 71/191 |
| 12,018,035 | B2 * | 6/2024 | Tsai | H10K 85/361 |
| 12,415,827 | B2 * | 9/2025 | Lee | C07F 15/0086 |
| 12,520,713 | B2 * | 1/2026 | Ji | C09K 11/06 |
| 12,545,698 | B2 * | 2/2026 | Che | C07F 15/0086 |
| 2004/0131881 | A1 | 7/2004 | Zheng et al. | |
| 2007/0106103 | A1 | 5/2007 | Ikeda et al. | |
| 2007/0190358 | A1 * | 8/2007 | Byun | H10K 85/361 546/10 |
| 2012/0199823 | A1 * | 8/2012 | Molt | C07F 15/0086 257/E51.026 |
| 2014/0058099 | A1 | 2/2014 | Wakamiya et al. | |
| 2015/0069334 | A1 * | 3/2015 | Xia | C09K 11/06 546/4 |
| 2015/0200369 | A1 * | 7/2015 | Kozhevnikov | C09K 11/06 544/225 |

(Continued)

FOREIGN PATENT DOCUMENTS

| | | |
|---|---|---|
| JP | 2001-172232 | 6/2001 |
| JP | 2005-170911 | 6/2005 |

(Continued)

OTHER PUBLICATIONS

Chaaban, Maya, et al. "Platinum (II) binuclear complexes: molecular structures, photophysical properties, and applications." Journal of Materials Chemistry C 7.20 (2019): 5910-5924. (Year: 2019).*

*Primary Examiner* — Robert S Loewe

(74) *Attorney, Agent, or Firm* — Womble Bond Dickinson (US) LLP

(57) ABSTRACT

Embodiments provide an organometallic compound, a light-emitting device including the same, an electronic apparatus including the light-emitting device, and an electronic device including the light-emitting device. The light-emitting device includes a first electrode, a second electrode facing the first electrode, an interlayer between the first electrode and the second electrode and including an emission layer, and the organometallic compound, which is represented by Formula 1:

[Formula 1]

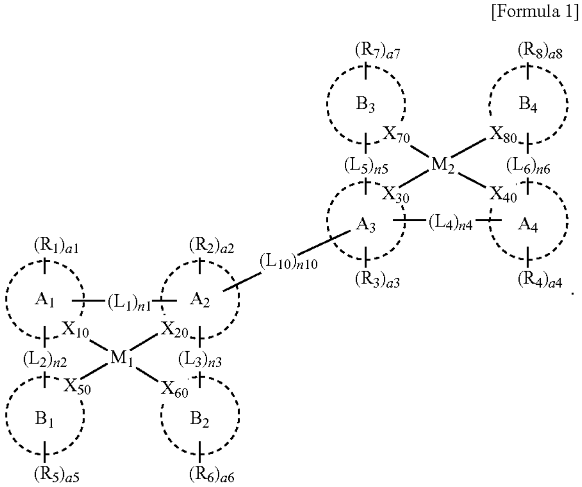

20 Claims, 8 Drawing Sheets

(56) References Cited

U.S. PATENT DOCUMENTS

| | | | | |
|---|---|---|---|---|
| 2019/0010178 | A1* | 1/2019 | Li | H10K 85/341 |
| 2019/0010179 | A1* | 1/2019 | Li | C09K 11/025 |
| 2019/0153007 | A1* | 5/2019 | Li | H10K 50/167 |
| 2020/0220089 | A1* | 7/2020 | Han | C09K 11/06 |
| 2020/0308208 | A1* | 10/2020 | Pigge | G01N 21/76 |
| 2021/0111345 | A1* | 4/2021 | Stoessel | C07F 15/0086 |
| 2022/0102653 | A1 | 3/2022 | Shin et al. | |
| 2022/0332741 | A1* | 10/2022 | Lee | C07F 15/0086 |
| 2024/0383934 | A1* | 11/2024 | Kang | H10K 85/6572 |
| 2025/0043172 | A1* | 2/2025 | Li | C07D 293/12 |
| 2025/0318424 | A1* | 10/2025 | Tsuboyama | H05B 33/14 |

FOREIGN PATENT DOCUMENTS

| | | |
|---|---|---|
| JP | 2017-212093 | 11/2017 |
| KR | 10-2012-0038319 | 4/2012 |
| KR | 10-2016-0012941 | 2/2016 |
| KR | 10-2018-0046851 | 5/2018 |
| KR | 10-2021-0124605 | 10/2021 |
| KR | 10-2022-0132715 | 10/2022 |
| WO | 2004061047 | 7/2004 |
| WO | 2011107186 | 9/2011 |
| WO | 2012118164 | 9/2012 |
| WO | 2015102118 | 7/2015 |

* cited by examiner

ORGANOMETALLIC COMPOUND, LIGHT-EMITTING DEVICE INCLUDING THE SAME, ELECTRONIC APPARATUS INCLUDING THE LIGHT-EMITTING DEVICE, AND ELECTRONIC DEVICE INCLUDING THE LIGHT-EMITTING DEVICE

CROSS-REFERENCE TO RELATED APPLICATION(S)

This application claims priority to and benefits of Korean Patent Application No. 10-2022-0053810 under 35 U.S.C. § 119, filed on Apr. 29, 2022, in the Korean Intellectual Property Office, the entire contents of which are incorporated herein by reference.

BACKGROUND

1. Technical Field

Embodiments relate to an organometallic compound, a light-emitting device including the same, an electronic apparatus including the light-emitting device, and an electronic device including the light-emitting device.

2. Description of the Related Art

Organic light-emitting devices are self-emissive devices that, as compared with devices of the related art, have wide viewing angles, high contrast ratios, short response times, and excellent characteristics in terms of luminance, driving voltage, and response speed, and produce full-color images.

As an example, an organic light-emitting device may have a structure in which a first electrode is arranged on a substrate, and a hole transport region, an emission layer, an electron transport region, and a second electrode are sequentially formed on the first electrode. Holes provided from the first electrode may move toward the emission layer through the hole transport region, and electrons provided from the second electrode may move toward the emission layer through the electron transport region. Carriers, such as the holes and electrons, may recombine in such an emission layer region to produce excitons. These excitons transition from an excited state to a ground state, thereby generating light.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments include an organometallic compound, a light-emitting device having low driving voltage, high luminance, high efficiency and long lifespan characteristics, an electronic apparatus including the light-emitting device, and an electronic device including the light-emitting device.

Additional aspects will be set forth in part in the description which follows and, in part, will be apparent from the description, or may be learned by practice of the embodiments of the disclosure.

According to embodiments, an organometallic compound may be represented by Formula 1:

[Formula 1]

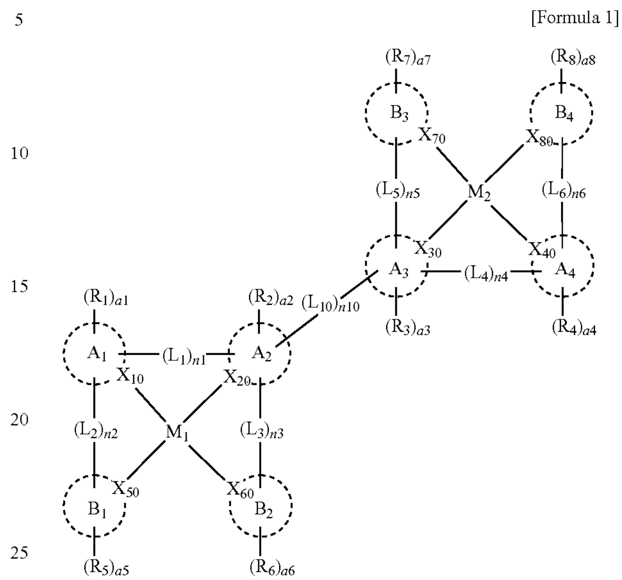

In Formula 1, $M_1$ and $M_2$ may each independently be platinum (Pt), palladium (Pd), copper (Cu), silver (Ag), gold (Au), rhodium (Rh), ruthenium (Ru), osmium (Os), titanium (Ti), zirconium (Zr), hafnium (Hf), europium (Eu), terbium (Tb), or thulium (Tm), $A_1$ to $A_4$ and $B_1$ to $B_4$ may each independently be a $C_5$-$C_{60}$ carbocyclic group or a $C_1$-$C_{60}$ heterocyclic group, $X_{10}$ to $X_{80}$ may each independently be C or N, $L_1$ to $L_6$ may each independently be *—O—*', *—S—*', *—C($Q_1$)($Q_2$)-*', *—C($Q_1$)=*', *=C($Q_1$)-*', *—C($Q_1$)=C($Q_2$)-*', *—C(=O)—*', *—C(=S)—*', *—C≡C—*', *—B($Q_1$)-*', *—N($Q_1$)-*', *—P($Q_1$)-*', *—Si($Q_1$)($Q_2$)-*', *—P($Q_1$)($Q_2$)-*', or *—Ge($Q_1$)($Q_2$)-*', $L_{10}$ may include a $C_3$-$C_{60}$ carbocyclic group that is unsubstituted or substituted with at least one $R_{10a}$, or a $C_1$-$C_6$ heterocyclic group that is unsubstituted or substituted with at least one $R_{10a}$, n1 to n6 and n10 may each independently be an integer from 0 to 5, when n1 is 0, *-$(L_1)_{n1}$-*' may be a single bond, when n2 is 0, *-$(L_2)_{n2}$-*' may be a single bond, when n3 is 0, *-$(L_3)_{n3}$-*' may be a single bond, when n4 is 0, *-$(L_4)_{n4}$-*' may be a single bond, when n5 is 0, *-$(L_5)_{n5}$-*' may be a single bond, when n6 is 0, *-$(L_6)_{n6}$-*' may be a single bond, when n10 is 0, *-$(L_{10})_{n10}$-*' may be a single bond, $R_1$ to $R_8$ and $R_{10a}$ may each independently be:

deuterium, —F, —Cl, —Br, —I, a hydroxyl group, a cyano group, or a nitro group;

a $C_1$-$C_6$ alkyl group, a $C_2$-$C_{60}$ alkenyl group, a $C_2$-$C_{60}$ alkynyl group, or a $C_1$-$C_6$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, a $C_1$-$C_{60}$ heteroarylthio group, —Si($Q_{11}$)($Q_{12}$)($Q_{13}$), —N($Q_{11}$)($Q_{12}$), —B($Q_{11}$)

$(Q_{12})$, —C(=O)$(Q_{11})$, —S(=O)$_2(Q_{11})$, —P(=O)$(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, or a $C_1$-$C_{60}$ heteroarylthio group, each unsubstituted or substituted with deuterium, —F, —Cl, —Br, —I, a hydroxyl group, a cyano group, a nitro group, a $C_1$-$C_6$ alkyl group, a $C_2$-$C_{60}$ alkenyl group, a $C_2$-$C_{60}$ alkynyl group, a $C_1$-$C_6$ alkoxy group, a $C_3$-$C_{60}$ carbocyclic group, a $C_1$-$C_6$ heterocyclic group, a $C_6$-$C_{60}$ aryloxy group, a $C_6$-$C_{60}$ arylthio group, a $C_1$-$C_6$ heteroaryloxy group, a $C_1$-$C_6$ heteroarylthio group, —Si$(Q_{21})(Q_{22})(Q_{23})$, —N$(Q_{21})(Q_{22})$, —B$(Q_{21})(Q_{22})$, —C(=O)$(Q_{21})$, —S(=O)$_2(Q_{21})$, —P(=O)$(Q_{21})(Q_{22})$, or any combination thereof, or —Si$(Q_{31})(Q_{32})(Q_{33})$, —N$(Q_{31})(Q_{32})$, —B$(Q_{31})(Q_{32})$, —C(=O)$(Q_{31})$, —S(=O)$_2(Q_{31})$, or —P(=O)$(Q_{31})(Q_{32})$, a1 to a8 may each independently be an integer from 0 to 8,

* and *' may each indicate a binding site to a neighboring atom, $Q_1$, $Q_2$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and two neighboring substituents among $Q_1$, $Q_2$, $Q_{11}$ to $Q_{13}$, $Q_{21}$ to $Q_{23}$, and $Q_{31}$ to $Q_{33}$ may optionally be bonded to each other to form a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$.

In an embodiment, $M_1$ and $M_2$ may each independently be Pt or Pd.

In an embodiment, $A_1$ to $A_4$ may each independently be a 5-membered cyclic group, a 5-membered heterocyclic group, a 6-membered cyclic group, a 6-membered heterocyclic group, a polycyclic $C_1$-$C_{30}$ cyclic group comprising a 5-membered cyclic group, a polycyclic $C_1$-$C_{30}$ cyclic group comprising a 6-membered cyclic group, a polycyclic $C_1$-$C_{30}$ heterocyclic group comprising a 5-membered cyclic group, a polycyclic $C_1$-$C_{30}$ heterocyclic group comprising a 6-membered cyclic group, a polycyclic $C_1$-$C_{30}$ heterocyclic group comprising a 5-membered heterocyclic group, or a polycyclic $C_1$-$C_{30}$ heterocyclic group comprising a 6-membered heterocyclic group.

In an embodiment, $B_1$ to $B_4$ may each independently be a 5-membered heterocyclic group, a polycyclic $C_1$-$C_{30}$ heterocyclic group comprising a 5-membered heterocyclic group, a 6-membered heterocyclic group, or a polycyclic $C_1$-$C_{30}$ heterocyclic group comprising a 6-membered heterocyclic group.

In an embodiment, $B_1$ to $B_4$ may each independently be a group represented by one of Formulae 3-1 to 3-3, which are explained below.

In an embodiment, at least one of a bond between $M_1$ and $X_{10}$, a bond between $M_1$ and $X_{20}$, a bond between $M_2$ and $X_{30}$, and a bond between $M_2$ and $X_{40}$ may be a covalent bond; and at least one of a bond between $M_1$ and $X_{50}$, a bond between $M_1$ and $X_{60}$, a bond between $M_2$ and $X_{70}$, and a bond between $M_2$ and $X_{80}$ may be a coordinate bond.

In an embodiment, $L_1$ and $L_4$ may each independently be *—C$(Q_1)(Q_2)$-*', *—N$(Q_1)$-*', *—O—*', or *—S—*'; a1 and a4 may each be 1; and $Q_1$ and $Q_2$ may each be the same as described in Formula 1.

In an embodiment, $L_{10}$ may include a $C_1$-$C_{20}$ alkylene group that is unsubstituted or substituted with at least one $R_{10a}$, a $C_2$-$C_{20}$ alkenylene group that is unsubstituted or substituted with at least one $R_{10a}$, a $C_2$-$C_{20}$ alkynylene group that is unsubstituted or substituted with at least one $R_{10a}$, a $C_3$-$C_{10}$ cycloalkylene group that is unsubstituted or substituted with at least one $R_{10a}$, a $C_1$-$C_{10}$ heterocycloalkylene group that is unsubstituted or substituted with at least one $R_{10a}$, a $C_3$-$C_{10}$ cycloalkenylene group that is unsubstituted or substituted with at least one $R_{10a}$, a $C_1$-$C_{10}$ heterocycloalkenylene group that is unsubstituted or substituted with at least one $R_{10a}$, a $C_6$-$C_{60}$ arylene group that is unsubstituted or substituted with at least one $R_{10a}$, a $C_1$-$C_{60}$ heteroarylene group that is unsubstituted or substituted with at least one $R_{10a}$, a divalent non-aromatic condensed polycyclic group that is unsubstituted or substituted with at least one $R_{10a}$, or a divalent non-aromatic condensed heterocyclic group that is unsubstituted or substituted with at least one $R_{10a}$.

In an embodiment, $L_{10}$ may include a group represented by one of Formulae 4-1 to 4-3, which are explained below.

In an embodiment, $R_1$ to $R_8$ may each independently be:

hydrogen, deuterium, —F, —Cl, —Br, —I, a cyano group, a $C_1$-$C_{20}$ alkyl group, a $C_1$-$C_{20}$ alkoxy group, a $C_3$-$C_{60}$ carbocyclic group, or a $C_1$-$C_{60}$ heterocyclic group;

a $C_1$-$C_{20}$ alkyl group, a $C_1$-$C_{20}$ alkoxy group, a $C_3$-$C_{60}$ carbocyclic group, or a $C_1$-$C_{60}$ heterocyclic group, each substituted with deuterium, —F, —Cl, —Br, —I, a cyano group, a phenyl group, a biphenyl group, or any combination thereof; or a group represented by one of Formulae 5-1 to 5-26 and 6-1 to 6-55, which are explained below.

In an embodiment, the organometallic compound may be electrically neutral.

In an embodiment, the organometallic compound represented by Formula 1 may be one of Compounds BD1 to BD104, which are explained below.

According to embodiments, a light-emitting device may include a first electrode, a second electrode facing the first electrode, an interlayer between the first electrode and the second electrode and including an emission layer, and the organometallic compound according to embodiments.

In an embodiment, the first electrode may be an anode, and the second electrode may be a cathode. The interlayer may further include: a hole transport region between the first electrode and the emission layer and including a hole injection layer, a hole transport layer, an emission auxiliary layer, an electron blocking layer, or any combination thereof; and an electron transport region between the emission layer and the second electrode and including a hole blocking layer, an electron transport layer, an electron injection layer, or any combination thereof.

In an embodiment, the emission layer may include the organometallic compound.

In an embodiment, the emission layer may include a host and a dopant, and the dopant may include the organometallic compound.

In an embodiment, the emission layer may emit blue light.

According to embodiments, an electronic apparatus may include the light-emitting device according to embodiments.

In an embodiment, the electronic apparatus may further include: a thin-film transistor; and a color filter, a color conversion layer, a touch screen layer, a polarizing layer, or any combination thereof. The thin-film transistor may include a source electrode and a drain electrode, and the first electrode of the light-emitting device may be electrically connected to the source electrode or the drain electrode.

According to embodiments, an electronic device may include the light-emitting device according to embodiments, wherein the electronic device may be a flat panel display, a curved display, a computer monitor, a medical monitor, a television, a billboard, an indoor light, an outdoor light, a signaling light, a head-up display, a fully transparent display, a partially transparent display, a flexible display, a rollable display, a foldable display, a stretchable display, a laser printer, a telephone, a portable phone, a tablet, a phablet, a personal digital assistant (PDA), a wearable device, a laptop computer, a digital camera, a camcorder, a viewfinder, a micro display, a three-dimensional (3D) display, a virtual reality display, an augmented reality display, a vehicle, a video wall with multiple displays tiled together, a theater screen, a stadium screen, a phototherapy device, or a signboard.

It is to be understood that the embodiments above are described in a generic and explanatory sense only and not for the purpose of limitation, and the disclosure is not limited to the embodiments described above.

BRIEF DESCRIPTION OF THE DRAWINGS

The above and other aspects and features of the disclosure will be more apparent by describing in detail embodiments thereof with reference to the accompanying drawings, in which.

DETAILED DESCRIPTION OF THE EMBODIMENTS

Figure 1:
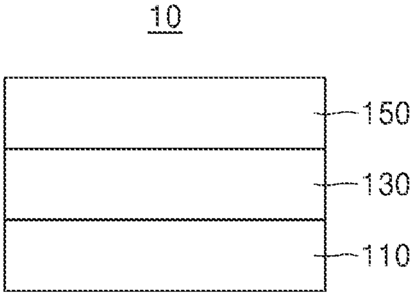
FIG. 1 is a schematic cross-sectional view of a structure of a light-emitting device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

When an example may be implemented in a different manner, a process order may be performed differently from the described order. For example, two processes described in succession may be performed substantially simultaneously or may be performed in an order opposite to the described order.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

In the specification, the x-axis, y-axis, and z-axis are not limited to three axes in an orthogonal coordinate system, and may be interpreted in a broad sense including these axes. For example, the x-axis, y-axis, and z-axis may refer to axes which are orthogonal to each other, or may refer to axes which are in different directions that are not orthogonal to each other.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within +20%, 10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

An organometallic compound according to an embodiment is represented by Formula 1:

[Formula 1]

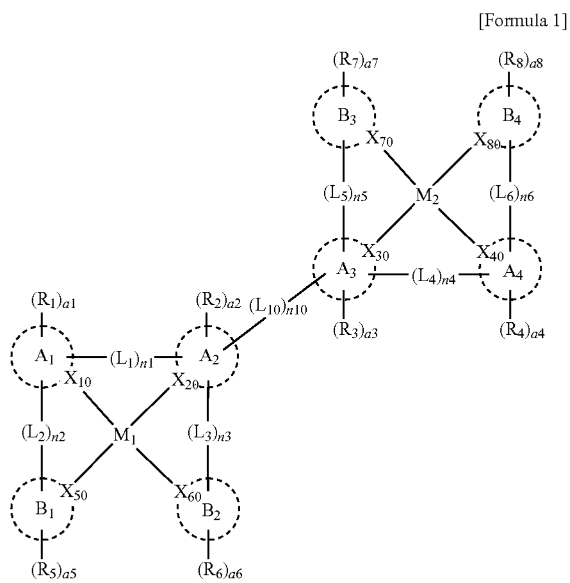

In Formula 1, $M_1$ and $M_2$ may each independently be platinum (Pt), palladium (Pd), copper (Cu), silver (Ag), gold (Au), rhodium (Rh), ruthenium (Ru), osmium (Os), titanium (Ti), zirconium (Zr), hafnium (Hf), europium (Eu), terbium (Tb), or thulium (Tm), $A_1$ to $A_4$ and $B_1$ to $B_4$ may each independently be a $C_5$-$C_{60}$ carbocyclic group or a $C_1$-$C_{60}$ heterocyclic group, $X_{10}$ to $X_{80}$ may each independently be C or N, $L_1$ to $L_6$ may each independently be *—O—*', *—S—*', *—C($Q_1$)($Q_2$)-*', *—C($Q_1$)=*', *=C($Q_1$)-*', *—C($Q_1$)=C($Q_2$)-*', *—C(=O)—*', *—C(=S)—*', *—C≡C—*', *—B($Q_1$)-*', *—N($Q_1$)-*', *—P($Q_1$)-*', *—Si($Q_1$)($Q_2$)-*', *—P($Q_1$)($Q_2$)-*', or *—Ge($Q_1$)($Q_2$)-*', $L_{10}$ may include: a $C_3$-$C_{60}$ carbocyclic group that is unsubstituted or substituted with at least one $R_{10a}$; or a $C_1$-$C_6$ heterocyclic group that is unsubstituted or substituted with at least one $R_{10a}$, n1 to n6 and n10 may each independently be an integer from 0 to 5, when n1 is 0, *-$(L_1)_{n1}$-*' may be a single bond, when n2 is 0, *-$(L_2)_{n2}$-*' may be a single bond, when n3 is 0, *-$(L_3)_{n3}$-*' may be a single bond, when n4 is 0, *-$(L_4)_{n4}$-*' may be a single bond, when n5 is 0, *-$(L_5)_{n5}$-*' may be a single bond, when n6 is 0, *-$(L_6)_{n6}$-*' may be a single bond, when n10 is 0, *-$(L_{10})_{n10}$-*' may be a single bond, $R_1$ to $R_8$ and $R_{10a}$ may each independently be:

deuterium, —F, —Cl, —Br, —I, a hydroxyl group, a cyano group, or a nitro group;

a $C_1$-$C_6$ alkyl group, a $C_2$-$C_{60}$ alkenyl group, a $C_2$-$C_{60}$ alkynyl group, or a $C_1$-$C_6$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, a $C_1$-$C_{60}$ heteroarylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, or a $C_1$-$C_{60}$ heteroarylthio group, each unsubstituted or substituted with deuterium, —F, —Cl, —Br, —I, a hydroxyl group, a cyano group, a nitro group, a $C_1$-$C_6$ alkyl group, a $C_2$-$C_{60}$ alkenyl group, a $C_2$-$C_{60}$ alkynyl group, a $C_1$-$C_6$ alkoxy group, a $C_3$-$C_{60}$ carbocyclic group, a $C_1$-$C_6$ heterocyclic group, a $C_6$-$C_{60}$ aryloxy group, a $C_6$-$C_{60}$ arylthio group, a $C_1$-$C_6$ heteroaryloxy group, a $C_1$-$C_6$ heteroarylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), a1 to a8 may each independently be an integer from 0 to 8,

* and *' may each indicate a binding site to a neighboring atom, $Q_1$, $Q_2$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and two neighboring substituents among $Q_1$, $Q_2$, $Q_{11}$ to $Q_{13}$, $Q_{21}$ to $Q_{23}$, and $Q_{31}$ to $Q_{33}$ may optionally be bonded to each other to form a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$.

In the organometallic compound according to an embodiment, $M_1$ and $M_2$ may be identical to each other.

In the organometallic compound according to an embodiment, $M_1$ and $M_2$ may be different from each other.

In the organometallic compound according to an embodiment, $M_1$ and $M_2$ may each independently be Pt or Pd.

In the organometallic compound according to an embodiment, $A_1$ to $A_4$ may each independently be a 5-membered cyclic group, a 5-membered heterocyclic group, a 6-membered cyclic group, a 6-membered heterocyclic group, a polycyclic $C_1$-$C_{30}$ cyclic group including a 5-membered cyclic group, a polycyclic $C_1$-$C_{30}$ cyclic group including a 6-membered cyclic group, a polycyclic $C_1$-$C_{30}$ heterocyclic group including a 5-membered cyclic group, a polycyclic $C_1$-$C_{30}$ heterocyclic group including a 6-membered cyclic group, a polycyclic $C_1$-$C_{30}$ heterocyclic group including a 5-membered heterocyclic group, or a polycyclic $C_1$-$C_{30}$ heterocyclic group including a 6-membered heterocyclic group.

In the organometallic compound according to an embodiment, $A_1$ and $A_4$ may each independently include one or more nitrogen atoms, or $A_2$ and $A_3$ may each independently include one or more nitrogen atoms, or one of $A_1$ to $A_4$ may include a nitrogen atom.

In the organometallic compound according to an embodiment, $B_1$ to $B_4$ may each independently be a 5-membered heterocyclic group, a polycyclic $C_1$-$C_{30}$ heterocyclic group including a 5-membered heterocyclic group, a 6-membered heterocyclic group, or a polycyclic $C_1$-$C_{30}$ heterocyclic group including a 6-membered heterocyclic group.

In the organometallic compound according to an embodiment, at least one of $B_1$ to $B_4$ may each independently include a carbene moiety.

In the organometallic compound according to an embodiment, $B_1$ to $B_4$ may each independently include at least one carbene moiety.

In the organometallic compound according to an embodiment, $B_1$ to $B_4$ may each independently be a group represented by one of Formulae 3-1 to 3-3:

3-1

3-2

3-3

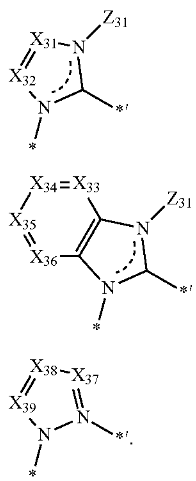

In Formulae 3-1 to 3-3, $X_{31}$ to $X_{39}$ may each independently be $C(Z_{32})$ or N, $Z_{31}$ may be the same as described in connection with Rio in Formula 1, and

*, *', and *" may each indicate a binding site to a neighboring atom.

In the organometallic compound according to an embodiment, $Z_{31}$ may be one selected from among a $C_1$-$C_{60}$ alkyl group that is substituted with at least one deuterium, a $C_3$-$C_{60}$ carbocyclic group that is substituted with at least one deuterium, and a $C_1$-$C_{60}$ heterocyclic group that is substituted with at least one deuterium.

In the organometallic compound according to an embodiment, $Z_{31}$ may be —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$.

In the organometallic compound according to an embodiment, at least one of a bond between $M_1$ and $X_{10}$, a bond between $M_1$ and $X_{20}$, a bond between $M_2$ and $X_{30}$, and a bond between $M_2$ and $X_{40}$ may be a covalent bond; and at least one of a bond between $M_1$ and $X_{50}$, a bond between $M_1$ and $X_{60}$, a bond between $M_2$ and $X_{70}$, and a bond between $M_2$ and $X_{80}$ may be a coordinate bond.

In the organometallic compound according to an embodiment, a bond between $M_1$ and $X_{10}$, a bond between $M_1$ and $X_{20}$, a bond between $M_2$ and $X_{30}$, and a bond between $M_2$ and $X_{40}$ may each be a covalent bond; and a bond between $M_1$ and $X_{50}$, a bond between $M_1$ and $X_{60}$, a bond between $M_2$ and $X_{70}$, and a bond between $M_2$ and $X_{80}$ may each be a coordinate bond.

In the organometallic compound according to an embodiment, $L_1$ and $L_4$ may each independently be *—$C(Q_1)(Q_2)$-*', *—$N(Q_1)$-*', *—O—*', or *—S—*', a1 and a4 may each be 1, and $Q_1$ and $Q_2$ may each be the same as described in Formula 1.

In the organometallic compound according to an embodiment, $L_1$ and $L_4$ may each be *—O—*', a1 and a4 may each be 1, and a2, a3, a5, and a6 may each be 0.

In the organometallic compound according to an embodiment, $L_{10}$ may include a $C_1$-$C_{20}$ alkylene group that is unsubstituted or substituted with at least one $R_{10a}$, a $C_2$-$C_{20}$ alkenylene group that is unsubstituted or substituted with at least one $R_{10a}$, a $C_2$-$C_{20}$ alkynylene group that is unsubstituted or substituted with at least one $R_{10a}$, a $C_3$-$C_{10}$ cycloalkylene group that is unsubstituted or substituted with at least one $R_{10a}$, a $C_1$-$C_{10}$ heterocycloalkylene group that is unsubstituted or substituted with at least one $R_{10a}$, a $C_3$-$C_{10}$ cycloalkenylene group that is unsubstituted or substituted with at least one $R_{10a}$, a $C_1$-$C_{10}$ heterocycloalkenylene group that is unsubstituted or substituted with at least one $R_{10a}$, a $C_6$-$C_{60}$ arylene group that is unsubstituted or substituted with at least one $R_{10a}$, a $C_1$-$C_{60}$ heteroarylene group that is unsubstituted or substituted with at least one $R_{10a}$, a divalent non-aromatic condensed polycyclic group that is unsubstituted or substituted with at least one $R_{10a}$, or a divalent non-aromatic condensed heterocyclic group that is unsubstituted or substituted with at least one $R_{10a}$.

In the organometallic compound according to an embodiment, $L_{10}$ may include a group represented by one of Formulae 4-1 to 4-3:

4-1

4-2

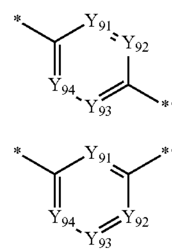

-continued 4-3

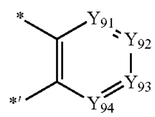

In Formulae 4-1 to 4-3, $Y_{91}$ may be $C(R_{91})$ or N, $Y_{92}$ may be $C(R_{92})$ or N, $Y_{93}$ may be $C(R_{93})$ or N, and $Y_{94}$ may be $C(R_{94})$ or N, $R_{91}$ to $R_{94}$ may each independently be the same as described in connection with $R_{10a}$ in Formula 1, and

* and *' may each indicate a binding site to a neighboring atom.

In the organometallic compound according to an embodiment, $L_{10}$ may include a group represented by Formula 4-1, and n10 may be 1.

In the organometallic compound according to an embodiment, $R_1$ to $R_8$ may each independently be:

hydrogen, deuterium, —F, —Cl, —Br, —I, a cyano group, a $C_1$-$C_{20}$ alkyl group, a $C_1$-$C_{20}$ alkoxy group, a $C_3$-$C_{60}$ carbocyclic group, or a $C_1$-$C_{60}$ heterocyclic group;

a $C_1$-$C_{20}$ alkyl group, a $C_1$-$C_{20}$ alkoxy group, a $C_3$-$C_{60}$ carbocyclic group, or a $C_1$-$C_{60}$ heterocyclic group, each substituted with deuterium, —F, —Cl, —Br, —I, a cyano group, a phenyl group, a biphenyl group, or any combination thereof; or a group represented by one of Formulae 5-1 to 5-26 and 6-1 to 6-55:

5-1

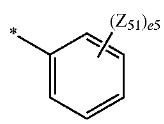

5-2

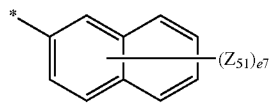

5-3

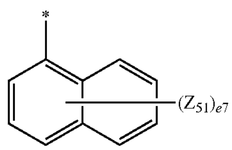

5-4

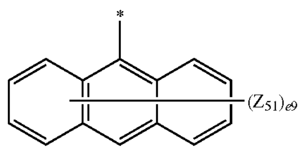

5-5

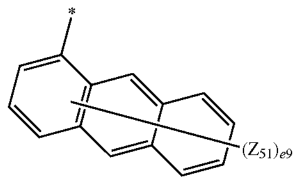

-continued 5-6

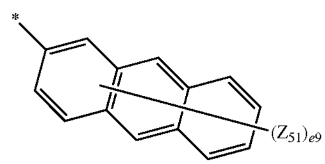

5-7

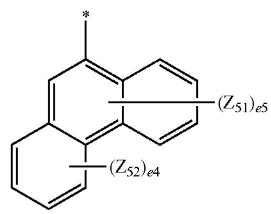

5-8

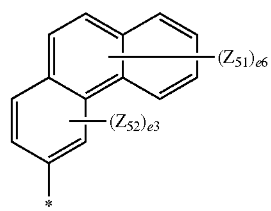

5-9

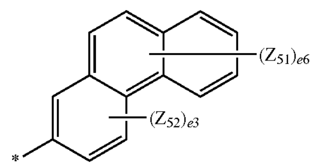

5-10

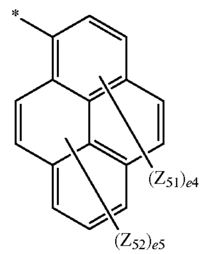

5-11

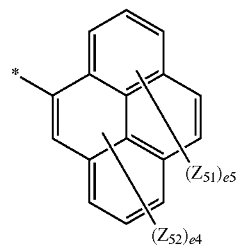

5-12

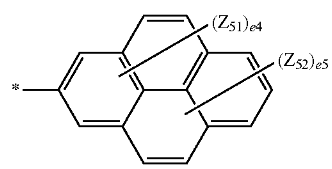

5-13

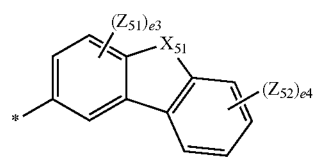

-continued
5-14
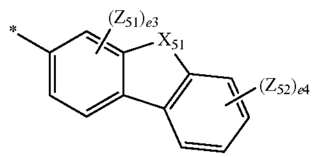
5-15
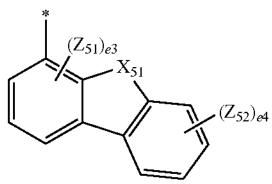
5-16
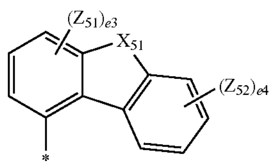
5-17
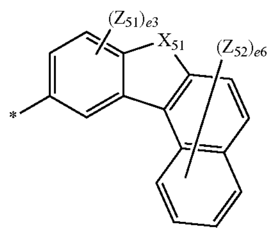
5-18
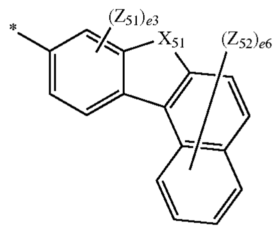
5-19
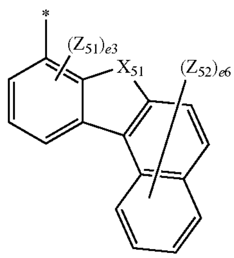
5-20
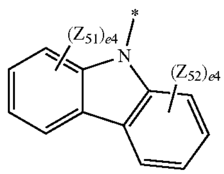
5-21
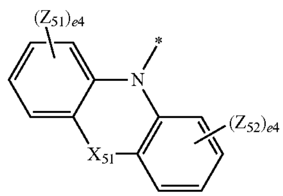
-continued
5-22
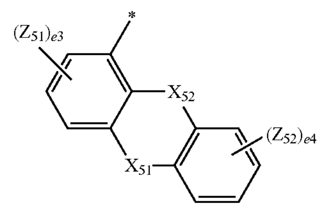
5-23
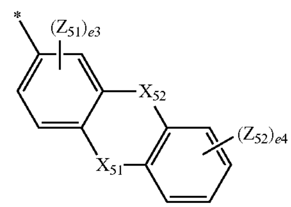
5-24
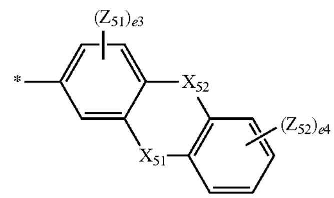
5-25
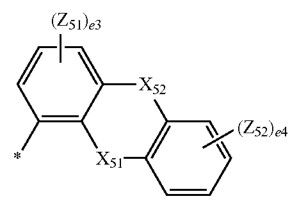
5-26
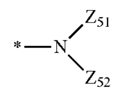
6-1
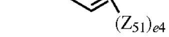
6-2
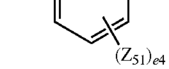
6-3
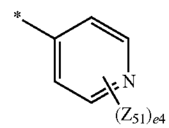
6-4
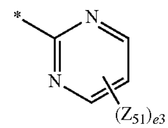
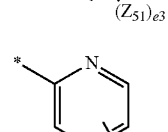
6-5
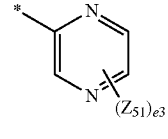
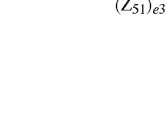
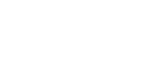

-continued
6-6
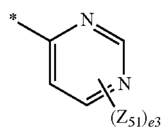
6-7
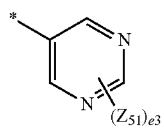
6-8
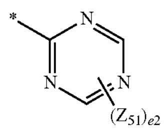
6-9
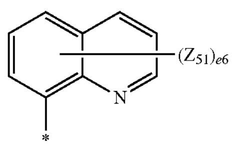
6-10
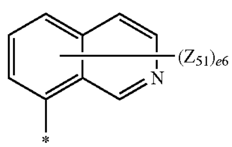
6-11
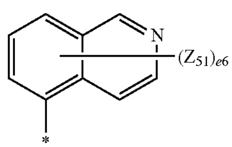
6-12
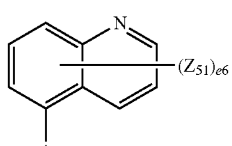
6-13
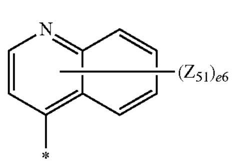
6-14
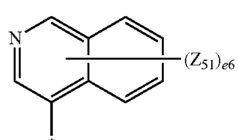
6-15
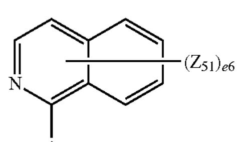
6-16
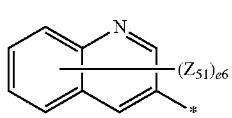
-continued
6-17
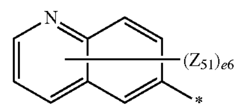
6-18
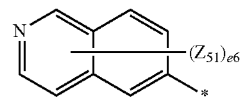
6-19
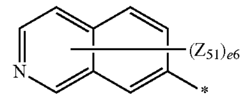
6-20
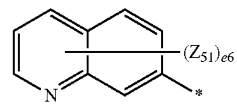
6-21
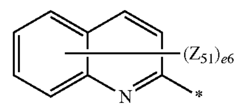
6-22
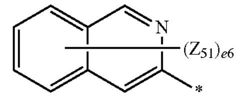
6-23
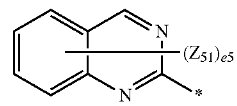
6-24
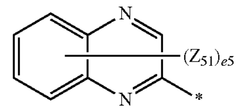
6-25
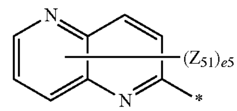
6-26
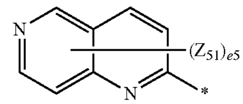
6-27
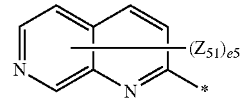
6-28
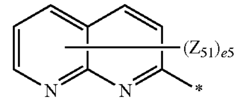
6-29
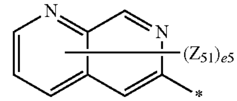
6-30
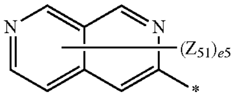

-continued
6-31
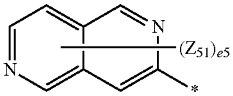
6-32
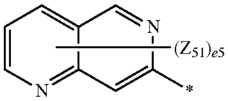
6-33
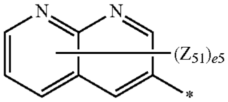
6-34
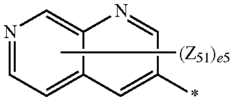
6-35
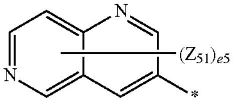
6-36
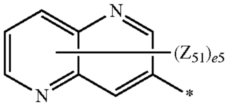
6-37
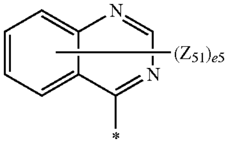
6-38
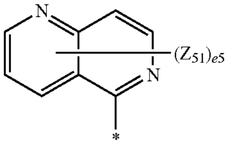
6-39
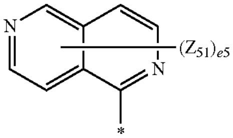
6-40
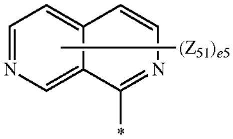
6-41
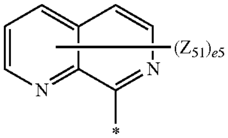
6-42
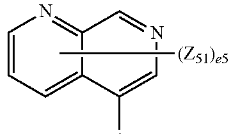
-continued
6-43
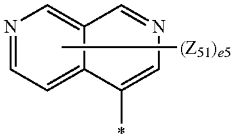
6-44
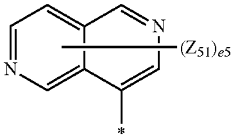
6-45
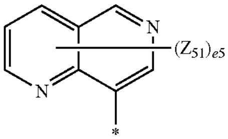
6-46
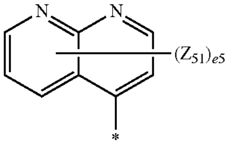
6-47
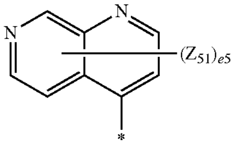
6-48
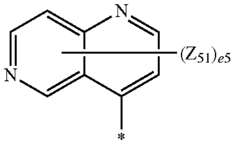
6-49
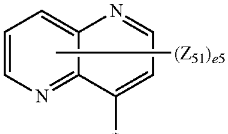
6-50
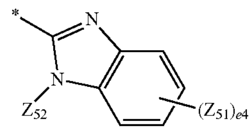

-continued 6-51

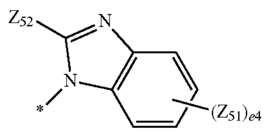

6-52

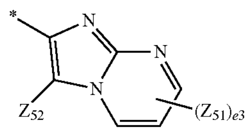

6-53

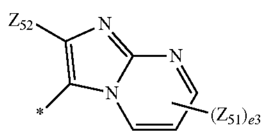

6-54

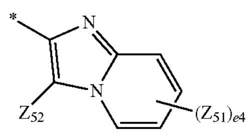

6-55

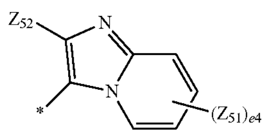

In Formulae 5-1 to 5-26 and 6-1 to 6-55, $X_{51}$ and $X_{52}$ may each independently be O, S, $C(Z_{53})(Z_{54})$, $N(Z_{55})$, or $Si(Z_{53})(Z_{54})$, $Z_{51}$ to $Z_{54}$ may each independently be:

$-CH_3$, $-CD_3$, $-CD_2H$, $-CDH_2$, $-CH_2CH_3$, $-CH_2CD_3$, $-CH_2CD_2H$, $-CH_2CDH_2$, $-CHDCH_3$, $-CHDCD_2H$, $-CHDCDH_2$, $-CHDCD_3$, $-CD_2CD_3$, $-CD_2CD_2H$, or $-CD_2CDH_2$; or hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a biphenyl group, a terphenyl group, a naphthyl group, a fluorenyl group, a spiro-bifluorenyl group, a phenanthrenyl group, an anthracenyl group, a triphenylenyl group, a pyridinyl group, a pyrimidinyl group, a carbazolyl group, or a triazinyl group, e2 may be 1 or 2, e3 may be 1, 2, or 3, e4 may be 1, 2, 3, or 4, e5 may be 1, 2, 3, 4, or 5, e6 may be 1, 2, 3, 4, 5, or 6, e7 may be 1, 2, 3, 4, 5, 6, or 7, e9 may be 1, 2, 3, 4, 5, 6, 7, 8, or 9, and

* may indicate a binding site to a neighboring atom.

In the organometallic compound according to an embodiment, the organometallic compound may be electrically neutral.

In the organometallic compound according to an embodiment, in Formula 1, a moiety represented by

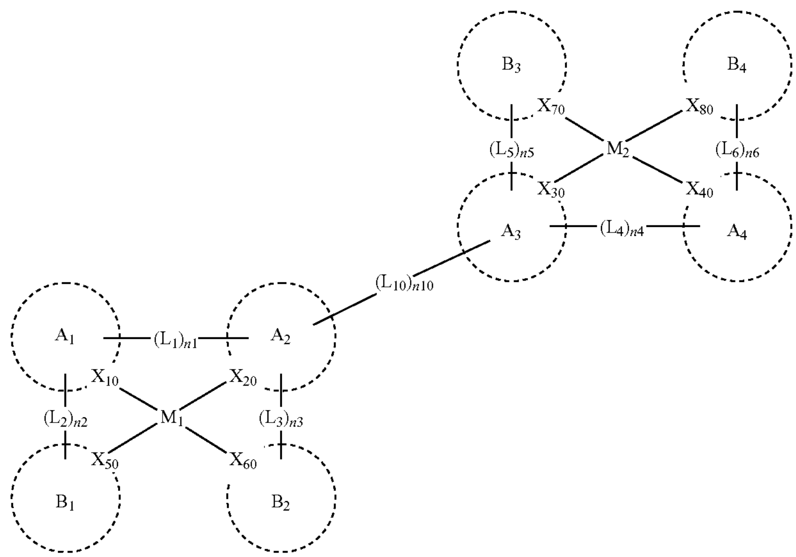

may be included in an $S_2$ symmetry group.

The organometallic compound according to an embodiment may be represented by one of Formulae 1-1 to 1-3:

[Formula 1-1]

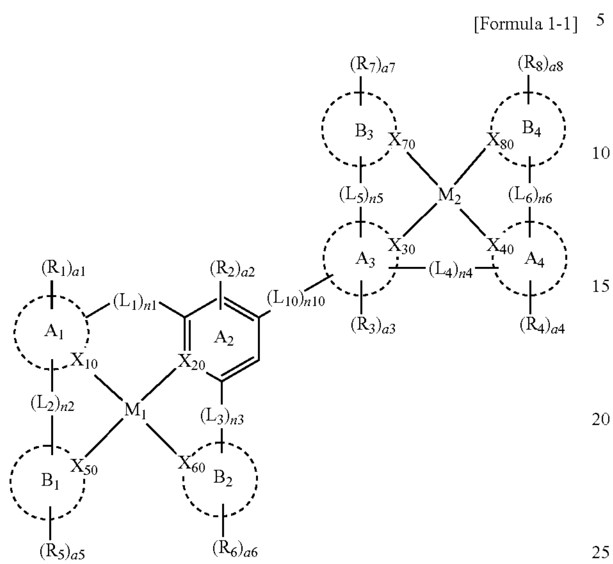

[Formula 1-2]

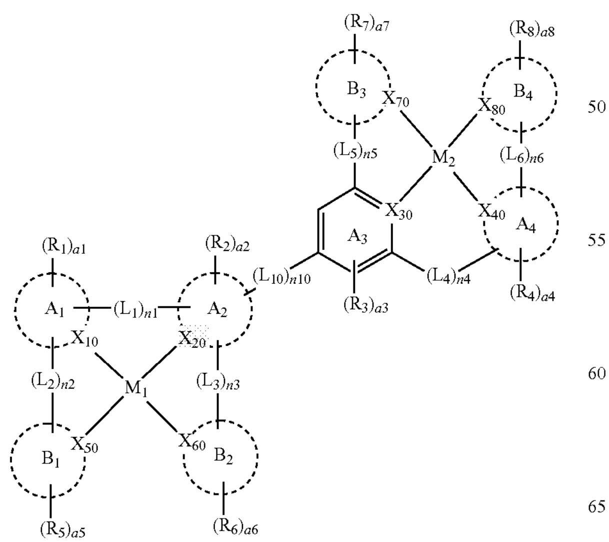

-continued

[Formula 1-3]

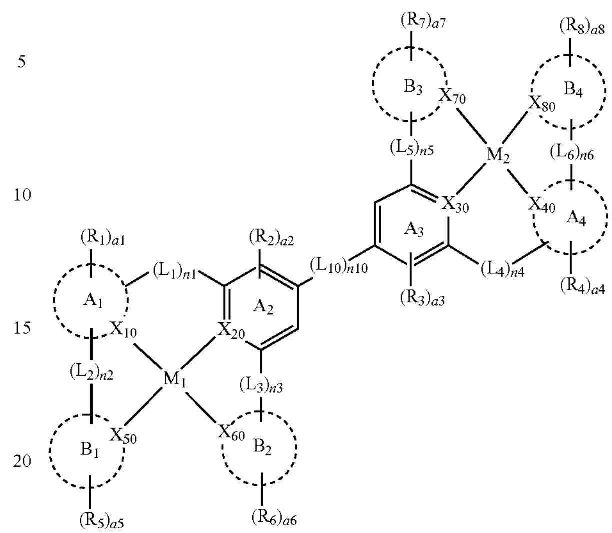

In Formulae 1-1 to 1-3, $M_1$, $M_2$, $A_1$ to $A_4$, $B_1$ to $B_4$, $X_{10}$ to $X_{80}$, $R_1$ to $R_8$, a1 to a8, $L_1$ to $L_6$, $L_{10}$, n1 to n6, and n10 may each be the same as described in Formula 1.

In the organometallic compound according to an embodiment, the organometallic compound represented by Formula 1 may be one of Compounds BD1 to BD104:

BD1
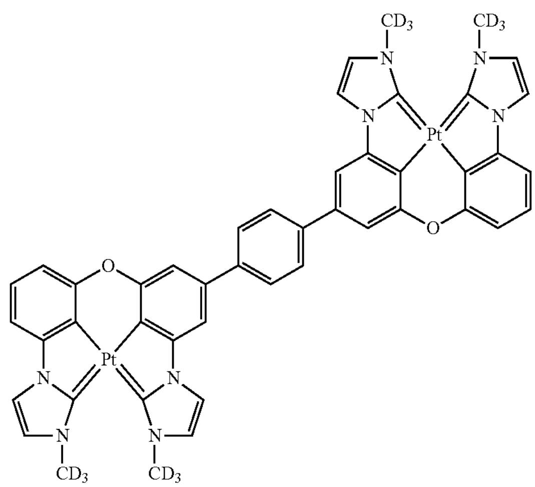
BD2
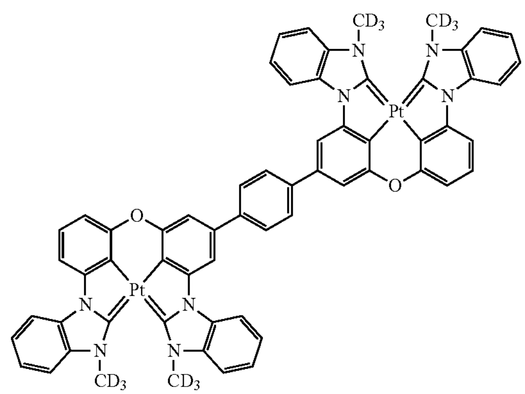
BD3
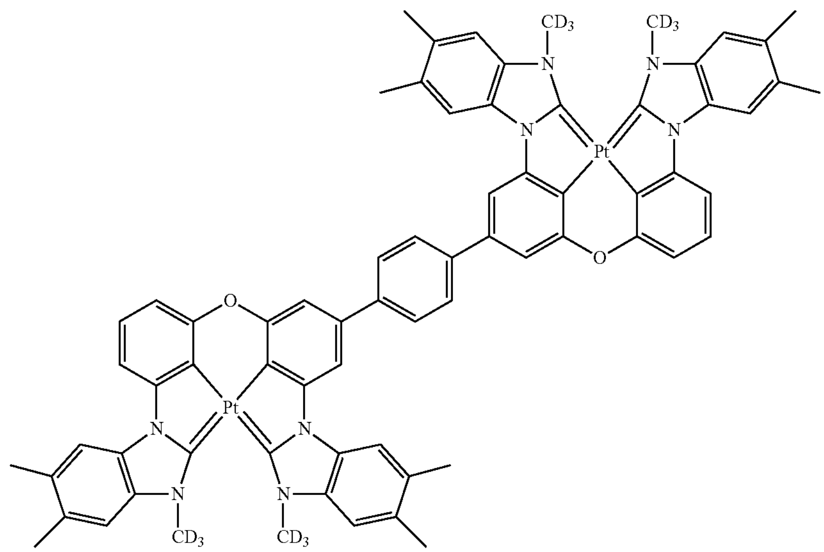
BD4
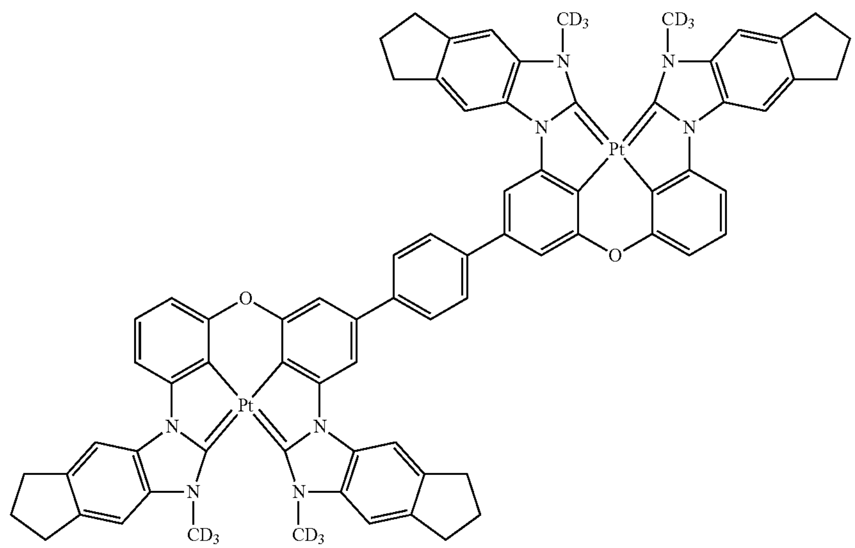

-continued
BD5
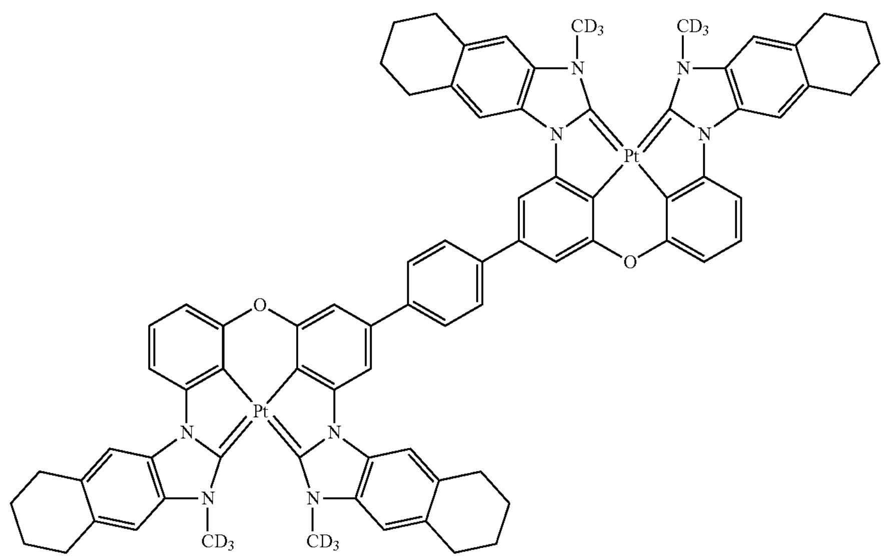
BD6
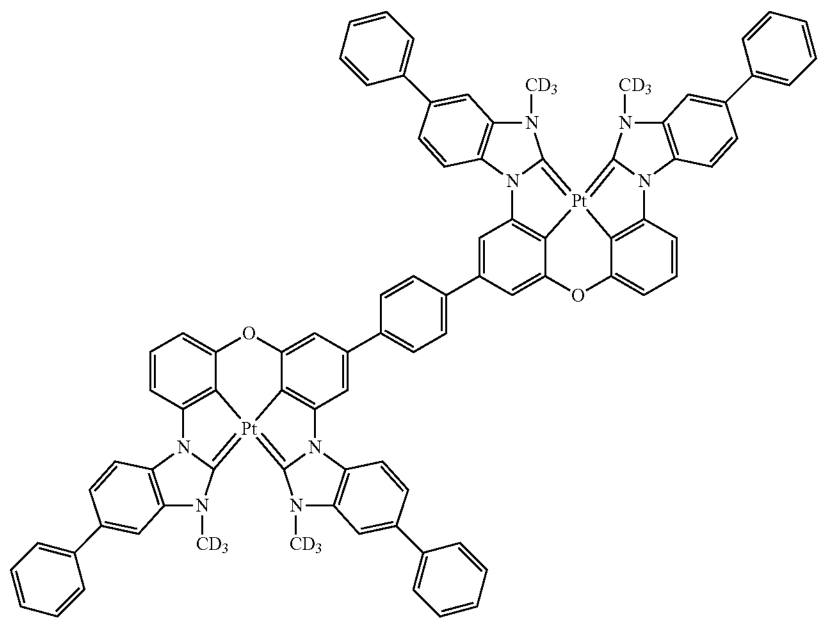

-continued
BD7
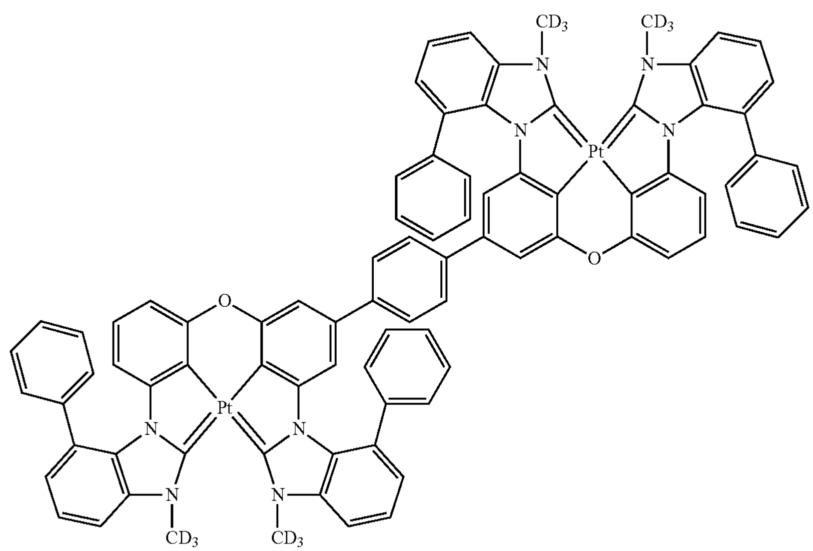
BD8
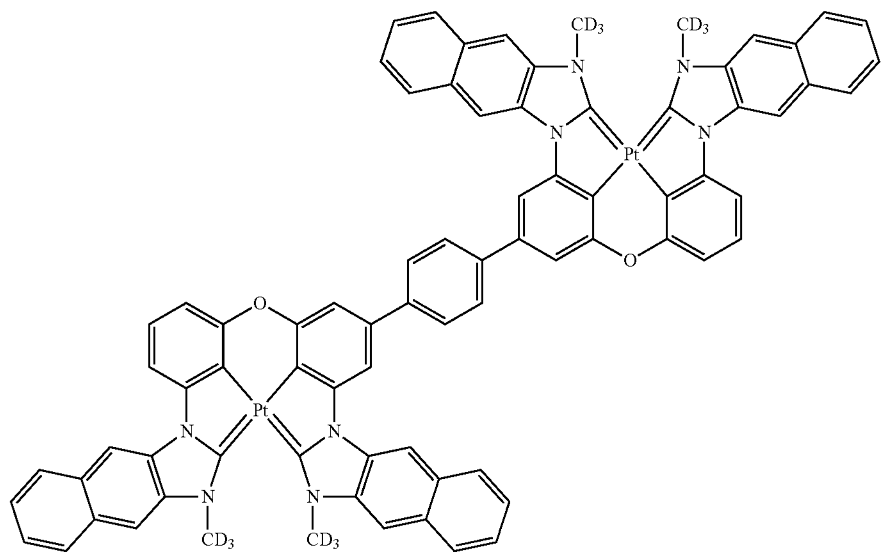
BD9
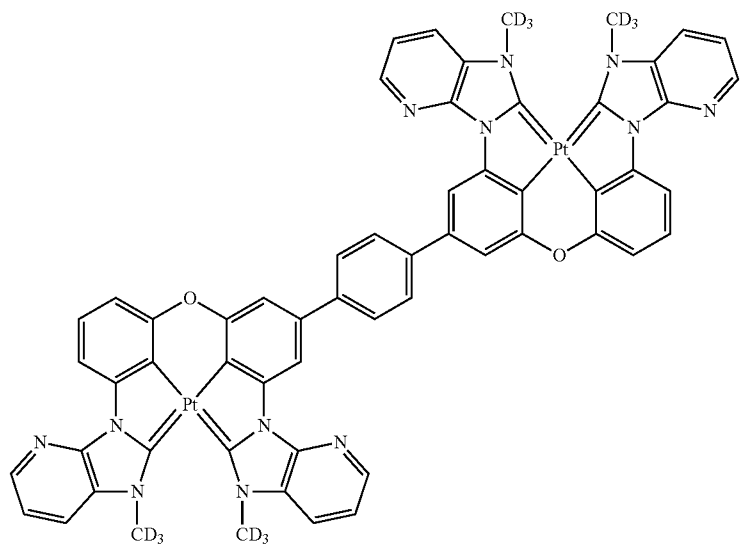

-continued
BD10
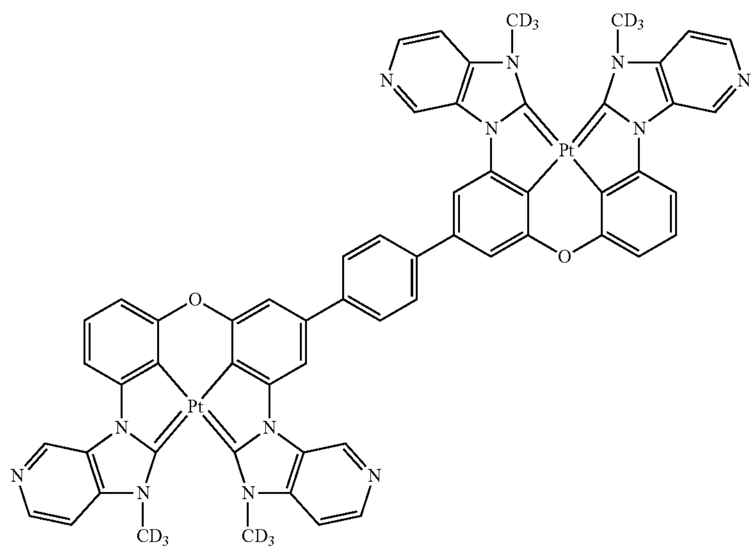
BD11
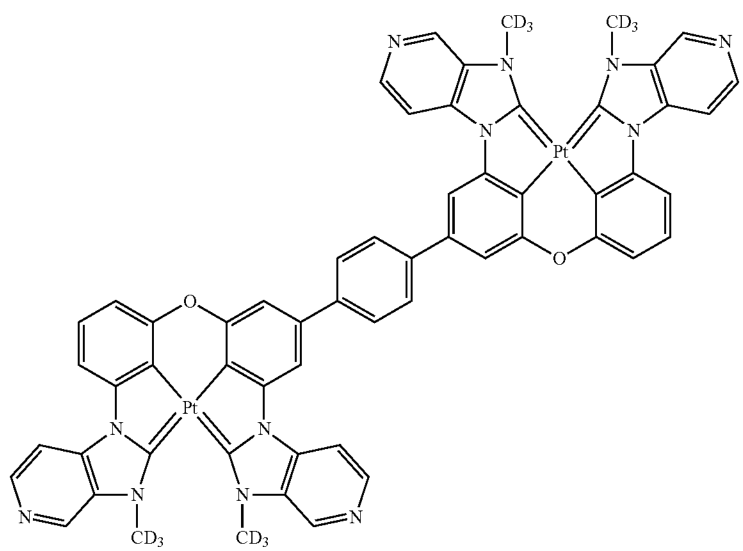
BD12
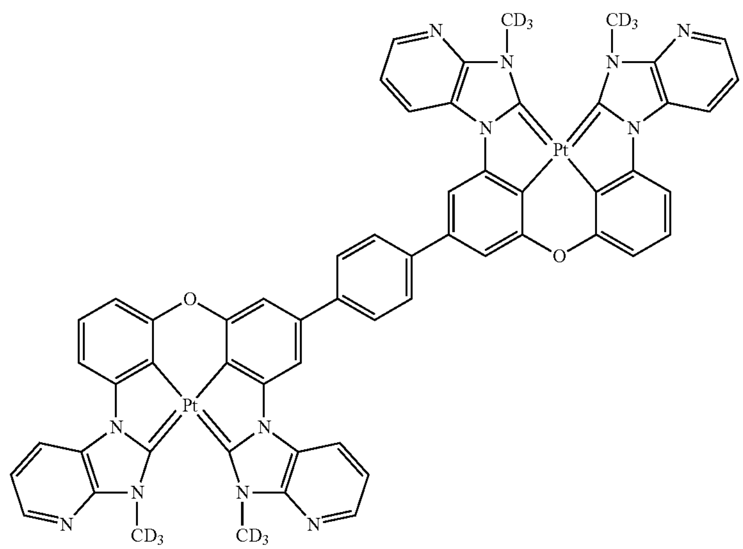

-continued
BD13
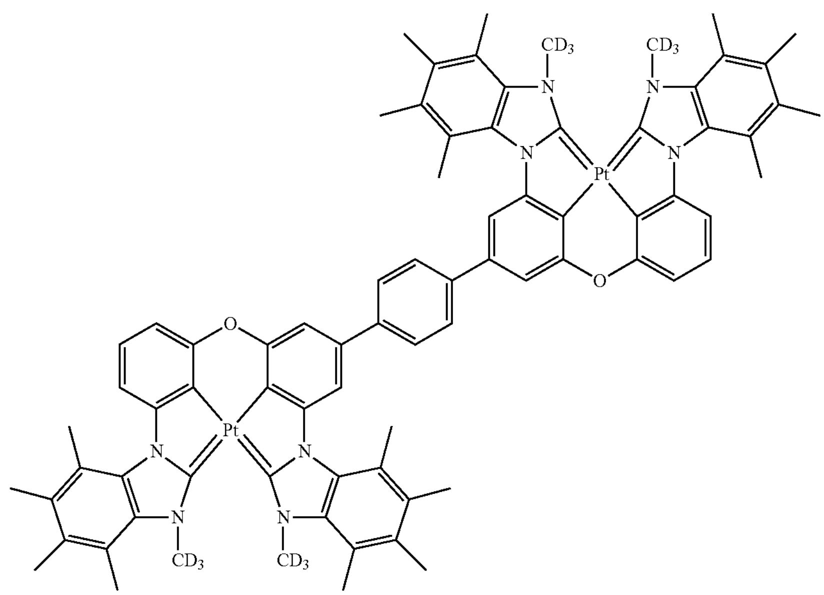
BD14
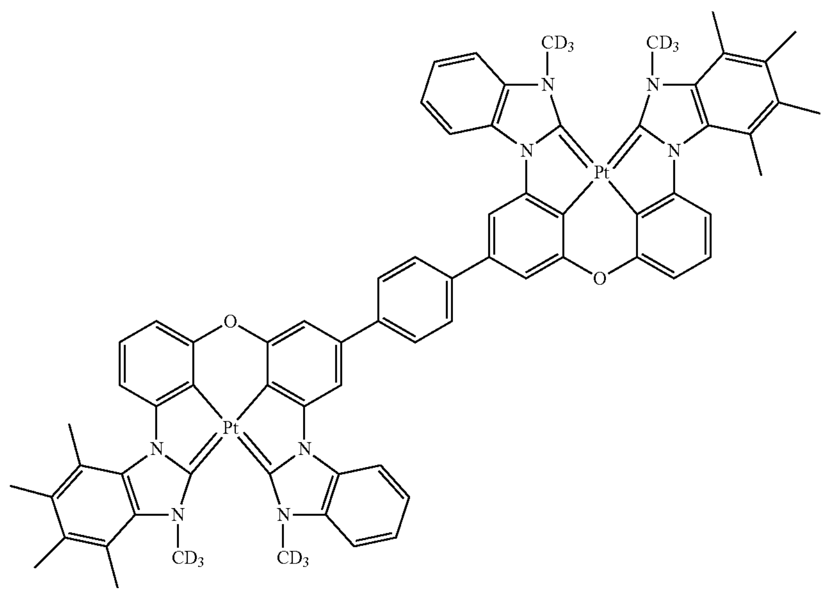

-continued
BD15
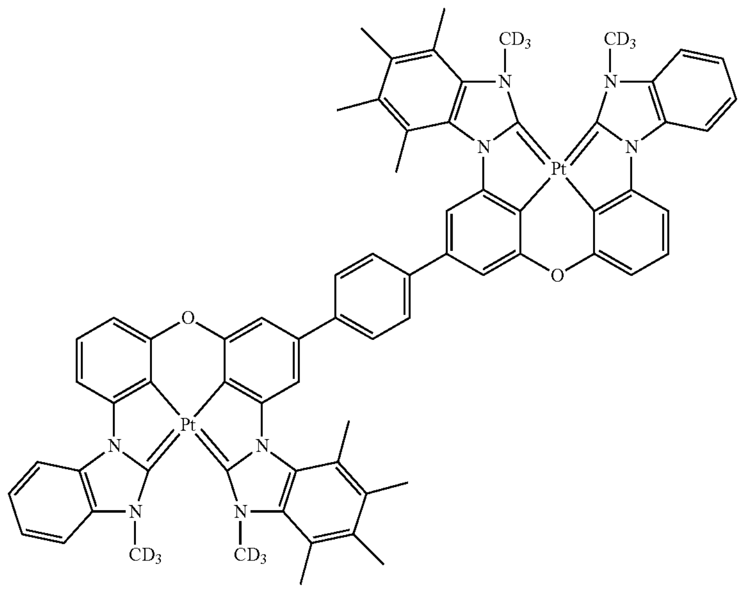
BD16
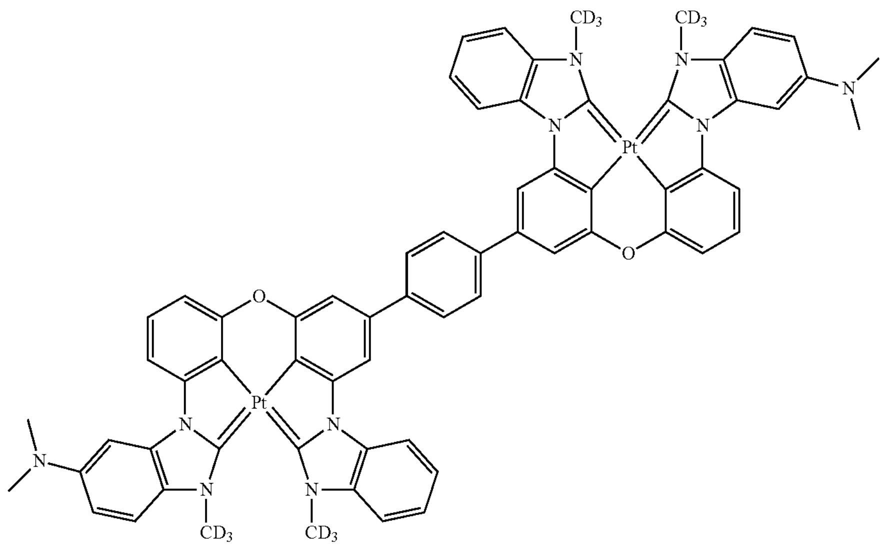
BD17
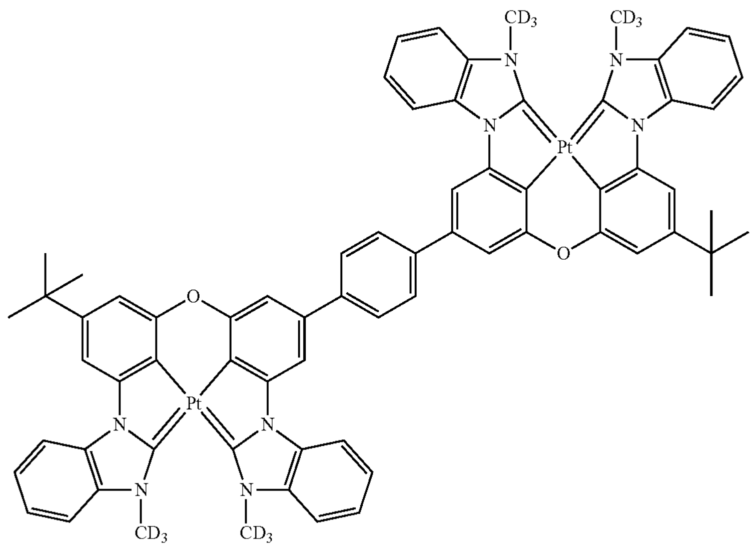

-continued
BD18
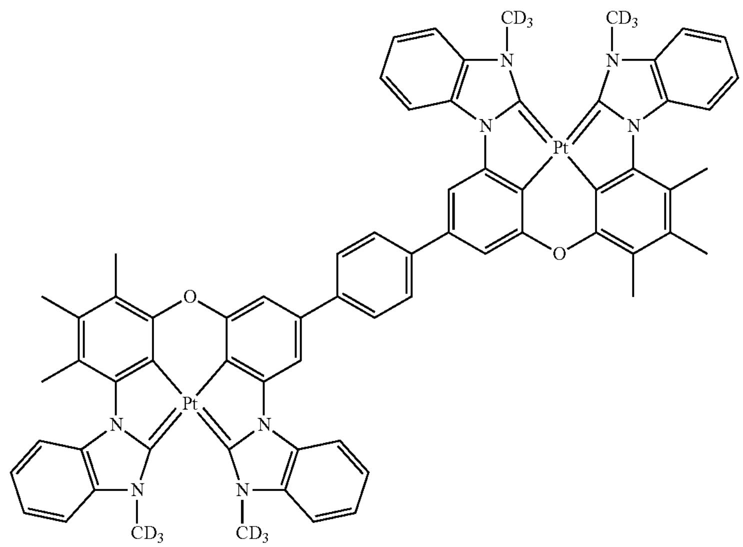
BD19
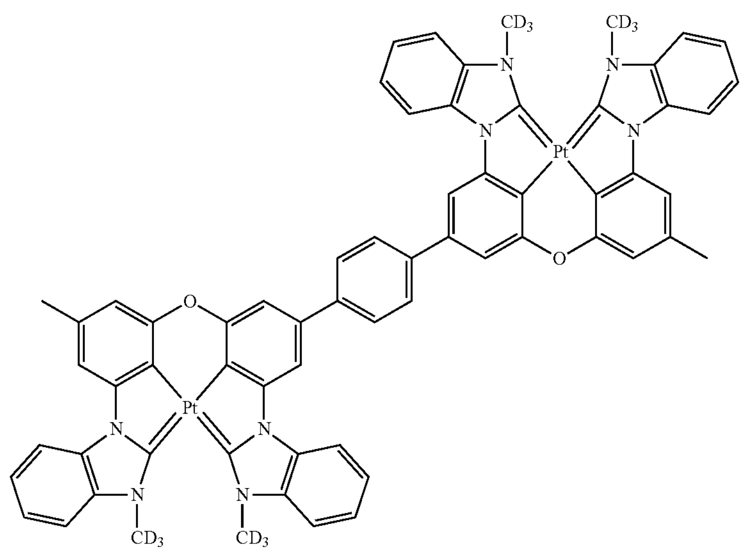
BD20
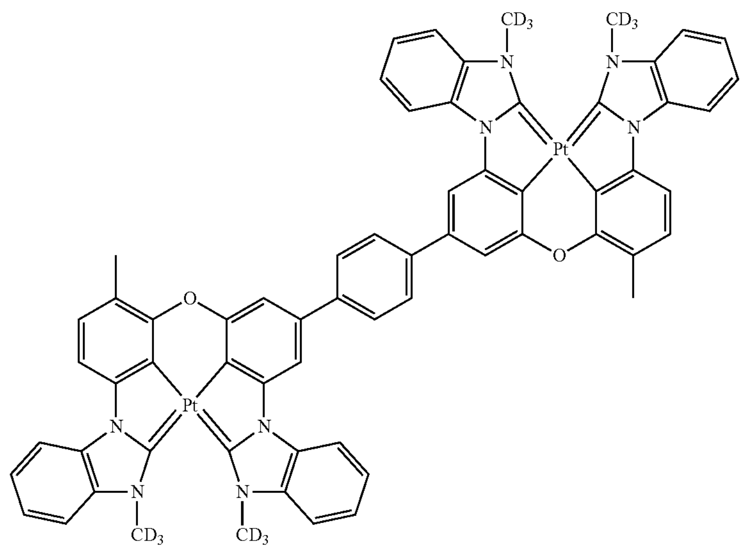

-continued
BD21
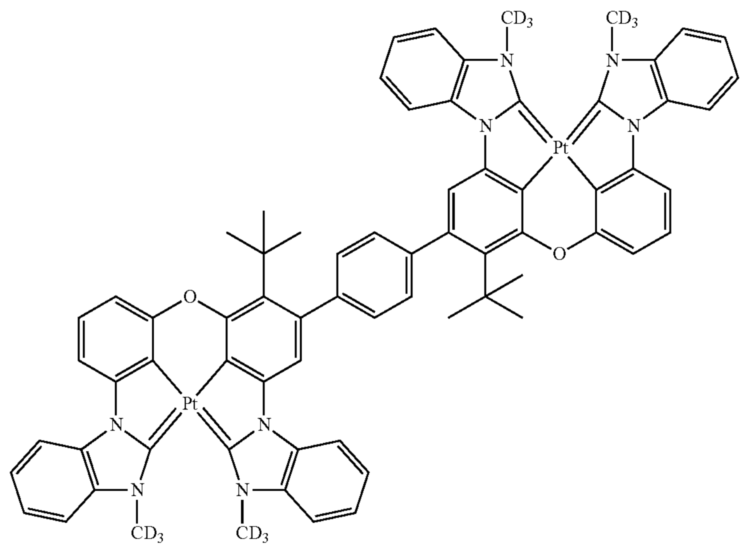
BD22
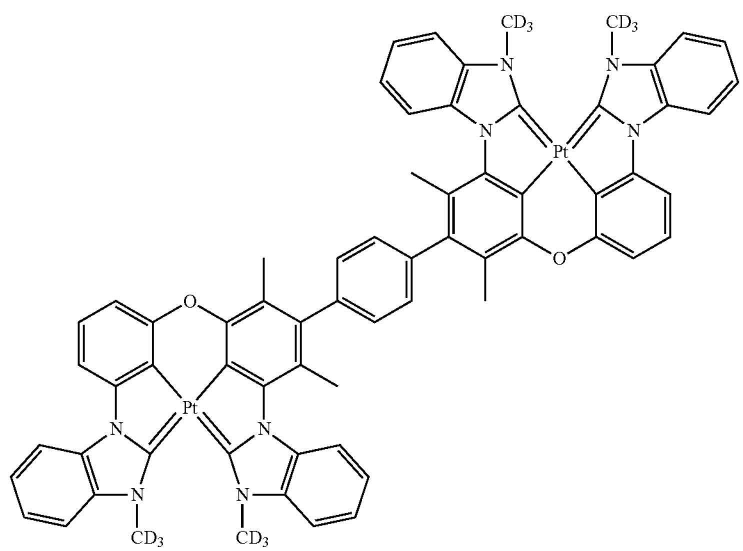
BD23
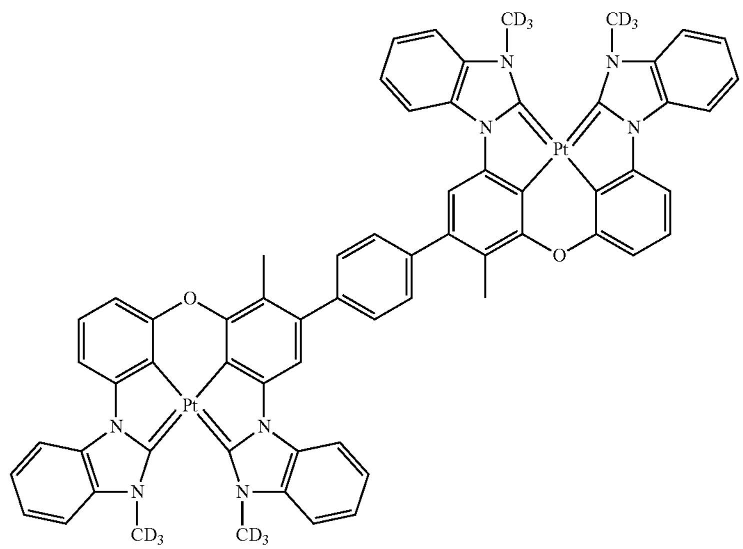

-continued
BD24
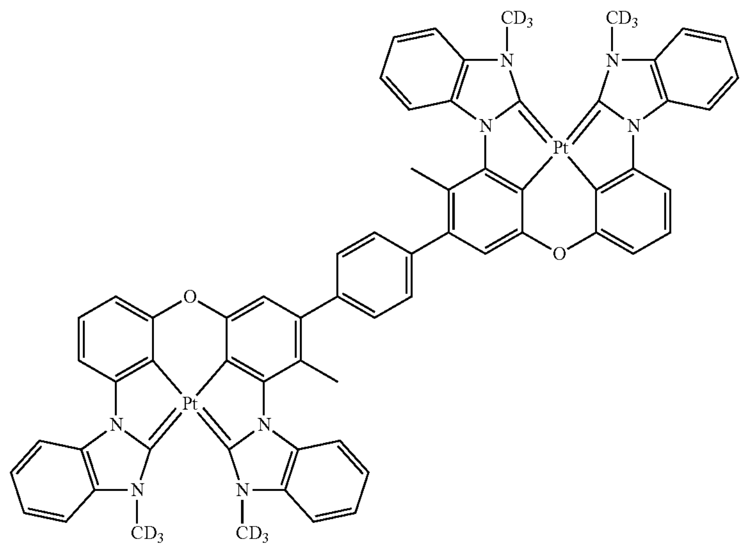
BD25
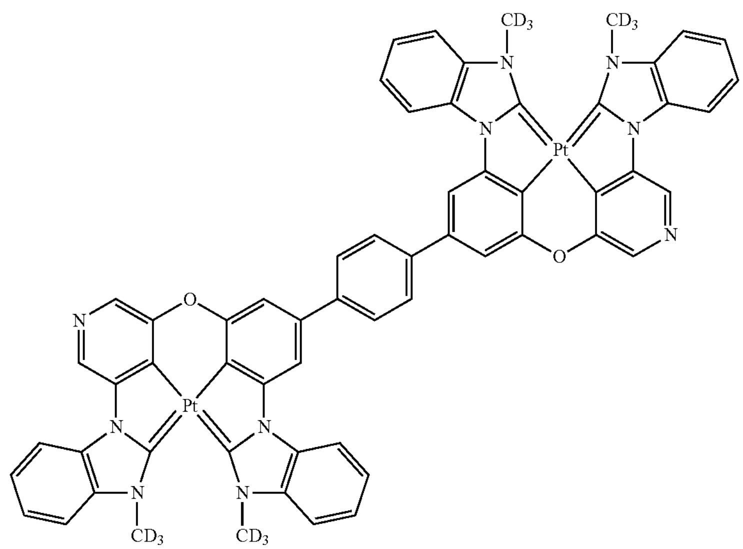
BD26
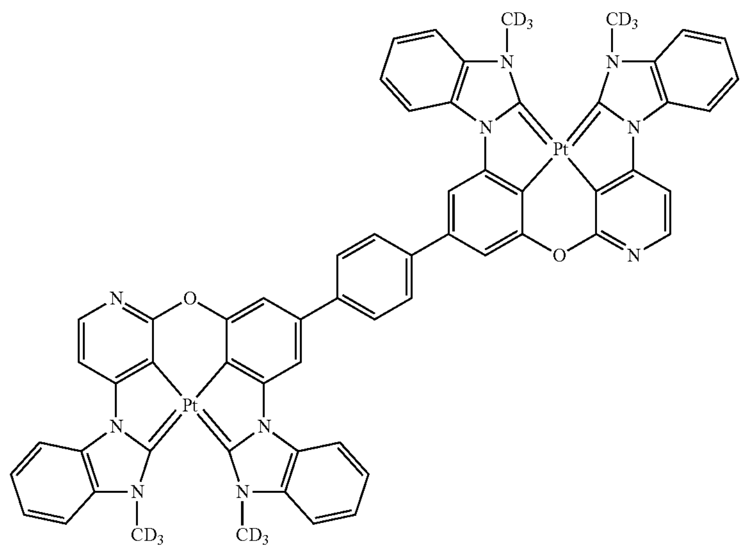

-continued
BD27
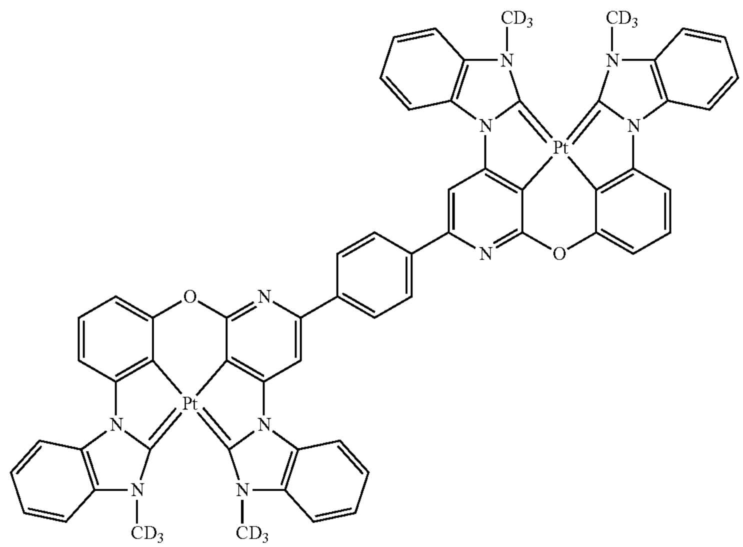
BD28
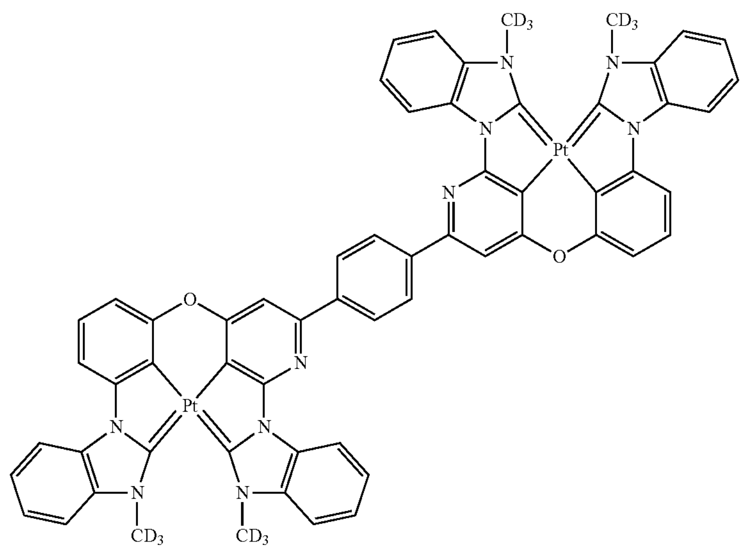
BD29
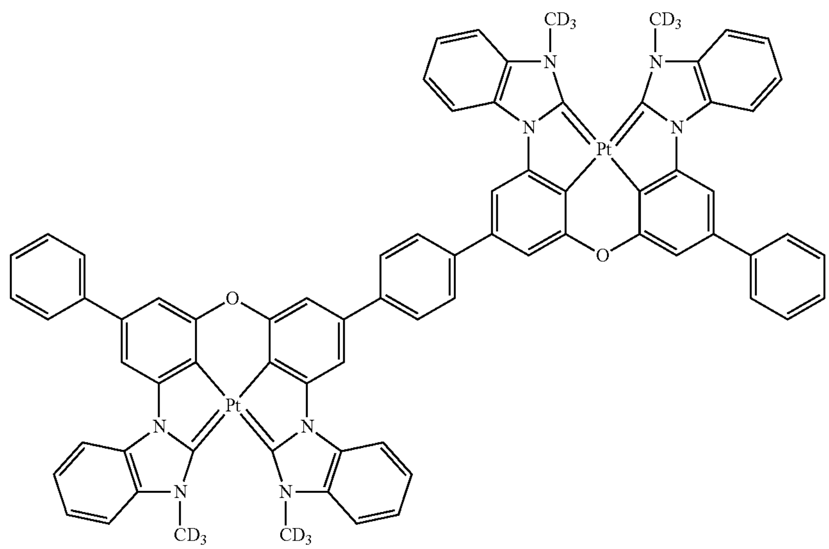

-continued
BD30
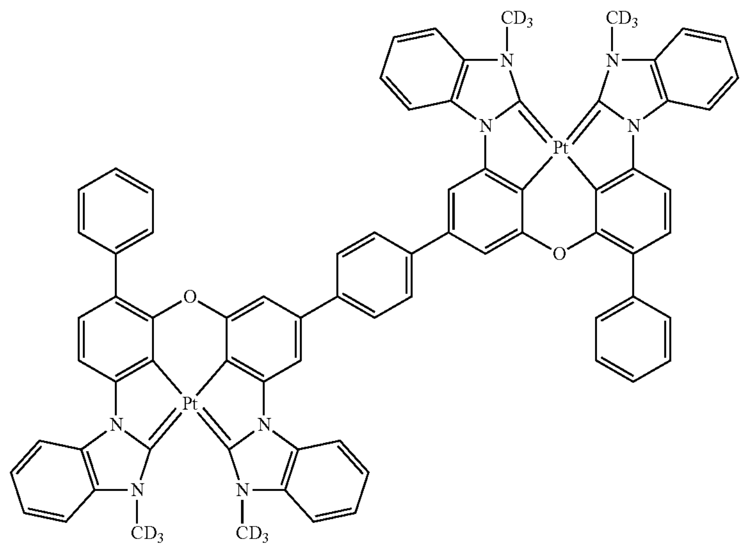
BD31
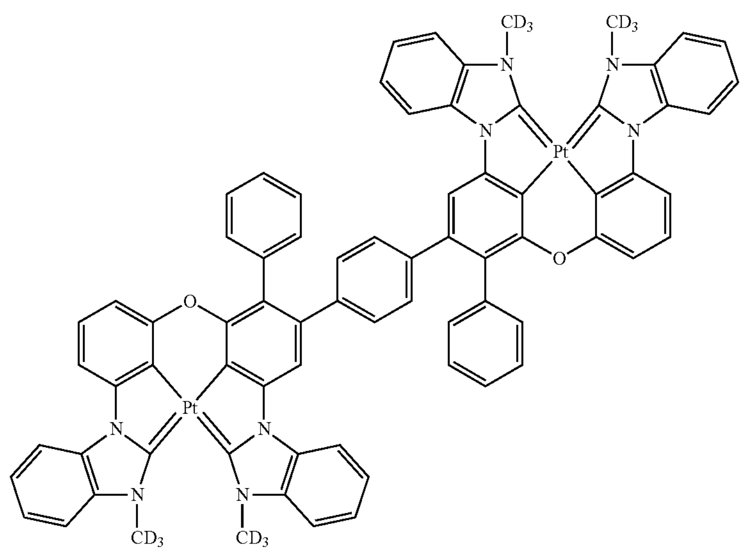
BD32
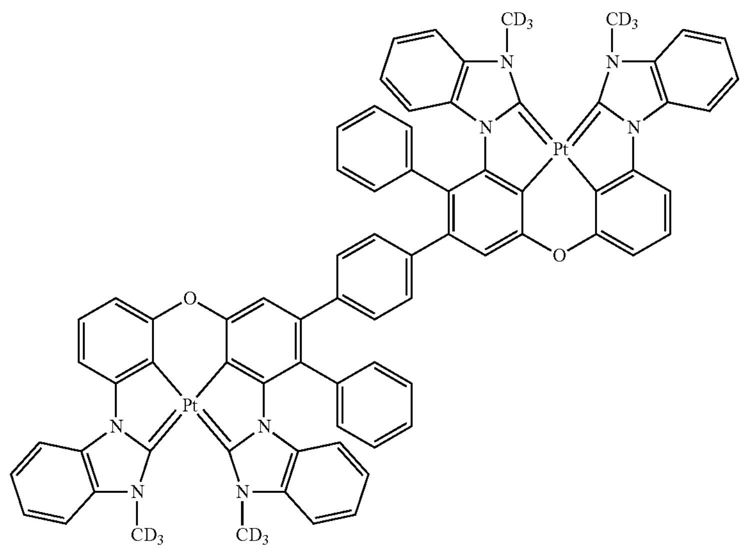

-continued
BD33
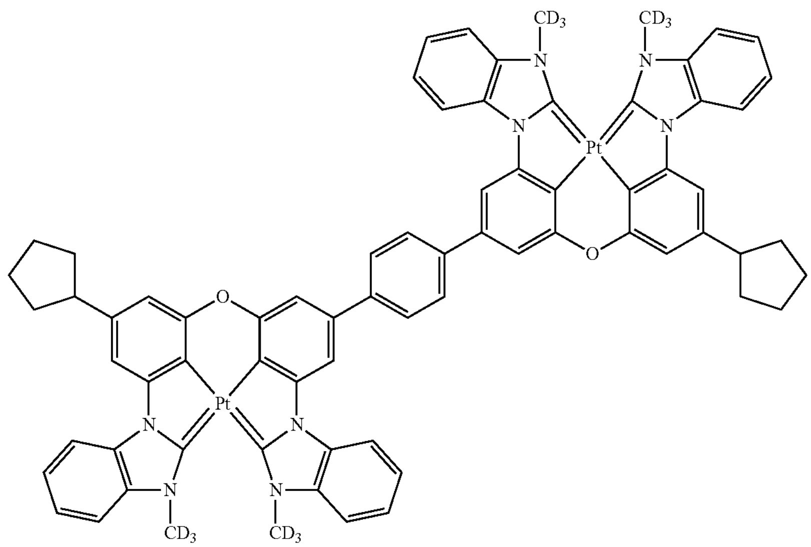
BD34
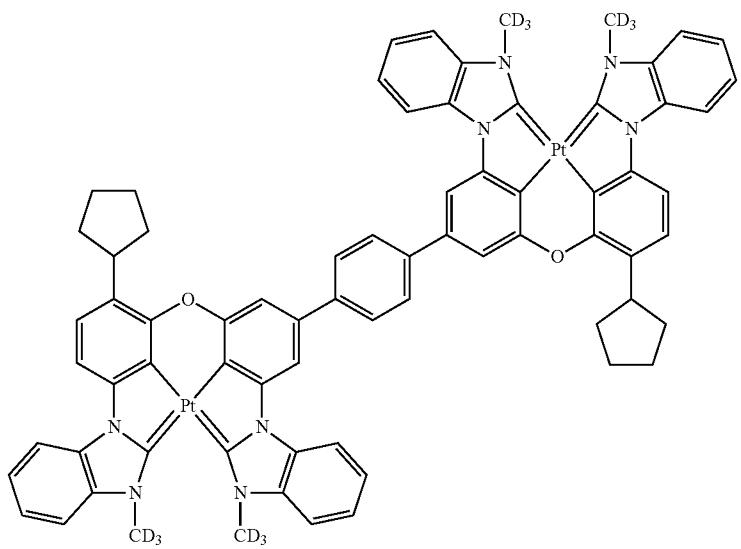
BD35
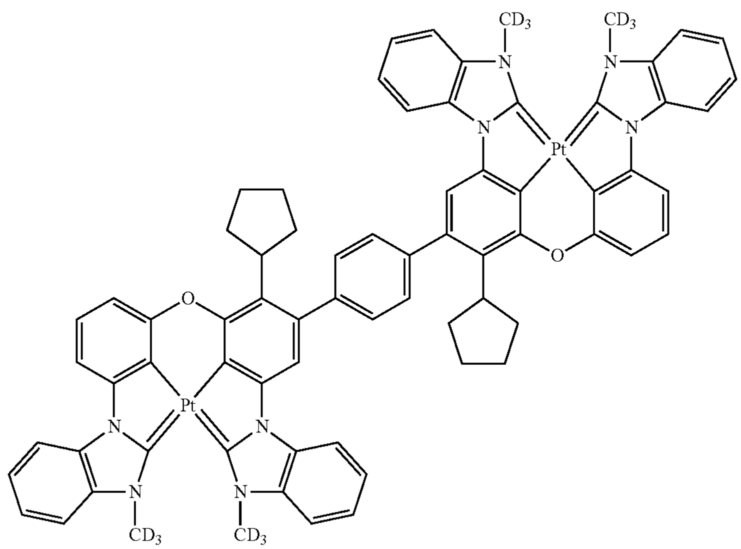

-continued
BD36
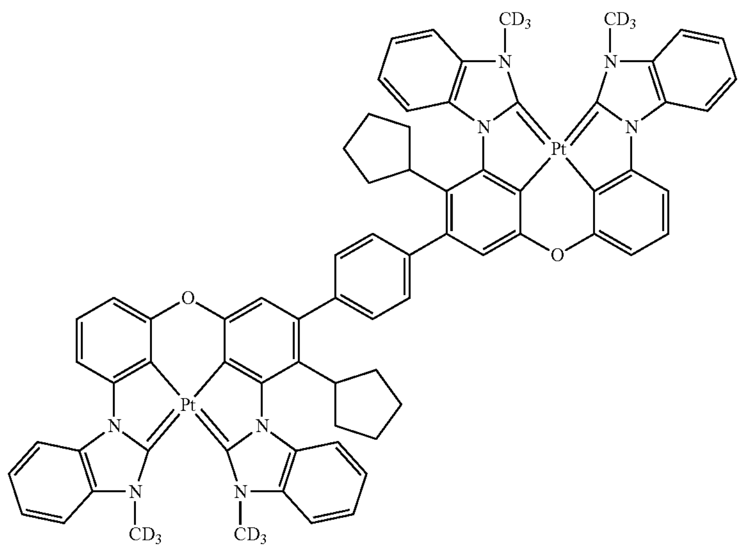
BD37
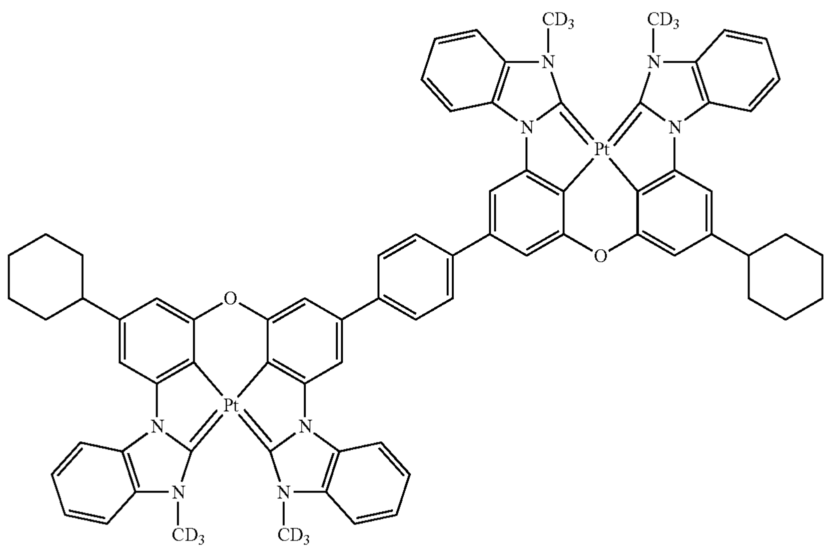
BD38
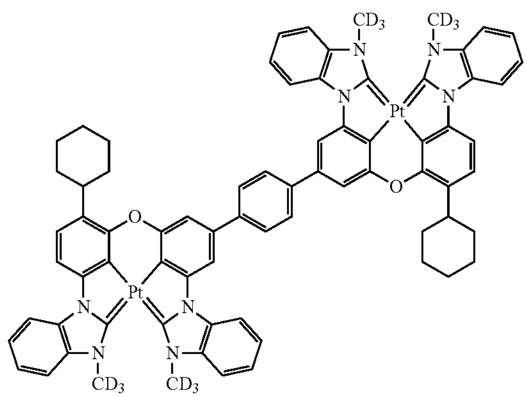
BD39
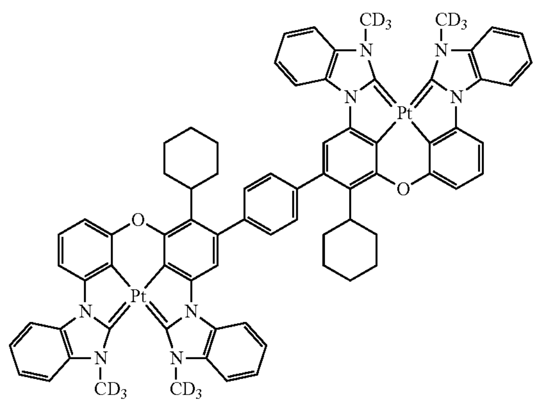

-continued
BD40
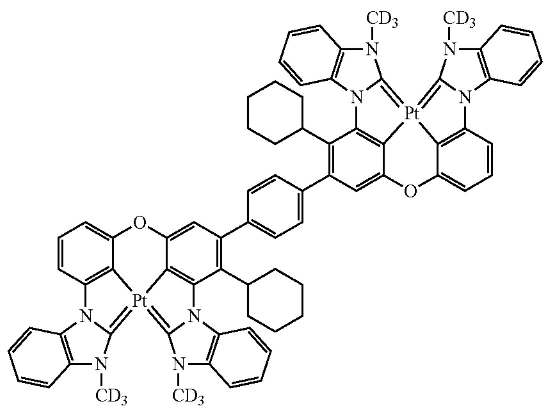
BD41
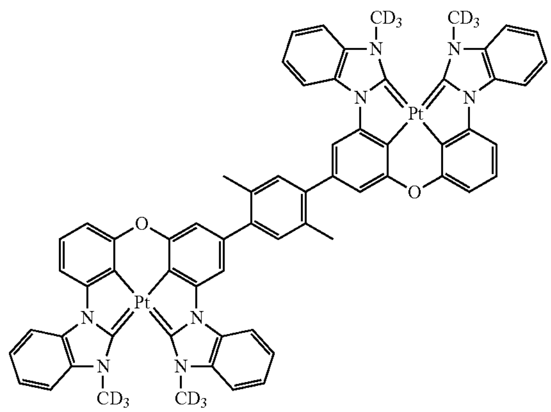
BD42
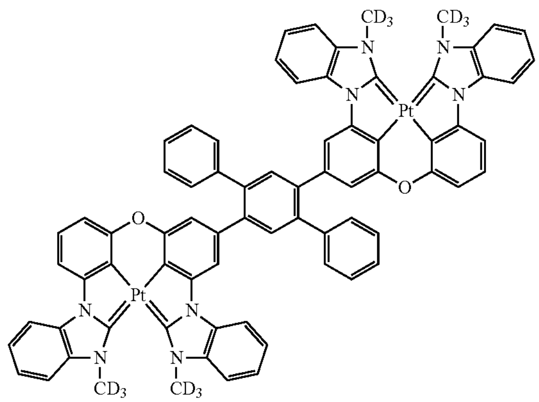
BD43
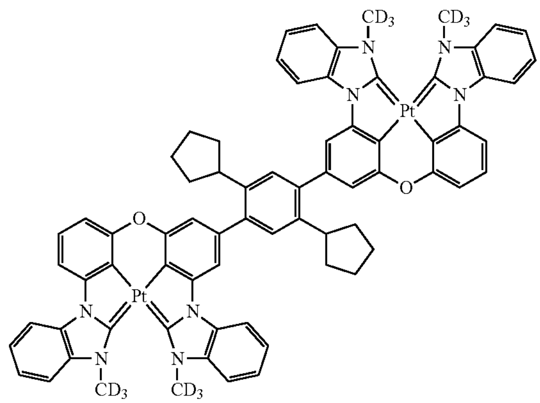
BD44
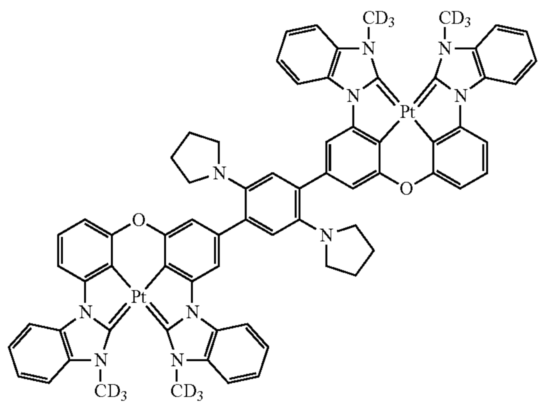
BD45
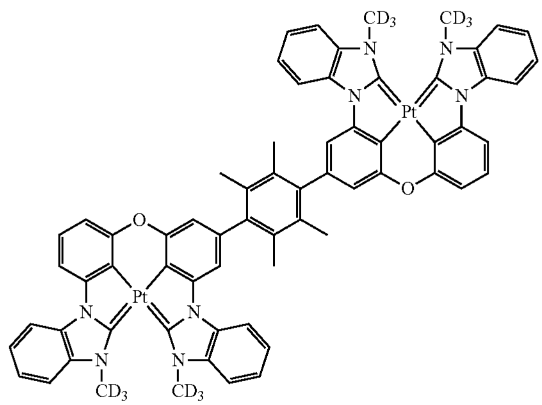

-continued
BD46
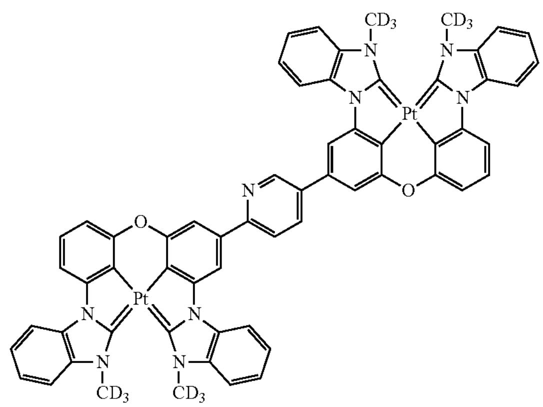
BD47
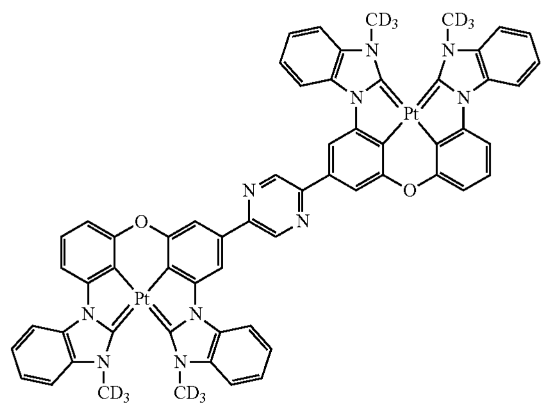
BD48
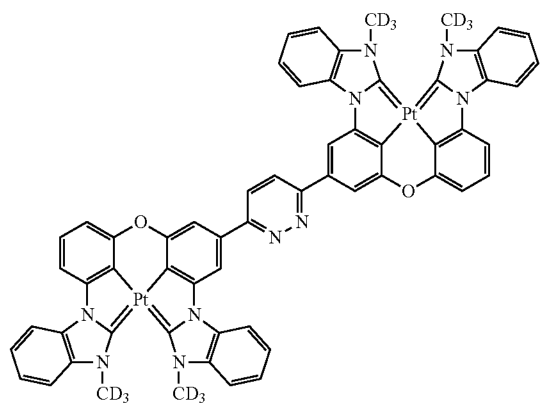
BD49
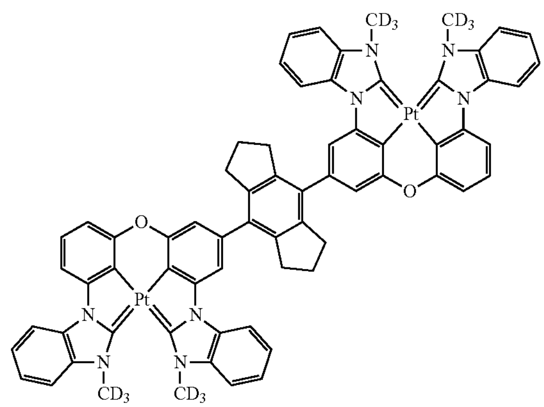
BD50
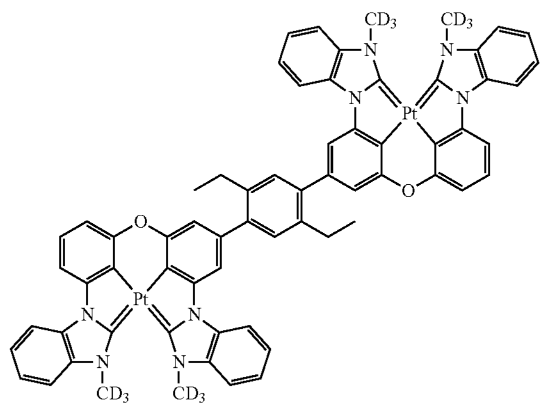
BD51
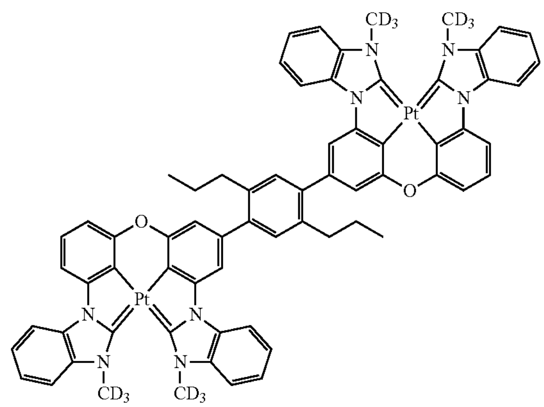

-continued
BD52
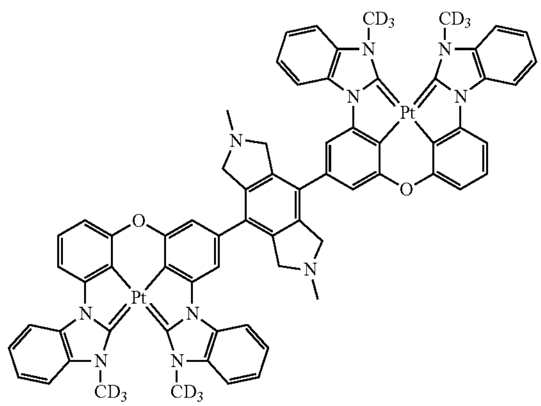
BD53
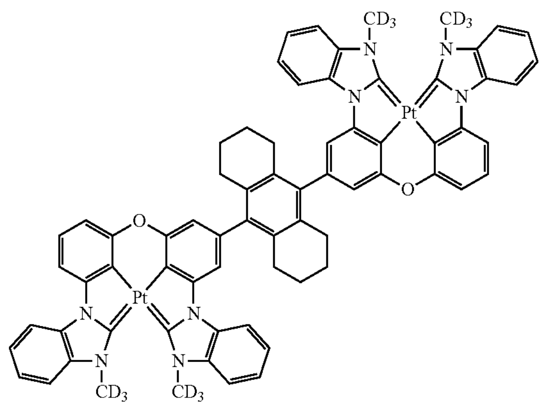
BD54
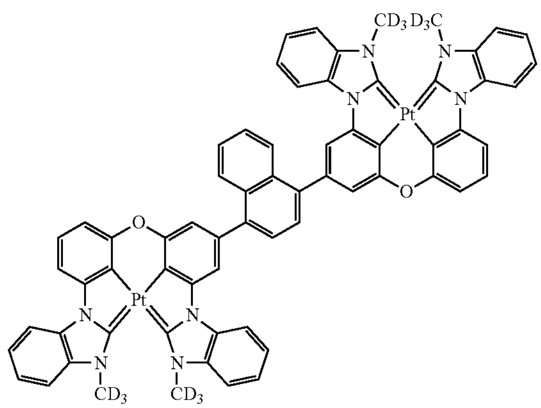
BD55
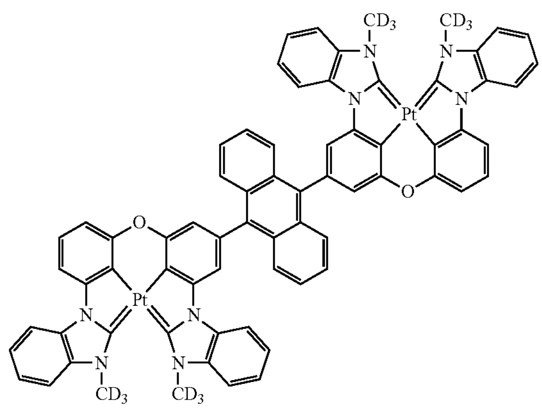
BD56
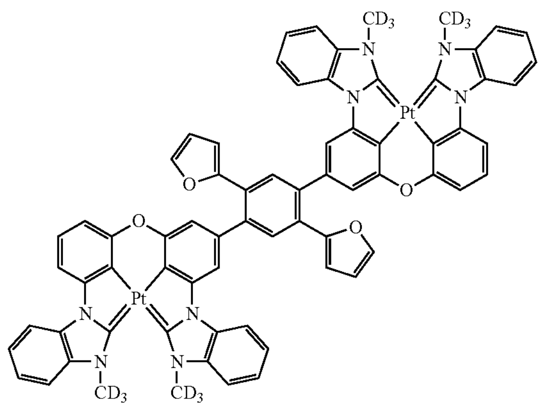
BD57
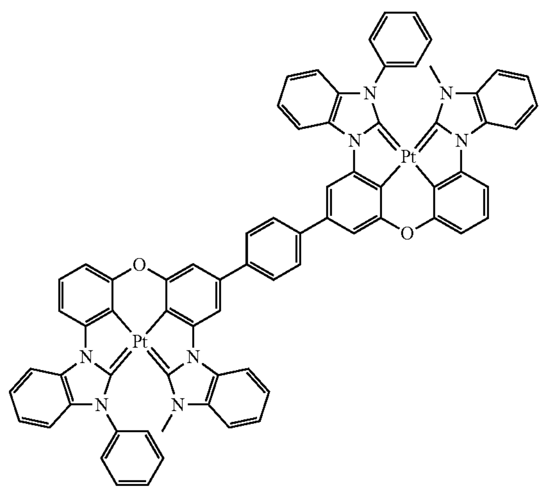

-continued
BD58
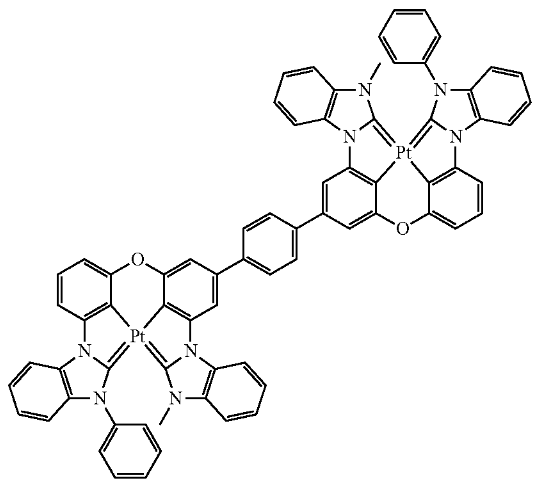
BD59
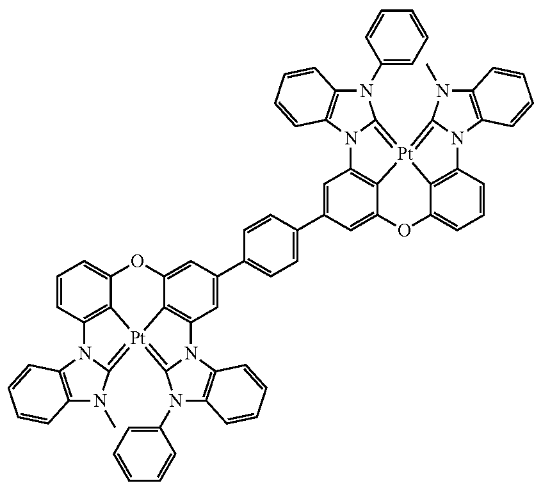
BD60
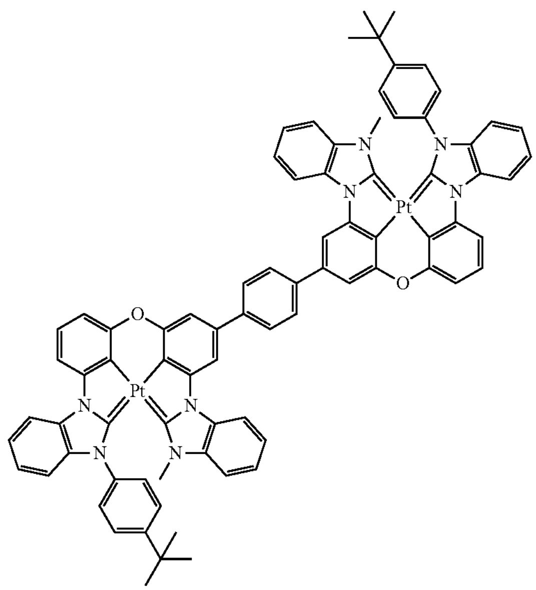
BD61
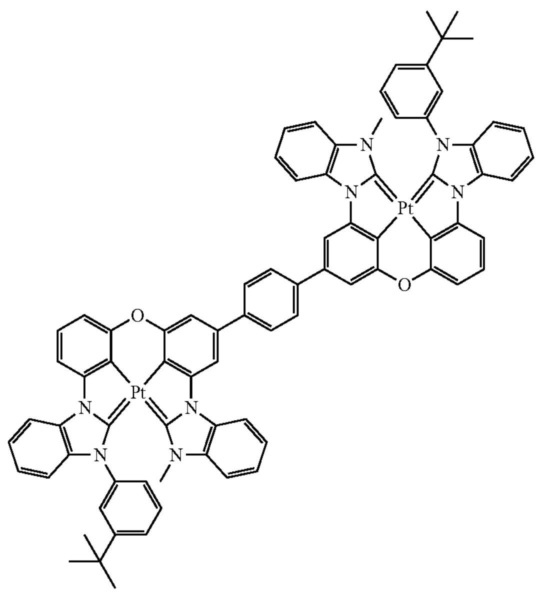
BD62
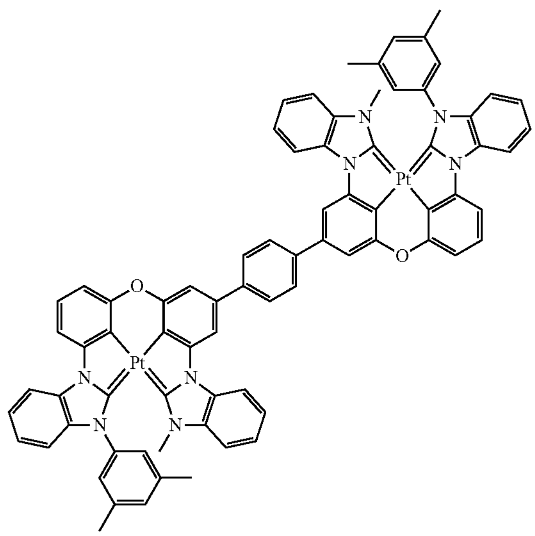
BD63
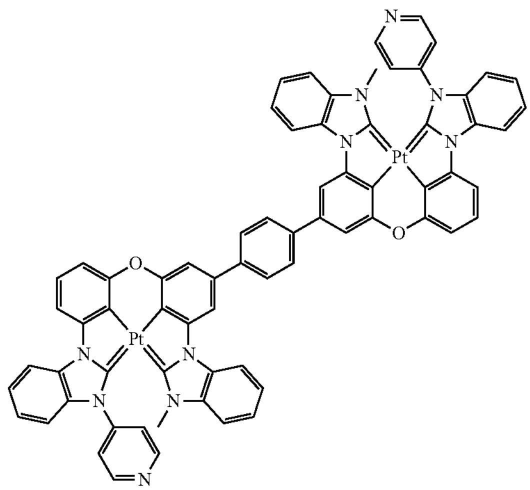

-continued
BD64
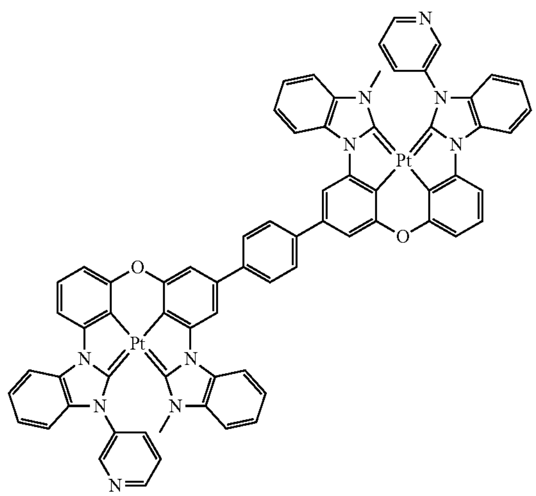
BD65
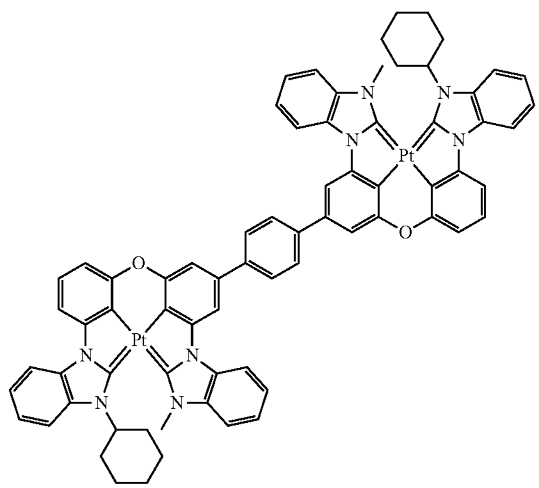
BD66
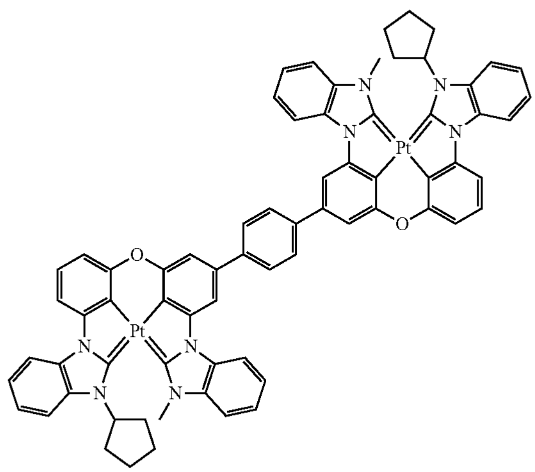
BD67
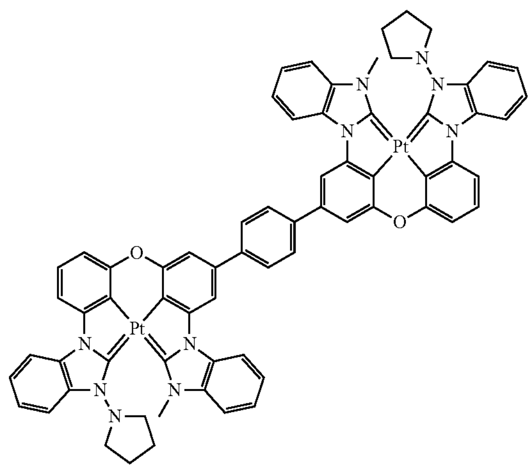
BD68
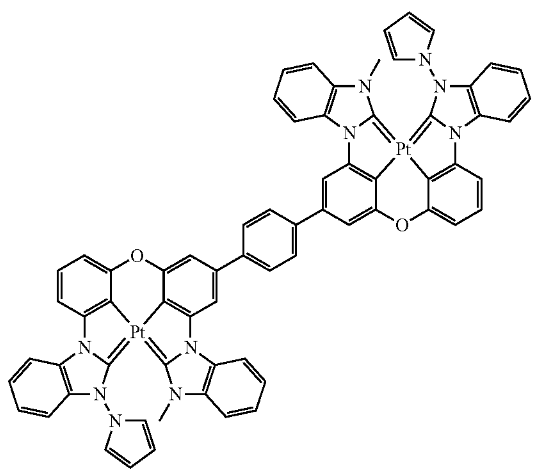
BD69
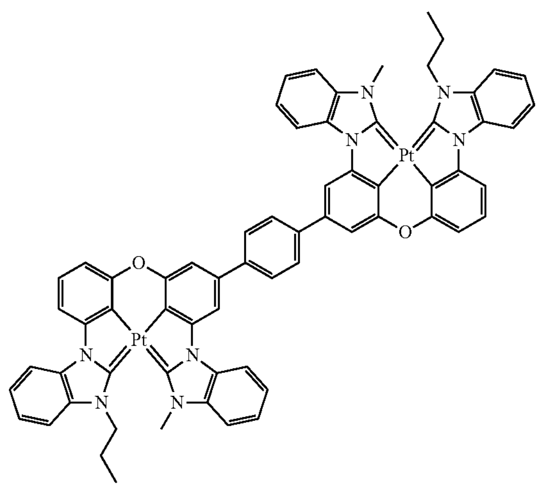

-continued
BD70
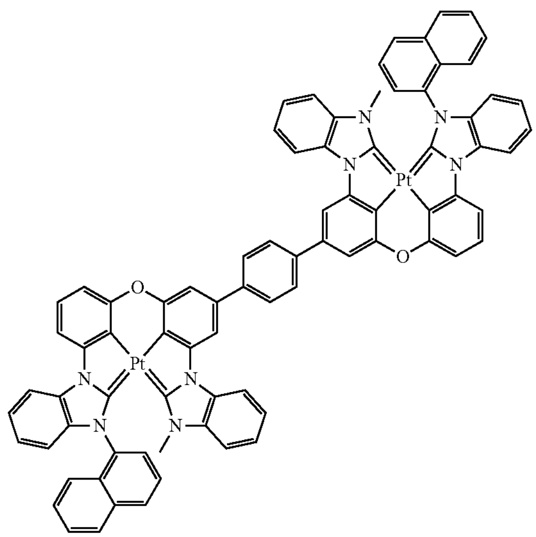
BD71
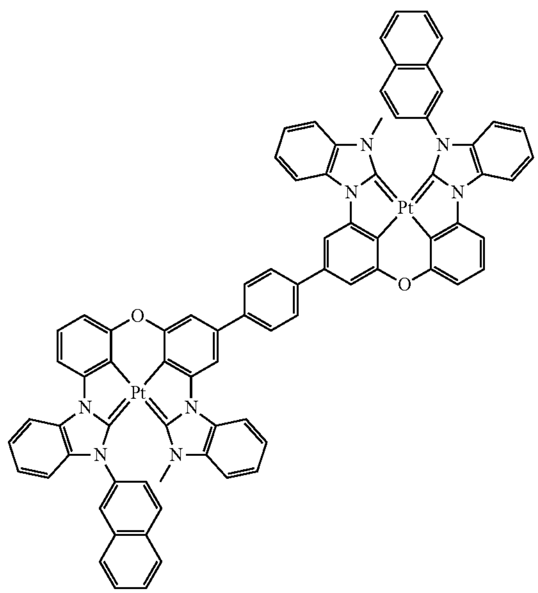
BD72
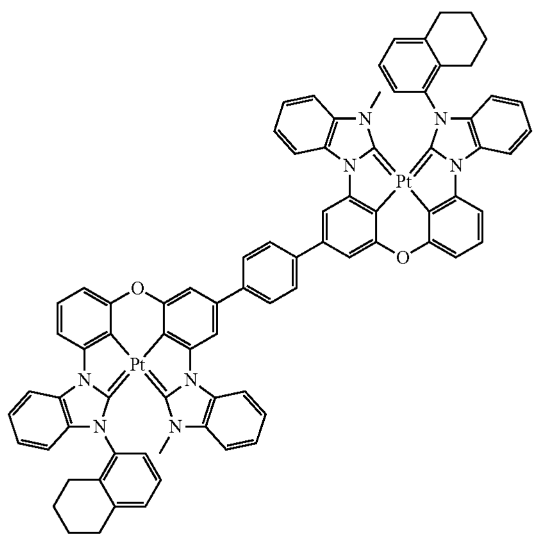
BD73
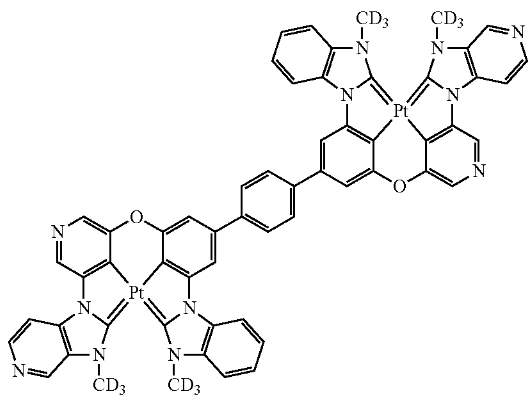
BD74
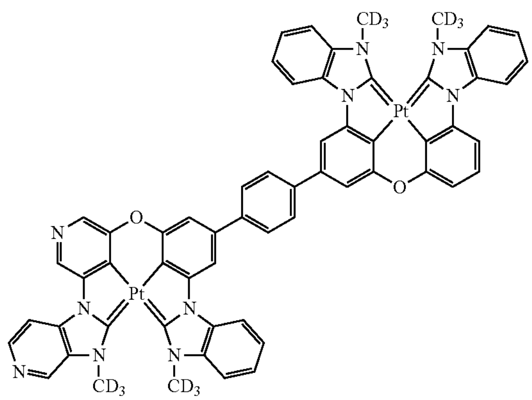
BD75
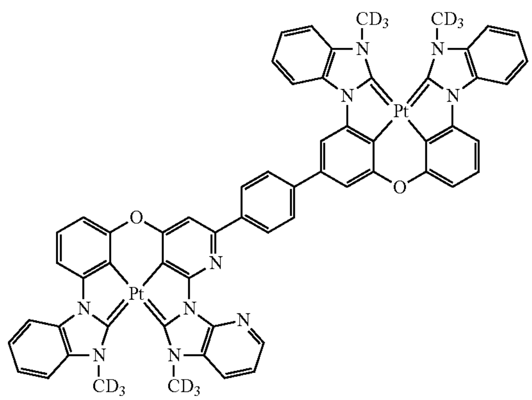

-continued
BD76
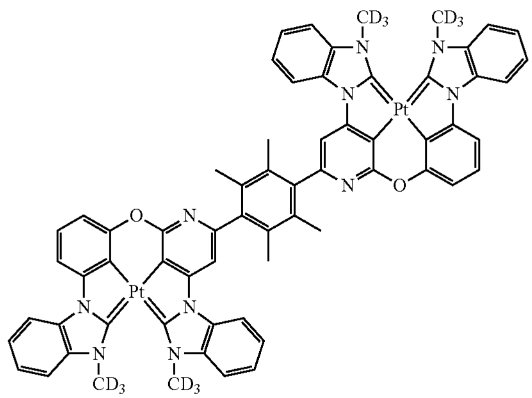
BD77
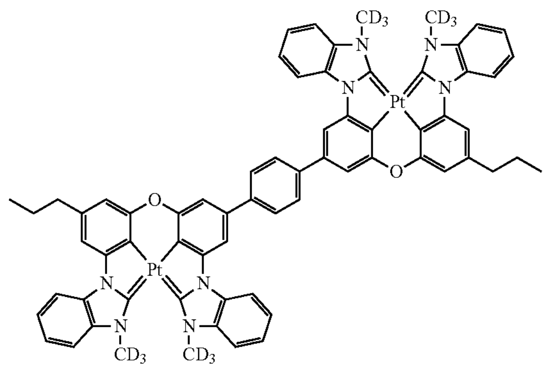
BD78
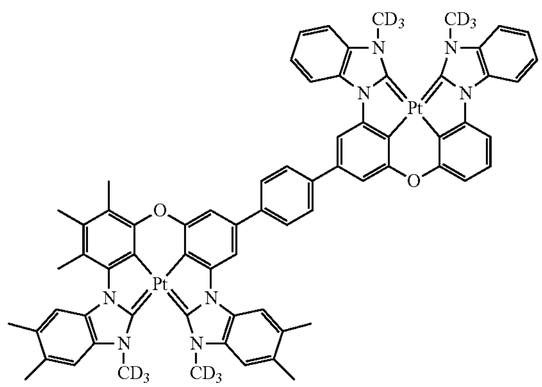
BD79
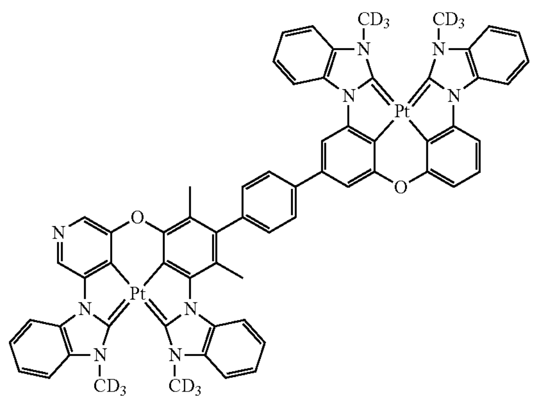
BD80
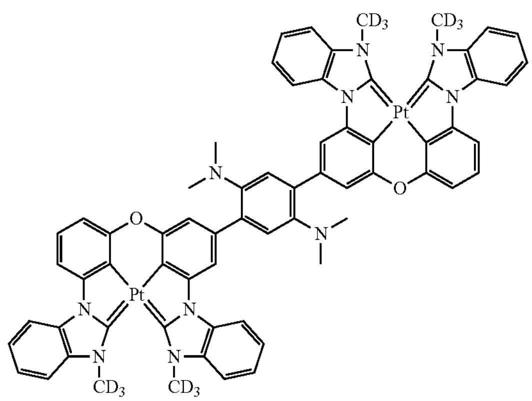
BD81
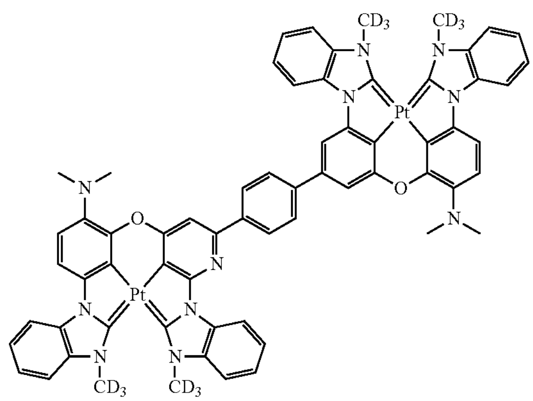

-continued
BD82
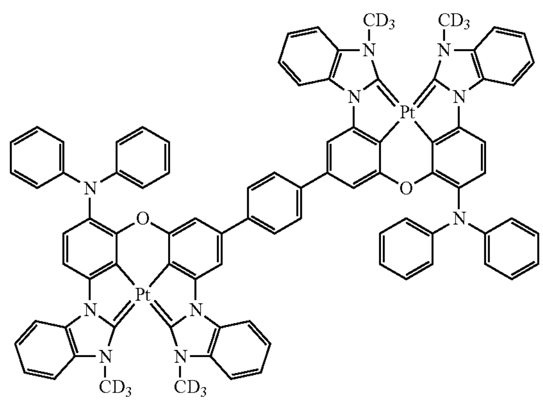
BD83
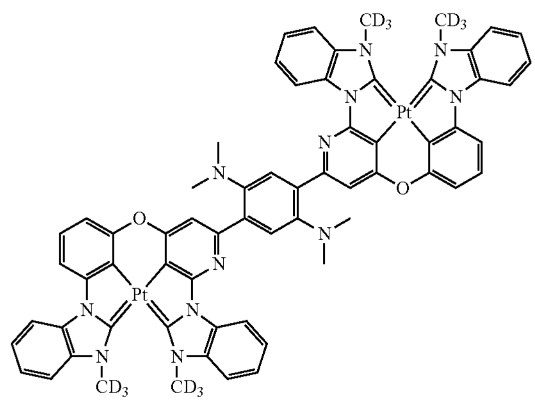
BD84
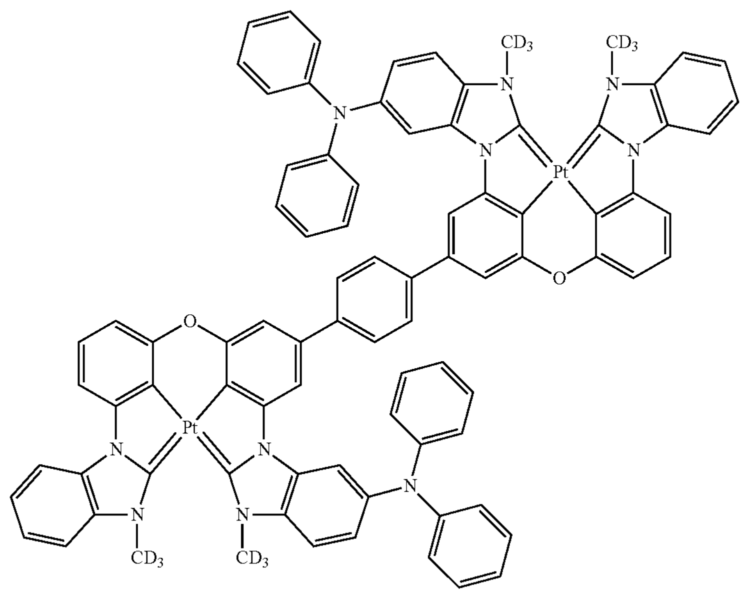
BD85
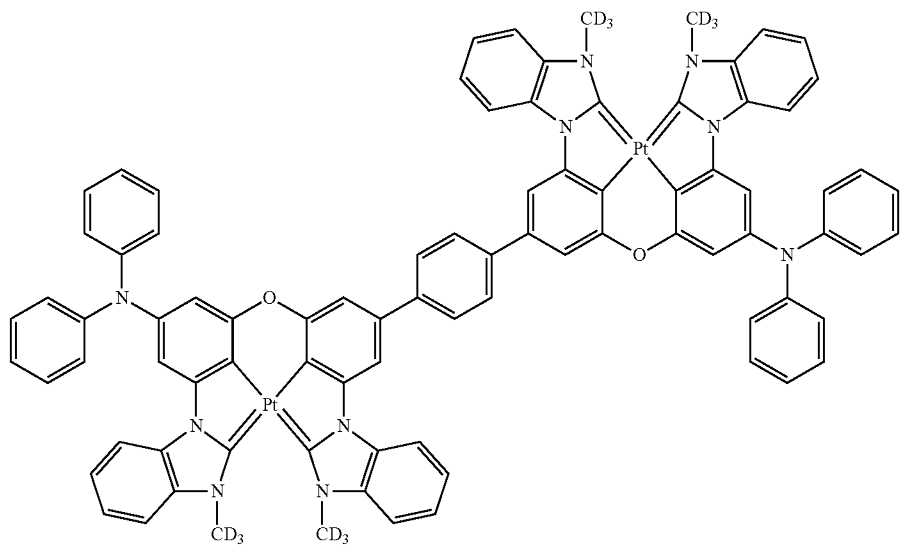

-continued
BD86
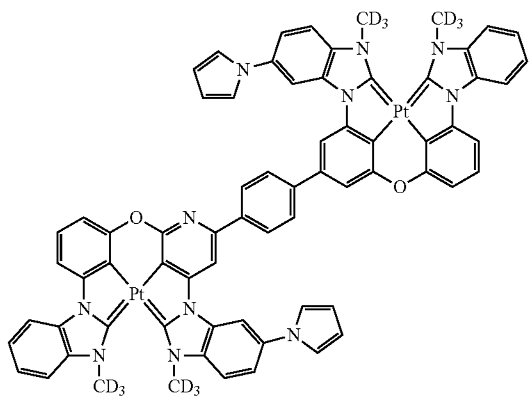
BD87
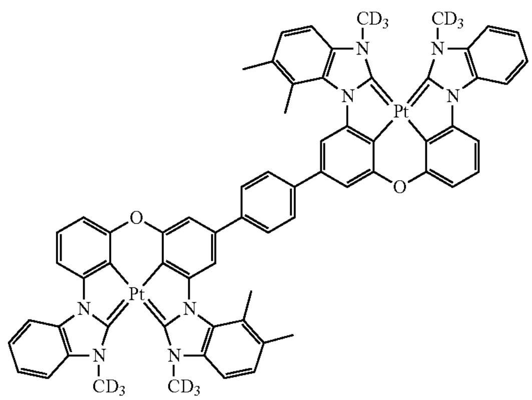
BD88
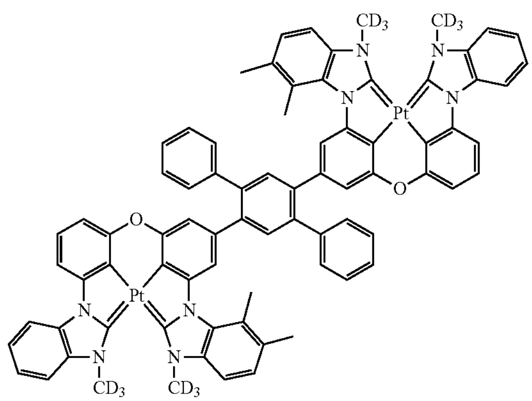
BD89
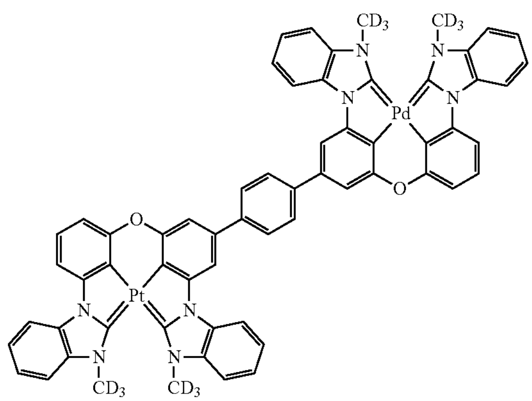
BD90
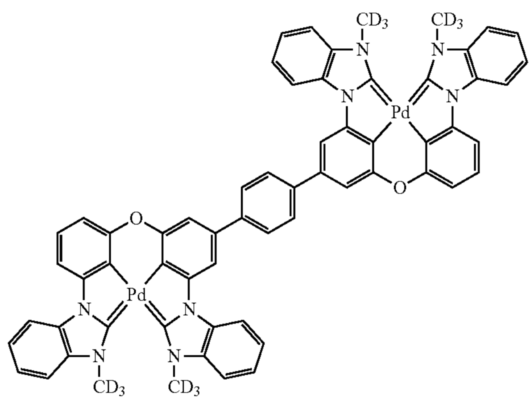
BD91
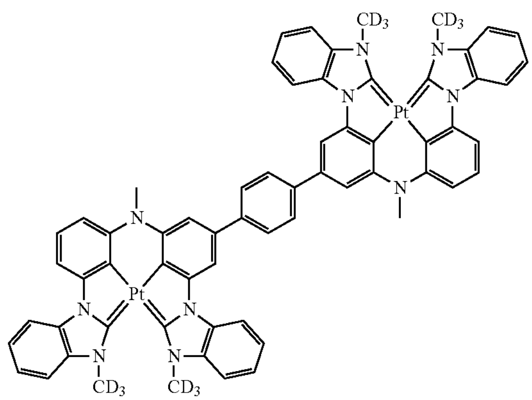

-continued
BD92
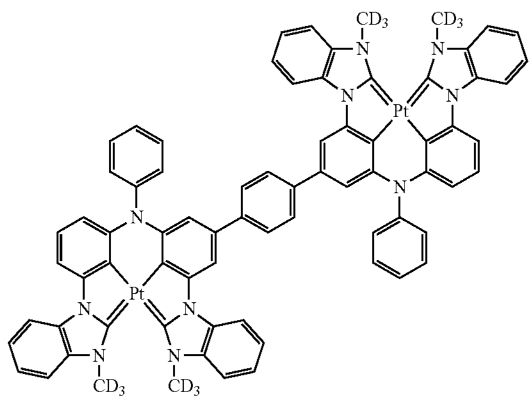
BD93
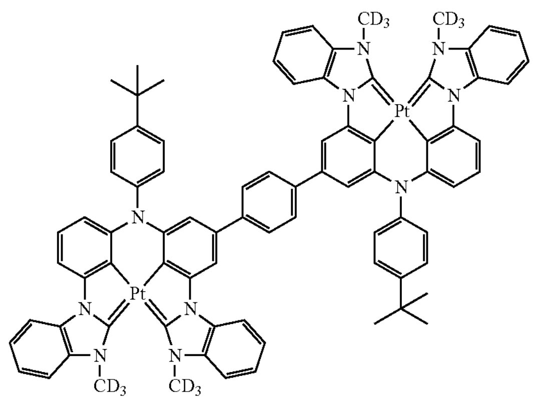
BD94
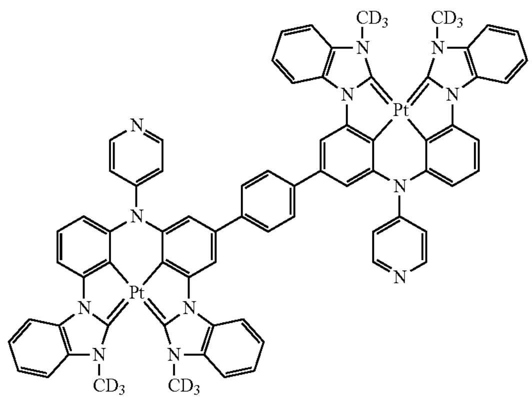
BD95
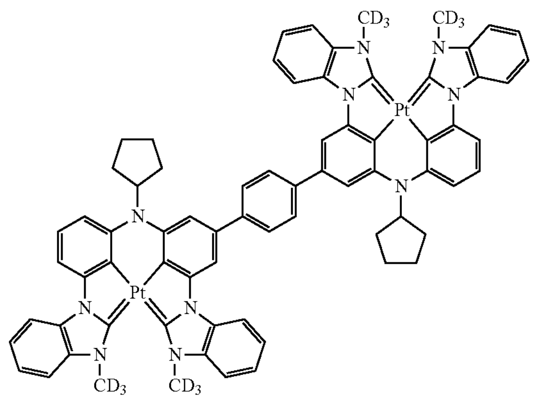
BD96
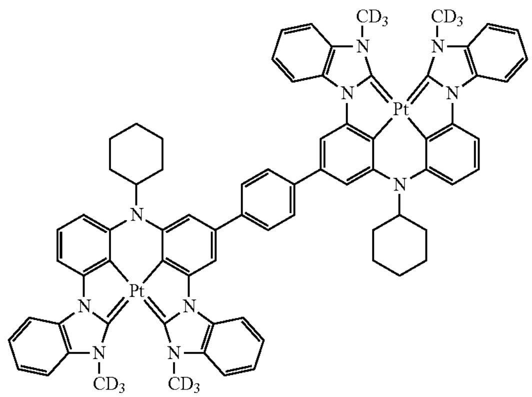
BD97
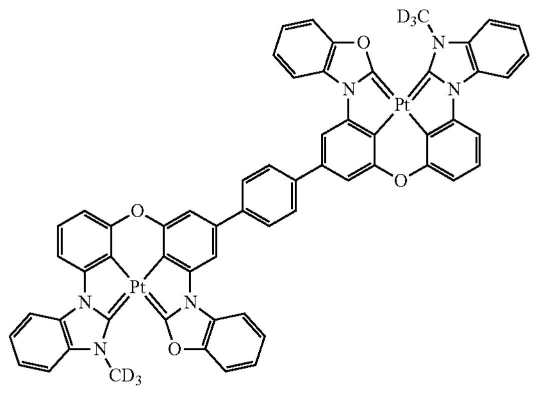
BD98
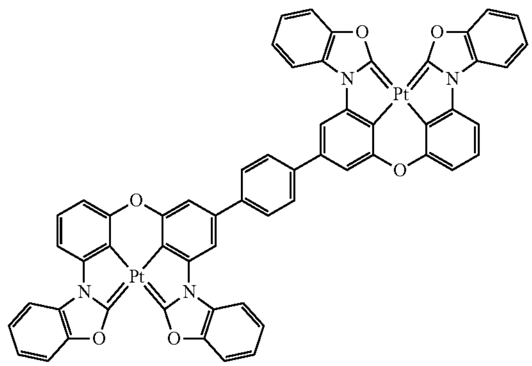
BD99
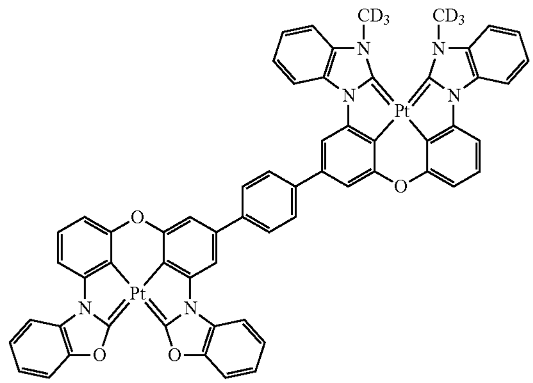

-continued
BD100
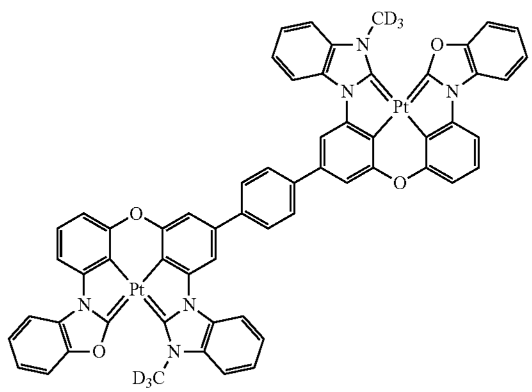
BD101
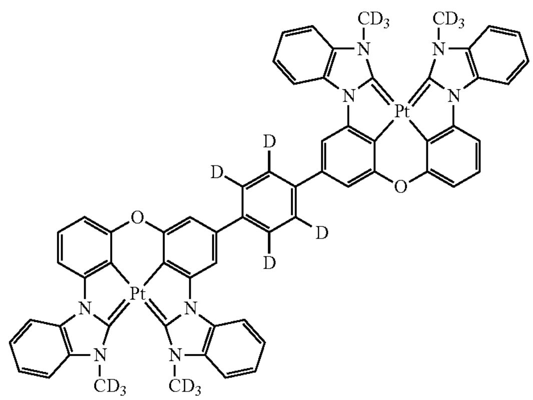
BD102
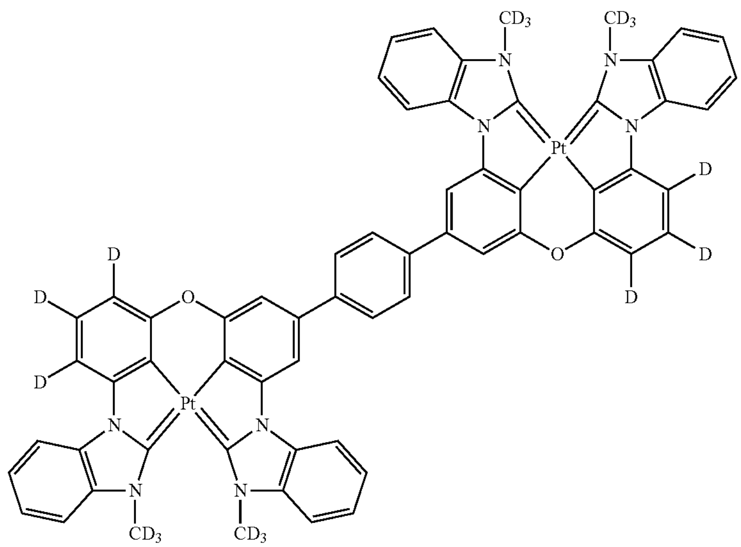
BD103
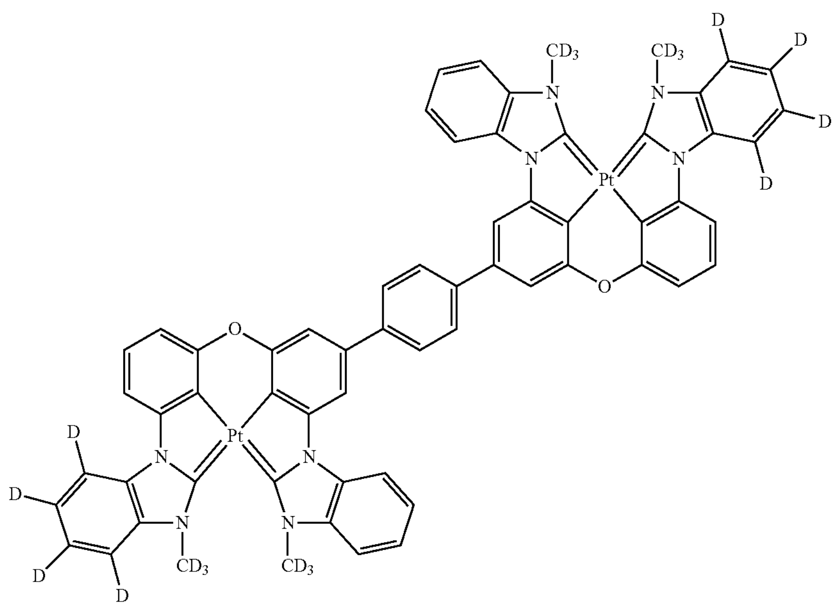

-continued

BD104

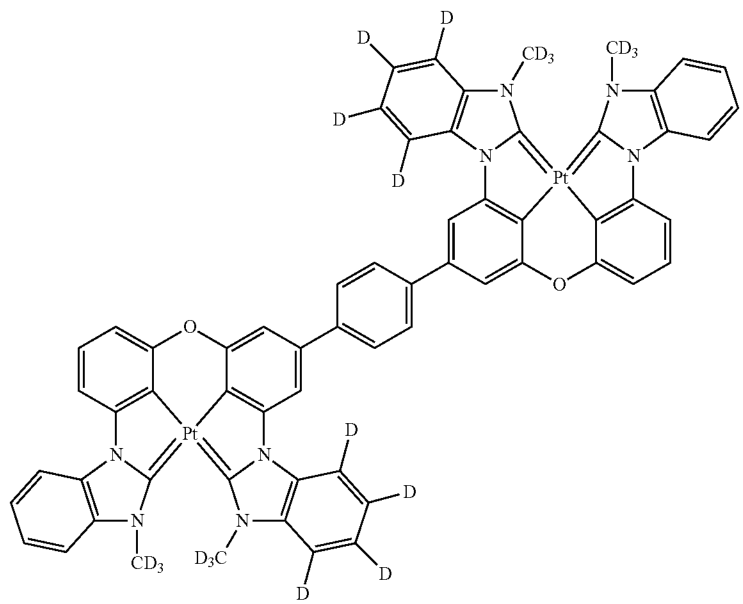

According to embodiments, a light-emitting device may include: a first electrode; a second electrode facing the first electrode; an interlayer between the first electrode and the second electrode and including an emission layer; and the organometallic compound according to embodiments.

In the light-emitting device according to an embodiment, the first electrode may be an anode, the second electrode may be a cathode, and the interlayer may further include:

a hole transport region between the first electrode and the emission layer and including a hole injection layer, a hole transport layer, an emission auxiliary layer, an electron blocking layer, or any combination thereof; and an electron transport region between the emission layer and the second electrode and including a hole blocking layer, an electron transport layer, an electron injection layer, or any combination thereof.

In the light-emitting device according to an embodiment, the interlayer may include the organometallic compound.

In the light-emitting device according to an embodiment, the emission layer may include the organometallic compound.

In the light-emitting device according to an embodiment, the emission layer may include a host and a dopant, and the dopant may include the organometallic compound.

The light-emitting device according to an embodiment may include:

a first capping layer outside the first electrode and including the organometallic compound represented by Formula 1; or a second capping layer outside the second electrode and including the organometallic compound represented by Formula 1; or the first capping layer and the second capping layer.

In the light-emitting device according to an embodiment, the hole transport region may include a p-dopant having a lowest unoccupied molecular orbital (LUMO) energy level equal to or less than about −3.5 eV.

In the light-emitting device according to an embodiment, the emission layer may emit blue light.

In the light-emitting device according to an embodiment, the electron transport region may include an electron transport layer and an electron injection layer, and at least one of the electron transport layer and the electron injection layer may each independently include an alkali metal, an alkaline earth metal, a rare earth metal, an alkali metal compound, an alkaline earth metal compound, a rare earth metal compound, an alkali metal complex, an alkaline earth metal complex, a rare earth metal complex, or any combination thereof.

Embodiments provide an electronic apparatus which may include the light-emitting device according to embodiments.

The electronic apparatus according to an embodiment may further include:

a thin-film transistor; and a color filter, a color conversion layer, a touch screen layer, a polarizing layer, or any combination thereof, wherein the thin-film transistor may include a source electrode and a drain electrode, and the first electrode of the light-emitting device may be electrically connected to the source electrode or the drain electrode.

Embodiments provide electronic device which may include the light-emitting device according to embodiments.

The electronic device according to an embodiment may be:

a flat panel display, a curved display, a computer monitor, a medical monitor, a television, a billboard, an indoor light, an outdoor light, a signaling light, a head-up display, a fully transparent display, a partially transparent display, a flexible display, a rollable display, a foldable display, a stretchable display, a laser printer, a telephone, a portable phone, a tablet, a phablet, a personal digital assistant (PDA), a wearable device, a laptop computer, a digital camera, a camcorder, a viewfinder, a micro display, a three-dimensional (3D) display, a virtual reality display, an augmented reality display, a vehicle, a video wall with multiple displays tiled together, a theater screen, a stadium screen, a phototherapy device, or a signboard.

The organometallic compound represented by Formula 1 includes two metal atoms, a first ligand moiety, and a second ligand moiety. The first ligand moiety includes rings $A_1$, $A_2$, $B_1$, and $B_2$, and the second ligand moiety includes rings $A_3$, $A_4$, $B_3$, and $B_4$.

Because the first ligand moiety and the second ligand moiety, which are each coordinated to a metal atom, are linked together via a single bond or via a linking group, the organometallic compounds represented by Formula 1 have a more rigid structure. As a result, the molecular stability of the organometallic compound represented by Formula 1 is excellent.

In an embodiment, the physicochemical properties of the first ligand moiety and the second ligand moiety of the organometallic compound represented by Formula 1 may be the same (or substantially similar), and the first ligand moiety and the second ligand moiety may have a symmetrical structure. For example, the following core structure may be included in an $S_2$ symmetry group. As a result, luminance and efficiency of light emitted by the organometallic compound may be further improved.

[Core structure]

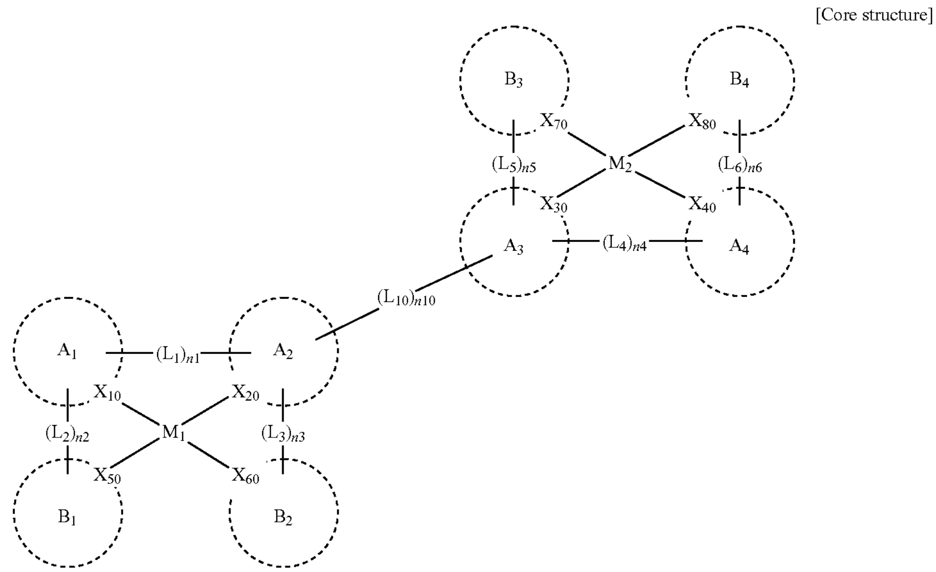

In another embodiment, the first ligand moiety and the second ligand moiety may have different structures, and the physiochemical properties of the first ligand moiety and the second ligand moiety may be different from each other. As a result, energy levels (for example, highest occupied molecular orbital (HOMO), LUMO, $T_1$, and $S_1$) of the organometallic compound according to an embodiment may be adjusted, and the color coordinates of light emitted by the organometallic compound may be adjusted.

An angle between the first ligand moiety and the second ligand moiety indicates a structure that is tilted with respect to the metal atom. The interaction between the organometallic compound molecules or the interaction between the organometallic compound molecules and other compounds are limited, and the formation of excimers is also inhibited. As a result, a light-emitting device including the organometallic compound according to an embodiment may have low driving voltage, high luminance, high efficiency, and long lifespan.

The organometallic compound according to an embodiment may emit blue light. For example, the organometallic compound may emit blue light (bottom emission $CIE_{x,y}$ color coordinates 0.05 to 0.06) having a maximum emission wavelength in a range of about 430 nm to about 470 nm. Accordingly, the organometallic compound represented by Formula 1 may be useful for the manufacture of a light-emitting device that emits blue light.

Synthesis methods of the organometallic compound represented by Formula 1 may be recognizable by those of ordinary skill in the art with reference to the Synthesis Examples and/or the Examples.

At least one organometallic compound represented by Formula 1 may be utilized in a light-emitting device (for example, an organic light-emitting device). Accordingly, embodiments provide a light-emitting device which may include a first electrode, a second electrode facing the first electrode, an interlayer between the first electrode and the second electrode and including an emission layer, and the organometallic compound represented by Formula 1.

The wording "(interlayer and/or capping layer) includes an organometallic compound" as used herein may mean that the (interlayer and/or capping layer) may include one kind of organometallic compound represented by Formula 1 or two or more different kinds of organometallic compounds, each independently represented by Formula 1.

In an embodiment, the interlayer and/or the capping layer may include Compound 1 only as the organometallic compound. In this regard, Compound 1 may be included in the emission layer of the light-emitting device. In another embodiment, the interlayer may include, as the organometallic compound, Compound 1 and Compound 2. In this regard, Compound 1 and Compound 2 may exist in an identical layer (for example, Compound 1 and Compound 2 may all exist in the emission layer), or may exist in different layers (for example, Compound 1 may exist in the emission layer and Compound 2 may exist in the electron transport region).

The term "interlayer" as used herein refers to a single layer and/or multiple layers arranged between the first electrode and the second electrode of the light-emitting device.

According to embodiments, provided is an electronic apparatus which may include the light-emitting device. The electronic apparatus may further include a thin-film transistor. For example, the electronic apparatus may further include a thin-film transistor including a source electrode and a drain electrode, and the first electrode of the light-emitting device may be electrically connected to the source electrode or the drain electrode. The electronic apparatus may further include a color filter, a color-conversion layer, a touch screen layer, a polarizing layer, or any combination thereof. Further details on the electronic apparatus are as described herein.

[Description of FIG. 1]

FIG. 1 is a schematic cross-sectional view of a light-emitting device 10 according to an embodiment. The light-emitting device 10 includes a first electrode 110, an interlayer 130, and a second electrode 150.

Hereinafter, a structure of the light-emitting device 10 according to an embodiment and a method of manufacturing the light-emitting device 10 will be described with reference to FIG. 1.

[First Electrode 110]

In FIG. 1, a substrate may be further included under the first electrode 110 or on the second electrode 150. The substrate may be a glass substrate or a plastic substrate. In an embodiment, the substrate may be a flexible substrate, and may include plastics with excellent heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, applying a material for forming the first electrode 110 onto the substrate by using a deposition or sputtering method. When the first electrode 110 is an anode, a material for forming the first electrode 110 may be a high work function material to facilitate injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In an embodiment, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a structure consisting of a single layer, or a structure including multiple layers. For example, the first electrode 110 may have a three-layered structure of ITO/Ag/ITO.

[Interlayer 130]

The interlayer 130 is located on the first electrode 110. The interlayer 130 may include an emission layer.

The interlayer 130 may further include a hole transport region located between the first electrode 110 and the emission layer and an electron transport region located between the emission layer and the second electrode 150.

The interlayer 130 may include a metal-containing compound, such as the organometallic compound represented by Formula 1, in addition to various organic materials, and may further include an inorganic material, such as quantum dots.

In an embodiment, the interlayer 130 may include two or more emitting units stacked between the first electrode 110 and the second electrode 150, and at least one charge generation layer located between the two emitting units. When the interlayer 130 includes the two or more emitting units and the at least one charge generation layer as described above, the light-emitting device 10 may be a tandem light-emitting device.

[Hole Transport Region in Interlayer 130]

The hole transport region may have a structure consisting of a layer consisting of a single material, a structure consisting of a layer including different materials, or a structure including multiple layers including different materials.

The hole transport region may include a hole injection layer, a hole transport layer, an emission auxiliary layer, an electron blocking layer, or any combination thereof.

In embodiments, the hole transport region may have a multilayer structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein the layers of each structure may be stacked from the first electrode 110 its respective stated order, but the structure of the hole transport region is not limited thereto.

The hole transport region may include a compound represented by Formula 201, a compound represented by Formula 202, or any combination thereof:

Formula 201

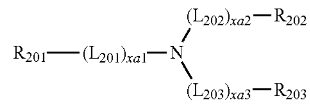

Formula 202

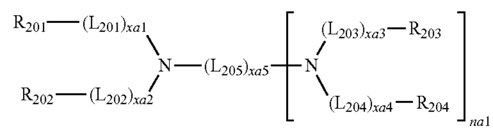

In Formulae 201 and 202, $L_{201}$ to $L_{204}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $L_{205}$ may be *—O—*', *—S—*', *—N($Q_{201}$)-*', a $C_1$-$C_{20}$ alkylene group that is unsubstituted or substituted with at least one $R_{10a}$, a $C_2$-$C_{20}$ alkenylene group that is unsubstituted or substituted with at least one $R_{10a}$, a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, $R_{201}$ and $R_{202}$ may optionally be linked to each other, via a single bond, a $C_1$-$C_5$ alkylene group that is unsubstituted or substituted with at least one $R_{10a}$, or a $C_2$-$C_5$ alkenylene group that is unsubstituted or substituted with at least one $R_{10a}$, to form a $C_8$-$C_{60}$ polycyclic group (for example, a carbazole group or the like)

unsubstituted or substituted with at least one $R_{10a}$ (for example, Compound HT16), $R_{203}$ and $R_{204}$ may optionally be linked to each other via a single bond, a $C_1$-$C_5$ alkylene group that is unsubstituted or substituted with at least one $R_{10a}$, or a $C_2$-$C_5$ alkenylene group that is unsubstituted or substituted with at least one $R_{10a}$, to form a $C_8$-$C_{60}$ polycyclic group that is unsubstituted or substituted with at least one $R_{10a}$, and na1 may be an integer from 1 to 4.

In an embodiment, Formulae 201 and 202 may each independently include at least one of groups represented by Formulae CY201 to CY217:

CY201

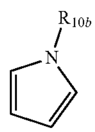

CY202

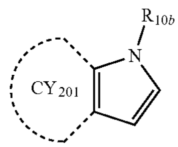

CY203

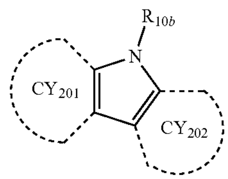

CY204

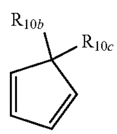

CY205

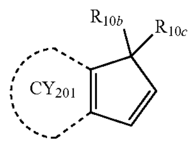

CY206

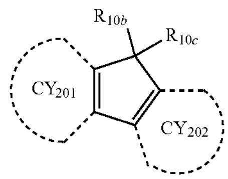

CY207

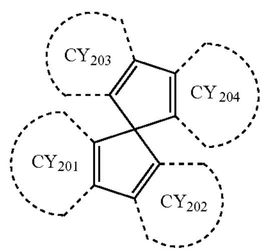

-continued

CY208

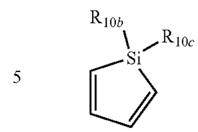

CY209

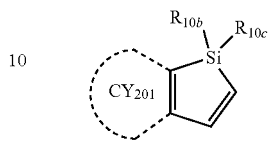

CY210

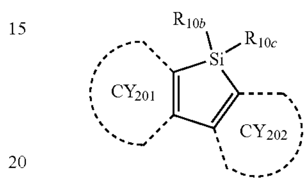

CY211

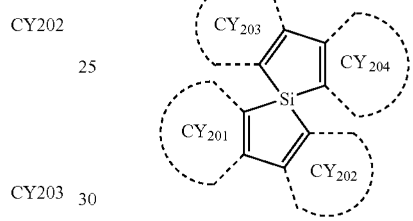

CY212

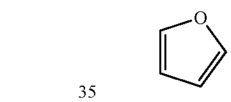

CY213

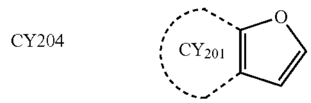

CY214

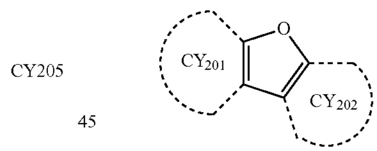

CY215

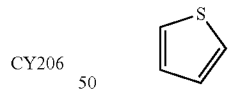

CY216

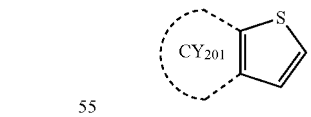

CY217

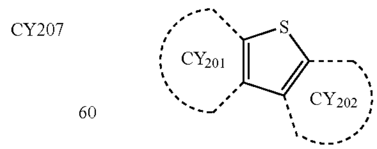

In Formulae CY201 to CY217, $R_{10b}$ and $R_{10c}$ may each independently be the same as described with respect to $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$ as described herein.

In an embodiment, in Formulae CY201 to CY217, ring $CY_{201}$ to ring $CY_{204}$ may each independently be a benzene group, a naphthalene group, a phenanthrene group, or an anthracene group.

In an embodiment, Formulae 201 and 202 may each independently include at least one of groups represented by Formulae CY201 to CY203.

In an embodiment, a compound represented by Formula 201 may include at least one of groups represented by Formulae CY201 to CY203 and at least one of groups represented by Formulae CY204 to CY217.

In an embodiment, in Formula 201, xa1 may be 1, $R_{201}$ may be a group represented by one of Formulae CY201 to CY203, xa2 may be 0, and $R_{202}$ may be a group represented by one of Formulae CY204 to CY207.

In an embodiment, Formulae 201 and 202 may each not include groups represented by Formulae CY201 to CY203.

In an embodiment, Formulae 201 and 202 may each not include groups represented by Formulae CY201 to CY203, and may each independently include at least one of groups represented by Formulae CY204 to CY217.

In an embodiment, Formulae 201 and 202 may each not include groups represented by Formulae CY201 to CY217.

In an embodiment, the hole transport region may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzene sulfonic acid (PANI/DBSA), poly(3,4-ethylene dioxythiophene)/poly(4-styrene sulfonate) (PEDOT/PSS), polyaniline/camphor sulfonic acid (PANI/CSA), polyaniline/poly(4-styrene sulfonate) (PANI/PSS), or any combination thereof:

HT1

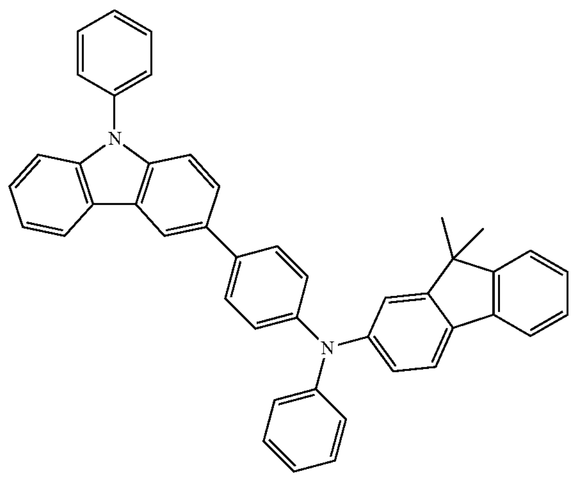

-continued

HT2

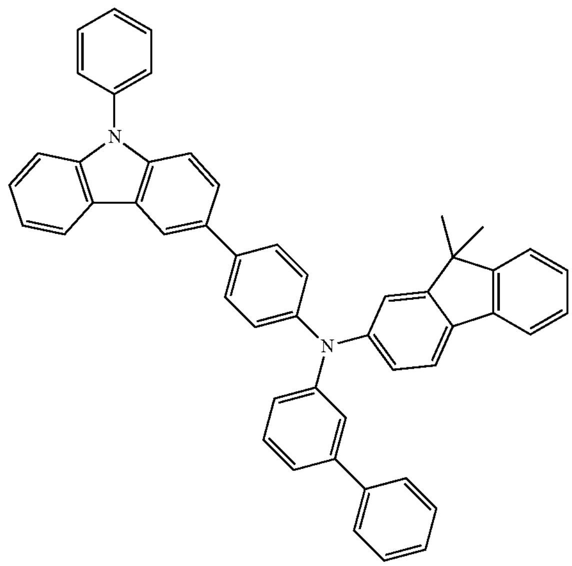

HT3

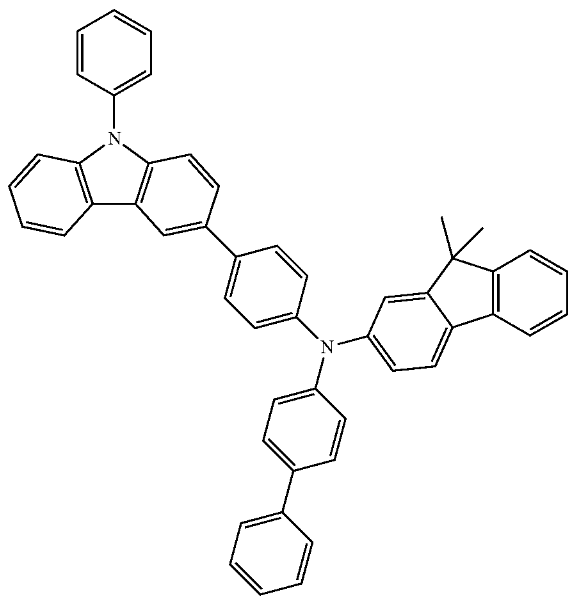

-continued
HT4
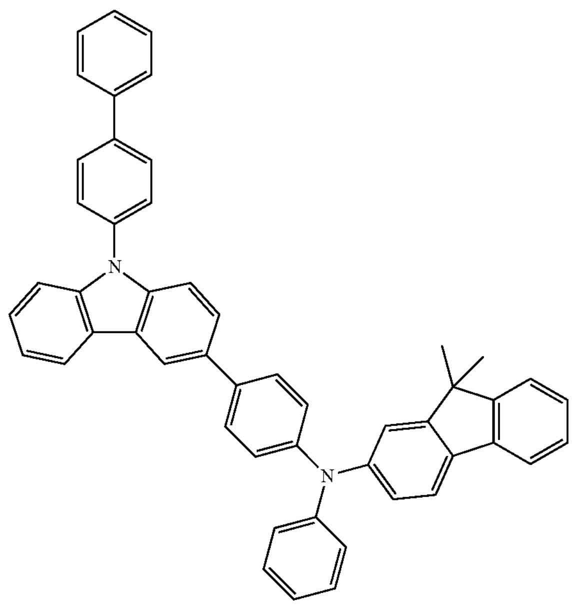
HT5
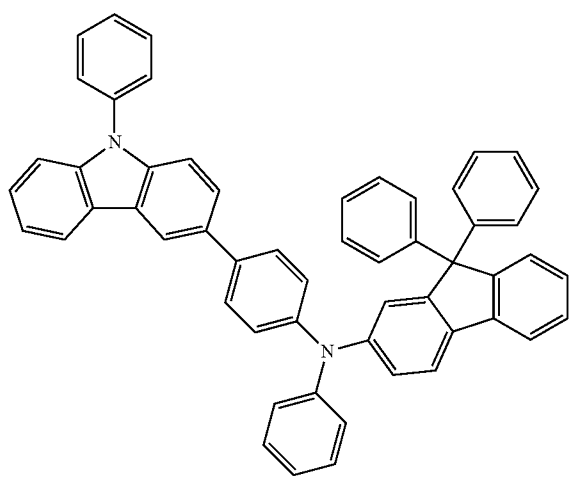
-continued
HT6
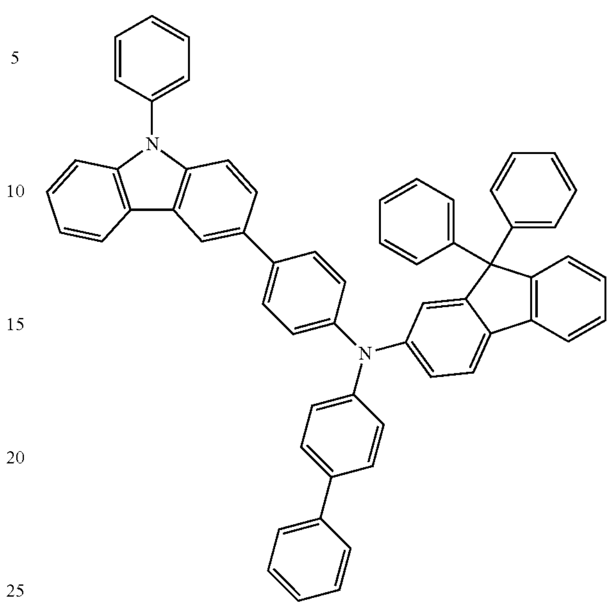
HT7
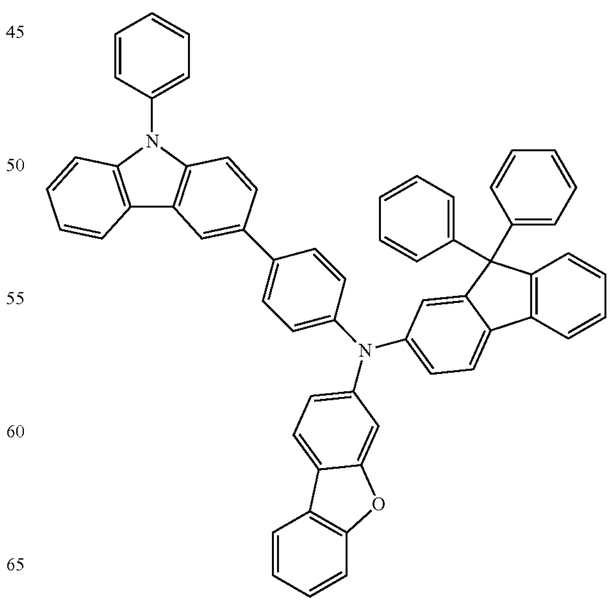

-continued
HT8
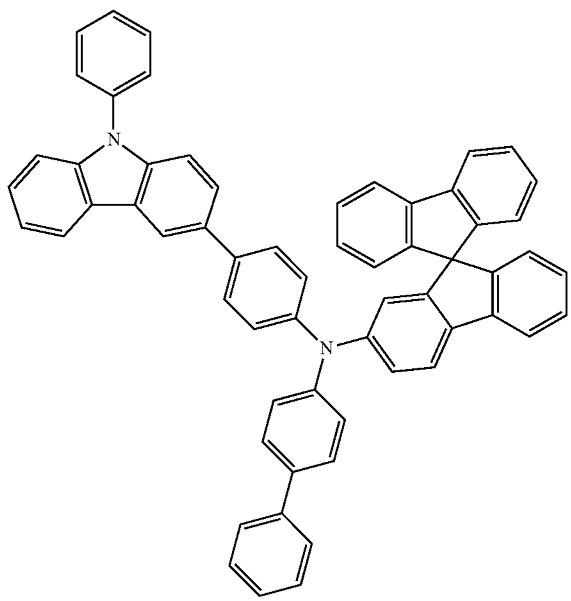
HT9
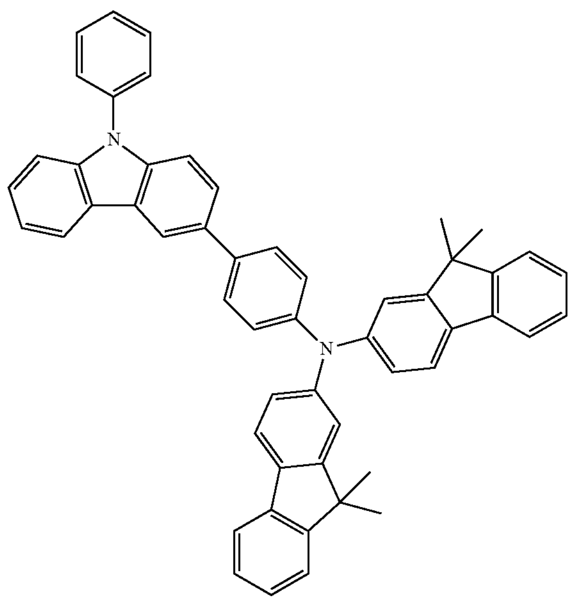
-continued
HT10
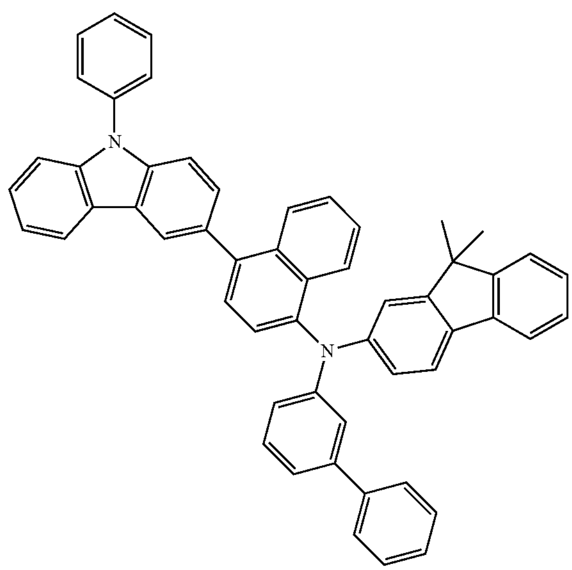
HT11
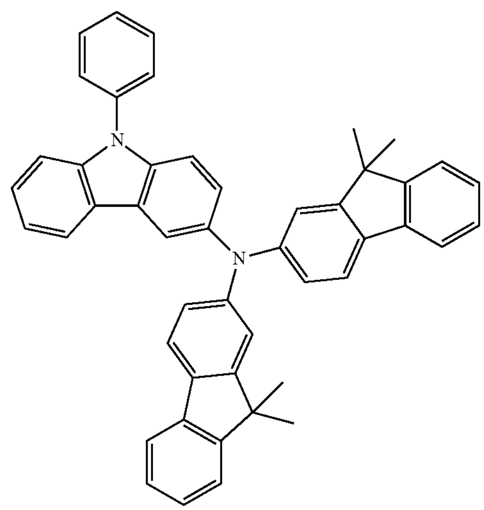
HT12
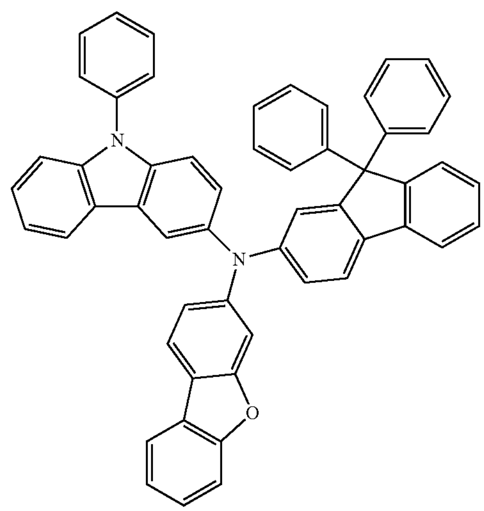

-continued
HT13
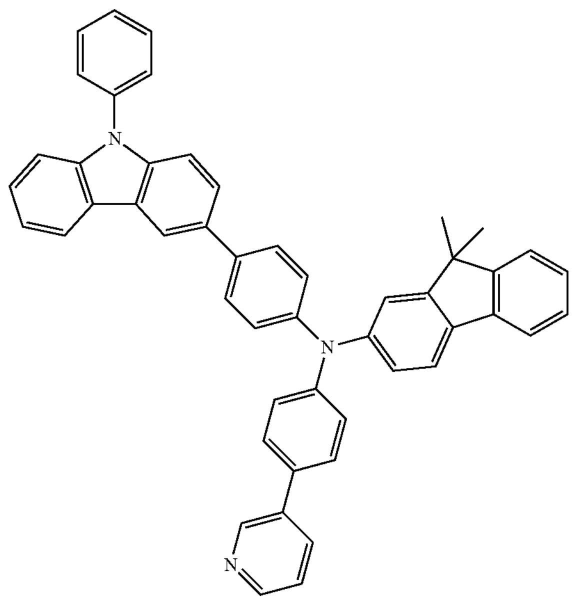
HT14
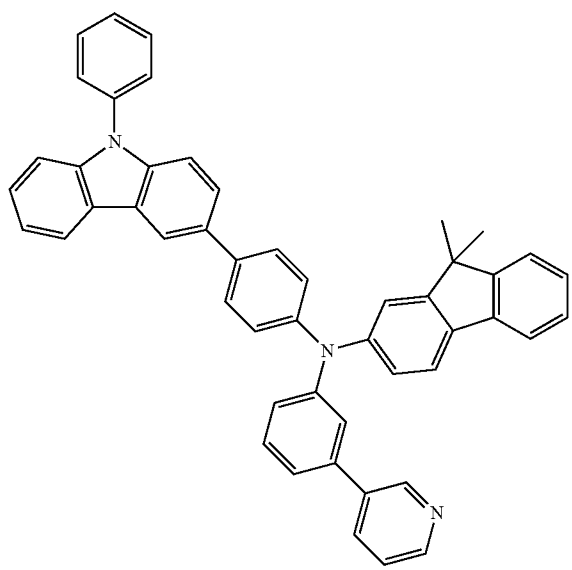
-continued
HT15
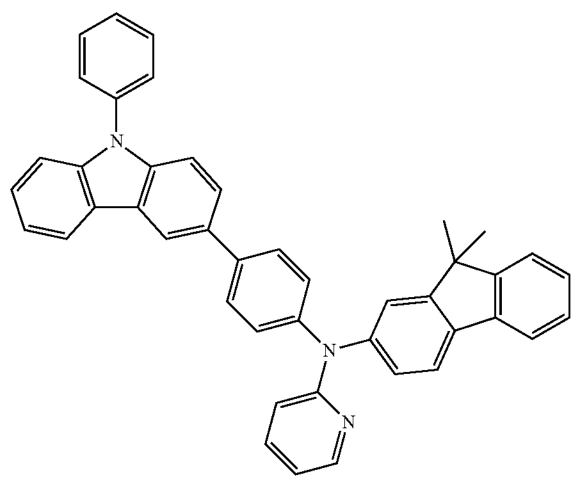
HT16
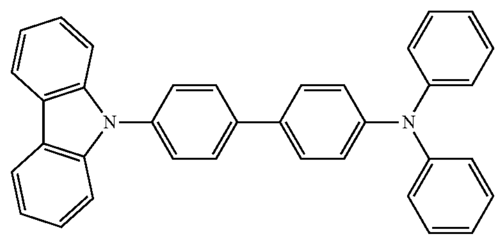
HT17
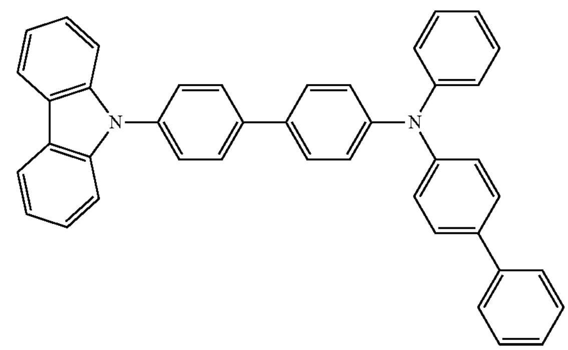
HT18
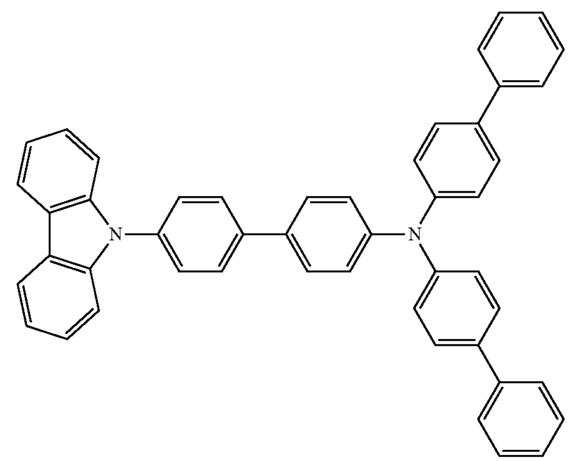

-continued
HT19
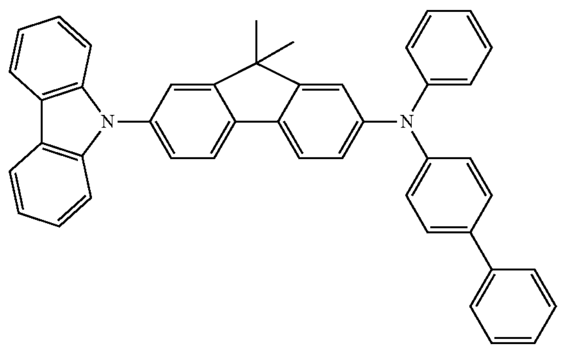
HT20
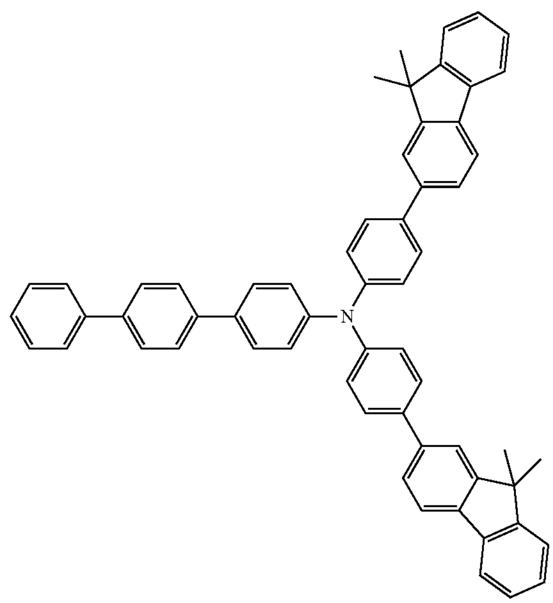
HT21
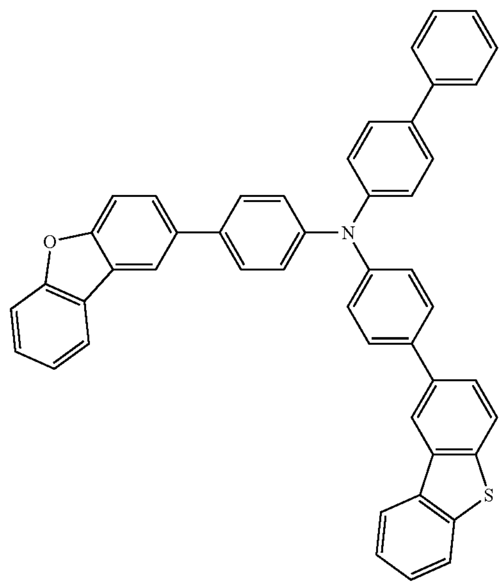
-continued
HT22
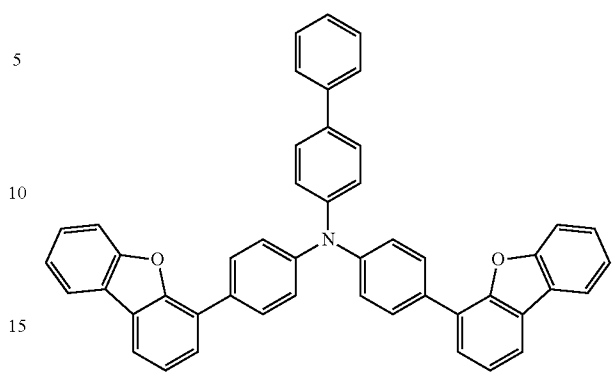
HT23
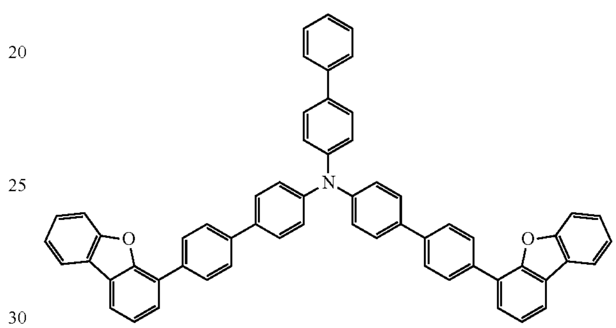
HT24
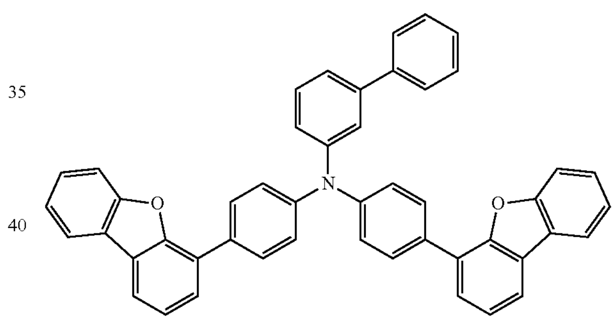
HT25
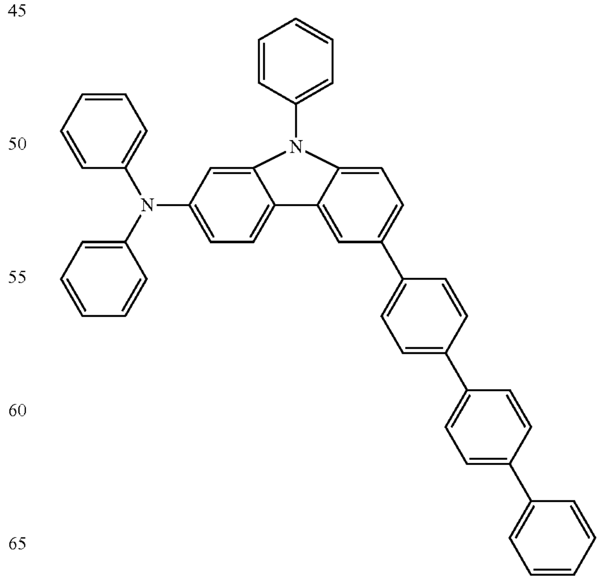

-continued
HT26
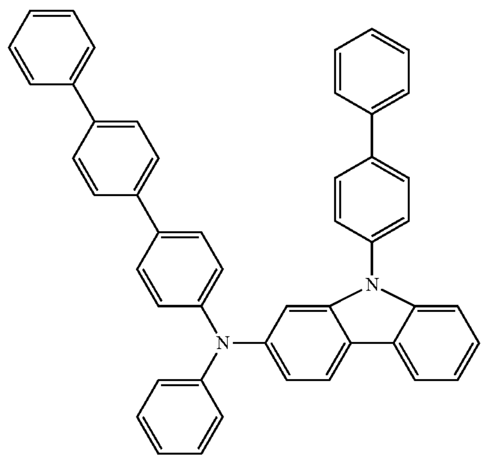
HT27
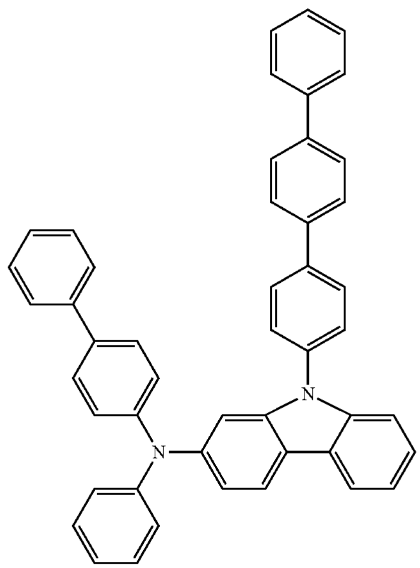
HT28
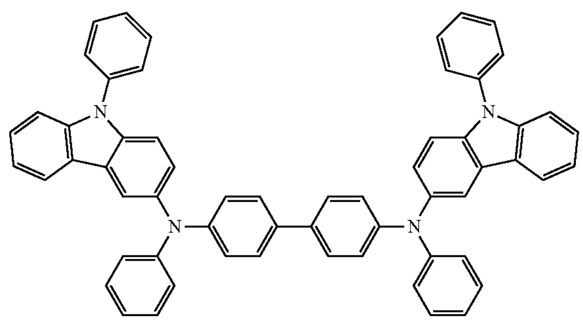
-continued
HT29
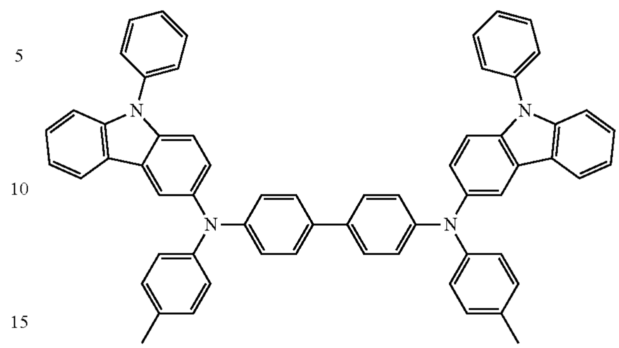
HT30
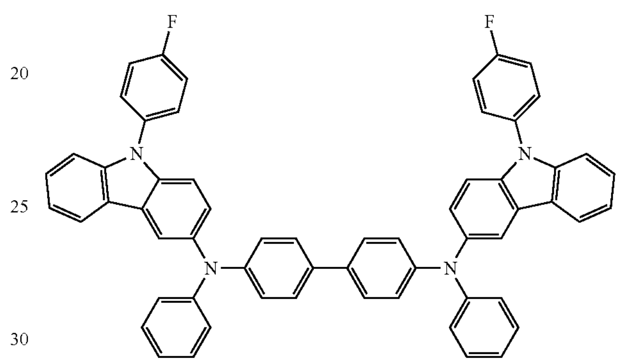
HT31
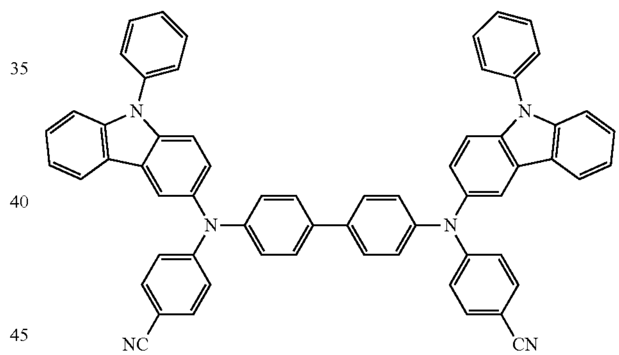
HT32
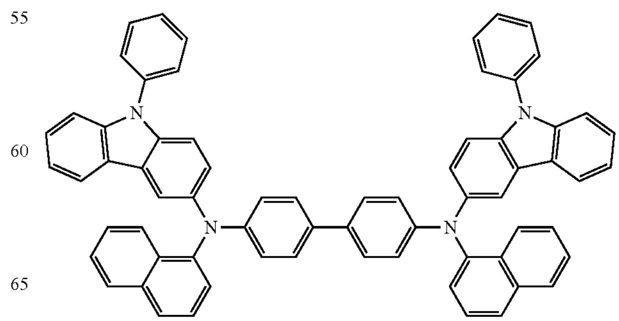

-continued
HT33
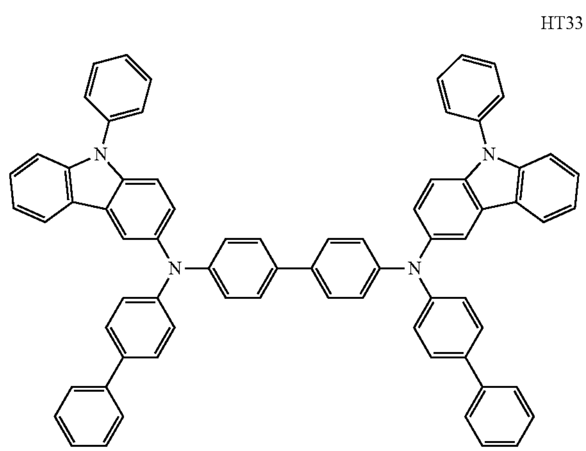
HT34
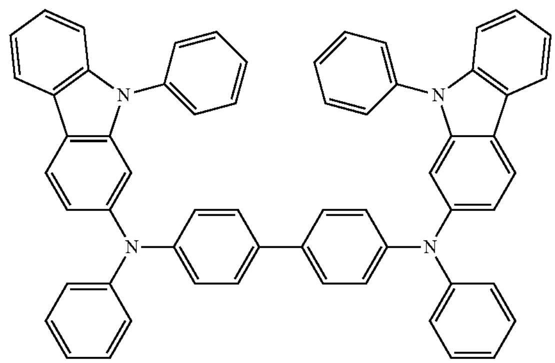
HT35
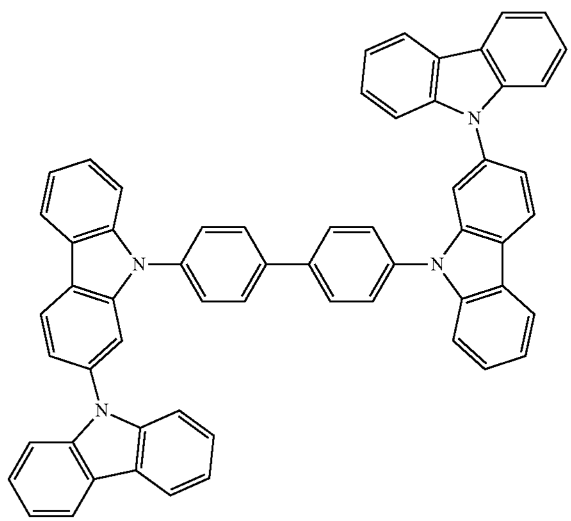
-continued
HT36
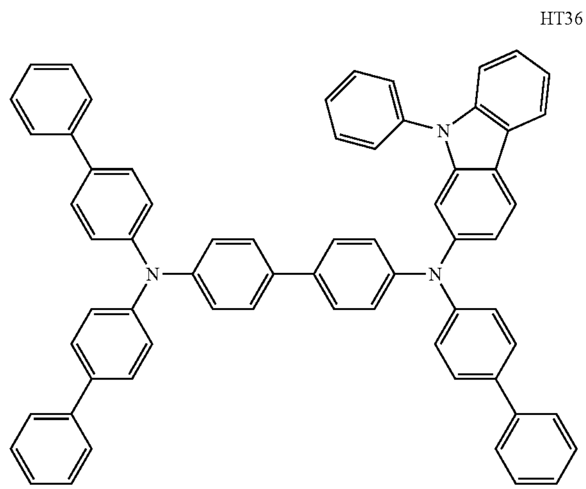
HT37
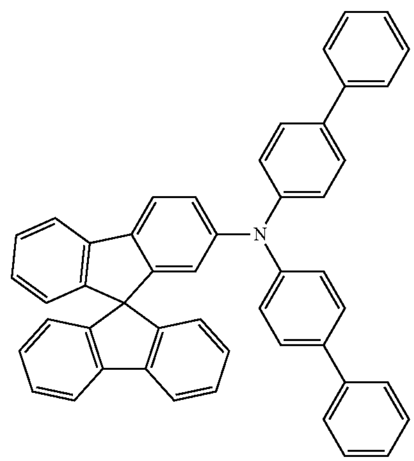
HT38
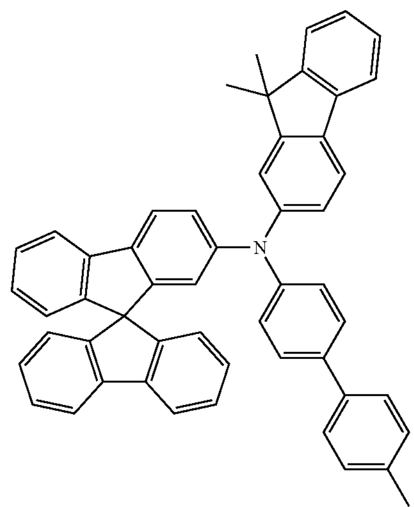

-continued
HT39
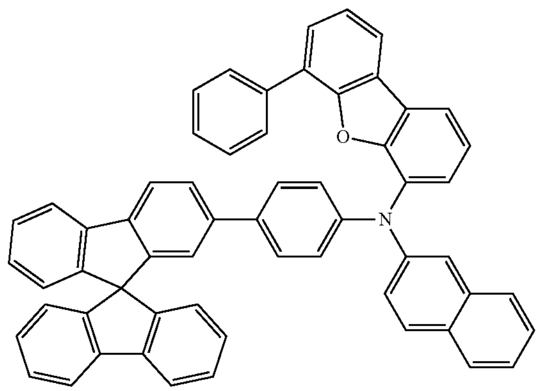
HT40
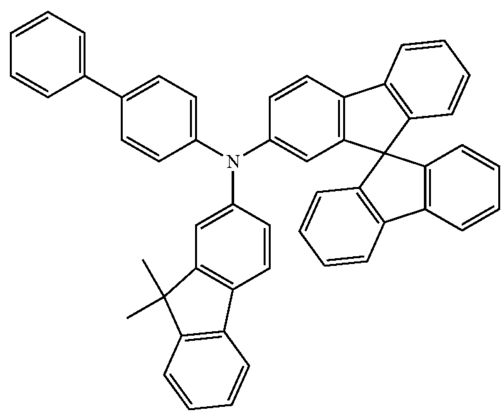
HT41
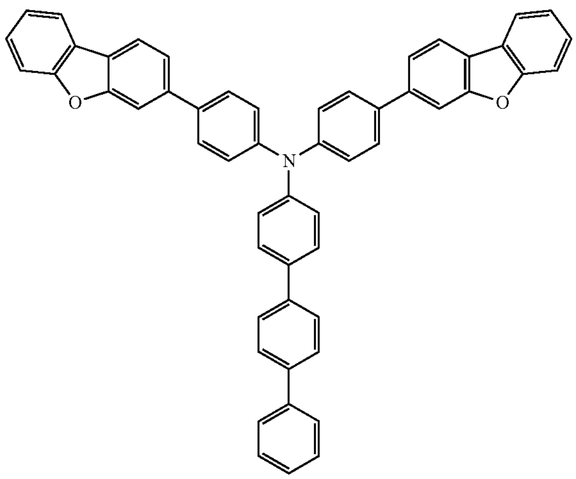
HT42
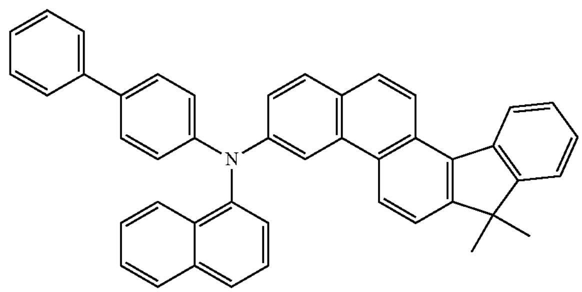
-continued
HT43
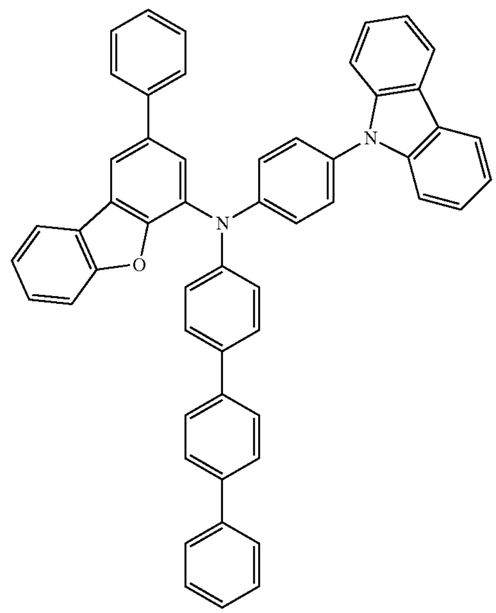
HT44
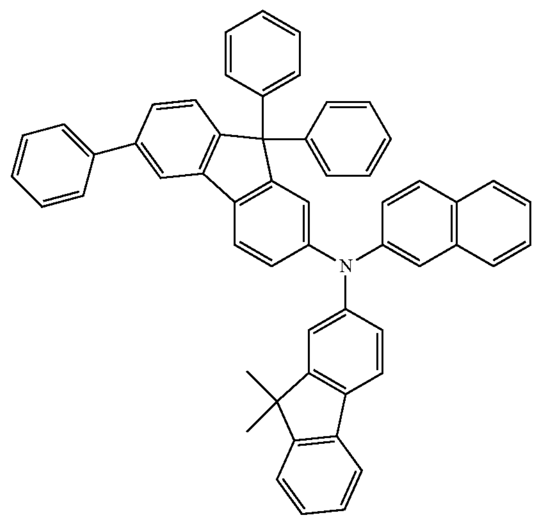
HT45
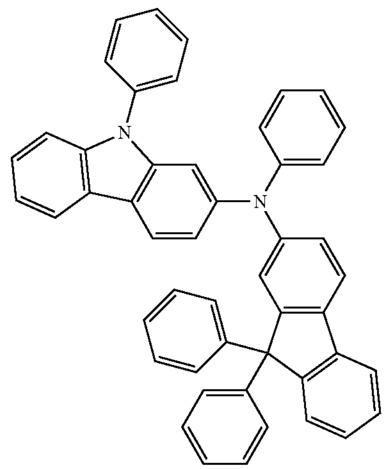

-continued
HT46
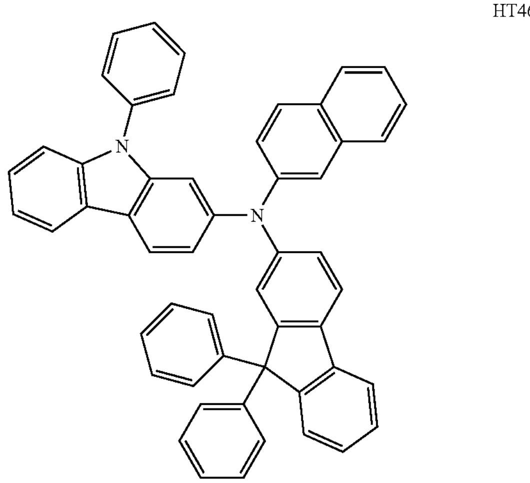
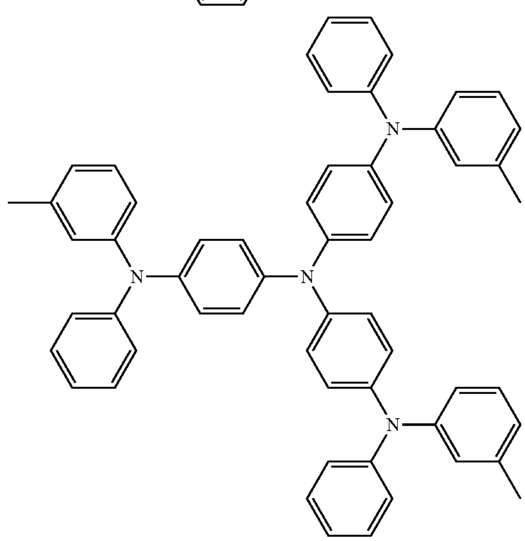
m-MTDATA
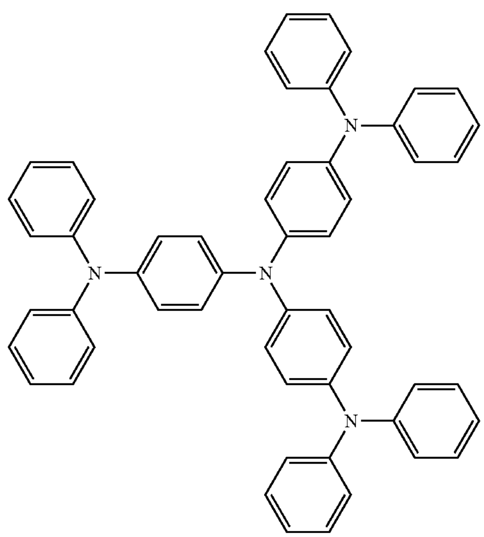
TDATA
-continued
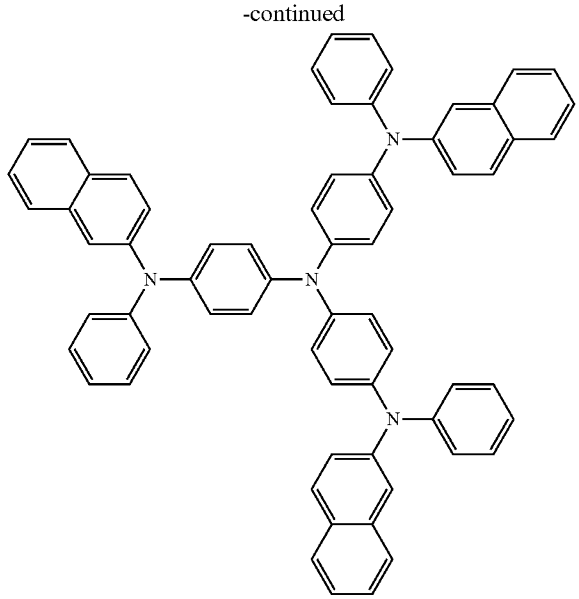
2-TNATA
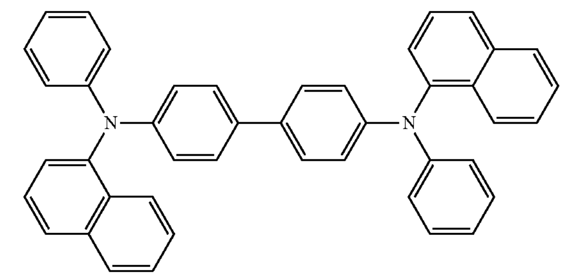
NPB
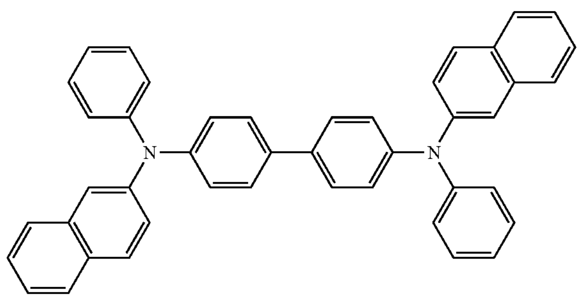
β-NPB
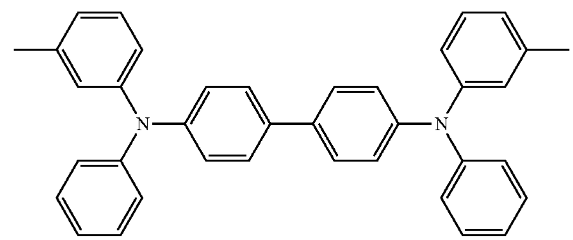
TPD -continued

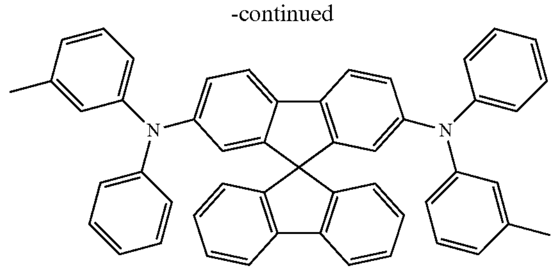

Spiro-TPD

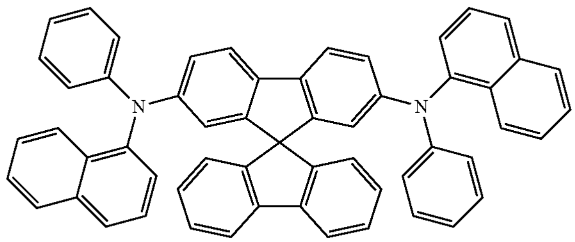

Spiro-NPB

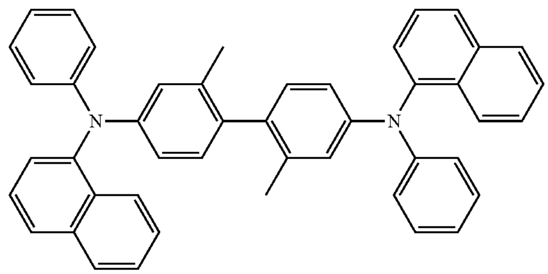

methylated-NPB

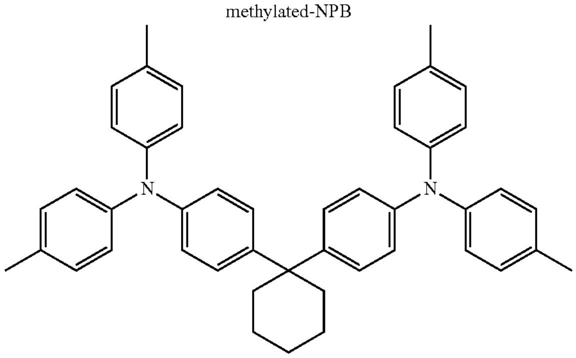

TAPC

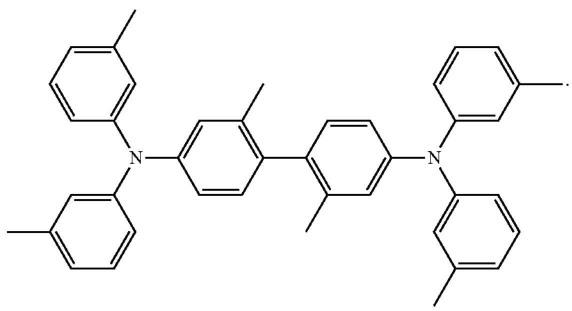

HMTPD

A thickness of the hole transport region may be in a range of about 50 Å to about 10,000 Å. For example, the thickness of the hole transport region may be in a range of about 100 Å to about 4,000 Å. When the hole transport region includes a hole injection layer, a hole transport layer, or any combination thereof, a thickness of the hole injection layer may be in a range of about 100 Å to about 9,000 Å, and a thickness of the hole transport layer may be in a range of about 50 Å to about 2,000 Å. For example, the thickness of the hole injection layer may be in a range of about 100 Å to about 1,000 Å. For example, the thickness of the hole transport layer may be in a range of about 100 Å to about 1,500 Å. When the thicknesses of the hole transport region, the hole injection layer, and the hole transport layer are within these ranges, satisfactory hole-transporting characteristics may be obtained without a substantial increase in driving voltage.

The emission auxiliary layer may increase light-emission efficiency by compensating for an optical resonance distance according to a wavelength of light emitted by an emission layer, and the electron blocking layer may block the leakage of electrons from an emission layer to a hole transport region. Materials that may be included in the hole transport region may be included in the emission auxiliary layer and the electron blocking layer.

[p-Dopant]

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

In an embodiment, a lowest unoccupied molecular orbital (LUMO) energy level of the p-dopant may be equal to or less than about −3.5 eV.

In an embodiment, the p-dopant may include a quinone derivative, a cyano group-containing compound, a compound including element EL1 and element EL2, or any combination thereof.

Examples of the quinone derivative may include TCNQ, F4-TCNQ, and the like.

Examples of the cyano group-containing compound may include HAT-CN, a compound represented by Formula 221, and the like:

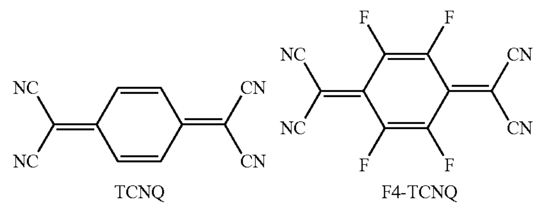

TCNQ F4-TCNQ

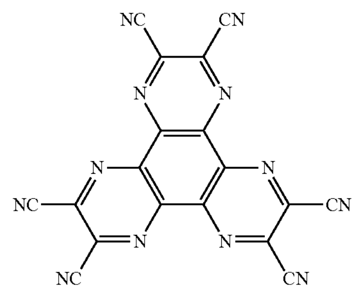

HAT-CN

-continued

[Formula 221]

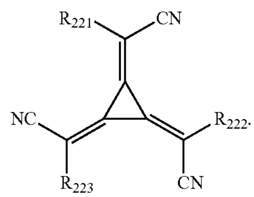

In Formula 221, $R_{221}$ to $R_{223}$ may each independently be a $C_3$-$C_{60}$ carbocyclic group that is unsubstituted or substituted with at least one $R_{10a}$ or a $C_1$-$C_6$ heterocyclic group that is unsubstituted or substituted with at least one $R_{10a}$, and at least one of $R_{221}$ to $R_{223}$ may each independently be a $C_3$-$C_{60}$ carbocyclic group or a $C_1$-$C_6$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be a metal, a metalloid, or any combination thereof, and element EL2 may be a non-metal, a metalloid, or any combination thereof.

Examples of the metal may include: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te).

Examples of the non-metal may include oxygen (O) and a halogen (for example, F, Cl, Br, I, etc.).

In an embodiment, examples of the compound containing element EL1 and element EL2 may include a metal oxide, a metal halide (for example, a metal fluoride, a metal chloride, a metal bromide, or a metal iodide), a metalloid halide (for example, a metalloid fluoride, a metalloid chloride, a metalloid bromide, or a metalloid iodide), a metal telluride, or any combination thereof.

Examples of the metal oxide may include a tungsten oxide (for example, $WO$, $W_2O_3$, $WO_2$, $WO_3$, $W_2O_5$, etc.), a vanadium oxide (for example, $VO$, $V_2O_3$, $VO_2$, $V_2O_5$, etc.), a molybdenum oxide ($MoO$, $Mo_2O_3$, $MoO_2$, $MoO_3$, $Mo_2O_5$, etc.), and a rhenium oxide (for example, $ReO_3$, etc.).

Examples of the metal halide may include an alkali metal halide, an alkaline earth metal halide, a transition metal halide, a post-transition metal halide, and a lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include a titanium halide (for example, $TiF_4$, $TiCl_4$, $TiBr_4$, $TiI_4$, etc.), a zirconium halide (for example, $ZrF_4$, $ZrCl_4$, $ZrBr_4$, $Zr_{14}$, etc.), a hafnium halide (for example, $HfF_4$, $HfC_{14}$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaCl_3$, etc.), a chromium halide (for example, $CrF_3$, $CrC_{13}$, $CrBr_3$, $Cr_{13}$, etc.), a molybdenum halide (for example, $MoF_3$, $MoCl_3$, $MoBr_3$, $MoI_3$, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $Re_{12}$, etc.), an iron halide (for example, $FeF_2$, $FeCl_2$, $FeBr_2$, $Fe_{12}$, etc.), a ruthenium halide (for example, $RuF_2$, $RuCl_2$, $RuBr_2$, $RuI_2$, etc.), an osmium halide (for example, $OsF_2$, $OSCl_2$, $OsBr_2$, $OSI_2$, etc.), a cobalt halide (for example, $CoF_2$, $CoC_{12}$, $CoBr_2$, $CoI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.), and a gold halide (for example, AuF, AuCl, AuBr, AuI, etc.).

Examples of the post-transition metal halide may include a zinc halide (for example, $ZnF_2$, $ZnCl_2$, $ZnBr_2$, $ZnI_2$, etc.), an indium halide (for example, $InI_3$, etc.), and a tin halide (for example, $SnI_2$, etc.).

Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$.

Examples of the metalloid halide may include an antimony halide (for example, $SbCl_5$, etc.).

Examples of the metal telluride may include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

[Emission Layer in Interlayer 130]

When the light-emitting device 10 is a full-color light-emitting device, the emission layer may be patterned into a red emission layer, a green emission layer, and/or a blue emission layer, according to a subpixel. In an embodiment, the emission layer may have a stacked structure of two or more layers of a red emission layer, a green emission layer, and a blue emission layer, in which the two or more layers may contact each other or may be separated from each other. In an embodiment, the emission layer may include two or more materials of a red light-emitting material, a green light-emitting material, and a blue light-emitting material, in which the two or more materials may be mixed with each other in a single layer to emit white light.

The emission layer may include a host and a dopant. The dopant may include a phosphorescent dopant, a fluorescent dopant, or any combination thereof.

The dopant included in the emission layer may be the organometallic compound represented by Formula 1.

An amount of the dopant in the emission layer may be in a range of about 0.01 wt % to about 15 wt %, based on 100 wt % of the host.

In an embodiment, the emission layer may further include quantum dots.

In an embodiment, the emission layer may further include a delayed fluorescence material. The delayed fluorescence material may serve as a host or as a dopant in the emission layer.

A thickness of the emission layer may be in a range of about 100 Å to about 1,000 Å. For example, the thickness of the emission layer may be in a range of about 200 Å to about 600 Å. When the thickness of the emission layer is within these ranges, excellent light-emission characteristics may be obtained without a substantial increase in driving voltage.

[Host]

The host may include a compound represented by Formula 301:

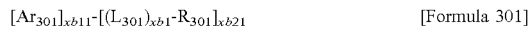

$[Ar_{301}]_{xb11}$-$[(L_{301})_{xb1}$-$R_{301}]_{xb21}$ [Formula 301]

In Formula 301, $Ar_{301}$ and $L_{301}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_6$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_6$ heterocyclic group that is unsubstituted or substituted with at least one $R_{10a}$, —$Si(Q_{301})(Q_{302})(Q_{303})$, —$N(Q_{301})(Q_{302})$, —$B(Q_{301})(Q_{302})$, —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ may each independently be the same as described in connection with $Q_1$.

In an embodiment, in Formula 301, when xb11 is 2 or more, two or more $Ar_{301}$(s) may be linked to each other via a single bond.

In an embodiment, the host may include a compound represented by Formula 301-1, a compound represented by Formula 301-2, or any combination thereof:

[Formula 301-1]

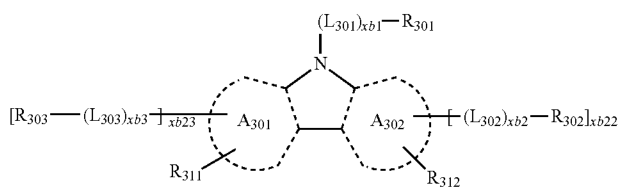

[Formula 301-2]

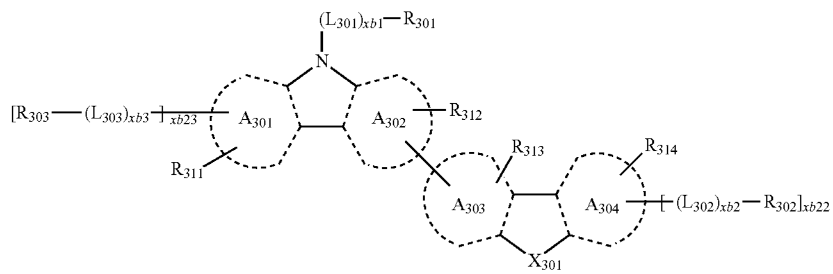

In Formulae 301-1 and 301-2, rings $A_{301}$ to $A_{304}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $X_{301}$ may be O, S, N-$[(L_{304})_{xb4}$-$R_{304}]$, $C(R_{304})(R_{305})$, or $Si(R_{304})(R_{305})$, xb22 and xb23 may each independently be 0, 1, or 2, $L_{301}$, xb1, and $R_{301}$ may each be the same as described in the specification, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each independently be the same as described in connection with $R_{301}$.

In an embodiment, the host may include an alkali earth metal complex, a post-transition metal complex, or a combination thereof. In an embodiment, the host may include a Be complex (for example, Compound H55), an Mg complex, a Zn complex, or a combination thereof.

In an embodiment, the host may include one of Compounds H1 to H128, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof:

-continued
H1
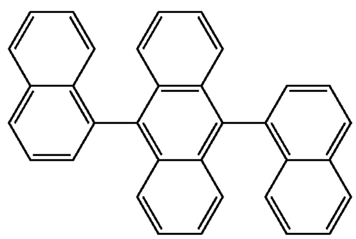
H2
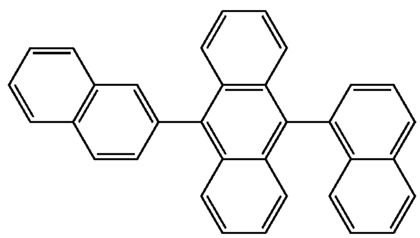
H3
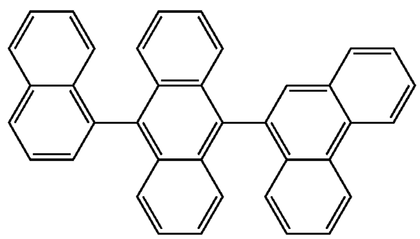
H4
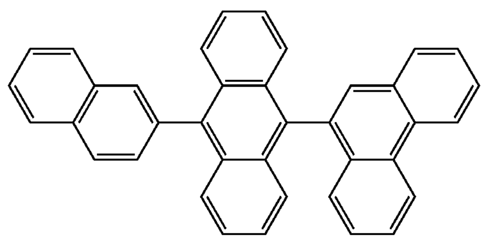
H5
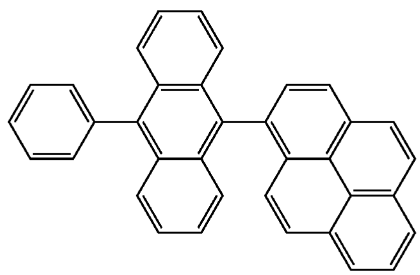
H6
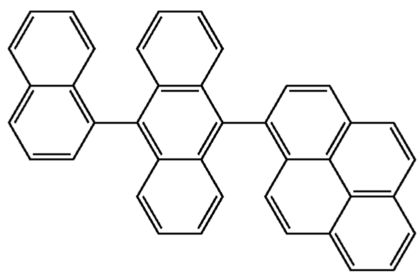
H7
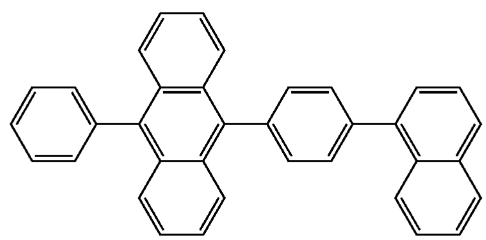
H8
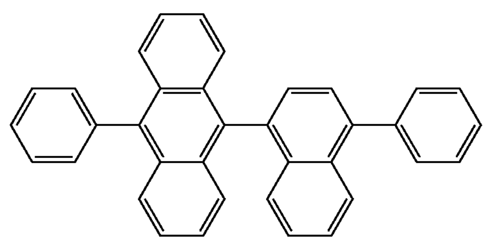
H9
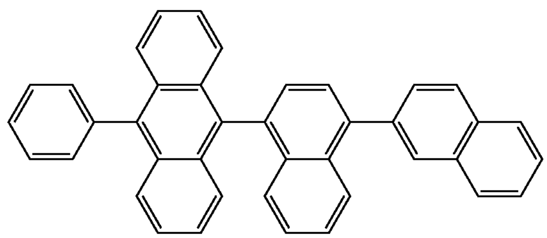
H10
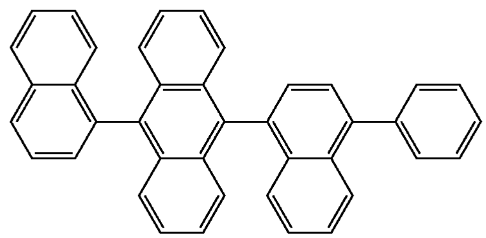
H11
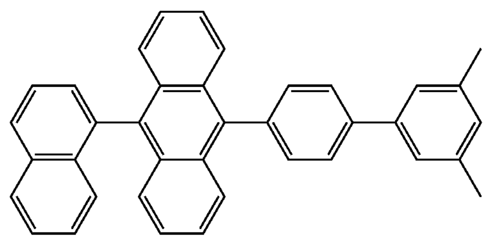
H12
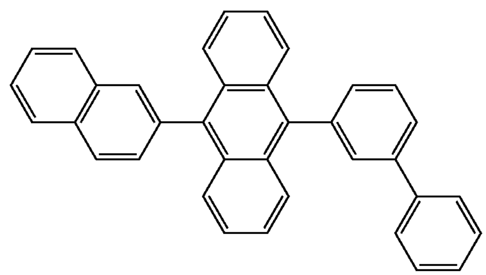

-continued
H13
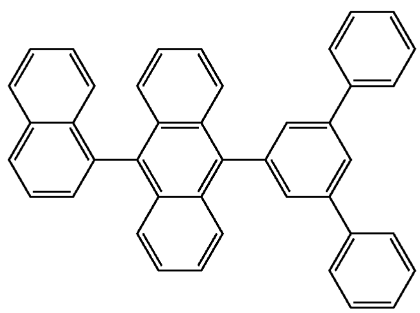
H14
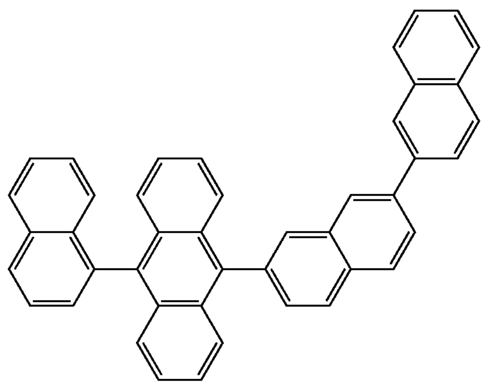
H15
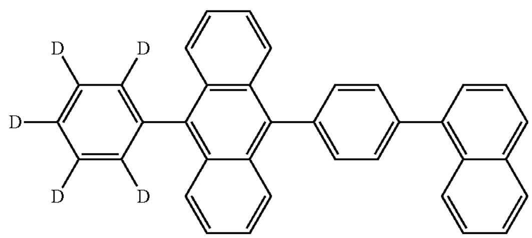
H16
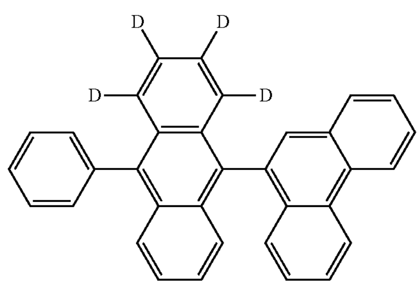
H17
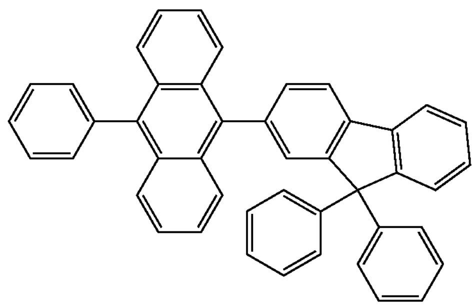
-continued
H18
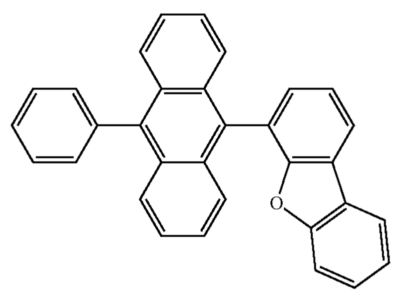
H19
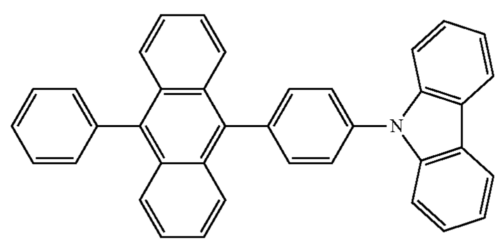
H20
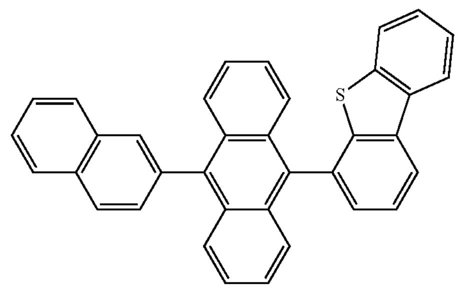
H21
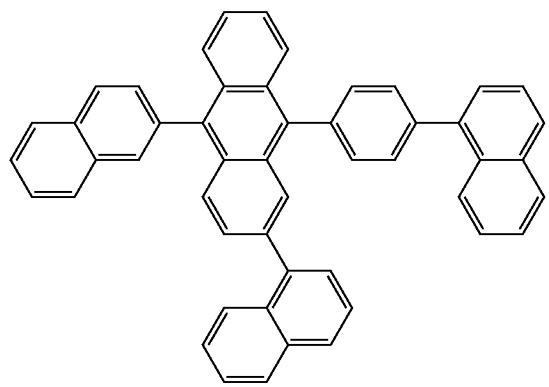
H22
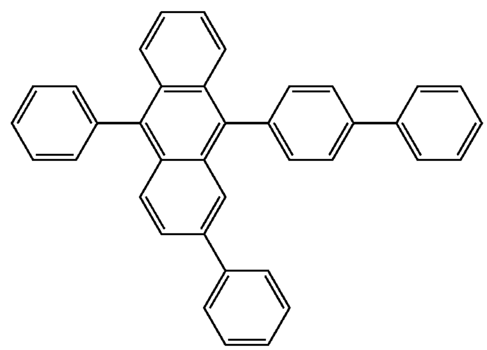

-continued
H23
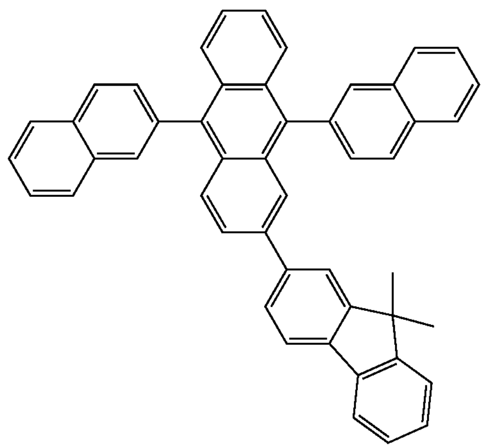
H24
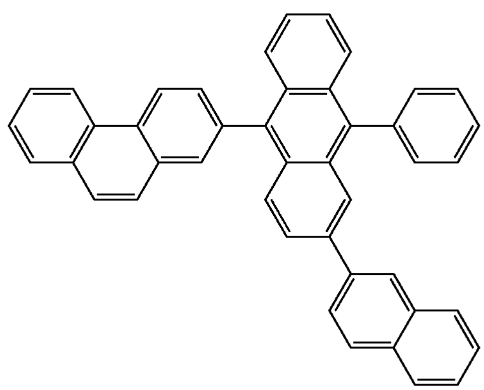
H25
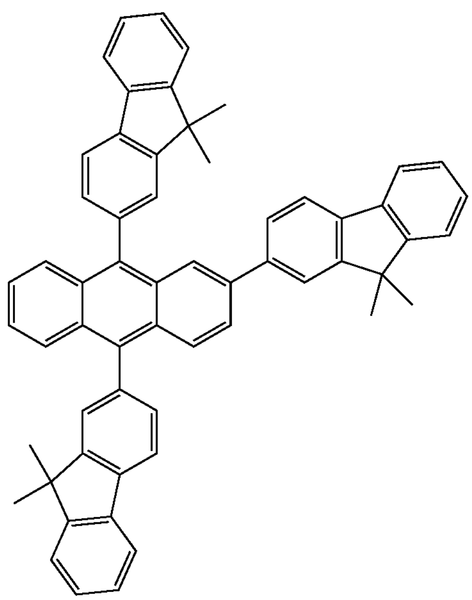
-continued
H26
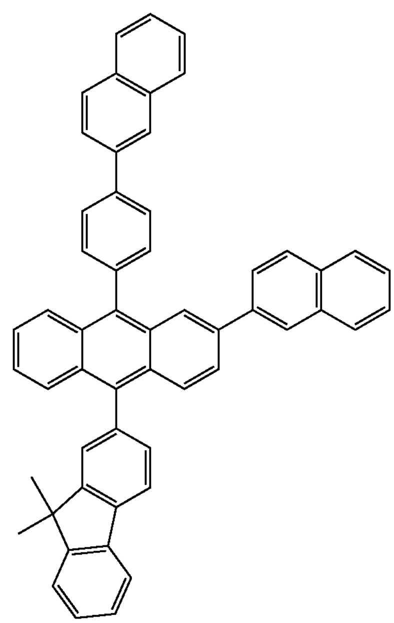
H27
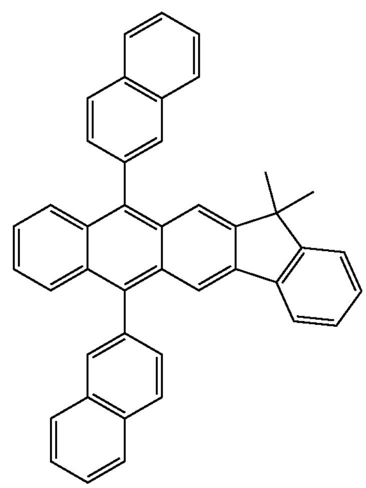
H28
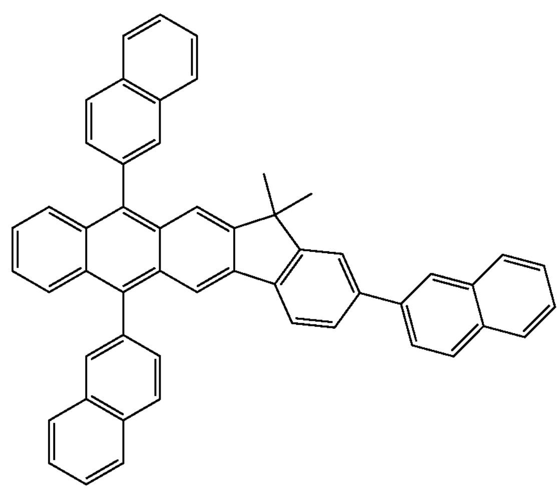

-continued
H29
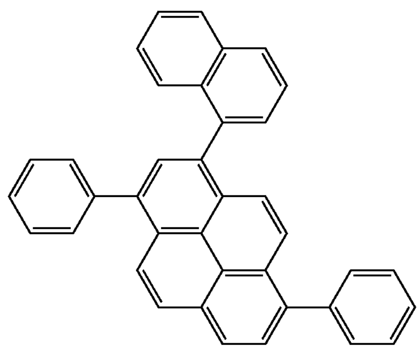
H30
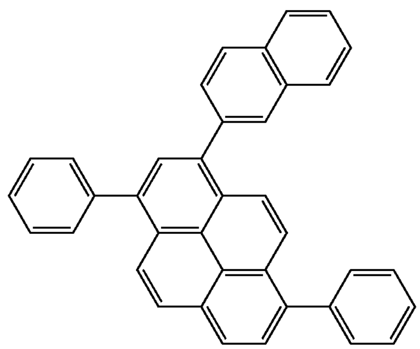
H31
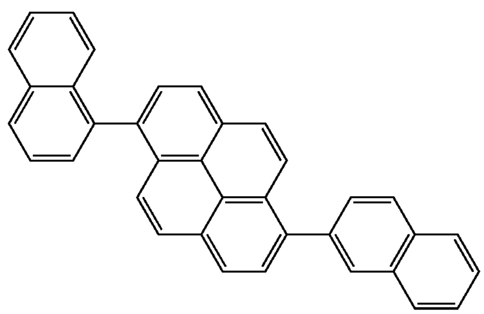
H32
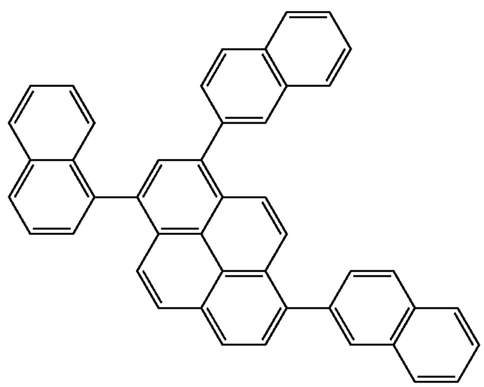
H33
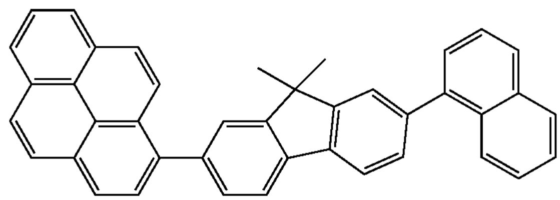
-continued
H34
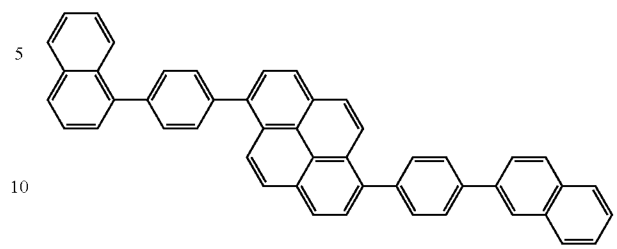
H35
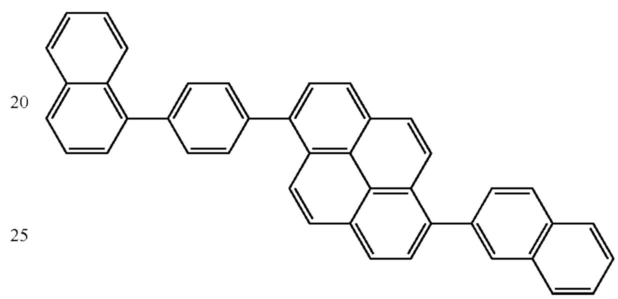
H36
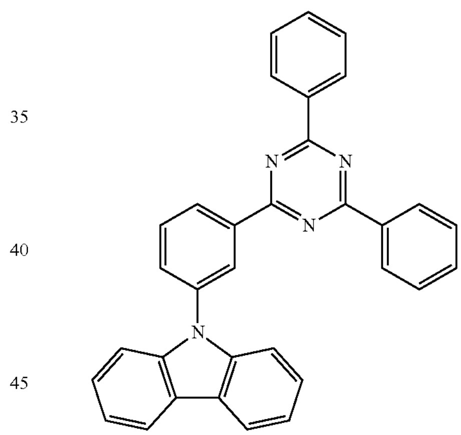
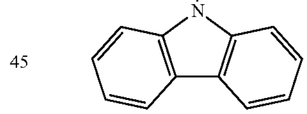
H37
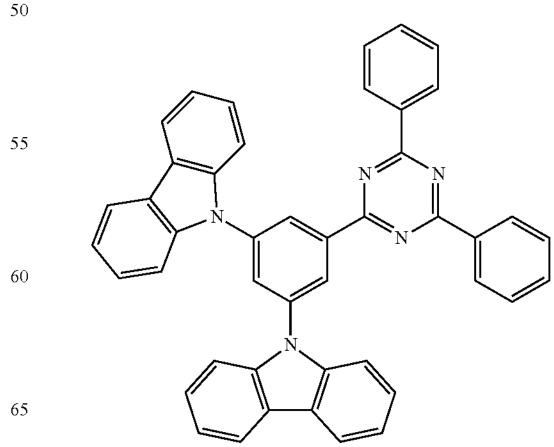

-continued
H38
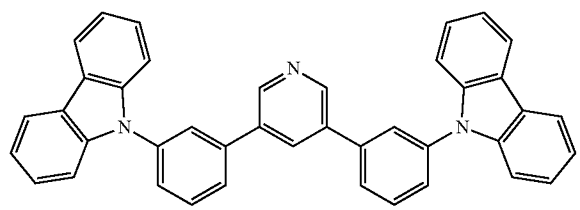
H39
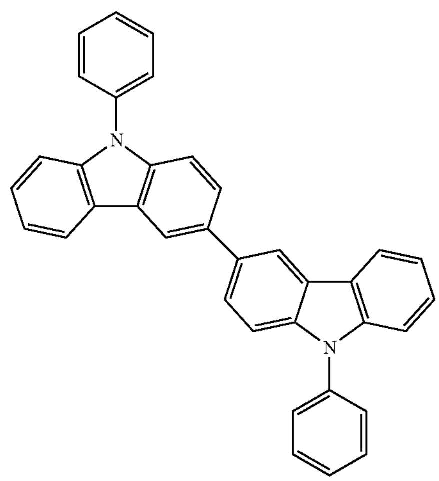
H40
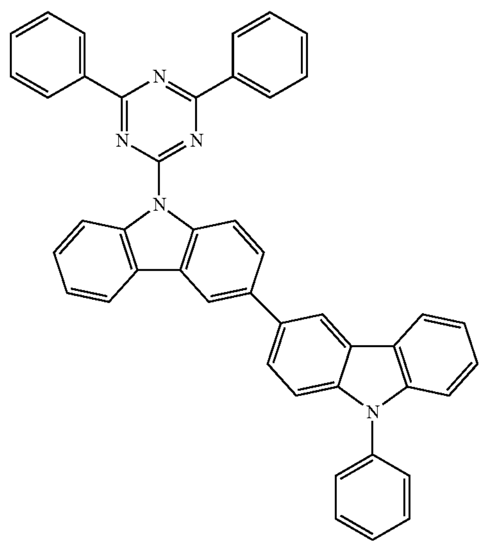
-continued
H41
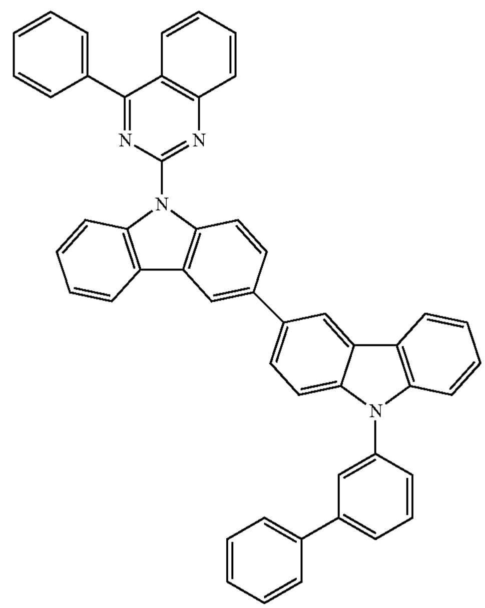
H42
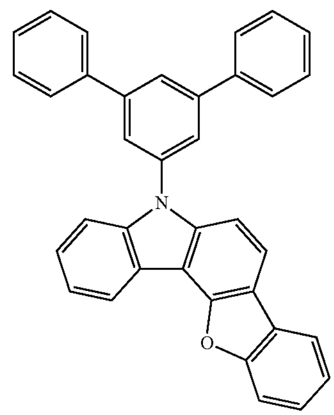
H43
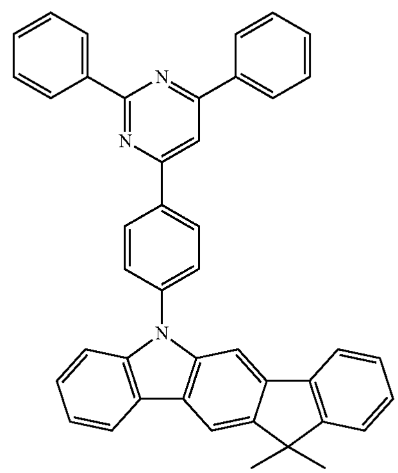

-continued
H44
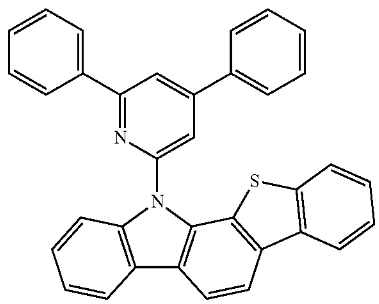
H45
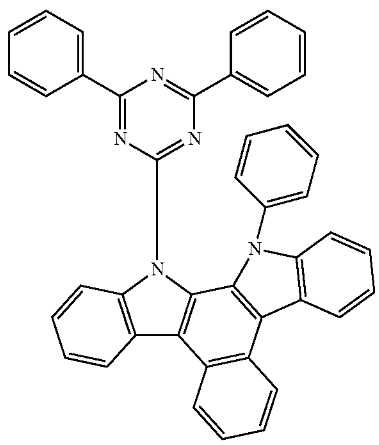
H46
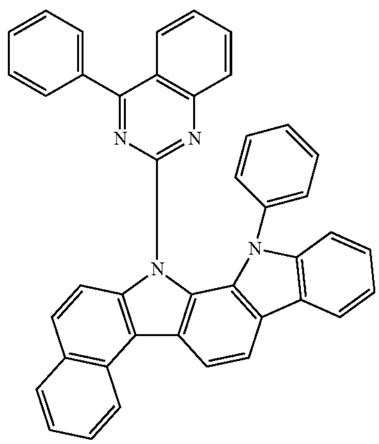
H47
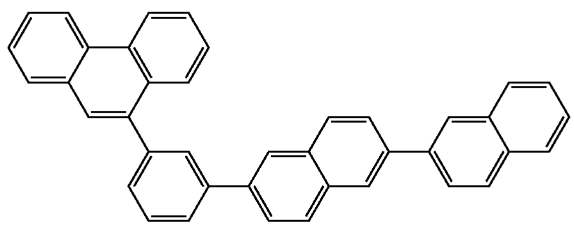
-continued
H48
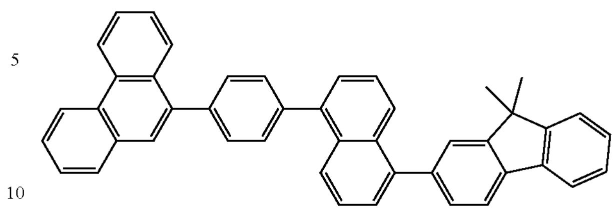
H49
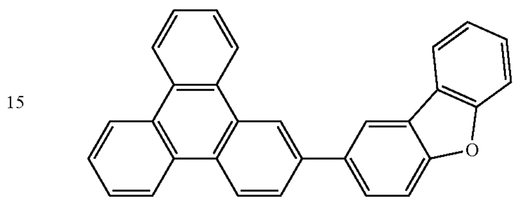
H50
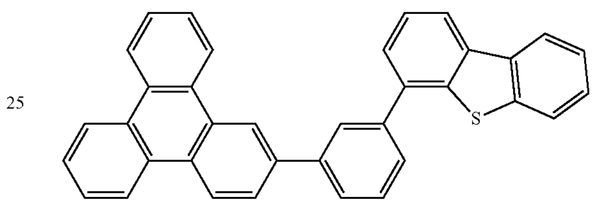
H51
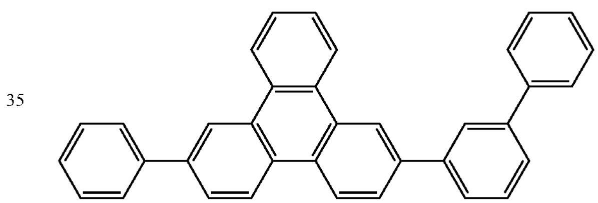
H52
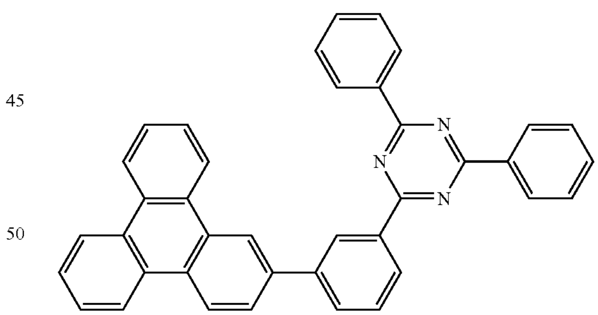
H53
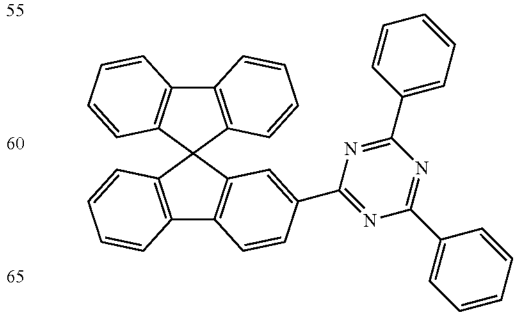

-continued
H54
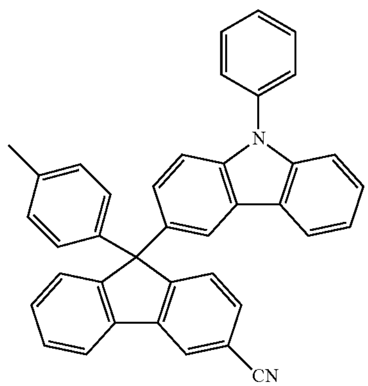
H55
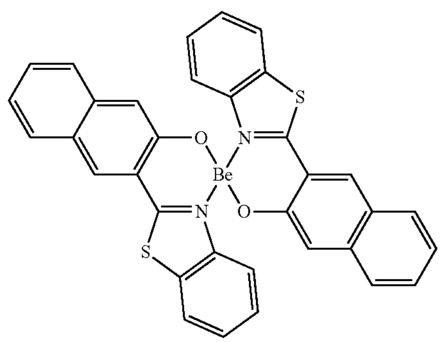
H56
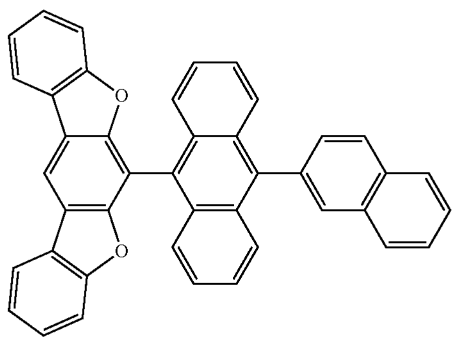
H57
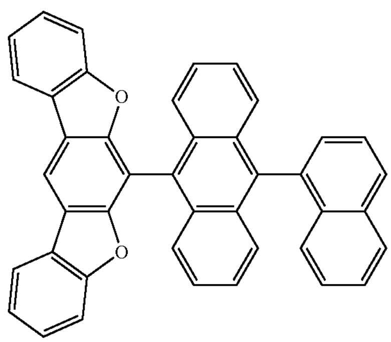
-continued
H58
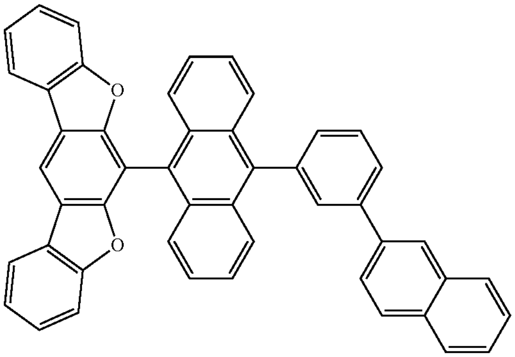
H59
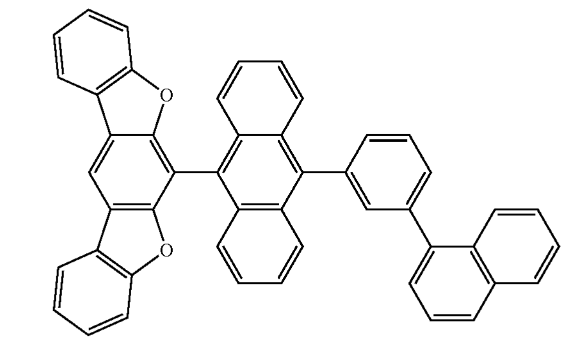
H60
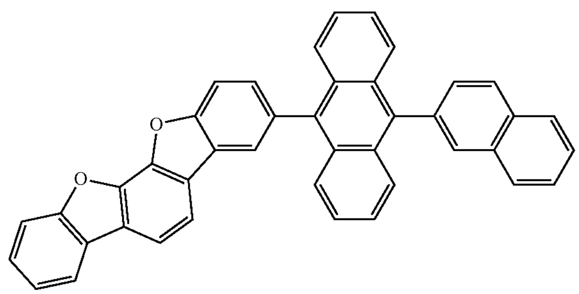
H61
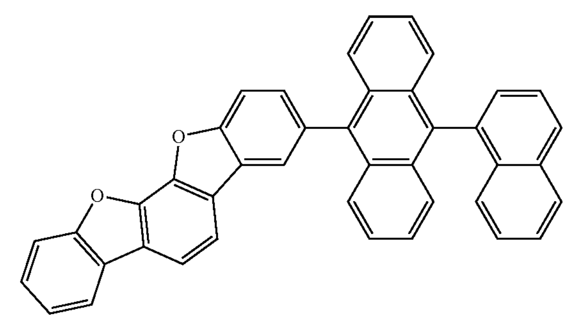

-continued
H62
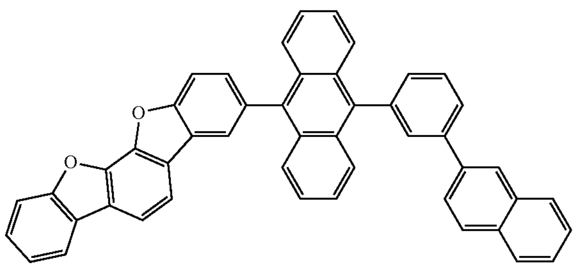
H63
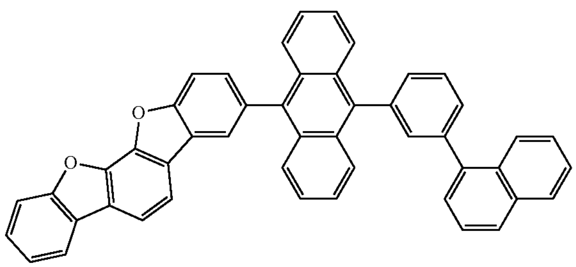
H64
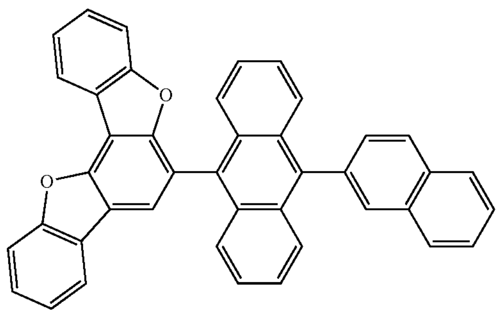
H65
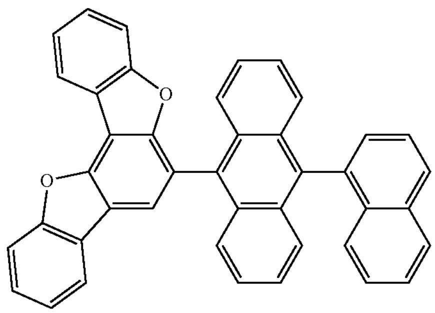
H66
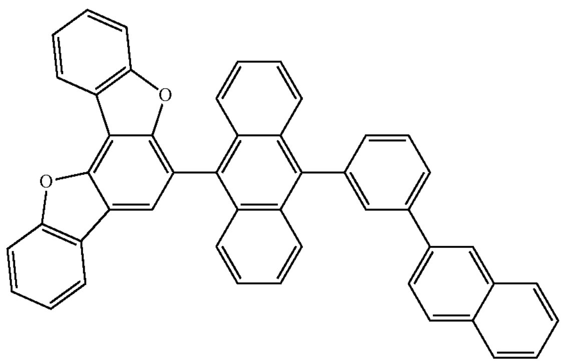
-continued
H67
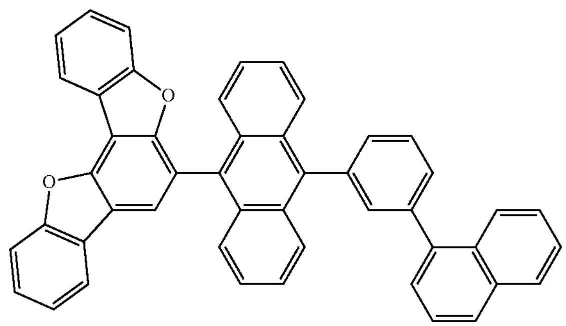
H68
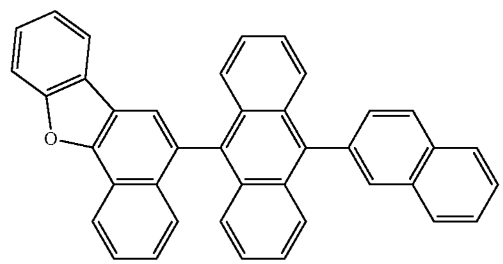
H69
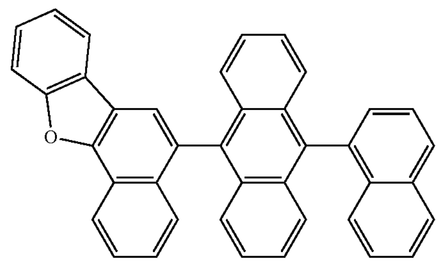
H70
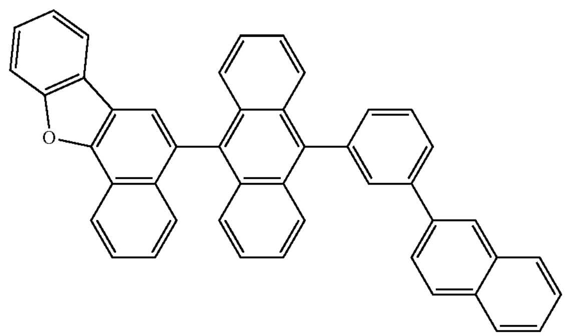
H71
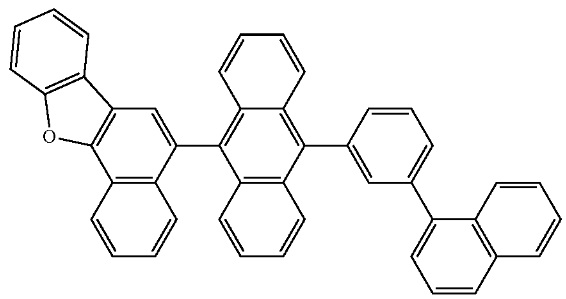

H72
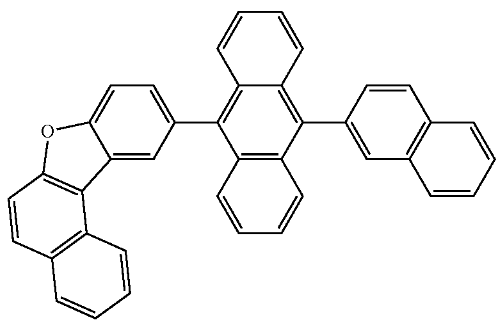
H73
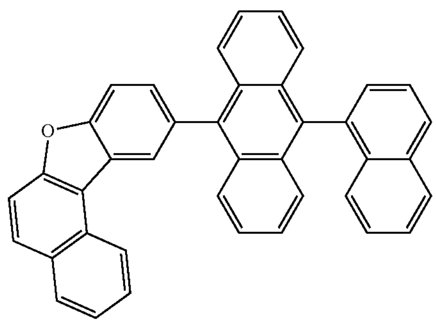
H74
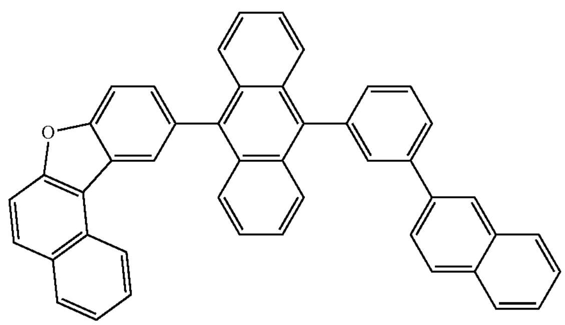
H75
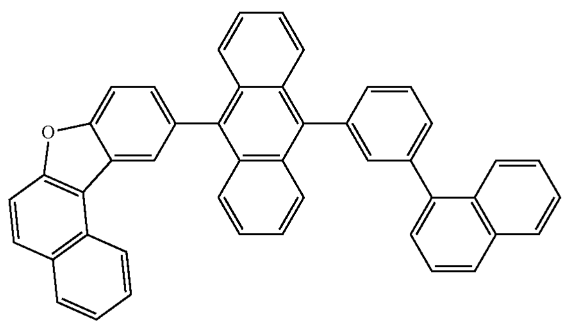
H76
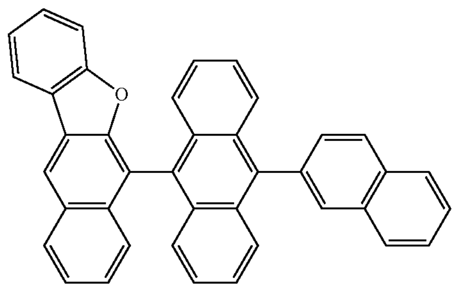
H77
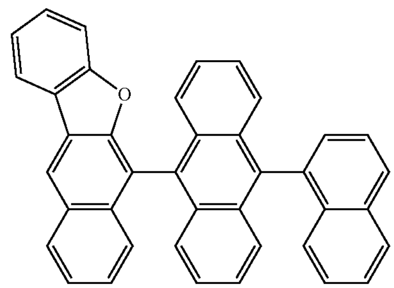
H78
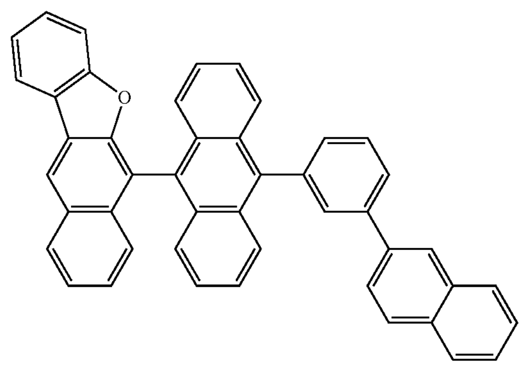
H79
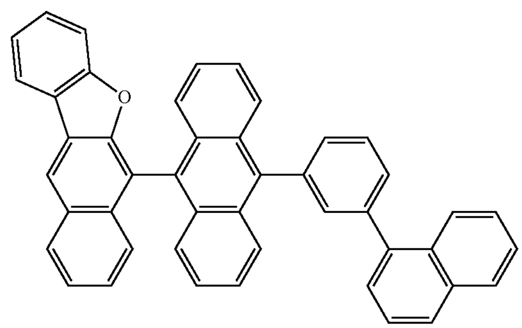
H80
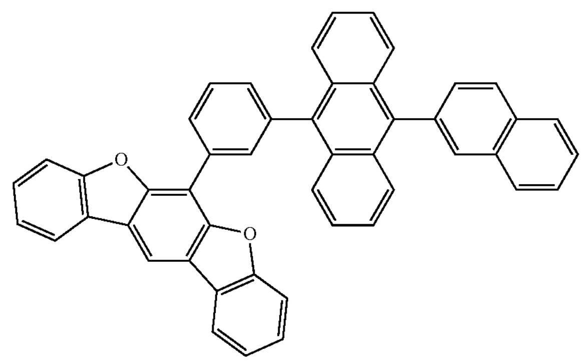

-continued
H81
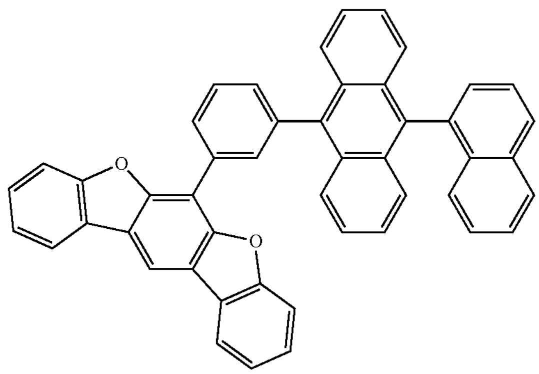
H82
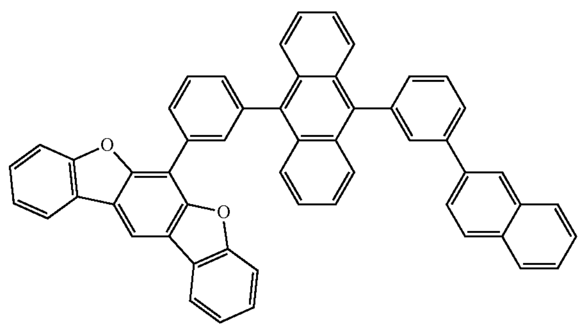
H83
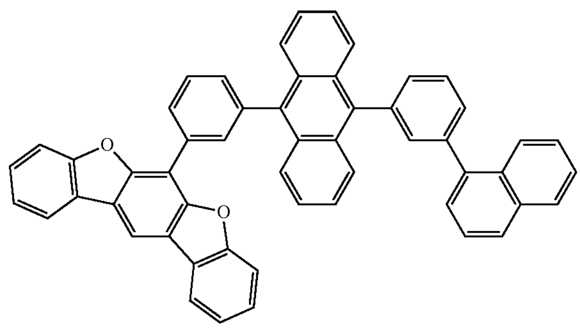
H84
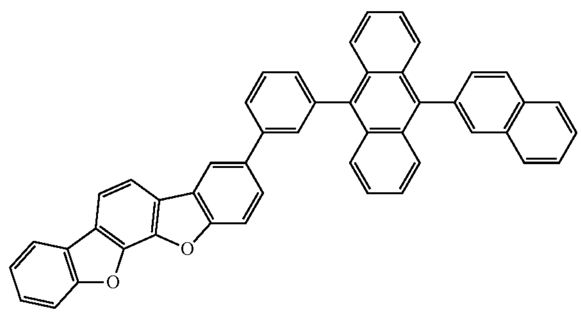
-continued
H85
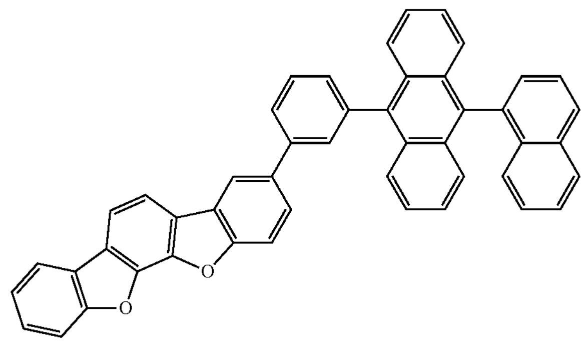
H86
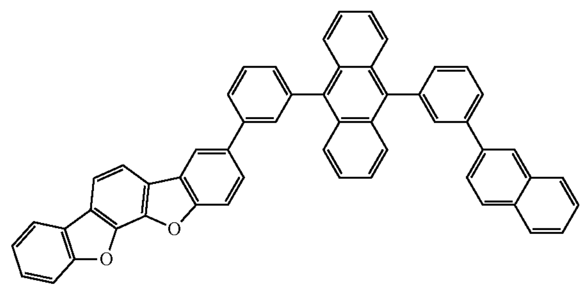
H87
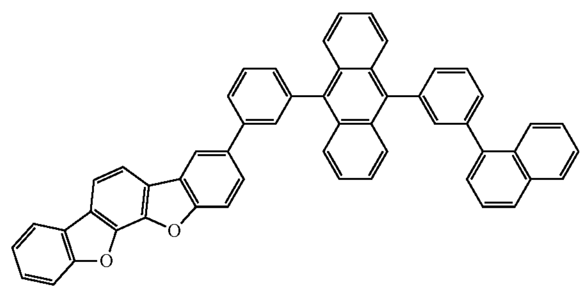
H88
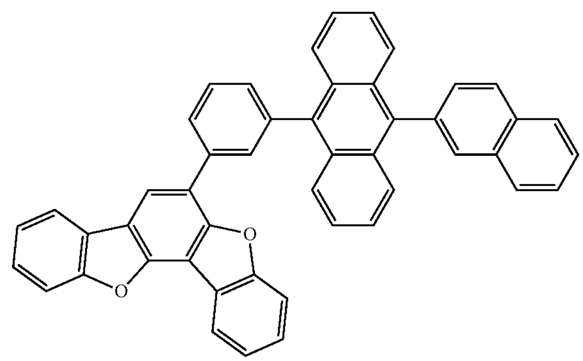

-continued
H89
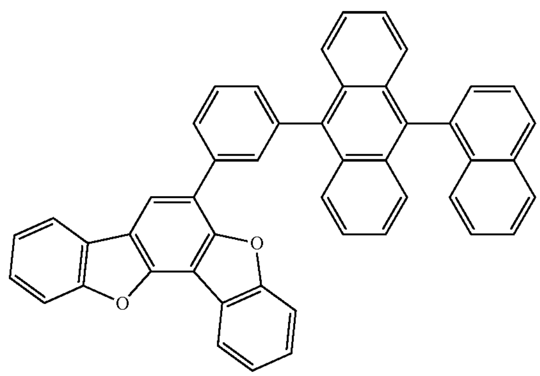
H90
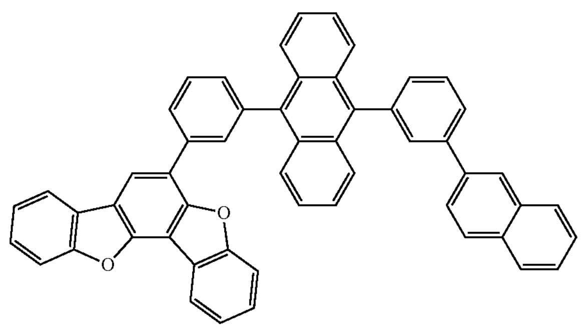
H91
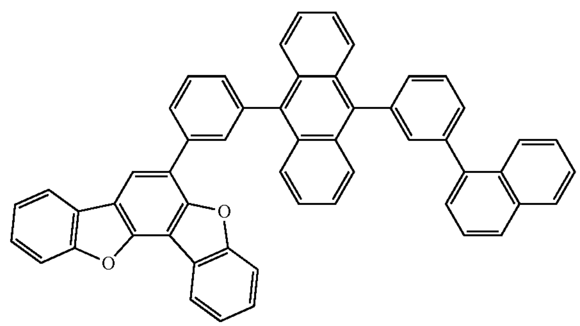
H92
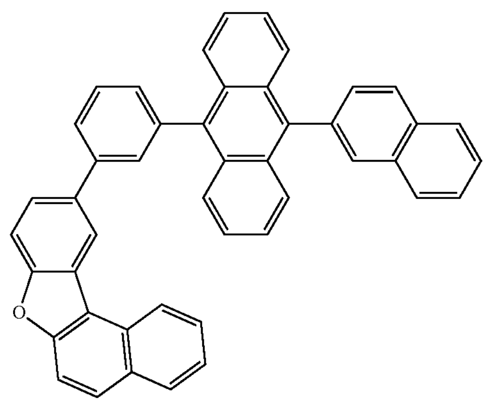
-continued
H93
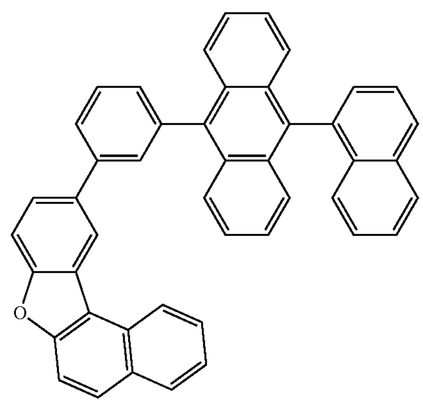
H94
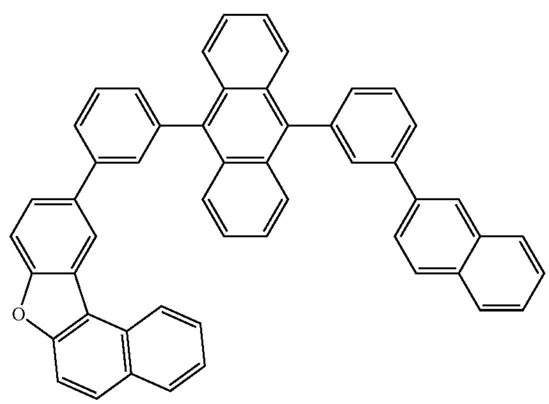
H95
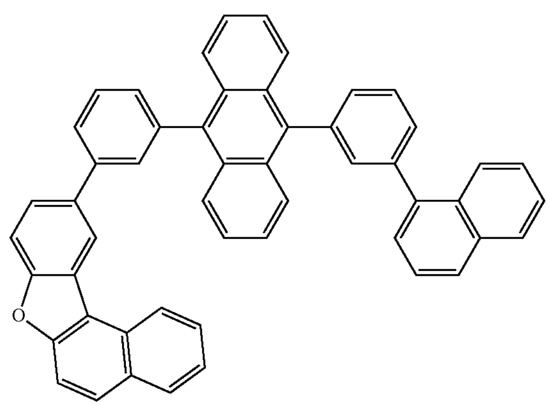
H96
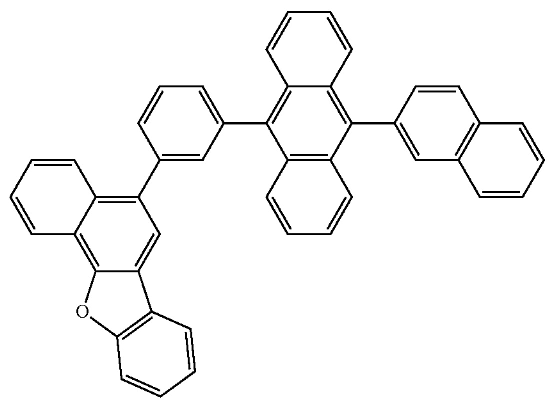

-continued
H97
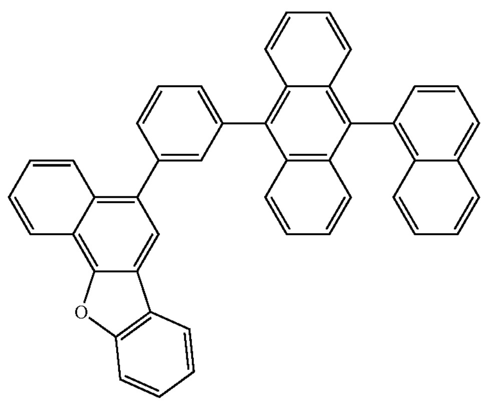
H98
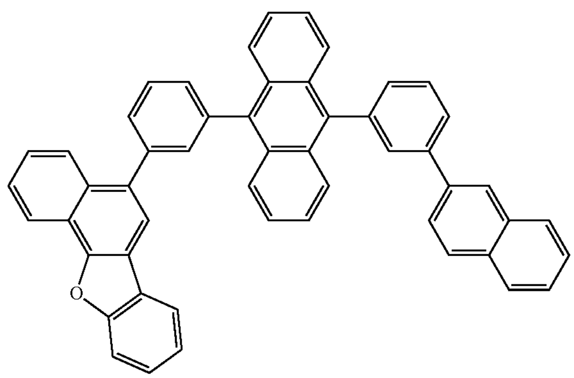
H99
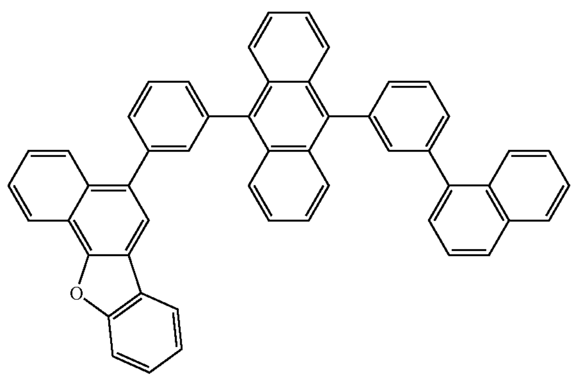
H100
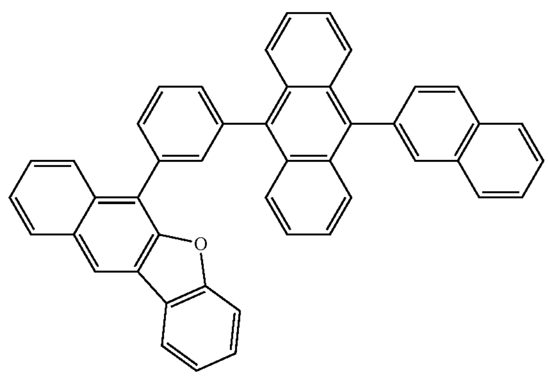
-continued
H101
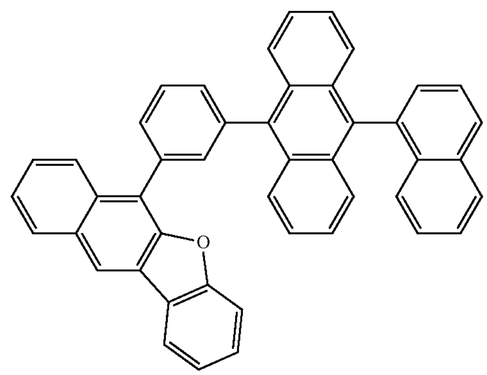
H102
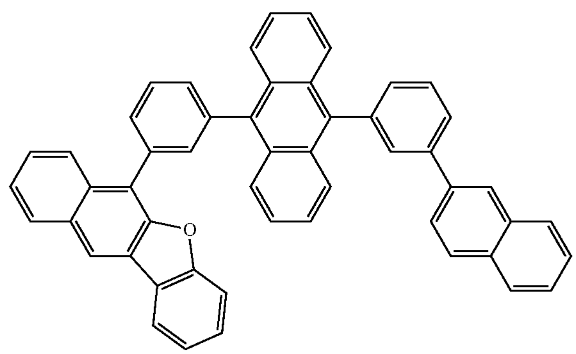
H103
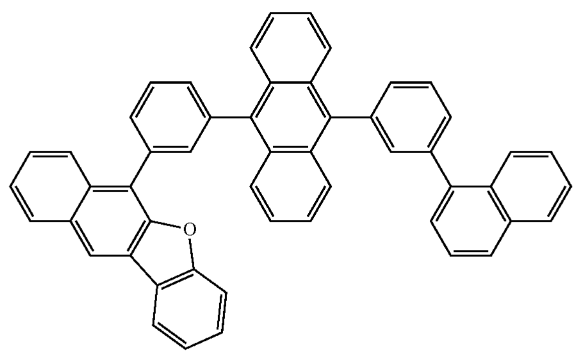
H104
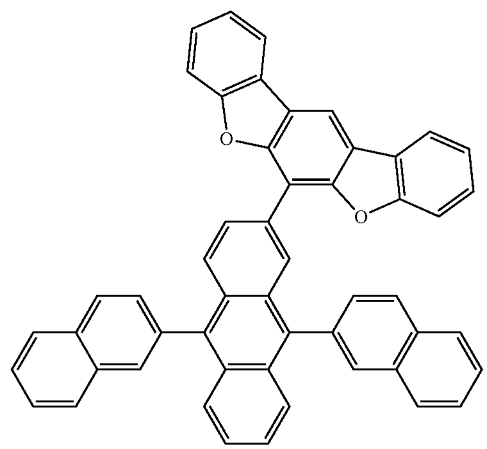

-continued
H105
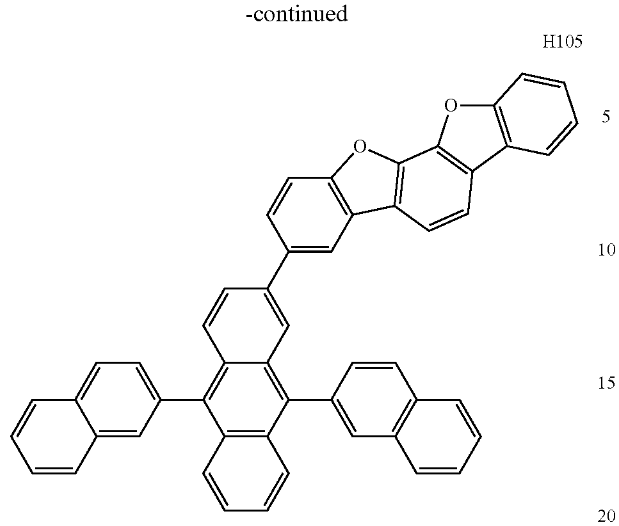
H106
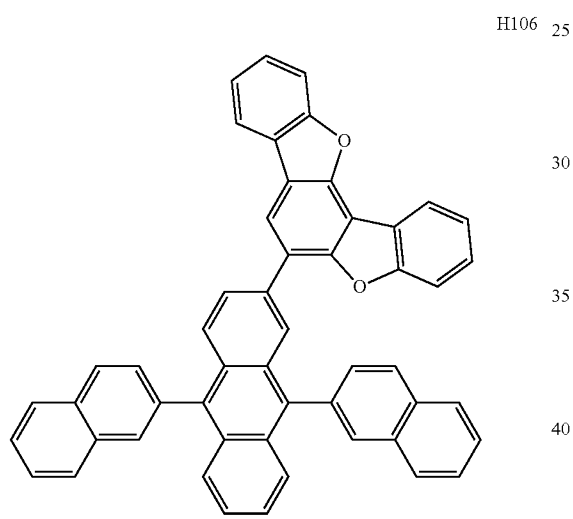
H107
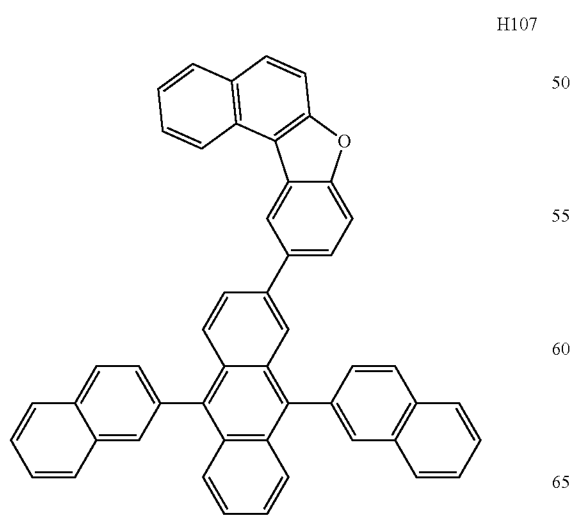
-continued
H108
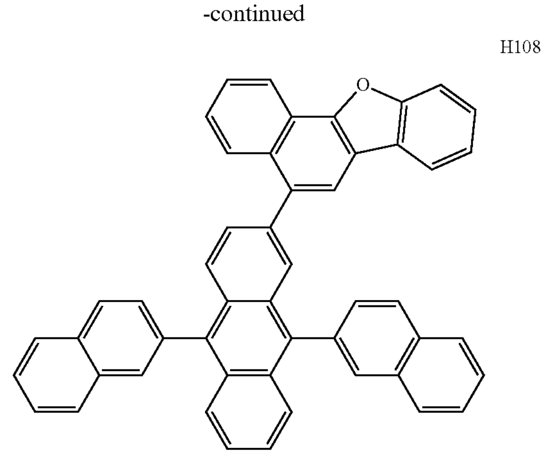
H109
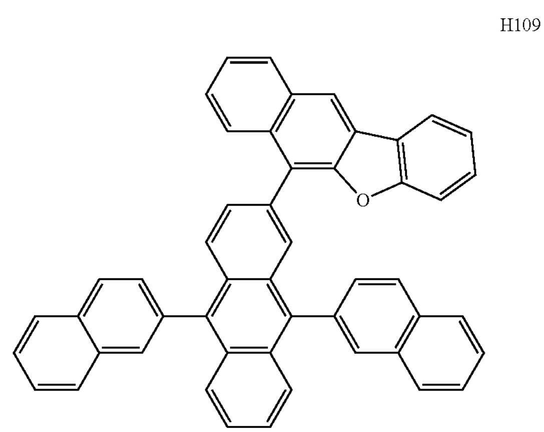
H110
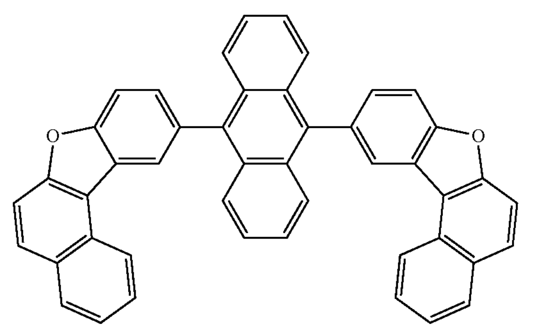
H111
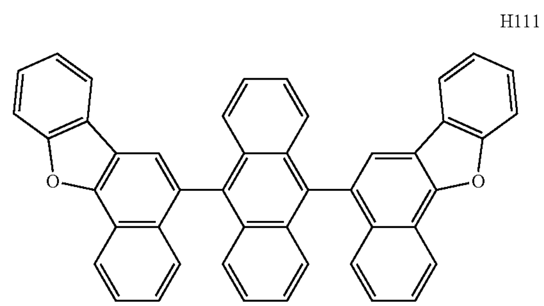

-continued
H112
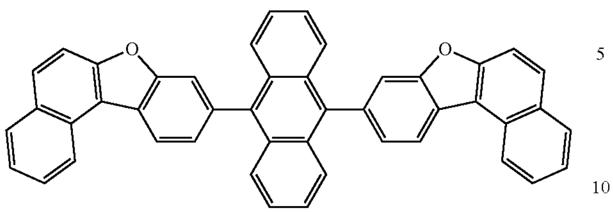
H113
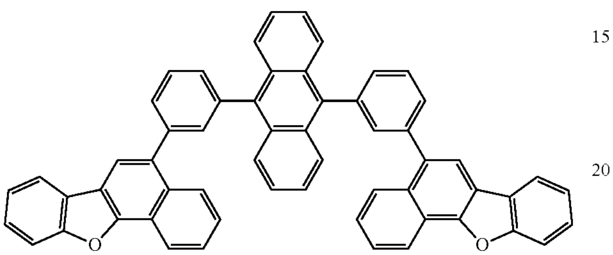
H114
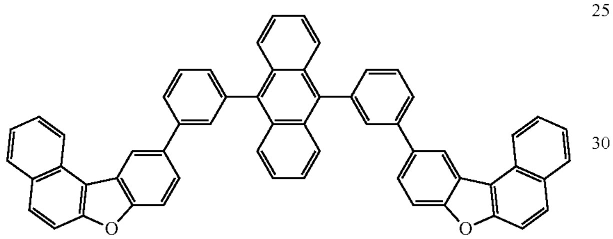
H115
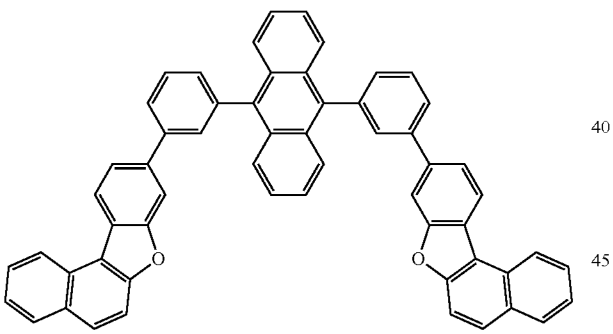
H116
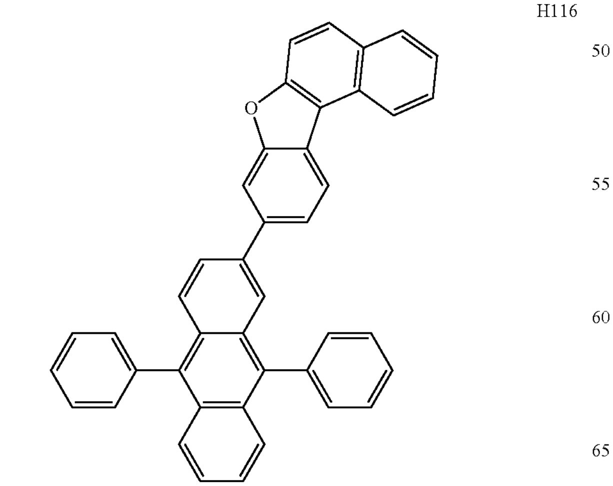
-continued
H117
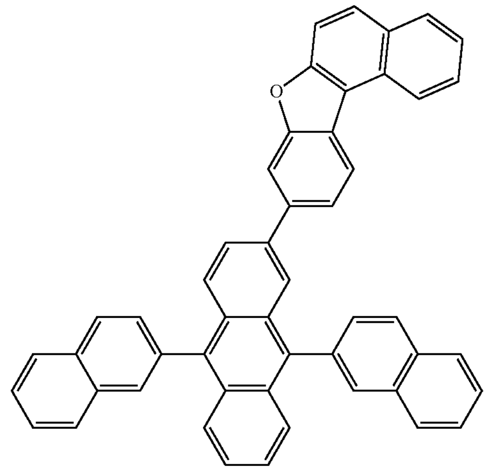
H118
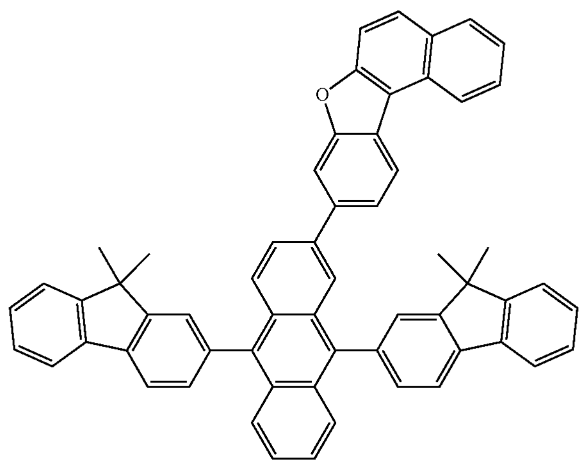
H119
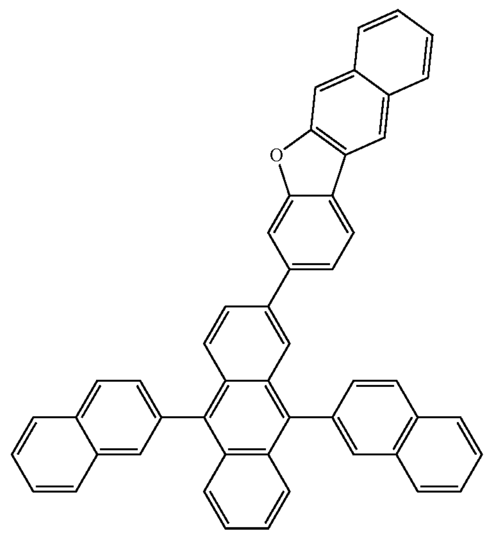

H120
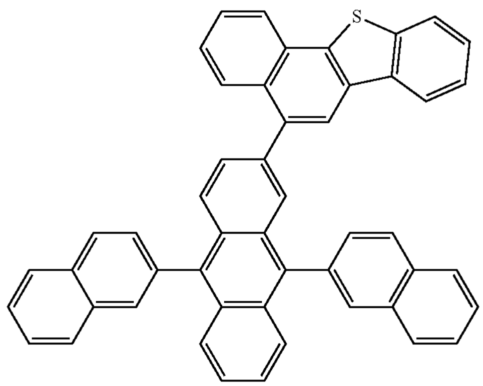
H121
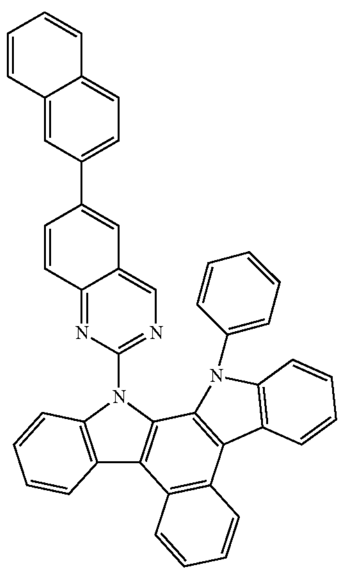
H122
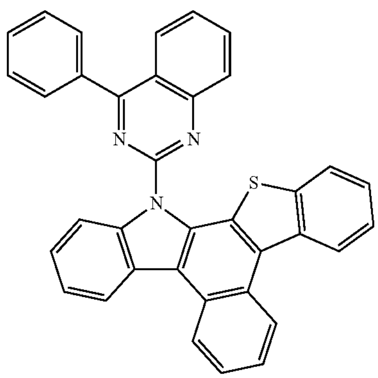
H123
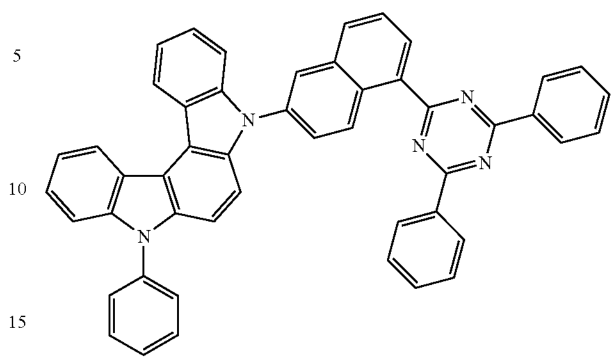
H124
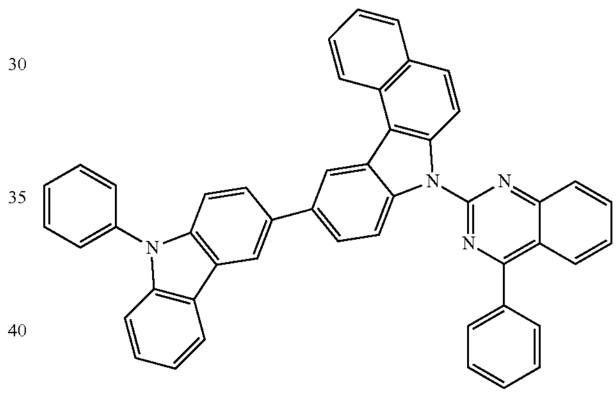
H125
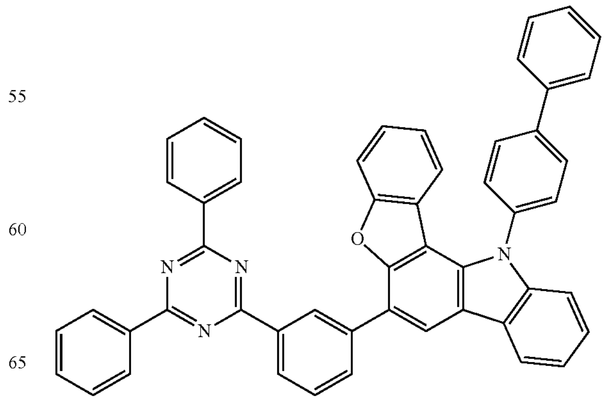

-continued

H126

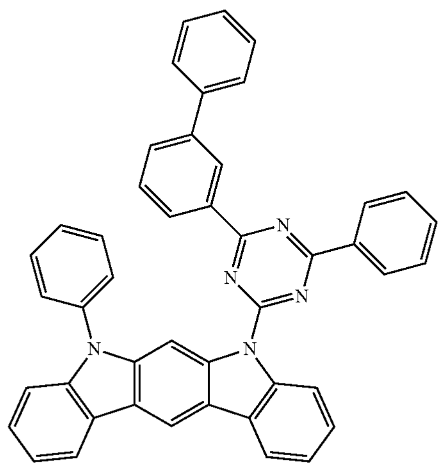

H127

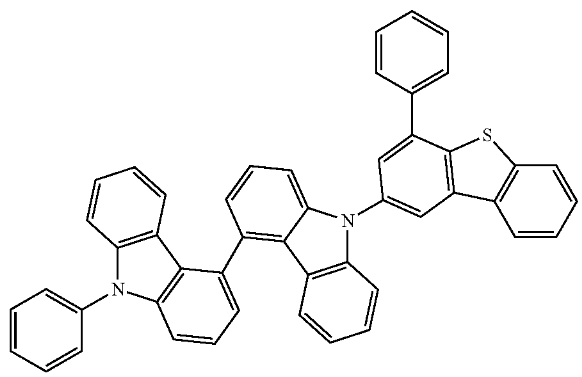

H128

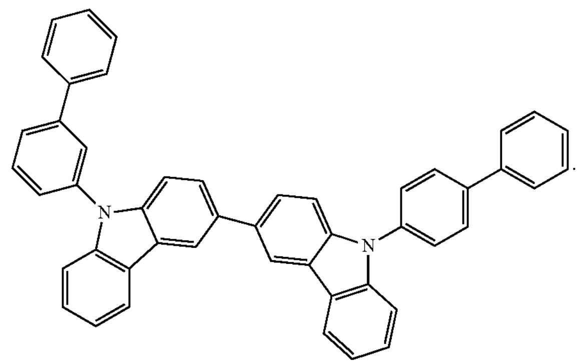

[Phosphorescent Dopant]

In the light-emitting device according to an embodiment, the emission layer may further include a phosphorescent dopant in addition to the organometallic compound represented by Formula 1.

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In an embodiment, the phosphorescent dopant may include an organometallic compound represented by Formula 401:

[Formula 401]

$M(L_{401})_{xc1}(L_{402})_{xc2}$

[Formula 402]

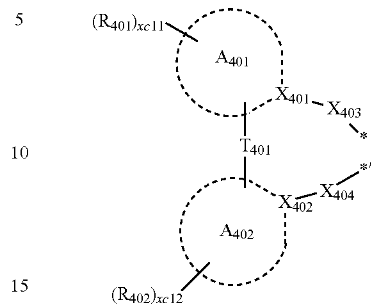

In Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is two or more, two or more $L_{401}$(s) may be identical to or different from each other, $L_{402}$ may be an organic ligand, and xc2 may be 0, 1, 2, 3, or 4, wherein when xc2 is 2 or more, two or more $L_{402}$(s) may be identical to or different from each other, $X_{401}$ and $X_{402}$ may each independently be nitrogen or carbon, rings $A_{401}$ and $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C=*', $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group that is unsubstituted or substituted with at least one $R_{10a}$, a $C_1$-$C_{20}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described in connection with $Q_1$, xc11 and xc12 may each independently be an integer from 0 to 10, and

* and *' in Formula 402 may each indicate a binding site to M in Formula 401.

In an embodiment, in Formula 402, $X_{401}$ may be nitrogen and $X_{402}$ may be carbon, or $X_{401}$ and $X_{402}$ may each be nitrogen.

In an embodiment, in Formula 401, when xc1 is 2 or more, two ring $A_{401}$ in two or more $L_{401}$(s) may be optionally linked to each other via $T_{402}$, which is a linking group, and two ring $A_{402}$ may optionally be linked to each other via $T_{403}$, which is a linking group (see Compounds PD1 to PD4 and PD7). $T_{402}$ and $T_{403}$ may each independently be the same as described in connection with $T_{401}$.

In Formula 401, $L_{402}$ may be an organic ligand. In an embodiment, $L_{402}$ may include a halogen group, a diketone group (for example, an acetylacetonate group), a carboxylic acid group (for example, a picolinate group), —C(═O), an isonitrile group, —CN group, a phosphorus group (for example, a phosphine group, a phosphite group, etc.), or any combination thereof.

The phosphorescent dopant may include, for example, one of Compounds PD1 to PD39, or any combination thereof:

PD1

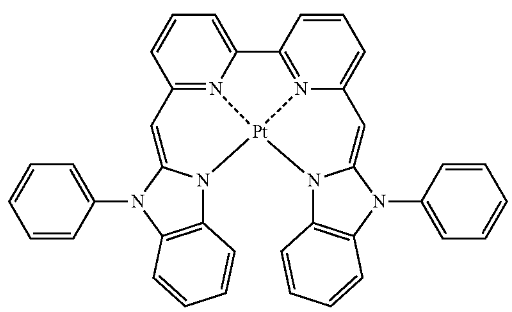

PD2

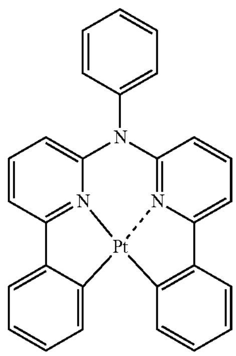

PD3

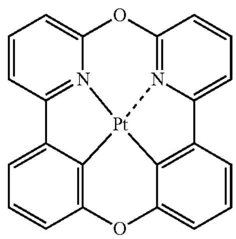

PD4

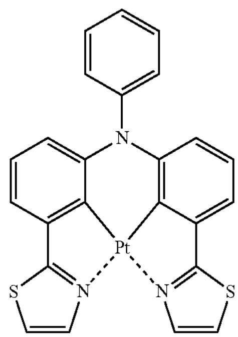

-continued

PD5

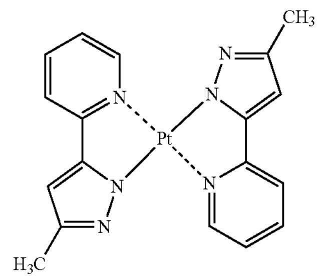

PD6

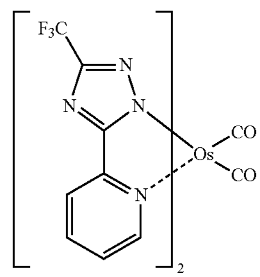

PD7

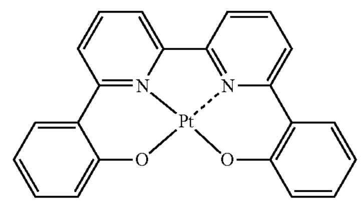

PD8

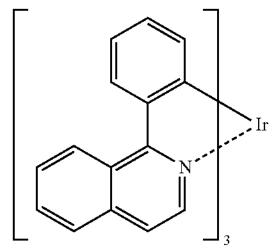

PD9

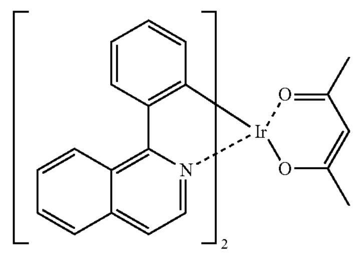

PD10

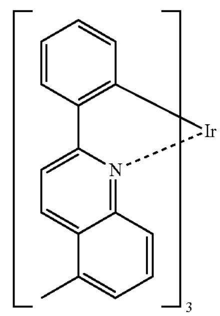

-continued
PD11
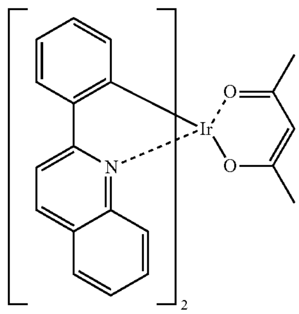
PD12
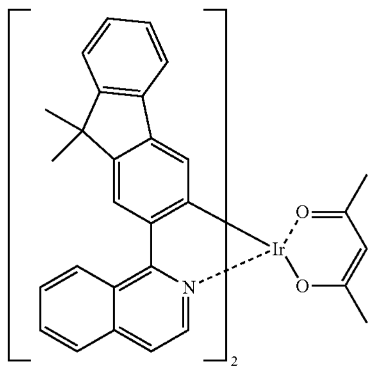
PD13
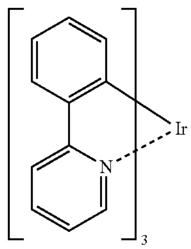
PD14
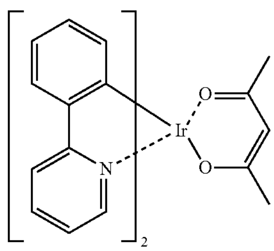
PD15
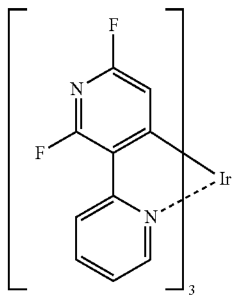
-continued
PD16
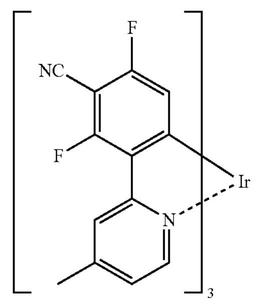
PD17
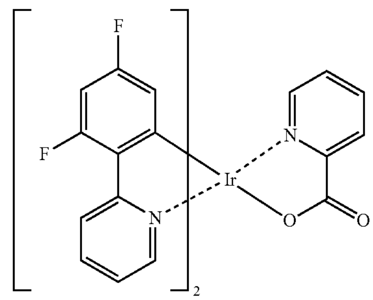
PD18
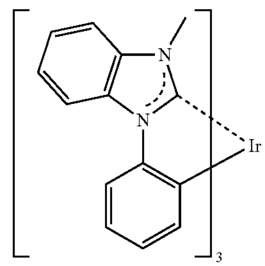
PD19
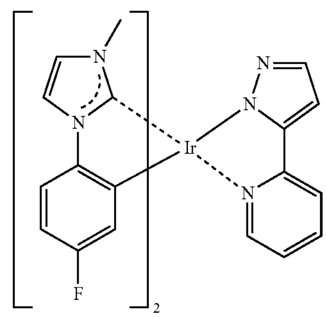
PD20
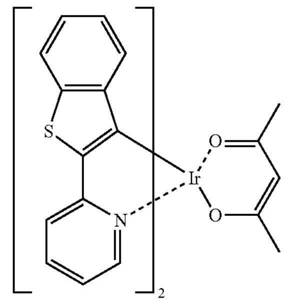

PD21
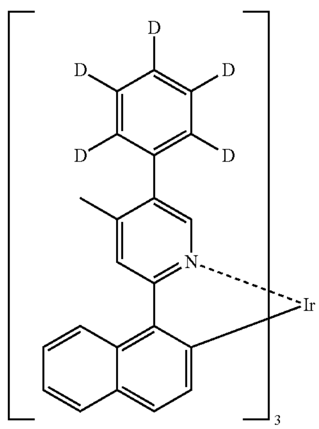
PD22
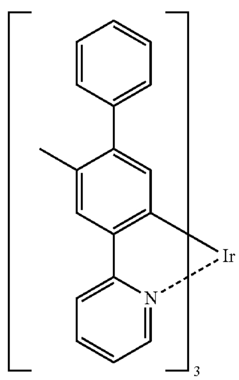
PD23
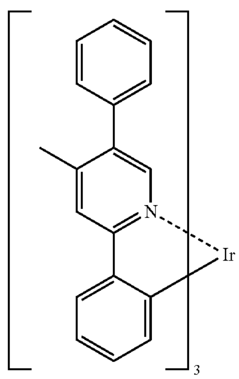
PD24
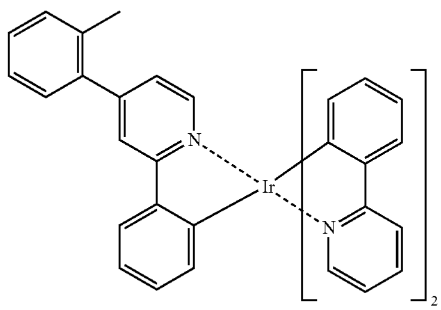
PD25
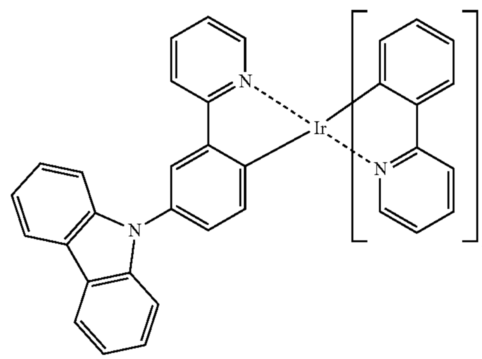
PD26
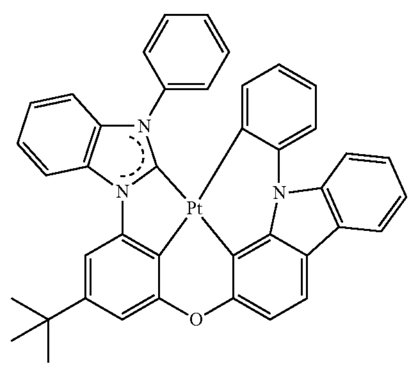
PD27
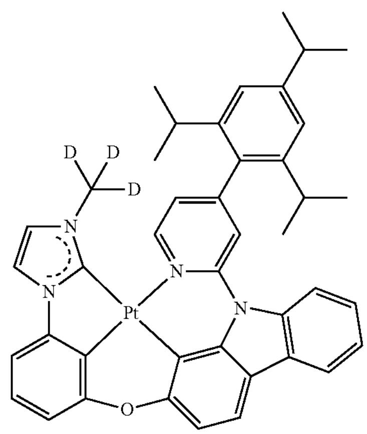
PD28
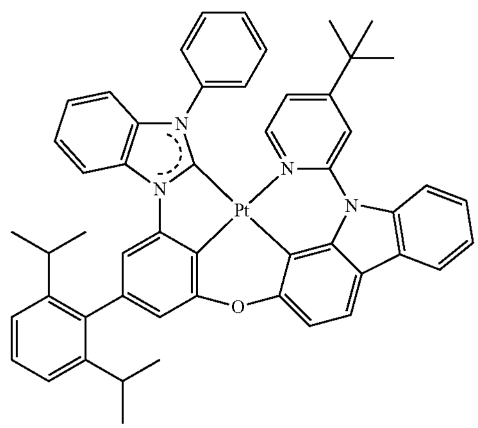

-continued
PD29
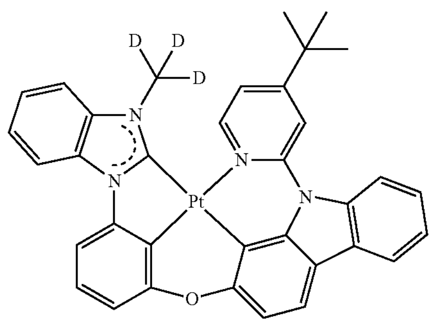
PD30
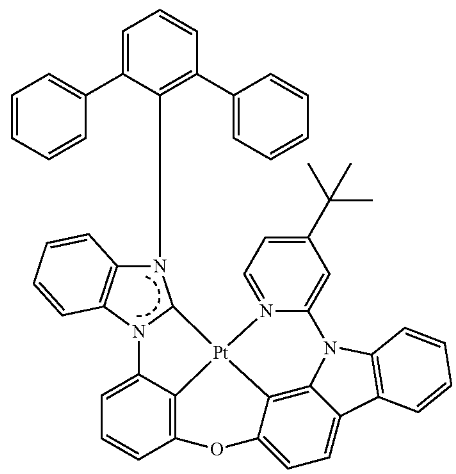
PD31
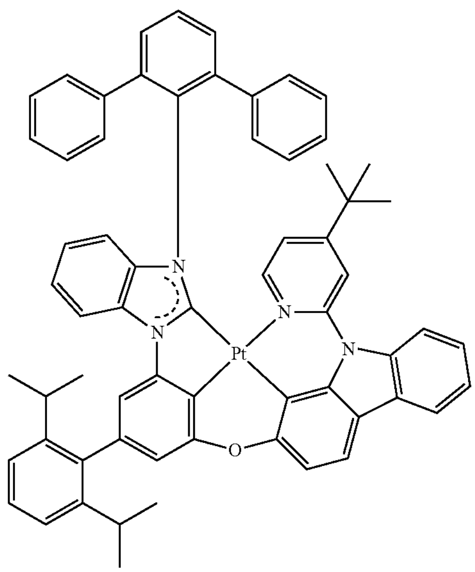
-continued
PD32
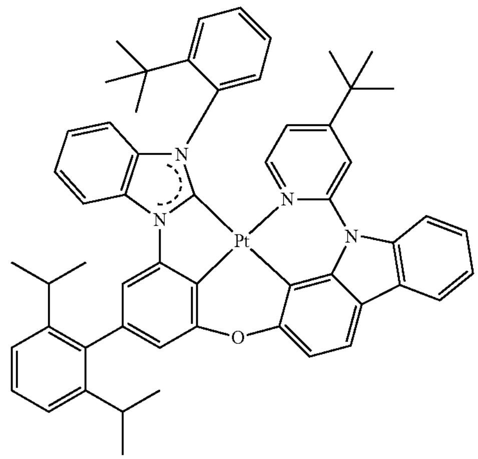
PD33
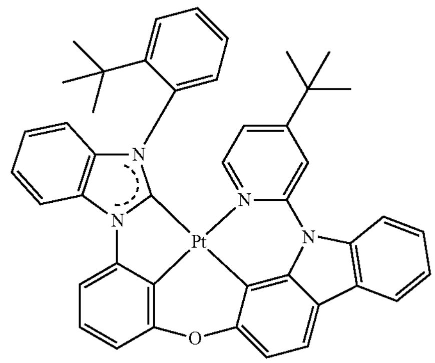
PD34

-continued

PD35

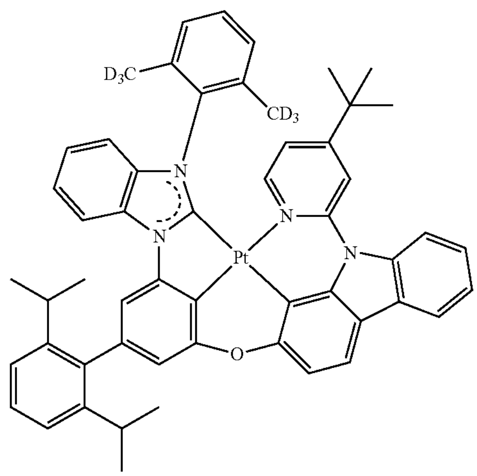

PD36

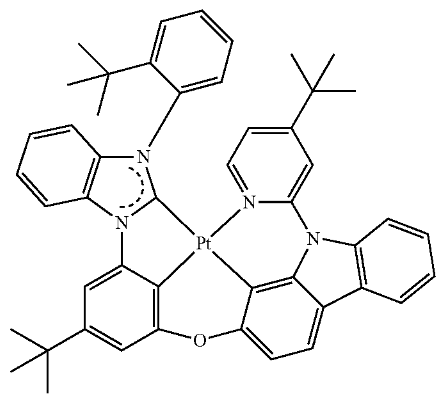

PD37

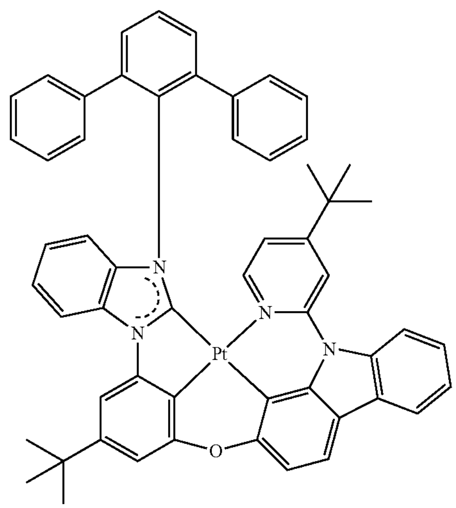

-continued

PD38

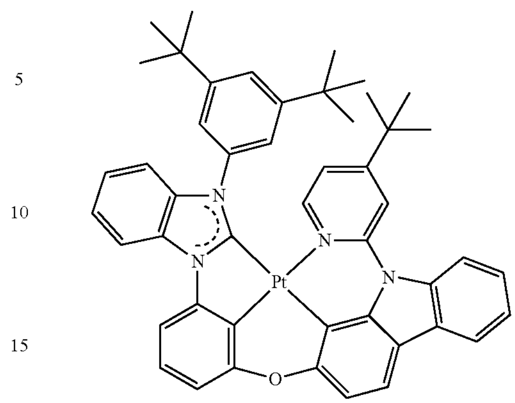

PD39

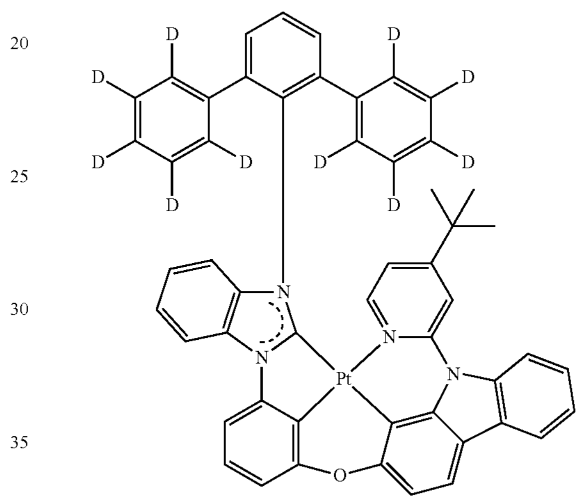

[Fluorescent Dopant]

In the light-emitting device according to an embodiment, the emission layer may further include a fluorescent dopant in addition to the organometallic compound represented by Formula 1.

The fluorescent dopant may include an amine group-containing compound, a styryl group-containing compound, or any combination thereof.

In an embodiment, the fluorescent dopant may include a compound represented by Formula 501:

[Formula 501]

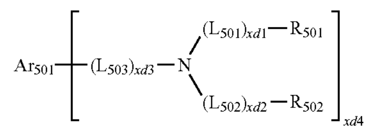

In Formula 501, $Ar_{501}$, $L_{501}$ to $L_{503}$, $R_{501}$, and $R_{502}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, xd1 to xd3 may each independently be 0, 1, 2, or 3, and xd4 may be 1, 2, 3, 4, 5, or 6.

In an embodiment, in Formula 501, $Ar_{501}$ may be a condensed cyclic group (for example, an anthracene group, a chrysene group, or a pyrene group) in which three or more monocyclic groups are condensed together.

In an embodiment, in Formula 501, xd4 may be 2.
In an embodiment, the fluorescent dopant may include one of Compounds FD1 to FD37, DPVBi, DPAVBi, or any combination thereof:
FD1
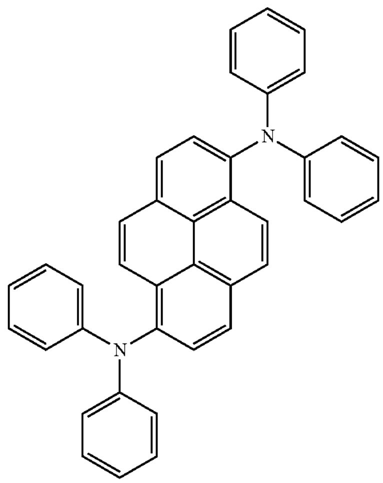
FD2
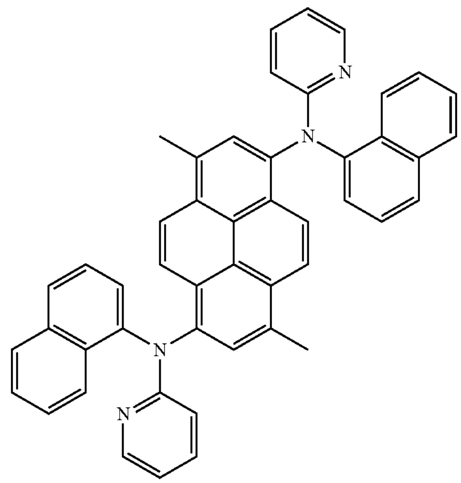
FD3
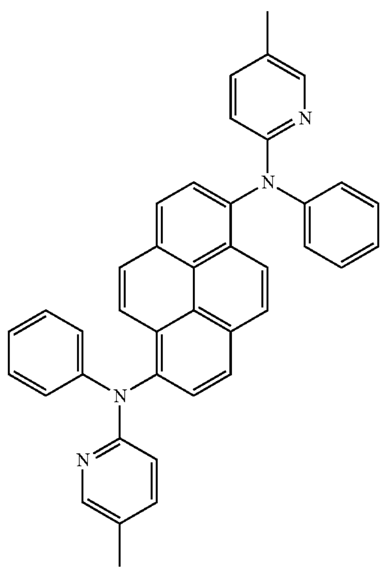
FD4
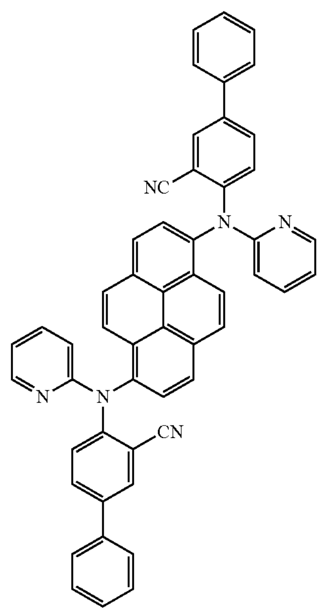
FD5
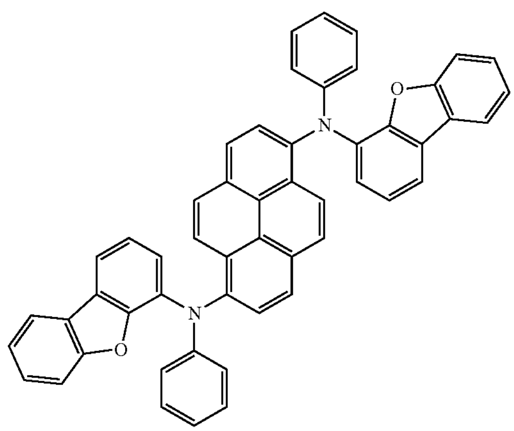
FD6
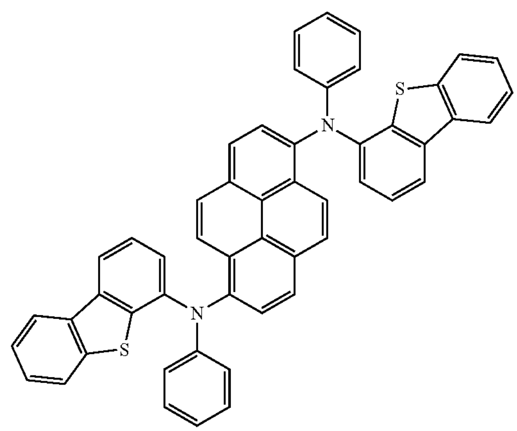

-continued
FD7
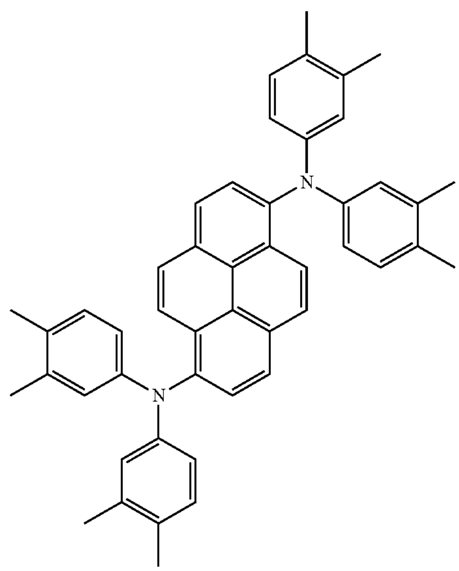
FD8
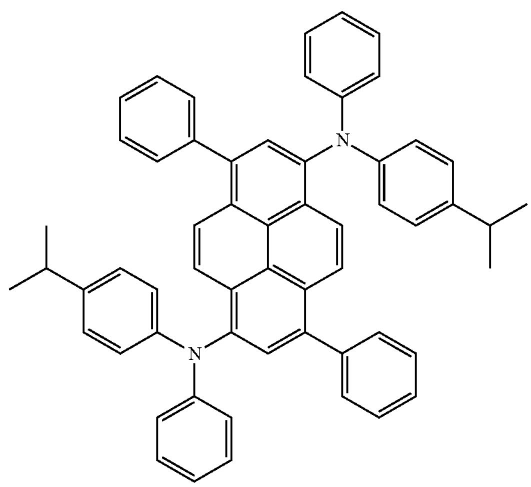
FD9
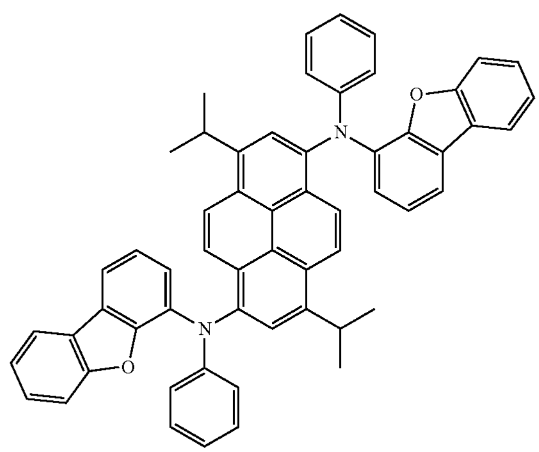
FD10
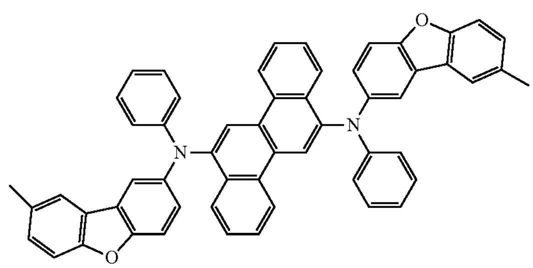
FD11
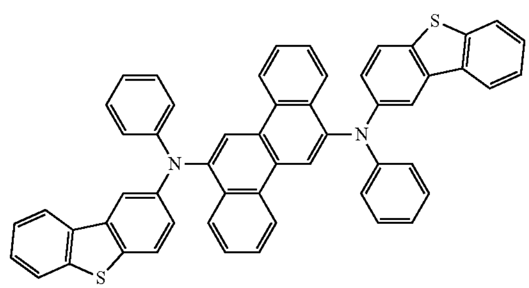
FD12
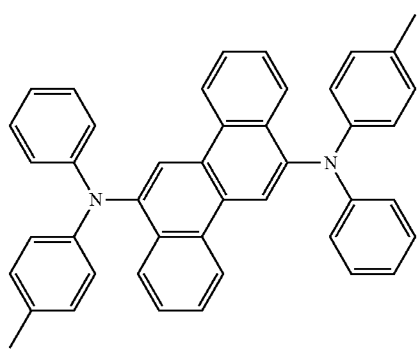

-continued
FD13
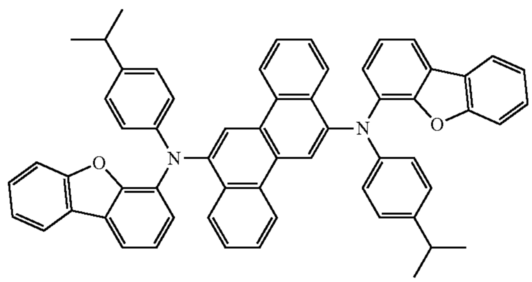
FD14
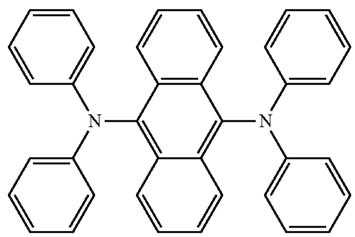
FD15
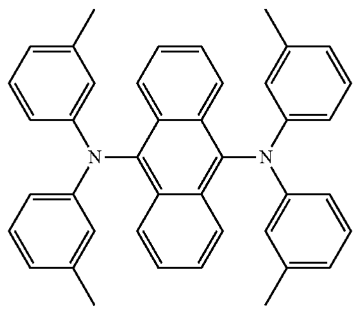
FD16
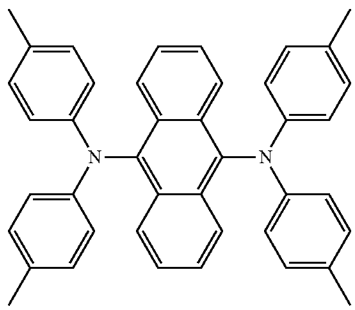
FD17
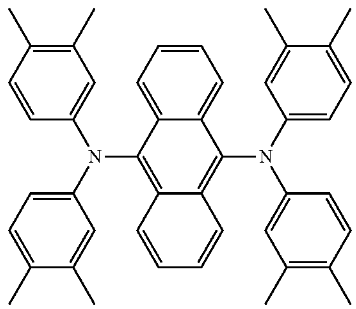
FD18
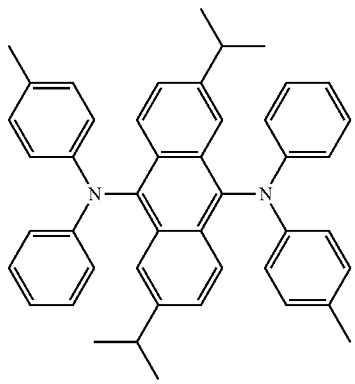
FD19
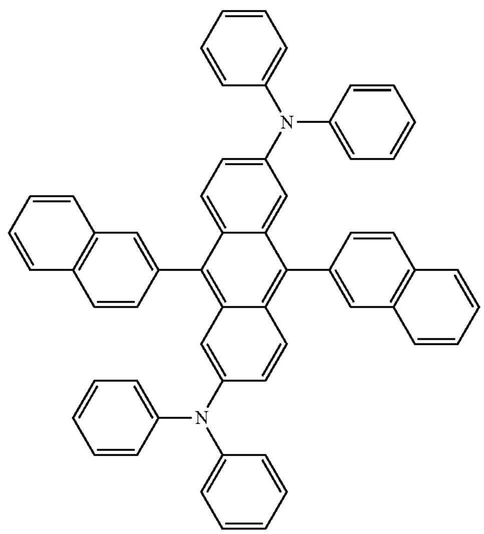
FD20
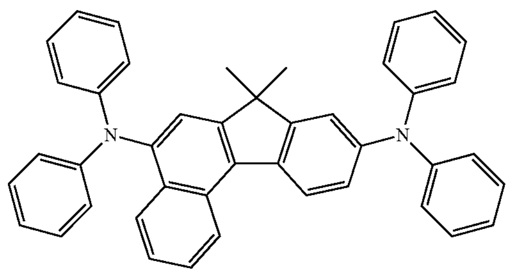

-continued
FD21
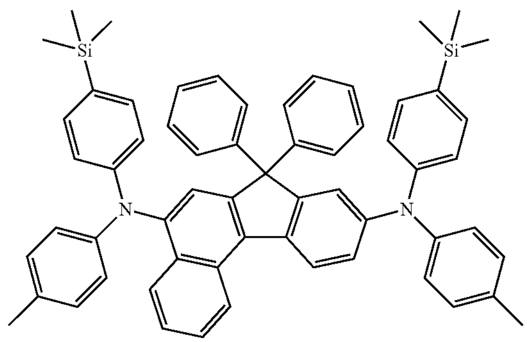
FD22
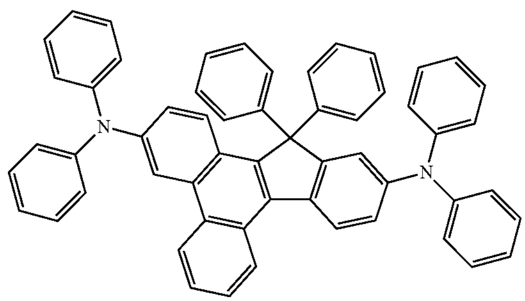
FD23
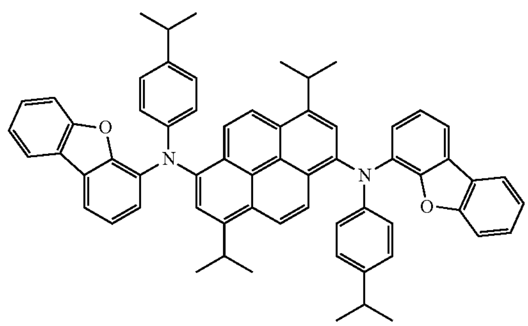
FD24
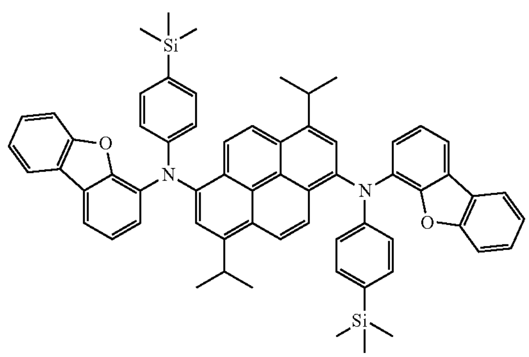
FD25
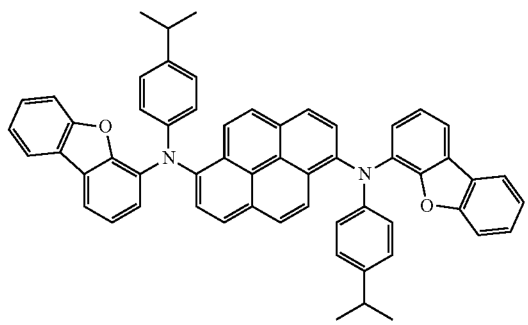
FD26
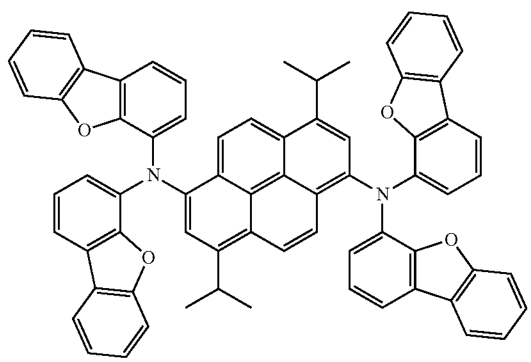
FD27
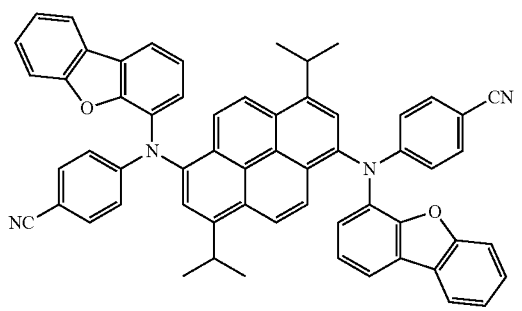
FD28
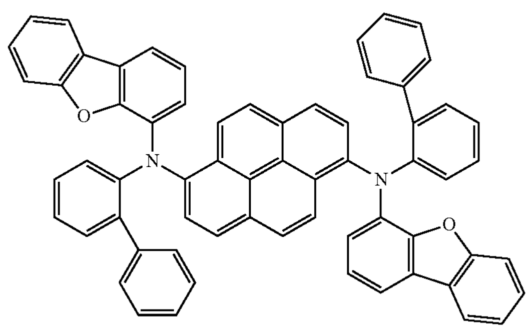

-continued
FD29
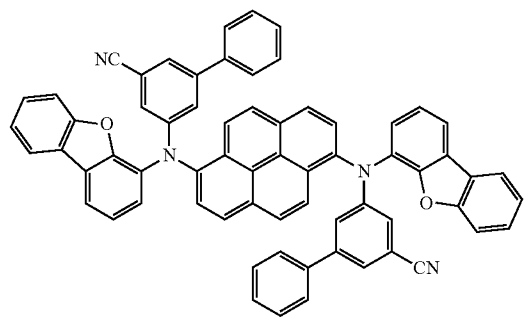
FD30
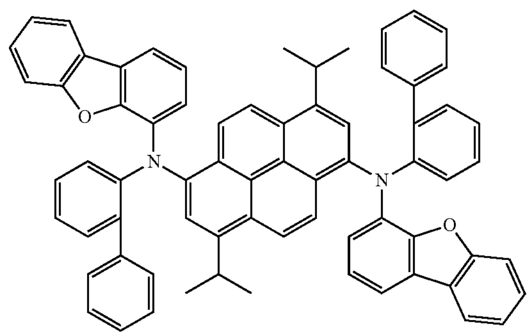
FD31
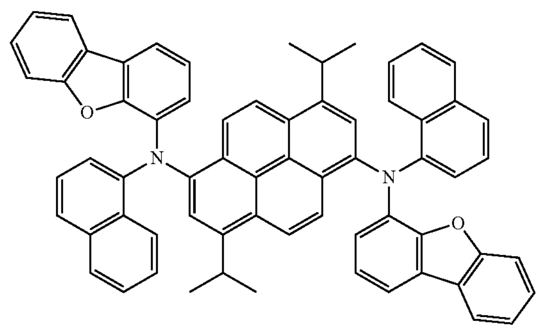
FD32
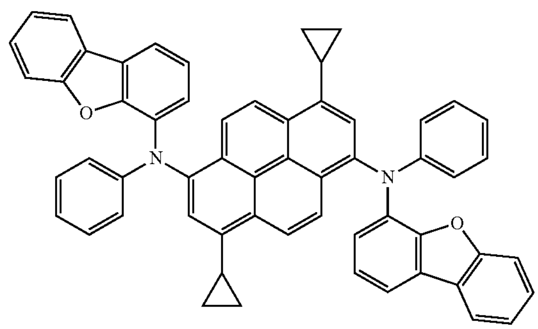
FD33
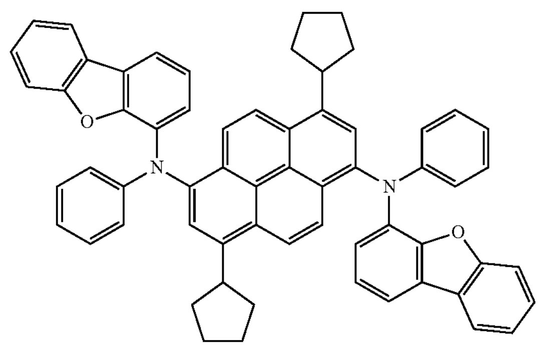
FD34
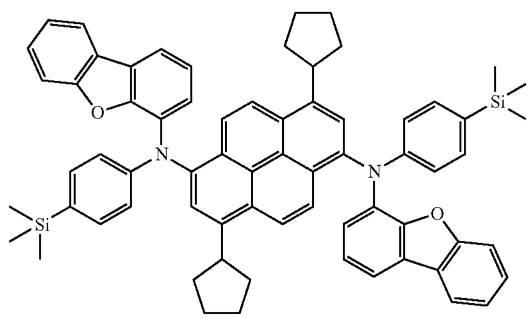
FD35
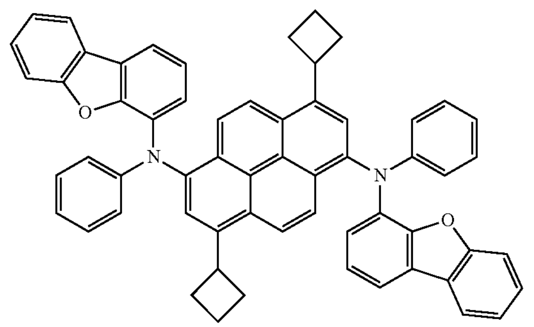
FD36
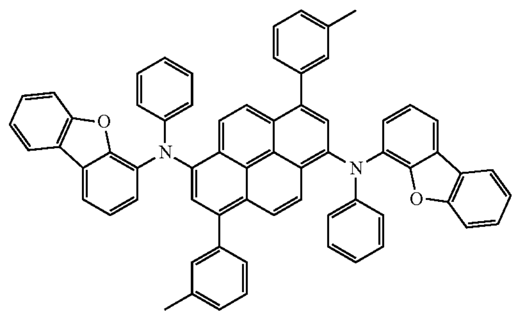

-continued

FD37

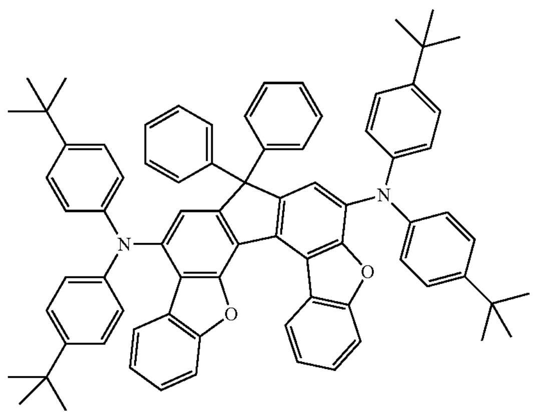

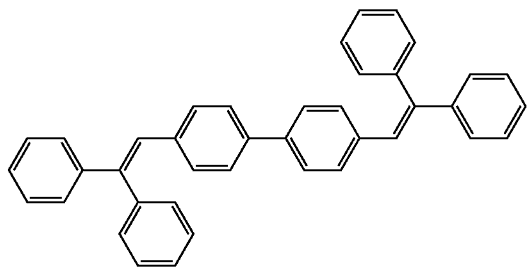

DPVBi

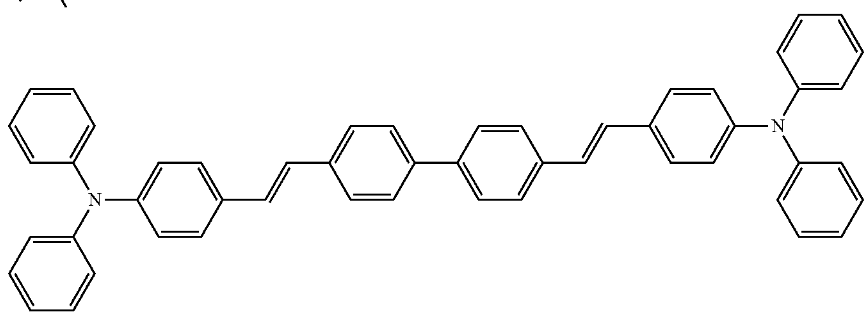

DPAVBi

[Delayed Fluorescence Material]

In the light-emitting device according to an embodiment, the emission layer may further include a delayed fluorescence material in addition to the organometallic compound represented by Formula 1.

The emission layer may include a delayed fluorescence material.

In the specification, the delayed fluorescence material may be selected from compounds capable of emitting delayed fluorescence based on a delayed fluorescence emission mechanism.

The delayed fluorescence material included in the emission layer may serve as a host or as a dopant, depending on the type of other materials included in the emission layer.

In an embodiment, a difference between a triplet energy level (eV) of the delayed fluorescence material and a singlet energy level (eV) of the delayed fluorescence material may be in a range of about 0 eV to about 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence material may effectively occur, and thus, the luminescence efficiency of the light-emitting device 10 may be improved.

In an embodiment, the delayed fluorescence material may include: a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group); or the delayed fluorescence material may include a material including a $C_8$-$C_{60}$ polycyclic group in which two or more cyclic groups are condensed while sharing boron (B).

Examples of the delayed fluorescence material may include at least one of Compounds DF1 to DF14:

DF1

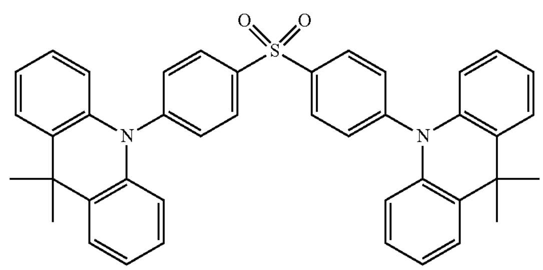

(DMAC-DPS)

DF2

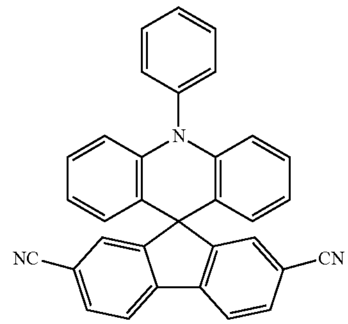

(ACRFLCN)

-continued
DF3
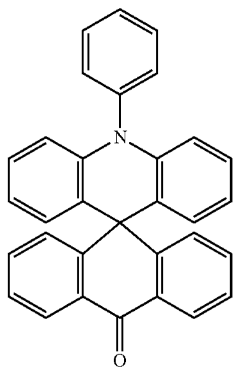
(ACRSA)
DF4
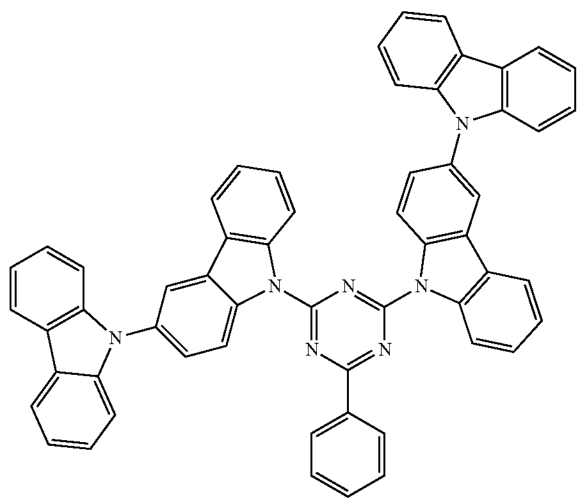
(CC2TA)
DF5
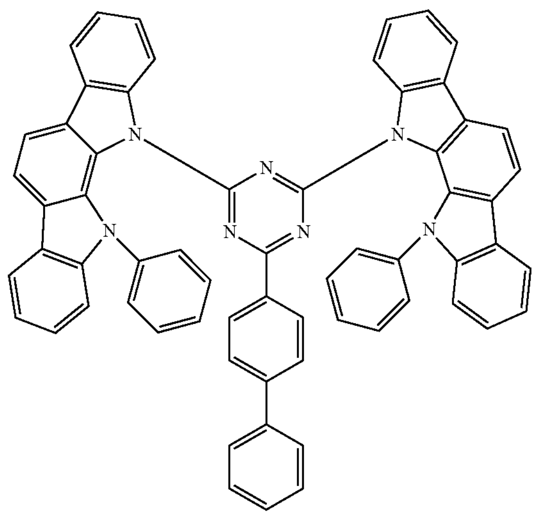
(PIC-TRZ)
-continued
DF6
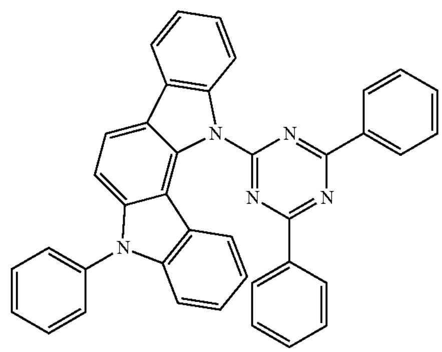
(PIC-TRZ2)
DF7
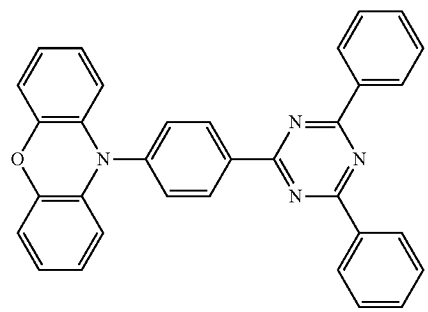
(PXZ-TRZ)
DF8
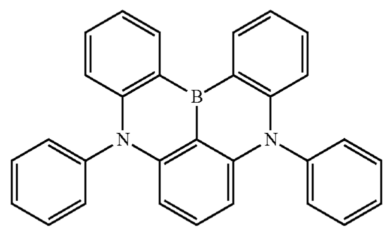
(DABNA-1)
DF9
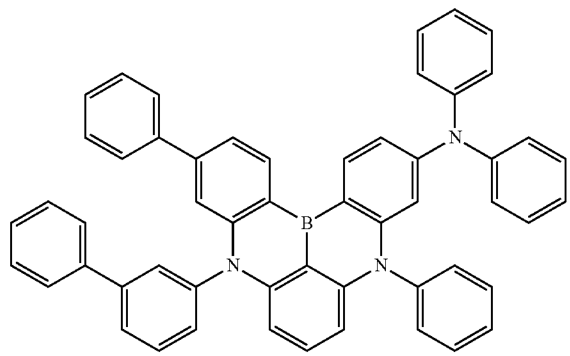
(DABNA-2)

-continued

DF10

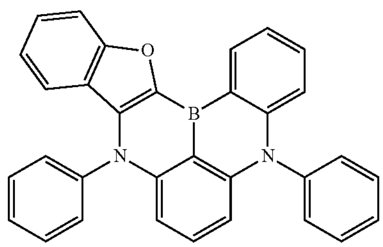

DF11

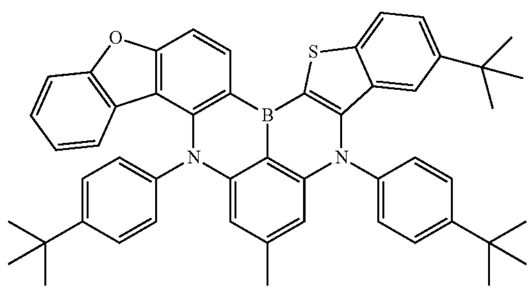

DF12

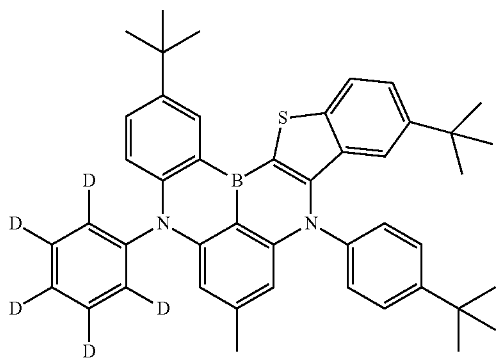

DF13

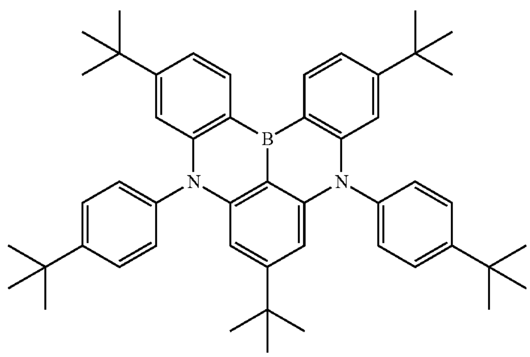

-continued

DF14

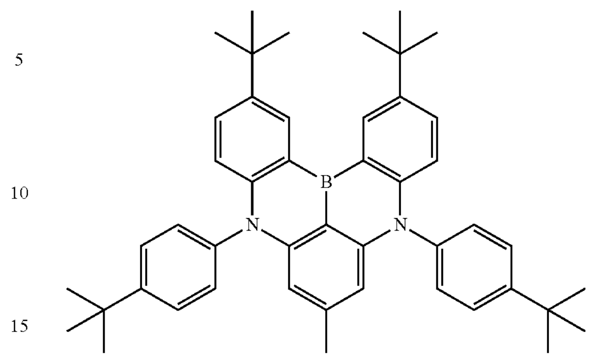

[Quantum Dot]

The emission layer may further include a quantum dot.

In the specification, a quantum dot may be a crystal of a semiconductor compound, and may include any material capable of emitting light of various emission wavelengths according to a size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

According to the wet chemical process, a precursor material is mixed with an organic solvent to grow a quantum dot particle crystal. As the crystal grows, the organic solvent naturally acts as a dispersant coordinated on the surface of the quantum dot crystal and controls the growth of the crystal so that the growth of quantum dot particles may be controlled through a process which may be more readily performed than vapor deposition methods, such as metal organic chemical vapor deposition (MOCVD) or molecular beam epitaxy (MBE), and which has a lower cost.

The quantum dot may include a Group II-VI semiconductor compound, a Group III-V semiconductor compound, a Group III-VI semiconductor compound, a Group I-III-VI semiconductor compound, a Group IV-VI semiconductor compound, a Group IV element or compound, or any combination thereof.

Examples of the Group II-VI semiconductor compound may include: a binary compound, such as CdS, CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the Group III-V semiconductor compound may include: a binary compound, such as GaN, GaP, GaAs, GaSb, AlN, AlP, AlAs, AlSb, InN, InP, InAs, or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. In an embodiment, the Group III-V semiconductor compound may further include a Group II element. Examples of the Group III-V semiconductor compound further including a Group II element may include InZnP, InGaZnP, InAlZnP, and the like.

Examples of the Group III-VI semiconductor compound may include: a binary compound, such GaS, GaSe, $Ga_2Se_3$, GaTe, InS, InSe, $In_2S_3$, $In_2Se_3$, or InTe; a ternary compound, such as $InGaS_3$, or $InGaSe_3$; or any combination thereof.

Examples of the Group I-III-VI semiconductor compound may include: a ternary compound, such as AgInS, $AgInS_2$, CuInS, $CuInS_2$, $CuGaO_2$, $AgGaO_2$, or $AgAlO_2$; or any combination thereof.

Examples of the Group IV-VI semiconductor compound may include: a binary compound, such as SnS, SnSe, SnTe, PbS, PbSe, PbTe, or the like; a ternary compound, such as SnSeS, SnSeTe, SnSTe, PbSeS, PbSeTe, PbSTe, SnPbS, SnPbSe, SnPbTe, or the like; a quaternary compound, such as SnPbSSe, SnPbSeTe, SnPbSTe, or the like; or any combination thereof.

Examples of the Group IV element or compound may include: a single element material, such as Si or Ge; a binary compound, such as SiC or SiGe; or any combination thereof.

Each element included in a multi-element compound such as a binary compound, a ternary compound, or a quaternary compound, may exist in a particle at a uniform concentration or at a non-uniform concentration.

In an embodiment, the quantum dot may have a single structure or a core-shell structure. In case that the quantum dot has a single structure, the concentration of each element included in the quantum dot may be uniform. In an embodiment, in case that the quantum dot has a core-shell structure, a material included in the core and a material included in the shell may be different from each other.

The shell of the quantum dot may serve as a protective layer to prevent chemical degeneration of the core to maintain semiconductor characteristics and/or may serve as a charging layer to impart electrophoretic characteristics to the quantum dot. The shell may be a single layer or a multilayer. A material that is present at an interface between the core and the shell of the quantum dot may have a concentration gradient wherein the concentration of the material decreases toward the center of the quantum dot.

Examples of the material forming the shell of the quantum dot may include a metal oxide, a metalloid oxide, a nonmetal oxide, a semiconductor compound, or any combination thereof. Examples of the metal oxide, the metalloid oxide, or the non-metal oxide may include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; or any combination thereof. Examples of the semiconductor compound may include, as described herein, a Group II-VI semiconductor compound, a Group III-V semiconductor compound, a Group III-VI semiconductor compound, a Group I-III-VI semiconductor compound, a Group IV-VI semiconductor compound, or any combination thereof. Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be equal to or less than about 45 nm. For example, a FWHM of an emission wavelength spectrum of the quantum dot may be equal to or less than about 40 nm. For example, a FWHM of an emission wavelength spectrum of the quantum dot may be equal to or less than about 30 nm. Within these ranges, color purity or color reproducibility may be increased. Light emitted through the quantum dot may be emitted in all directions, so that a wide viewing angle may be improved.

In embodiments, the quantum dot may be a spherical particle, a pyramidal particle, a multi-arm particle, a cubic nanoparticle, a nanotube particle, a nanowire particle, a nanofiber particle, or a nanoplate particle.

Because the energy band gap may be adjusted by controlling the size of the quantum dot, light having various wavelength bands may be obtained from the quantum dot emission layer. Therefore, by utilizing quantum dots of different sizes, a light-emitting device that emits light of various wavelengths may be implemented. In an embodiment, the size of the quantum dot may be selected to emit red light, green light, and/or blue light. In an embodiment, the size of the quantum dot may be configured to emit white light by combining light of various colors.

[Electron Transport Region in Interlayer 130]

The electron transport region may have a structure consisting of a layer consisting of a single material, a structure consisting of a layer including different materials, or a structure including multiple layers including different materials.

The electron transport region may include a buffer layer, a hole blocking layer, an electron control layer, an electron transport layer, an electron injection layer, or any combination thereof.

In an embodiment, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein the layers of each structure may be stacked from an emission layer in its respective stated order, but the structure of the electron transport region is not limited thereto.

In an embodiment, the electron transport region (for example, the buffer layer, the hole blocking layer, the electron control layer, or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601:

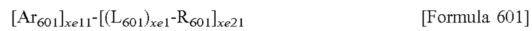

$$[Ar_{601}]_{xe11}\text{-}[(L_{601})_{xe1}\text{-}R_{601}]_{xe21} \quad \text{[Formula 601]}$$

In Formula 601, $Ar_{601}$ and $L_{601}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ may each independently be the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group that is unsubstituted or substituted with at least one $R_{10a}$.

In an embodiment, in Formula 601, when xe11 is 2 or more, two or more $Ar_{601}$(s) may be linked to each other via a single bond.

In an embodiment, in Formula 601, $Ar_{601}$ may be a substituted or unsubstituted anthracene group.

In an embodiment, the electron transport region may include a compound represented by Formula 601-1:

[Formula 601-1]

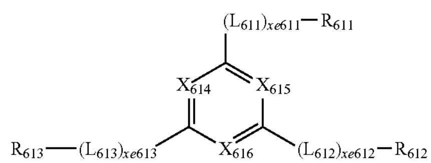

In Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may each be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$.

In an embodiment, in Formulae 601 and 601-1, xe1 and xe611 to xe613 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

ET1

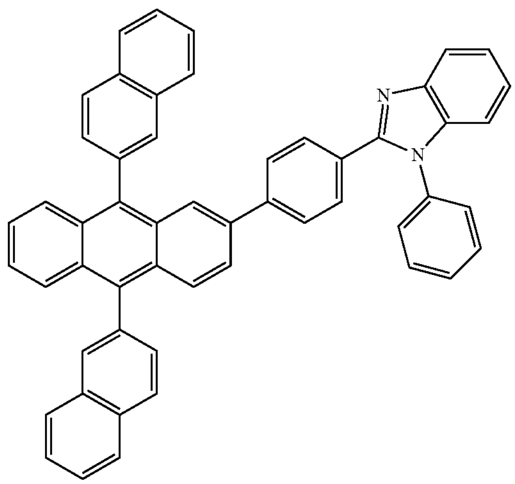

-continued

ET2

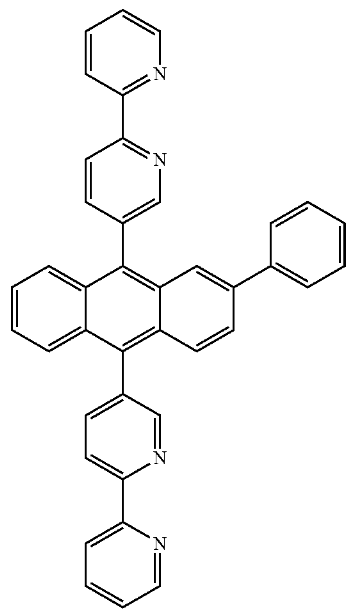

ET3

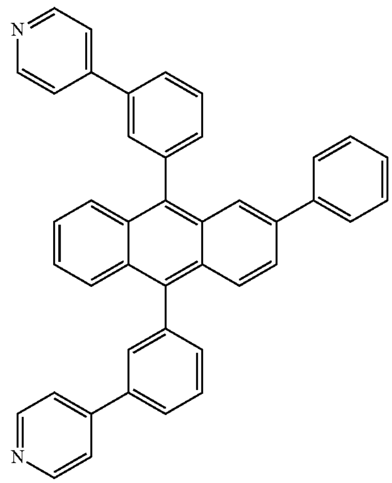

ET4

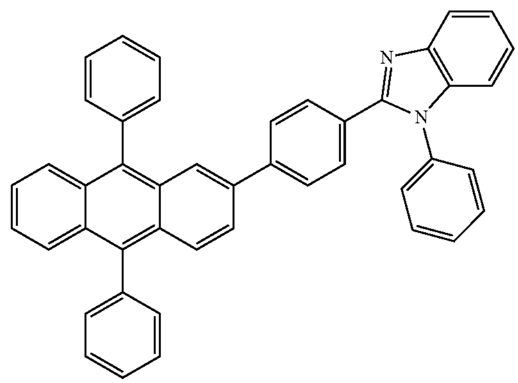

-continued
ET5
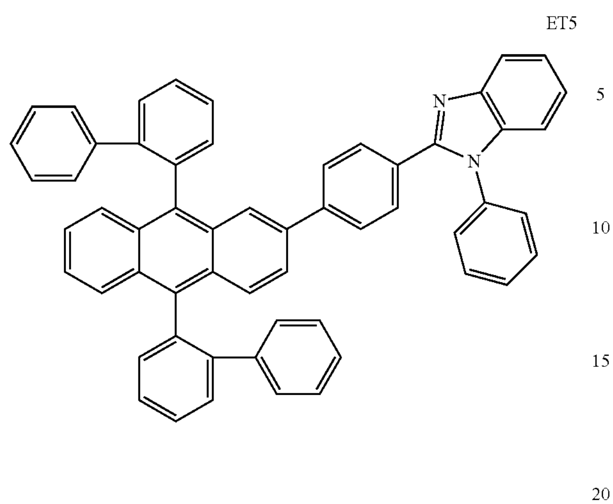
ET6
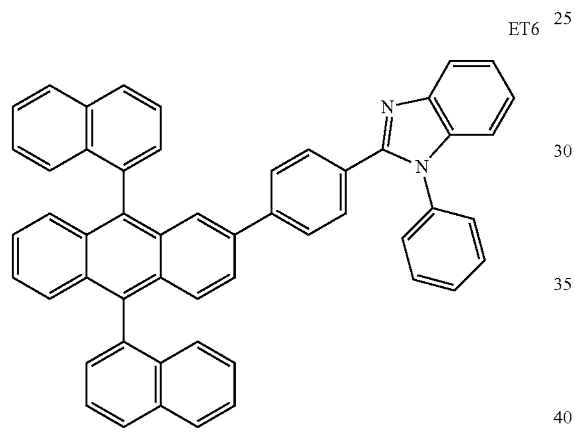
ET7
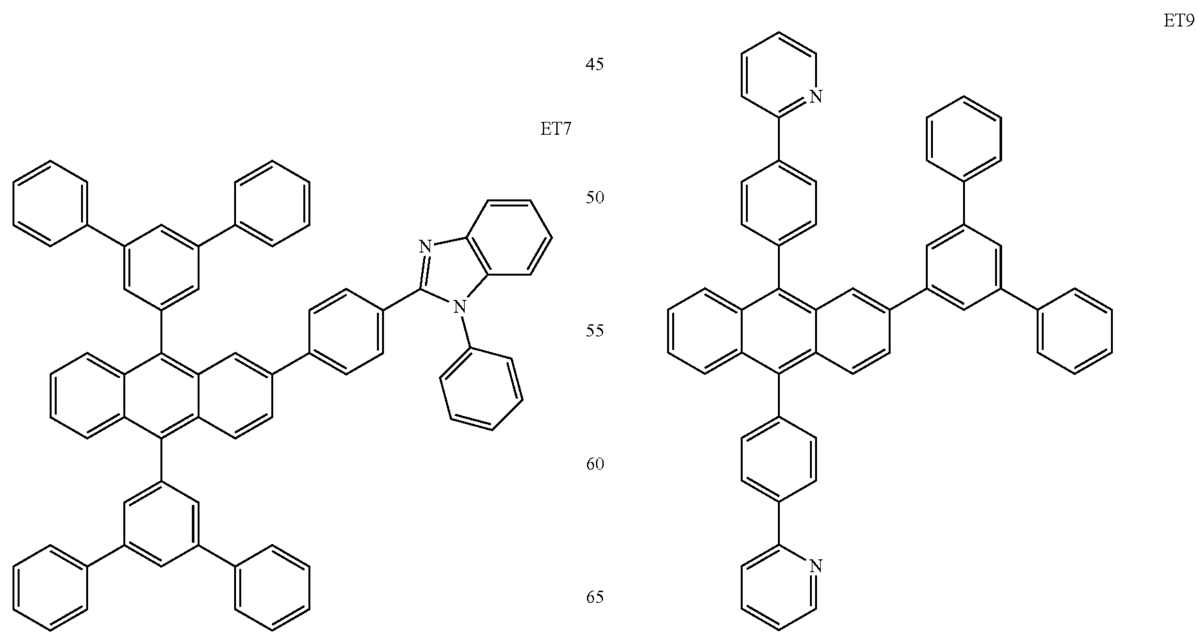
-continued
ET8
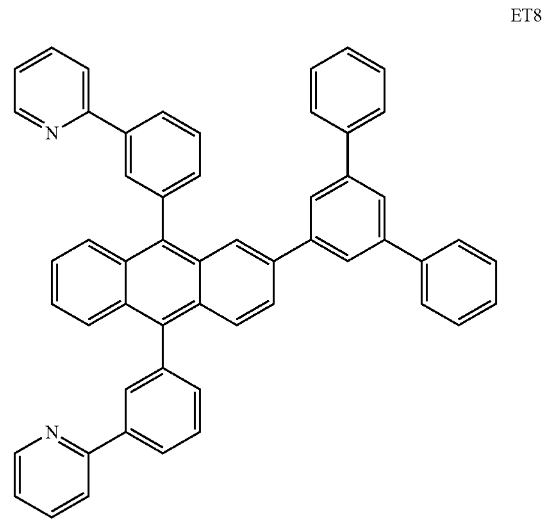
ET9

-continued
ET10
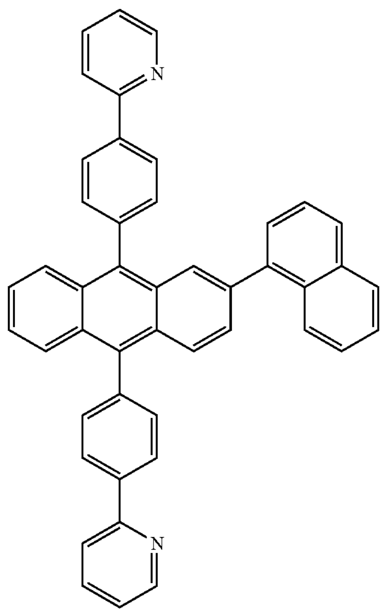
ET11
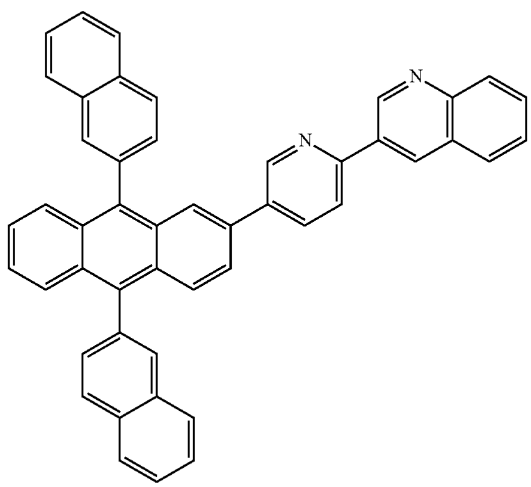
ET12
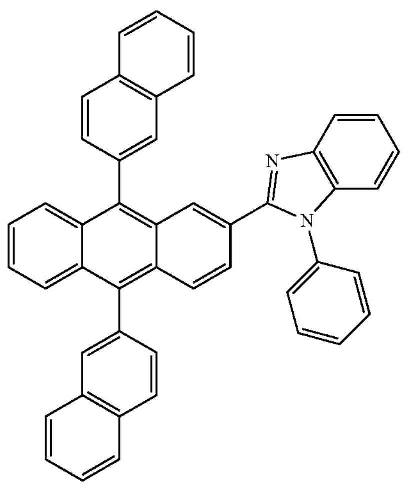
-continued
ET13
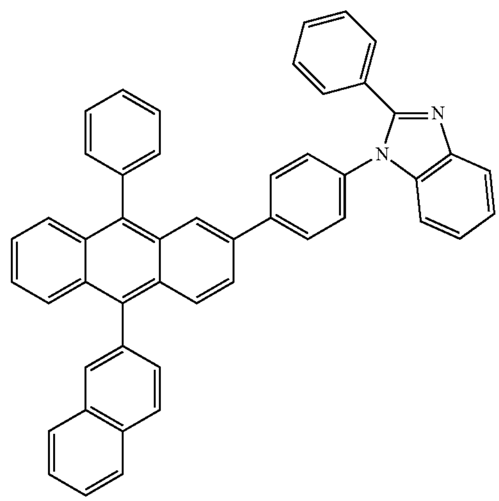
ET14
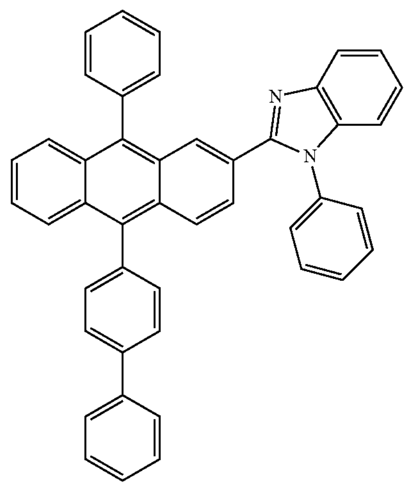
ET15
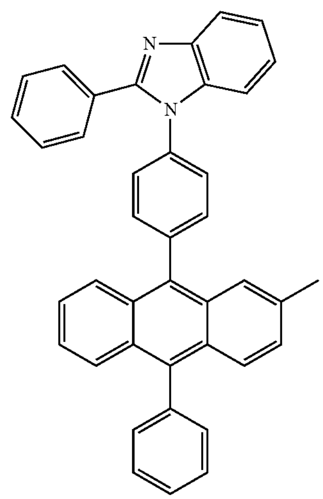

-continued
ET16
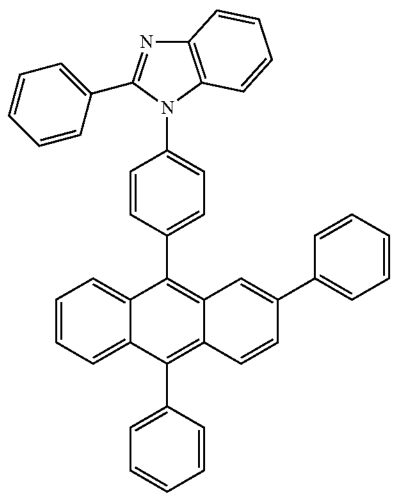
ET17
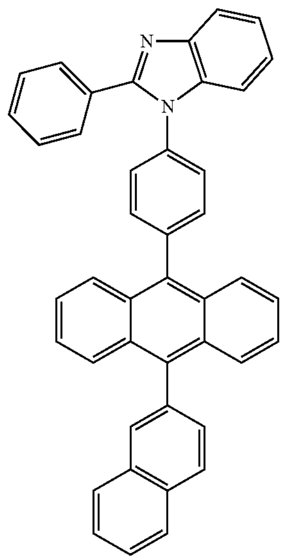
ET18
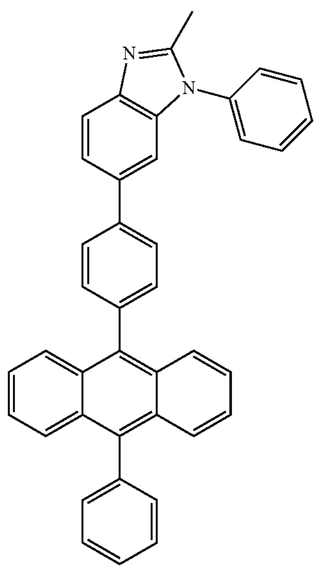
-continued
ET19
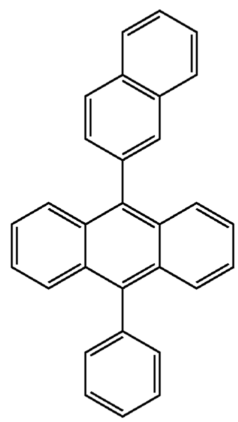
ET20
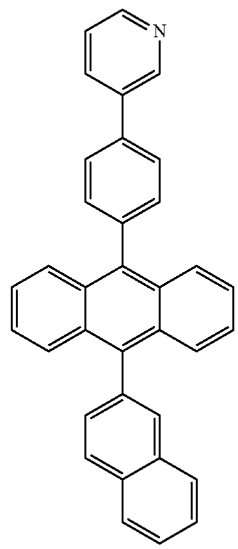
ET21
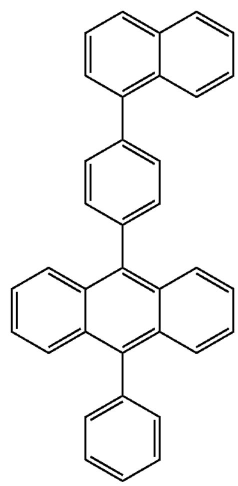

-continued
ET22
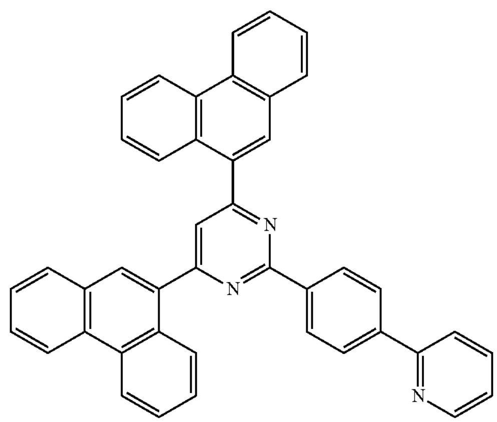
ET23
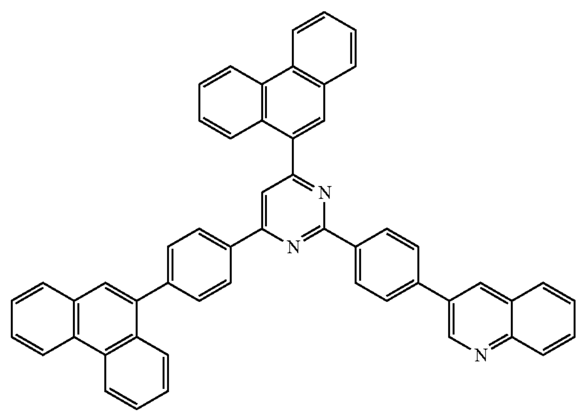
ET24
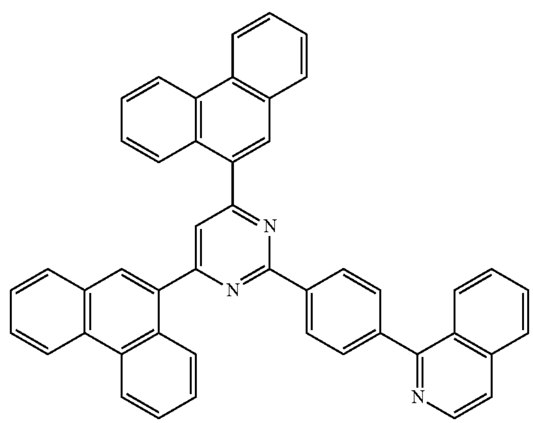
-continued
ET25
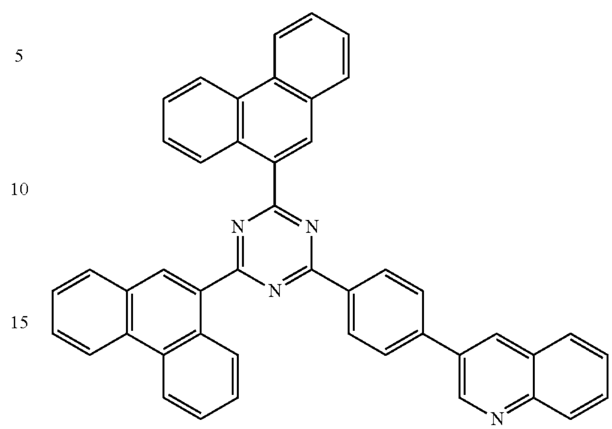
ET26
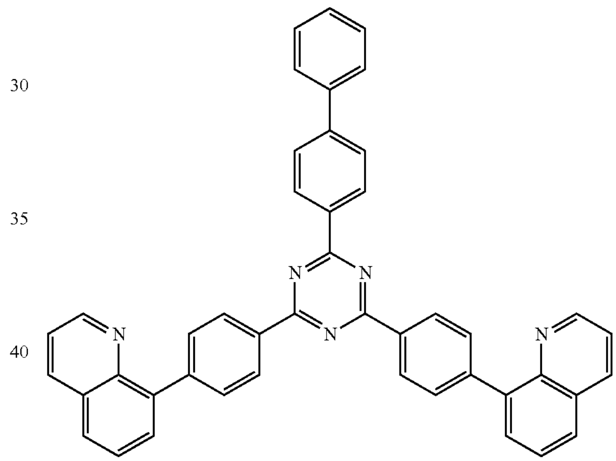
ET27
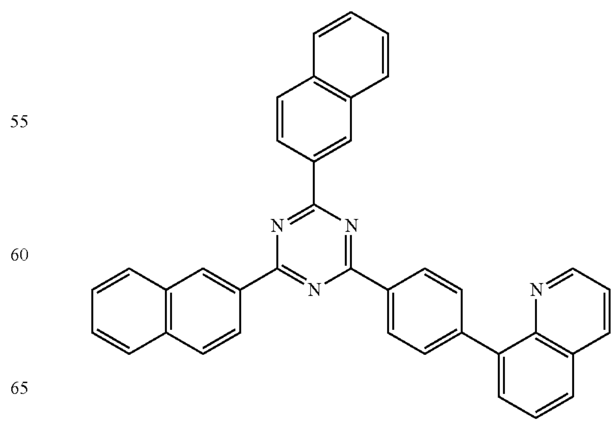

-continued
ET28
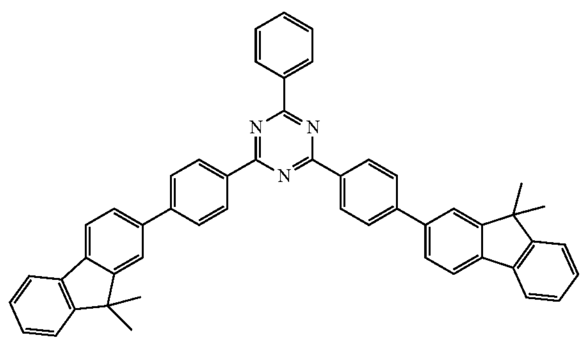
ET29
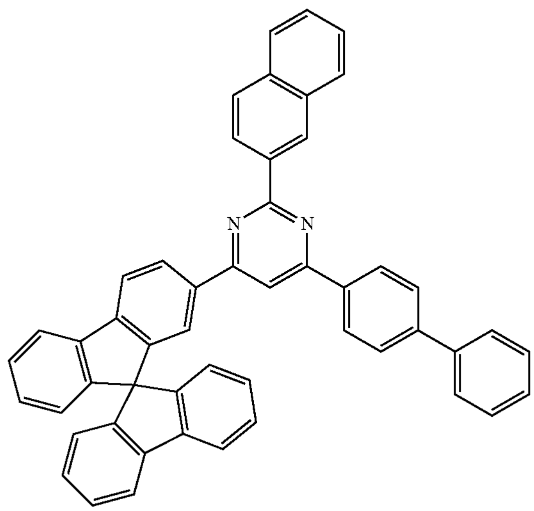
ET30
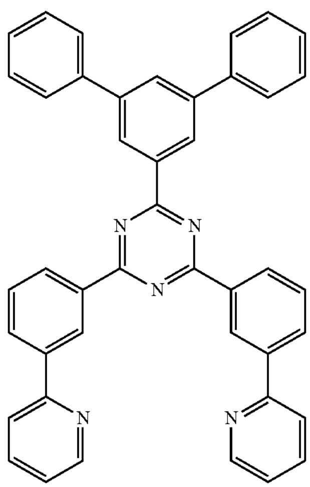
-continued
ET31
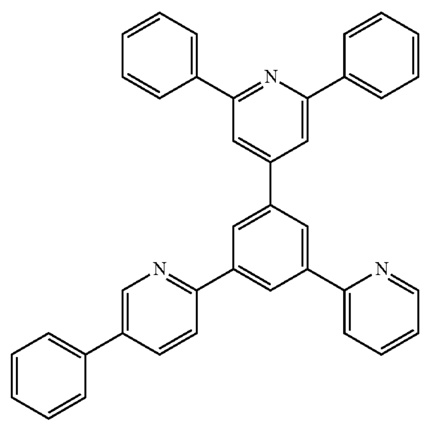
ET32
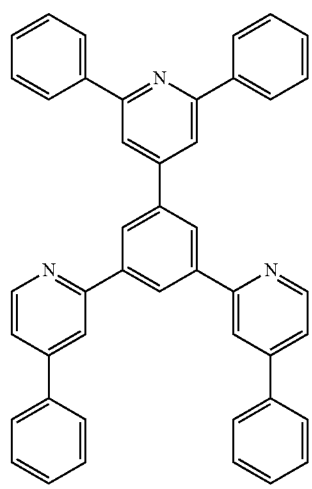
ET33
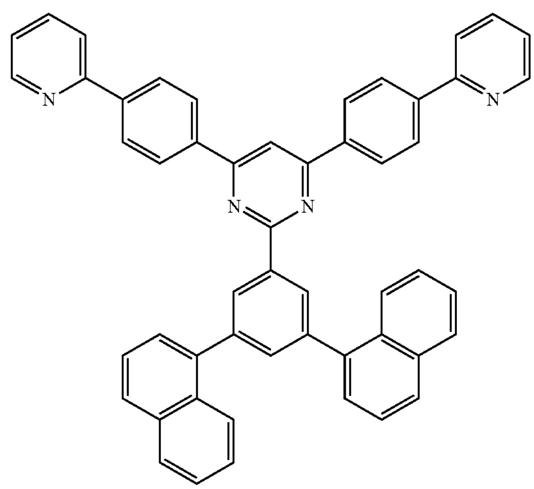

-continued
ET34
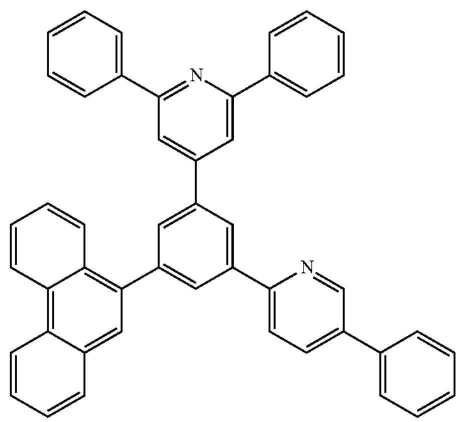
ET35
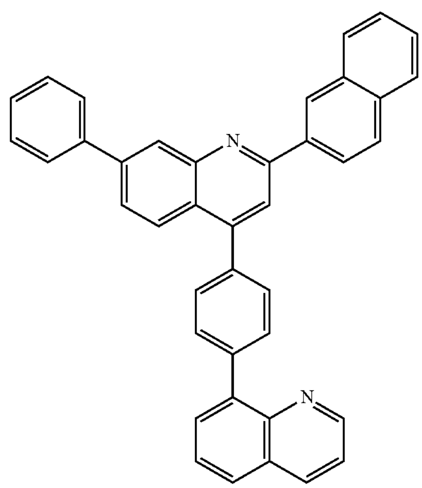
ET36
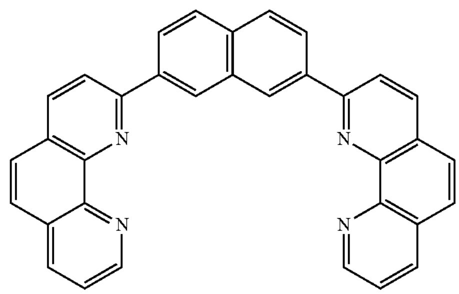
ET37
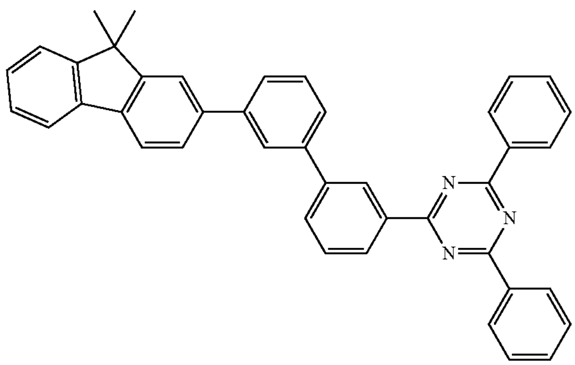
-continued
ET38
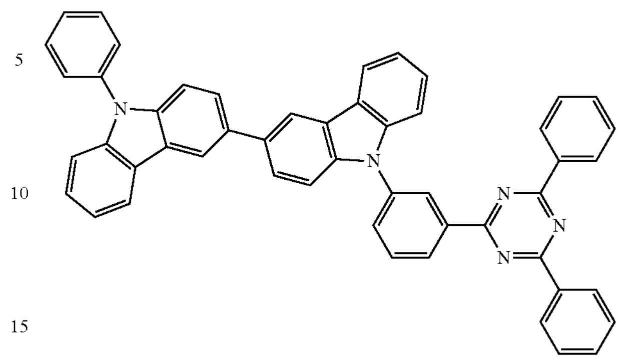
ET39
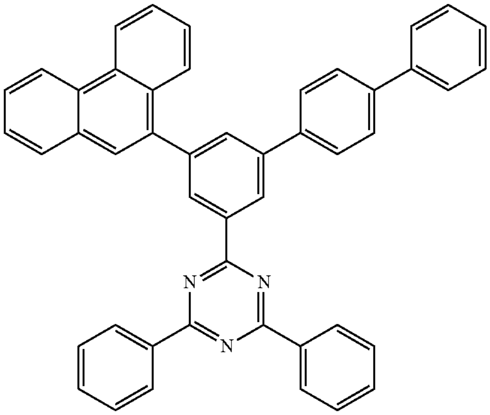
ET40
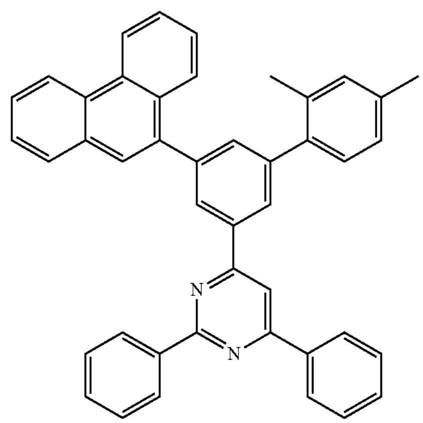

-continued
ET41
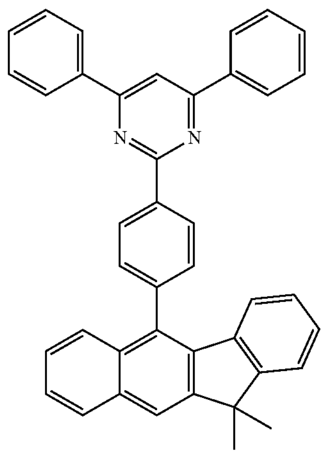
ET42
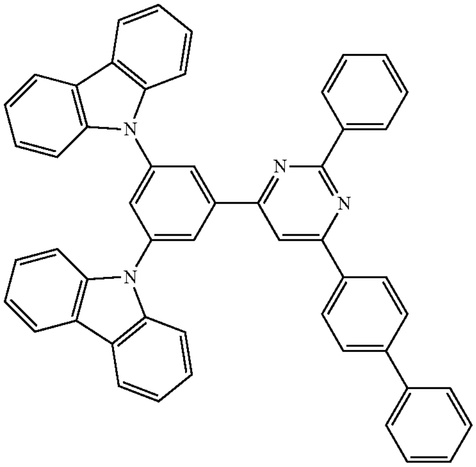
ET43
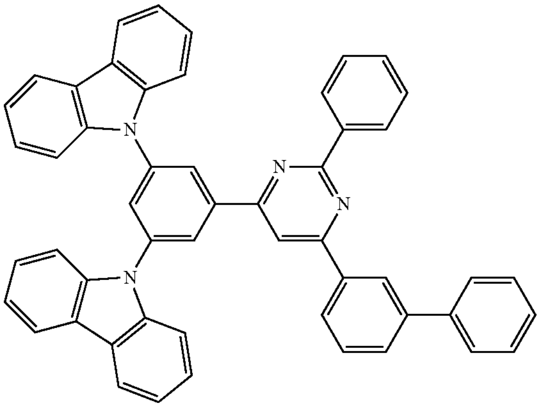
-continued
ET44
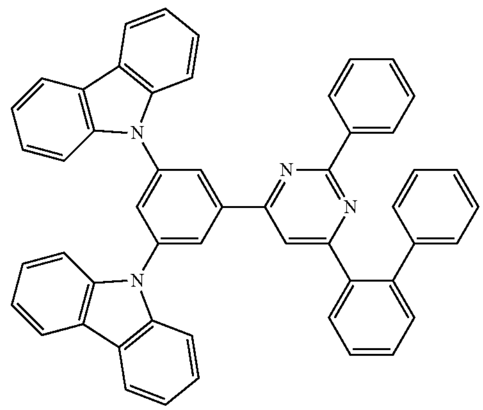
ET45
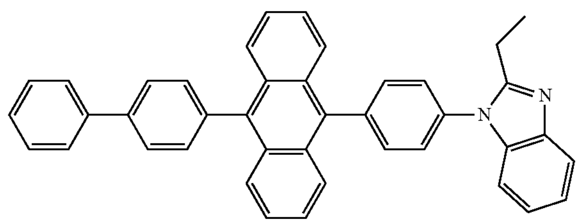
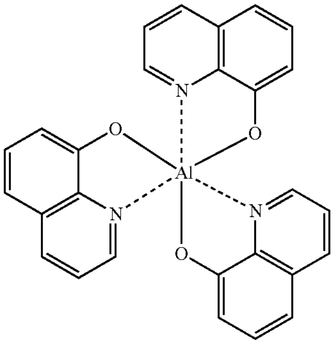
$Alq_3$
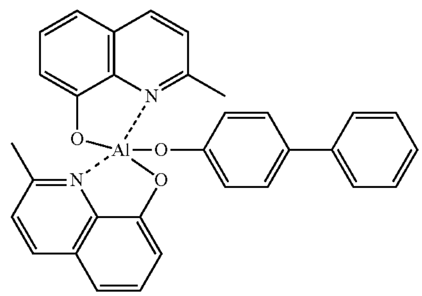
BAlq
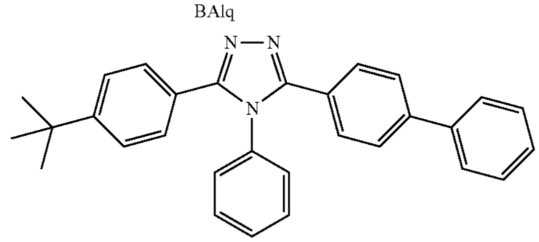
TAZ -continued

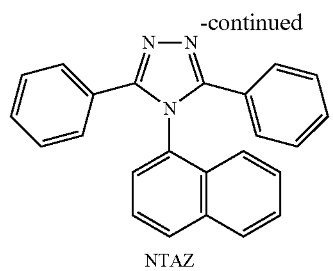

NTAZ

A thickness of the electron transport region may be in a range of about 100 Å to about 5,000 Å. For example, the thickness of the electron transport region may be in a range of about 160 Å to about 4,000 Å. When the electron transport region includes a buffer layer, a hole blocking layer, an electron control layer, an electron transport layer, or any combination thereof, a thickness of the buffer layer, the hole blocking layer, or the electron control layer may each independently be in a range of about 20 Å to about 1,000 Å, and a thickness of the electron transport layer may be in a range of about 100 Å to about 1,000 Å. For example, the thickness of the buffer layer, the hole blocking layer, or the electron control layer may each independently be in a range of about 30 Å to about 300 Å. For example, the thickness of the electron transport layer may be in a range of about 150 Å to about 500 Å. When the thickness of the buffer layer, the hole blocking layer, the electron control layer, the electron transport layer, and/or the electron transport region are within these ranges, satisfactory electron-transporting characteristics may be obtained without a substantial increase in driving voltage.

The electron transport region (for example, an electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion.

A ligand coordinated with the metal ion of the alkali metal complex or with the metal ion of the alkaline earth-metal complex may each independently include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) or Compound ET-D2:

ET-D1

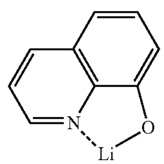

-continued

ET-D2

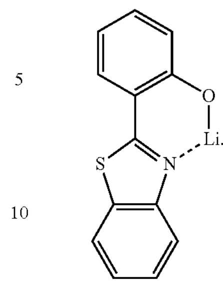

The electron transport region may include an electron injection layer to facilitate the injection of electrons from the second electrode 150. The electron injection layer may directly contact the second electrode 150.

The electron injection layer may have a structure consisting of a layer consisting of a single material, a structure consisting of a layer including different materials, or a structure including multiple layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides, halides (for example, fluorides, chlorides, bromides, or iodides), or tellurides of the alkali metal, the alkaline earth metal, and the rare earth metal, or any combination thereof.

The alkali metal-containing compound may include: alkali metal oxides, such as $Li_2O$, $Cs_2O$, or $K_2O$; alkali metal halides, such as LiF, NaF, CsF, KF, LiI, NaI, CsI, or KI; or any combination thereof. The alkaline earth metal-containing compound may include an alkaline earth metal compound, such as BaO, SrO, CaO, $Ba_xSr_{1-x}O$ (x is a real number satisfying the condition of $0<x<1$), $Ba_xCa_{1-x}O$ (x is a real number satisfying the condition of $0<x<1$), or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include one of an alkali metal ion, an alkaline earth metal ion, and a rare earth metal ion, and a ligand bonded to the metal ion (for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof).

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In an embodiment, the electron injection layer may further include an organic material (for example, a compound represented by Formula 601).

In an embodiment, the electron injection layer may consist of an alkali metal-containing compound (for example, an alkali metal halide); or the electron injection layer may consist of an alkali metal-containing compound (for example, an alkali metal halide), and an alkali metal, an alkaline earth metal, a rare earth metal, or any combination thereof. For example, the electron injection layer may be a KI:Yb co-deposited layer, a RbI:Yb co-deposited layer, a LiF:Yb co-deposited layer, or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within the range described above, satisfactory electron injection characteristics may be obtained without a substantial increase in driving voltage.

[Second Electrode 150]

The second electrode 150 may be located on the interlayer 130 having such a structure. The second electrode 150 may be a cathode, which is an electron injection electrode. A material for forming the second electrode 150 may be a material having a low work function, for example, a metal, an alloy, an electrically conductive compound, or any combination thereof.

In an embodiment, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multilayer structure.

[Capping Layer]

The light-emitting device 10 may include a first capping layer located outside the first electrode 110, and/or a second capping layer located outside the second electrode 150. For example, the light-emitting device 10 may have a structure in which the first capping layer, the first electrode 110, the interlayer 130, and the second electrode 150 are stacked in this stated order, a structure in which the first electrode 110, the interlayer 130, the second electrode 150, and the second capping layer are stacked in this stated order, or a structure in which the first capping layer, the first electrode 110, the interlayer 130, the second electrode 150, and the second capping layer are stacked in this stated order.

Light generated in an emission layer of the interlayer 130 of the light-emitting device 10 may be extracted toward the outside through the first electrode 110, which may be a semi-transmissive electrode or a transmissive electrode, and through the first capping layer. Light generated in an emission layer of the interlayer 130 of the light-emitting device 10 may be extracted toward the outside through the second electrode 150, which may be a semi-transmissive electrode or a transmissive electrode, and through the second capping layer.

The first capping layer and the second capping layer may each increase external luminescence efficiency according to the principle of constructive interference. Accordingly, the light extraction efficiency of the light-emitting device 10 is increased, so that the luminescence efficiency of the light-emitting device 10 may be improved.

The first capping layer and the second capping layer may each include a material having a refractive index equal to or greater than about 1.6 (with respect to a wavelength of about 589 nm).

The first capping layer and the second capping layer may each independently be an organic capping layer including an organic material, an inorganic capping layer including an inorganic material, or an organic-inorganic composite capping layer including an organic material and an inorganic material.

The inorganic capping layer or the organic-inorganic composite capping layer may include the organometallic compound represented by Formula 1.

At least one of the first capping layer and the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may be optionally substituted with a substituent containing O, N, S, Se, Si, F, Cl, Br, I, or any combination thereof.

In an embodiment, at least one of the first capping layer and the second capping layer may each independently include an amine group-containing compound.

In an embodiment, at least one of the first capping layer and the second capping layer may each independently include a compound represented by Formula 201, a compound represented by Formula 202, or any combination thereof.

In an embodiment, at least one of the first capping layer and the second capping layer may each independently include one of Compounds HT28 to HT33, one of Compounds CP1 to CP6, β-NPB, or any combination thereof:

CP1

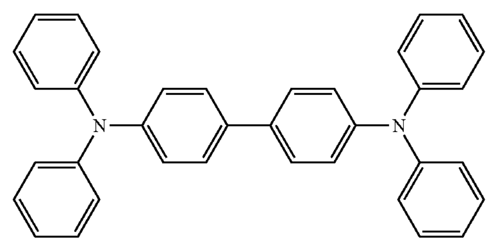

-continued

CP2

CP3

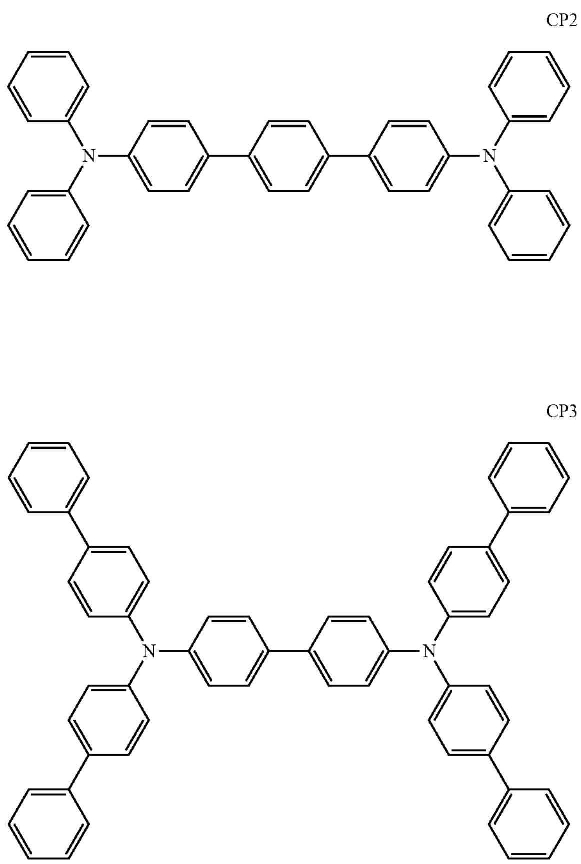

CP4

CP5

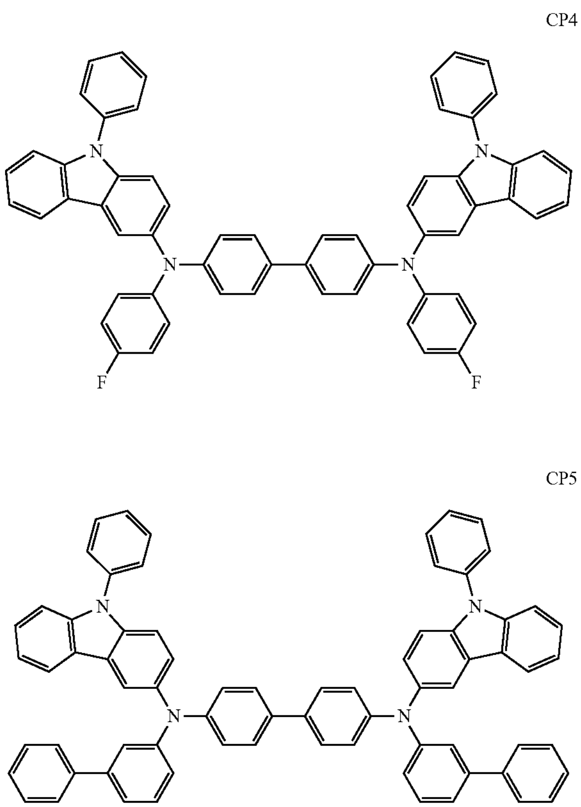

-continued

CP6

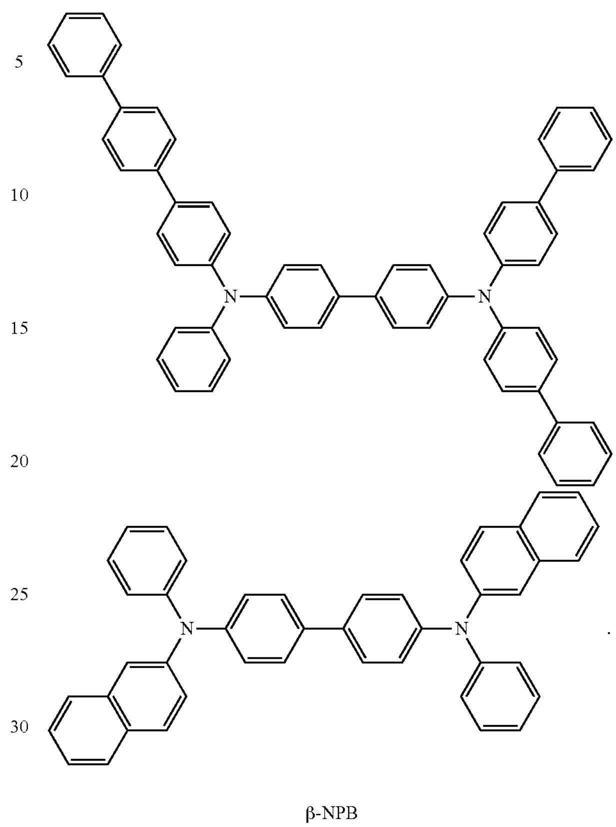

β-NPB

[Film]

The organometallic compound represented by Formula 1 may be included in various films. According to embodiments, a film including the organometallic compound represented by Formula 1 may be provided. The film may be, for example, an optical member (or a light control member) (for example, a color filter, a color conversion member, a capping layer, a light extraction efficiency enhancement layer, a selective light absorbing layer, a polarizing layer, a quantum dot-containing layer, or like), a light-blocking member (for example, a light reflective layer, a light absorbing layer, or the like), or a protective member (for example, an insulating layer, a dielectric layer, or the like).

[Electronic Apparatus]

The light-emitting device may be included in various electronic apparatuses. In an embodiment, an electronic apparatus including the light-emitting device may be a light-emitting apparatus, an authentication apparatus, or the like.

The electronic apparatus (for example, a light-emitting apparatus) may further include, in addition to the light-emitting device, a color filter, a color conversion layer, or a color filter and a color conversion layer. The color filter and/or the color conversion layer may be located in at least one traveling direction of light emitted from the light-emitting device. In an embodiment, the light emitted from the light-emitting device may be blue light or white light. The light-emitting device may be the same as described herein. In an embodiment, the color conversion layer may include quantum dots. The quantum dot may be, for example, a quantum dot as described herein.

The electronic apparatus may include a first substrate. The first substrate may include subpixels, the color filter may include color filter areas respectively corresponding to the subpixels, and the color conversion layer may include color conversion areas respectively corresponding to the subpixels.

A pixel-defining layer may be located between the subpixels to define each subpixel.

The color filter may further include color filter areas and light-shielding patterns located between the color filter areas, and the color conversion layer may include color conversion areas and light-shielding patterns located between the color conversion areas.

The color filter areas (or the color conversion areas) may include a first area emitting first color light, a second area emitting second color light, and/or a third area emitting third color light, and the first color light, the second color light, and/or the third color light may have different maximum emission wavelengths from one another. In an embodiment, the first color light may be red light, the second color light may be green light, and the third color light may be blue light. In an embodiment, the color filter areas (or the color conversion areas) may include quantum dots. For example, the first area may include a red quantum dot, the second area may include a green quantum dot, and the third area may not include a quantum dot. The quantum dot may be the same as described in the specification. The first area, the second area, and/or the third area may each further include a scatterer.

In an embodiment, the light-emitting device may emit a first light, the first area may absorb the first light to emit a first-first color light, the second area may absorb the first light to emit a second-first color light, and the third area may absorb the first light to emit a third-first color light. The first-first color light, the second-first color light, and the third-first color light may have different maximum emission wavelengths. For example, the first light may be blue light, the first-first color light may be red light, the second-first color light may be green light, and the third-first color light may be blue light.

The electronic apparatus may further include a thin-film transistor, in addition to the light-emitting device as described herein. The thin-film transistor may include a source electrode, a drain electrode, and an active layer, wherein any one of the source electrode and the drain electrode may be electrically connected to any one of the first electrode and the second electrode of the light-emitting device.

The thin-film transistor may further include a gate electrode, a gate insulating film, etc.

The active layer may include crystalline silicon, amorphous silicon, an organic semiconductor, an oxide semiconductor, or the like.

The electronic apparatus may further include a sealing portion for sealing the light-emitting device. The sealing portion may be located between the color filter and/or the color-conversion layer, and the light-emitting device. The sealing portion may allow light from the light-emitting device to be extracted to the outside, and may simultaneously prevent ambient air and moisture from penetrating into the light-emitting device. The sealing portion may be a sealing substrate including a transparent glass substrate or a plastic substrate. The sealing portion may be a thin-film encapsulation layer including an organic layer and/or an inorganic layer. When the sealing portion is a thin-film encapsulation layer, the electronic apparatus may be flexible.

Various functional layers may be further included on the sealing portion, in addition to the color filter and/or the color conversion layer, according to the use of the electronic apparatus. The functional layers may include a touch screen layer, a polarizing layer, an authentication apparatus, and the like. The touch screen layer may be a pressure-sensitive touch screen layer, a capacitive touch screen layer, or an infrared touch screen layer. The authentication apparatus may be, for example, a biometric authentication apparatus that authenticates an individual by utilizing biometric information of a living body (for example, fingertips, pupils, etc.).

The authentication apparatus may further include, in addition to the light-emitting device, a biometric information collector.

The electronic apparatus may be applied to various displays, light sources, lighting, personal computers (for example, a mobile personal computer), mobile phones, digital cameras, electronic diaries, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 2:
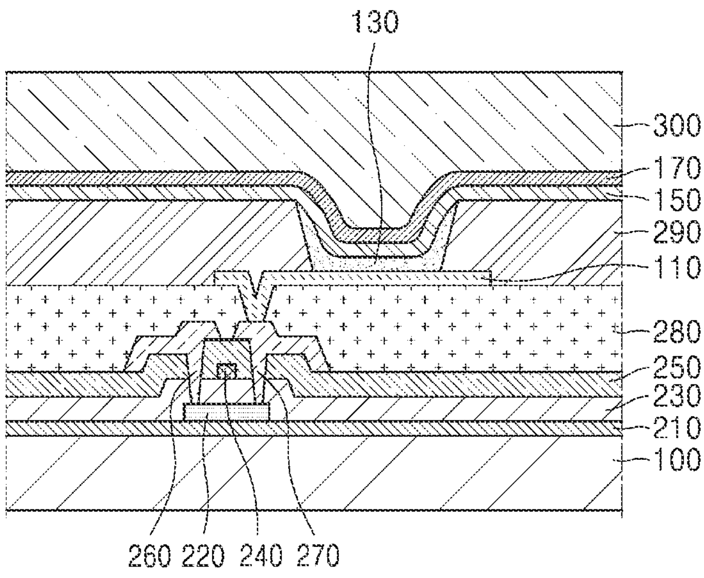
FIG. 2 is a schematic cross-sectional view of a structure of an electronic apparatus according to an embodiment.
Figure 3:
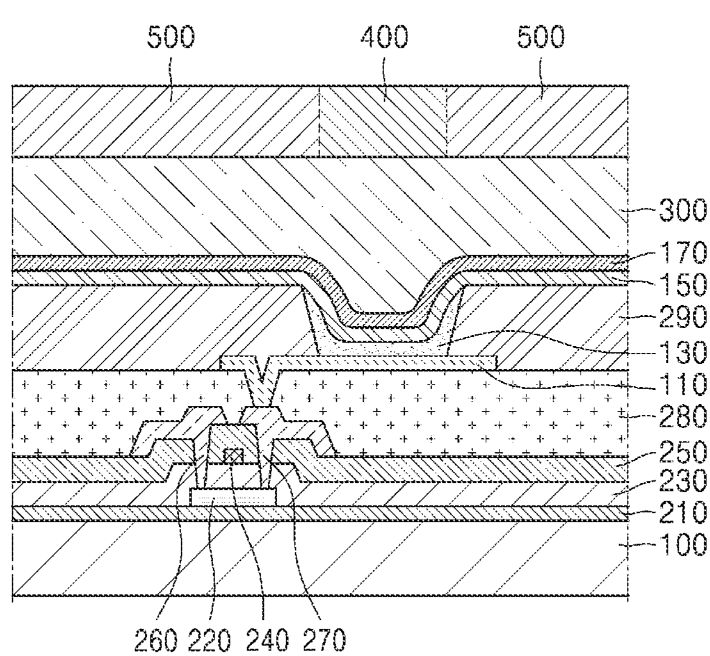
FIG. 3 is a schematic cross-sectional view of a structure of an electronic apparatus according to another embodiment.

[Description of FIGS. 2 and 3]

FIG. 2 is a schematic cross-sectional view of an electronic apparatus according to an embodiment.

The electronic apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be formed on the substrate 100. The buffer layer 210 may prevent penetration of impurities through the substrate 100 and may provide a flat surface on the substrate 100.

A TFT may be located on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the active layer 220 from the gate electrode 240 may be located on the active layer 220, and the gate electrode 240 may be located on the gate insulating film 230.

An interlayer insulating film 250 may be located on the gate electrode 240. The interlayer insulating film 250 may be placed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the active layer 220, and the source electrode 260 and the drain electrode 270 may respectively contact the exposed portions of the source region and the drain region of the activation layer 220.

The TFT is electrically connected to a light-emitting device to drive the light-emitting device, and is covered by a passivation layer 280. The passivation layer 280 may include an inorganic insulating film, an organic insulating film, or any combination thereof. A light-emitting device is provided on the passivation layer 280. The light-emitting device may include a first electrode 110, an interlayer 130, and a second electrode 150.

The first electrode 110 may be formed on the passivation layer 280. The passivation layer 280 may not completely cover the drain electrode 270 and may expose a portion of the drain electrode 270, and the first electrode 110 may be electrically connected to the exposed portion of the drain electrode 270.

A pixel-defining layer 290 including an insulating material may be located on the first electrode 110. The pixel-defining layer 290 may expose a region of the first electrode 110, and an interlayer 130 may be formed in the exposed region of the first electrode 110. The pixel-defining layer 290 may be a polyimide or polyacrylic organic film. Although not shown in FIG. 2, at least some layers of the interlayer 130 may extend beyond the upper portion of the pixel-defining layer 290 to be provided in the form of a common layer.

The second electrode 150 may be located on the interlayer 130, and a capping layer 170 may be further included on the second electrode 150. The capping layer 170 may cover the second electrode 150.

The encapsulation portion 300 may be located on the capping layer 170. The encapsulation portion 300 may be located on a light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, or the like), an epoxy-based resin (for example, aliphatic glycidyl ether (AGE), or the like), or a combination thereof; or a combination of the inorganic film and the organic film.

FIG. 3 is a schematic cross-sectional view of an electronic apparatus according to another embodiment.

The electronic apparatus of FIG. 3 may differ from the electronic apparatus of FIG. 2, at least in that a light-shielding pattern 500 and a functional region 400 are further included on the encapsulation portion 300. The functional region 400 may be a color filter area, a color conversion area, or a combination of the color filter area and the color conversion area. In an embodiment, the light-emitting device included in the electronic apparatus of FIG. 3 may be a tandem light-emitting device.

Figure 4:
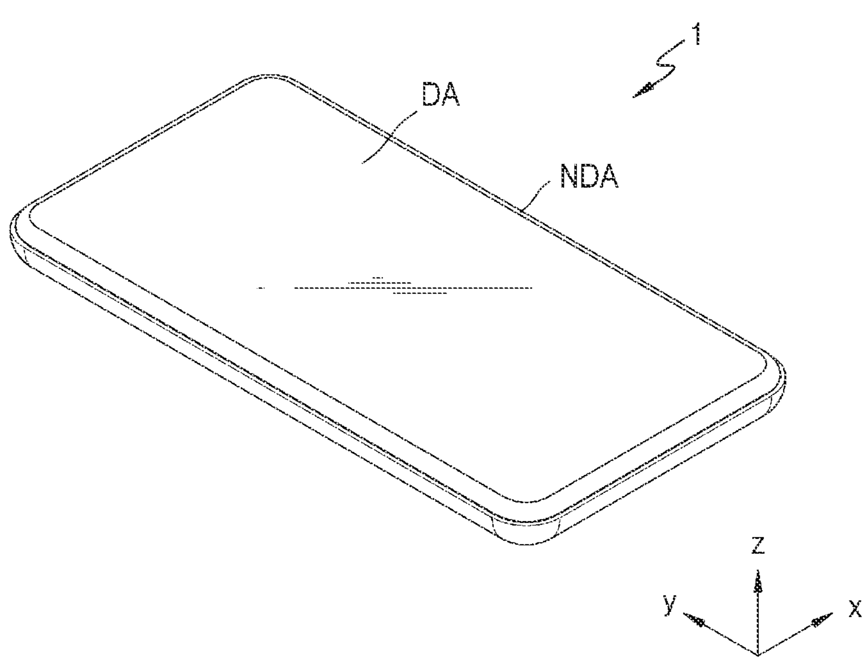
FIG. 4 is a schematic perspective view of an electronic device according to an embodiment.

[Description of FIG. 4]

FIG. 4 is a schematic perspective view of an electronic device 1 including a light-emitting device, according to an embodiment. The electronic device 1 may be a device that displays a moving image or a still image, and examples of the electronic device 1 may include: a portable electronic device, such as a mobile phone, a smart phone, a tablet personal computer (PC), a mobile communication terminal, an electronic diary, an electronic book, a portable multimedia player (PMP), a navigation system, or an ultra-mobile PC (UMPC); various products, such as a TV, a laptop, a monitor, a billboard, or Internet of things (IOT); or a part thereof.

In an embodiment, the electronic device 1 may be a wearable device, such as a smart watch, a watch phone, a glasses-type display, or a head mounted display (HMD), or part thereof. However, embodiments are not limited thereto. In an embodiment, the electronic device 1 may be a dashboard of a vehicle, a center information display (CID) arranged on a center fascia or on a dashboard of a vehicle, a room mirror display replacing a side-view mirror of a vehicle, an entertainment system for a back seat of a vehicle, or a display arranged on the back of a front seat of a vehicle, a head up display (HUD) installed on the front of a vehicle or projected on a front window glass, or a computer generated hologram augmented reality head up display (CGH AR HUD). For convenience of explanation, FIG. 4 shows an embodiment where the electronic device 1 is a smart phone.

The electronic device 1 may include a display area DA and a non-display area NDA located outside the display area DA. The electronic device 1 may implement an image through an array of pixels that are two-dimensionally arranged in the display area DA.

The non-display area NDA is an area that does not display an image, and may entirely surround the display area DA. A driver for providing an electrical signal or electric power to display elements and the like (for example, pixels) arranged in the display area DA may be arranged in the non-display area NDA. A pad, which is an area to which an electronic element or a printed circuit board may be electrically connected, may be arranged in the non-display area NDA.

The electronic device 1 may have different lengths in an X-axis direction and a y-axis direction. In an embodiment, as shown in FIG. 4, the length in the x-axis direction may be less than the length in the y-axis direction. In another embodiment, the length in the x-axis direction and the length in the y-axis direction may be identical to each other. In still another embodiment, the length in the x-axis direction may be greater than the length in the y-axis direction.

[Descriptions of FIGS. 5 and 6A to 6C]

Figure 5:
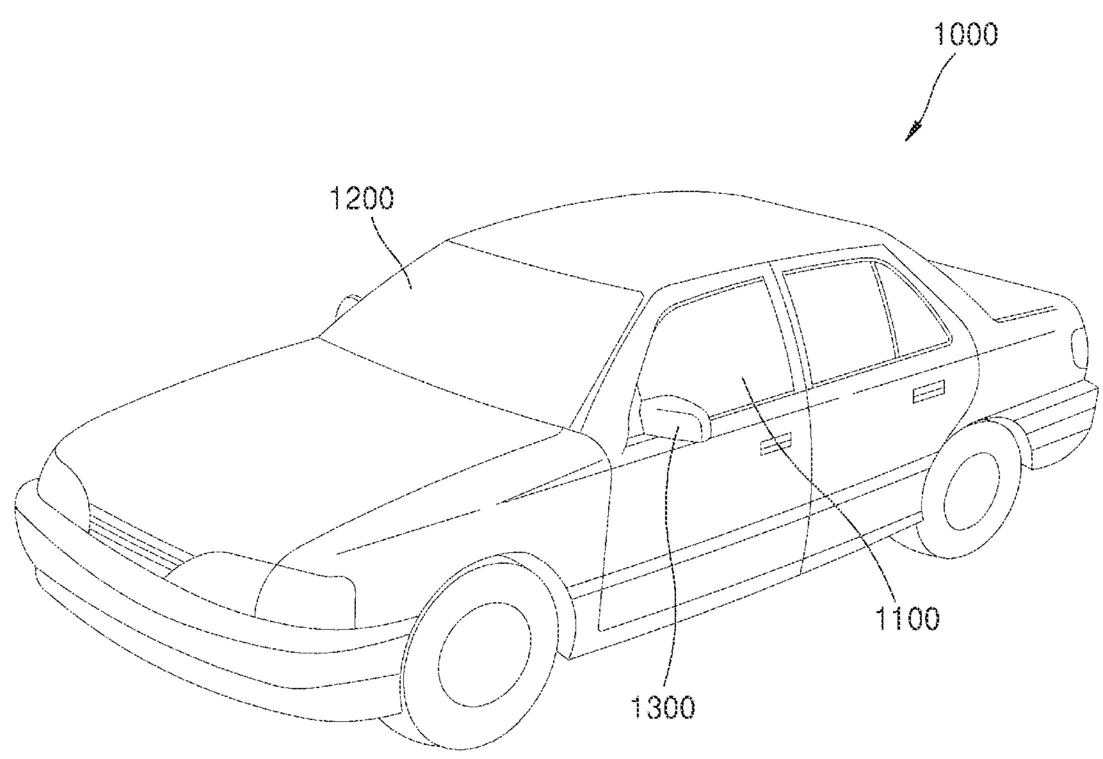
FIG. 5 is a schematic perspective view of the exterior of a vehicle as an electronic device, according to another embodiment.
Figure 6A:
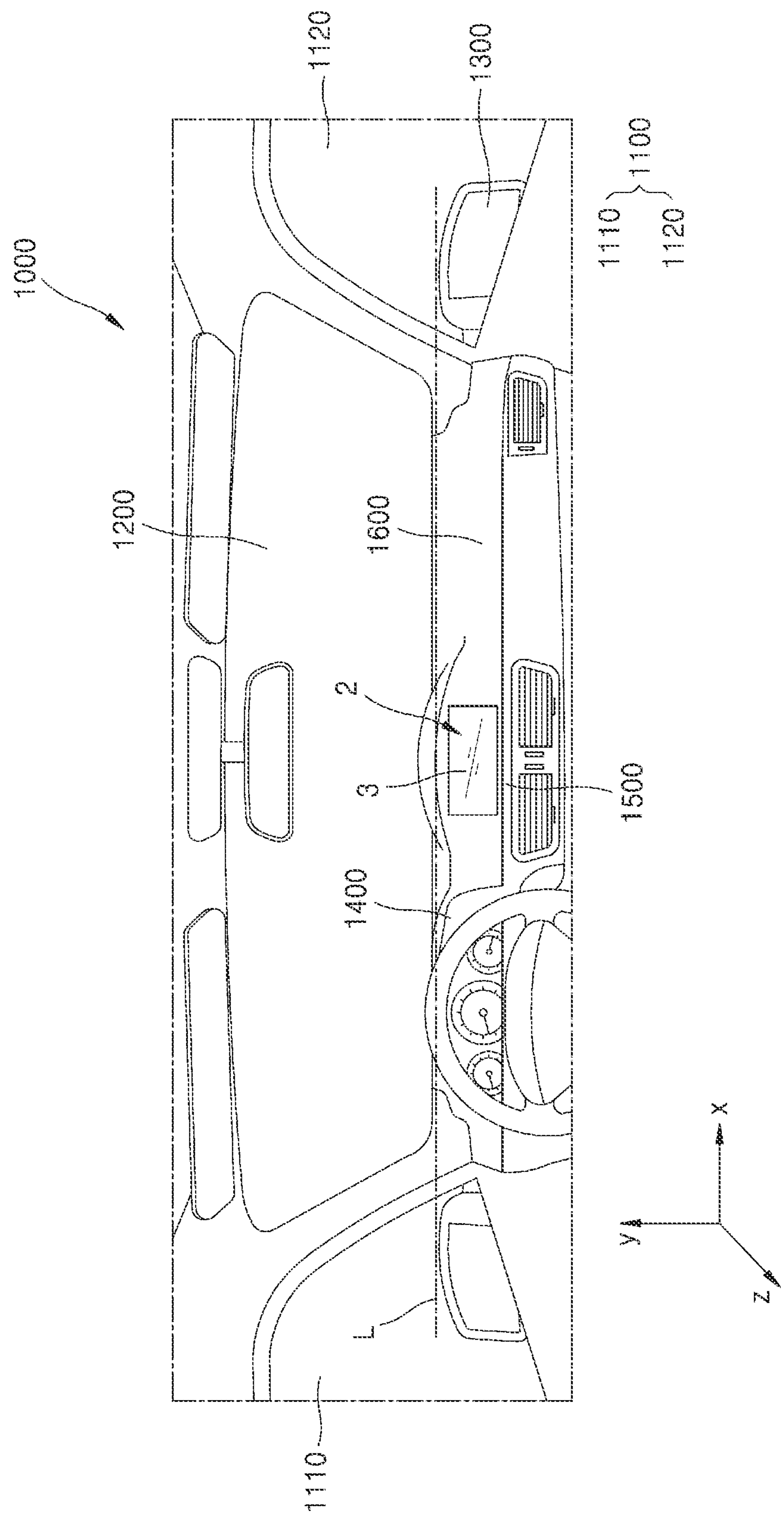
FIGS. 6A to 6C are each a schematic diagram illustrating the interior of a vehicle, according to an embodiment.
Figure 6B:
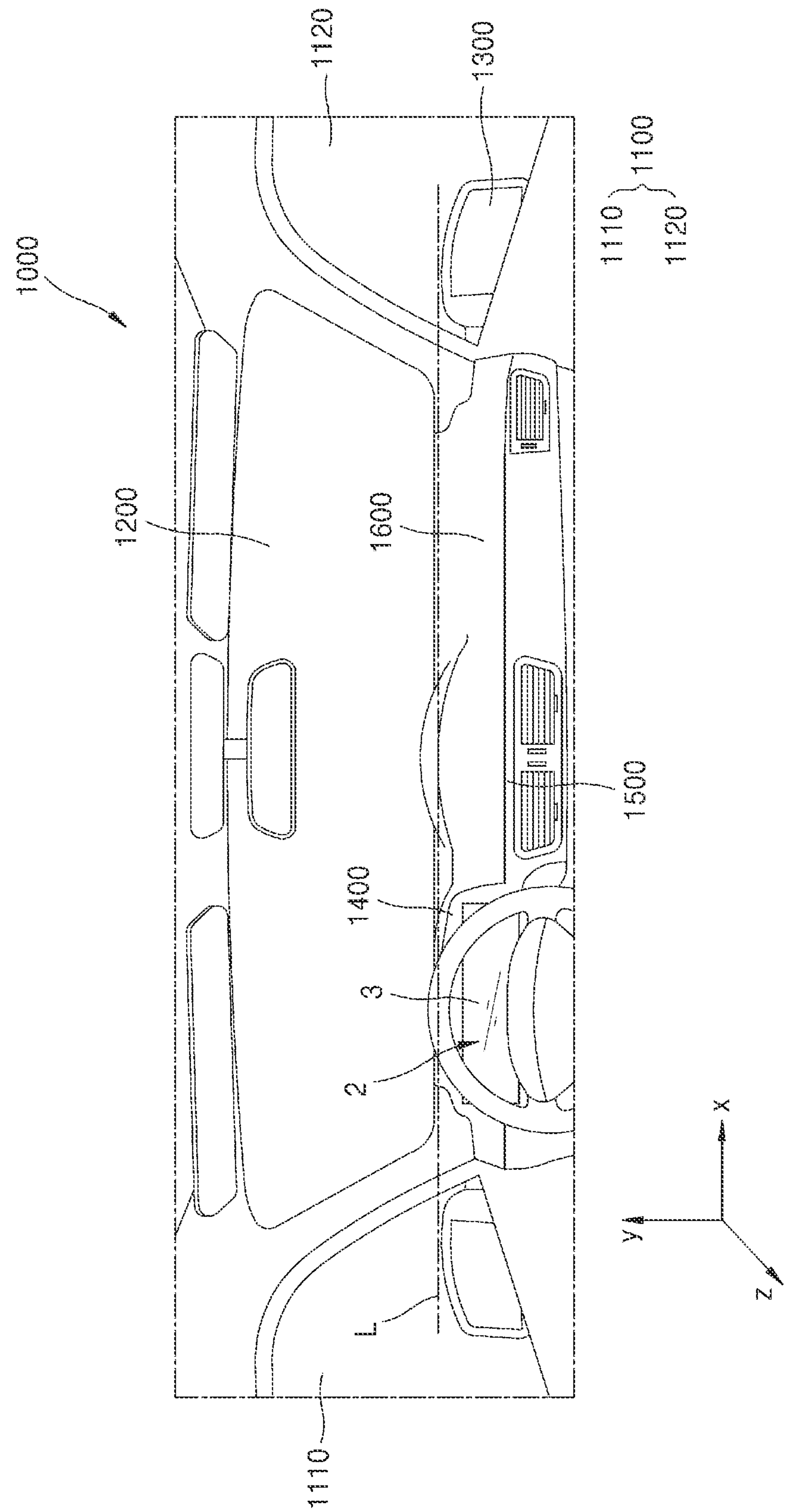
Figure 6C:
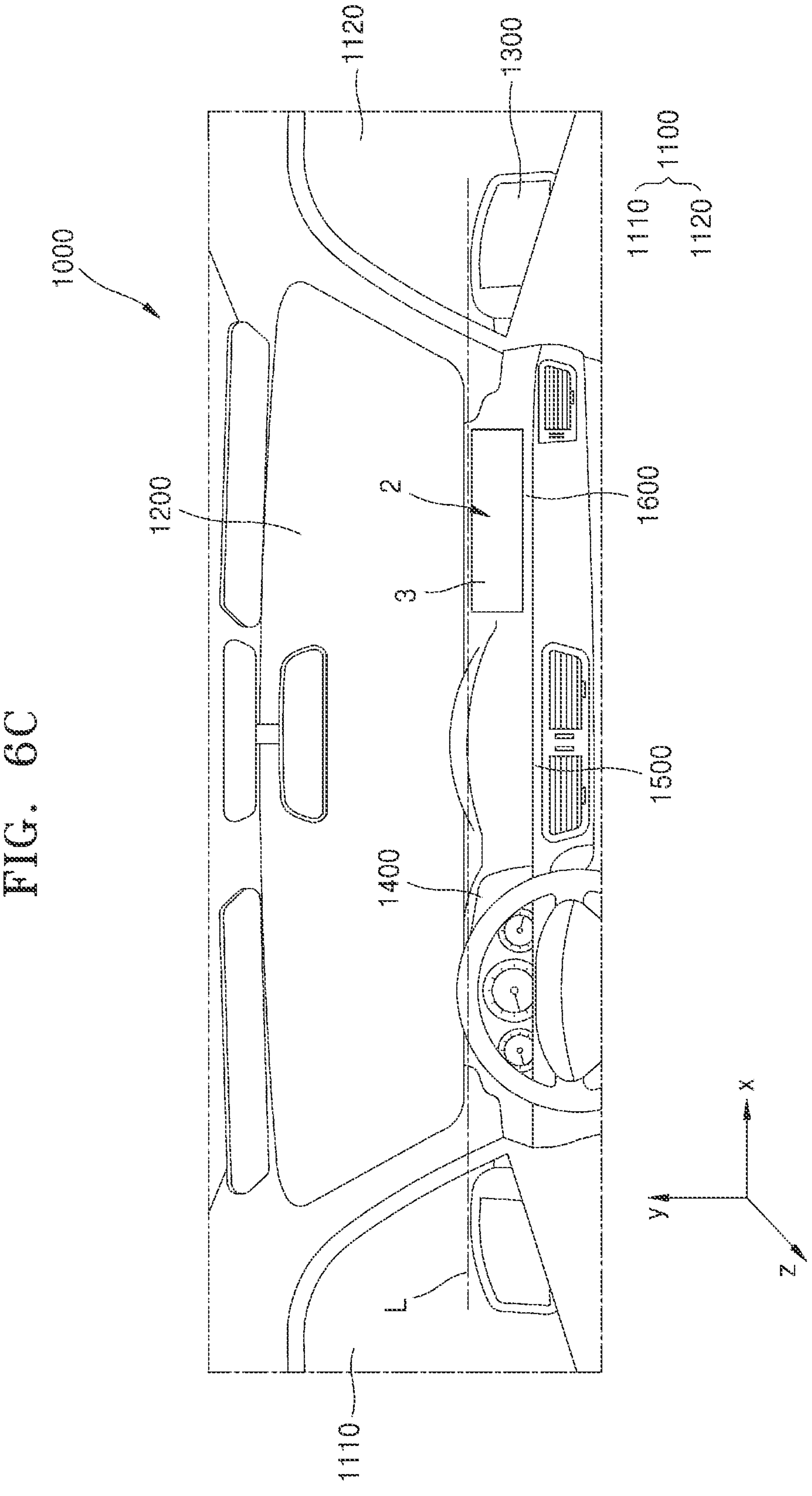

FIG. 5 is a schematic perspective view of the exterior of a vehicle 1000 as an electronic device including a light-emitting device according to an embodiment. FIGS. 6A to 6C are each a schematic diagram illustrating the interior of the vehicle 1000, according to embodiments.

Referring to FIGS. 5, 6A, 6B, and 6C, the vehicle 1000 may refer to various apparatuses for moving a subject to be transported, such as a human, an object, or an animal, from a departure point to a destination. The vehicle 1000 may be a vehicle traveling on a road or a track, a vessel moving over a sea or a river, an airplane flying in the sky using the action of air, or the like.

The vehicle 1000 may travel on a road or a track. The vehicle 1000 may move in a direction according to the rotation of at least one wheel. For example, the vehicle 1000 may be a three-wheeled or four-wheeled vehicle, a construction vehicle, a two-wheeled vehicle, a prime mover apparatus, a bicycle, or a train traveling on a track.

The vehicle 1000 may include a body having an interior and an exterior, and a chassis in which the mechanical apparatuses that are necessary for driving are installed and which may comprise other parts except for the body. The exterior of the body may include a front panel, a bonnet, a roof panel, a rear panel, a trunk, a door, and a pillar provided at boundaries between the aforementioned components. The chassis of the vehicle 1000 may include a power generating apparatus, a power transmitting apparatus, a driving apparatus, a steering apparatus, a braking apparatus, a suspension apparatus, a transmission apparatus, a fuel apparatus, and front, rear, left, and right wheels.

The vehicle 1000 may include a side window glass 1100, a front window glass 1200, a side-view mirror 1300, a cluster 1400, a center fascia 1500, a front passenger seat dashboard 1600, and a display apparatus 2.

The side window glass 1100 and the front window glass 1200 may be partitioned by a pillar arranged between the side window glass 1100 and the front window glass 1200.

The side window glass 1100 may be installed on the side of the vehicle 1000. In an embodiment, the side window glass 1100 may be installed on a door of the vehicle 1000. Multiple side window glasses 1100 may be provided and may face each other. In an embodiment, the side window glass 1100 may include a first side window glass 1110 and a second side window glass 1120. In an embodiment, the first side window glass 1110 may be arranged adjacent to the cluster 1400. The second side window glass 1120 may be arranged adjacent to the front passenger seat dashboard 1600.

In an embodiment, the side window glasses 1100 may be spaced apart from each other in an x direction or in a −x direction. For example, the first side window glass 1110 and the second side window glass 1120 may be spaced apart from each other in the x direction or in the −x direction. A virtual straight line L connecting the side window glasses 1100 to each other may extend in the x direction or in the −x direction. For example, a virtual straight line L connecting the first side window glass 1110 and the second side window glass 1120 to each other may extend in the x direction or in the −x direction.

The front window glass 1200 may be installed on the front of the vehicle 1000. The front window glass 1200 may be arranged between the side window glasses 1100 facing each other.

The side-view mirror 1300 may provide a rear view of the vehicle 1000. The side-view mirror 1300 may be installed on the exterior trim of the body. In an embodiment, multiple side-view mirrors 1300 may be provided. One of the side-view mirrors 1300 may be arranged outside the first side window glass 1110. Another of the side-view mirrors 1300 may be arranged outside the second side window glass 1120.

The cluster 1400 may be located in front of a steering wheel. The cluster 1400 may include a tachometer, a speedometer, a coolant thermometer, a fuel gauge, a turn signal indicator light, a high beam indicator light, a warning light, a seat belt warning light, an odometer, an automatic gear selector lever indicator light, a door open warning light, an engine oil warning light, and/or a low fuel warning light.

The center fascia 1500 may include a control panel on which buttons may be provided for adjusting an audio apparatus, an air conditioning apparatus, and a seat heater. The center fascia 1500 may be arranged on one side of the cluster 1400.

The front passenger seat dashboard 1600 may be spaced apart from the cluster 1400 with the center fascia 1500 therebetween. In an embodiment, the cluster 1400 may be arranged to correspond to a driver's seat (not shown), and the front passenger seat dashboard 1600 may be arranged to correspond to a front passenger seat (not shown). In an embodiment, the cluster 1400 may be adjacent to the first side window glass 1110, and the front passenger seat dashboard 1600 may be adjacent to the second side window glass 1120.

In an embodiment, the display apparatus 2 may include a display panel 3, and the display panel 3 may display an image. The display apparatus 2 may be arranged inside the vehicle 1000. In an embodiment, the display apparatus 2 may be arranged between the side window glasses 1100 facing each other. The display apparatus 2 may be arranged in at least one of the cluster 1400, the center fascia 1500, and the front passenger seat dashboard 1600.

The display apparatus 2 may include an organic light-emitting display, an inorganic electroluminescent (EL) light-emitting display (inorganic light-emitting display), a quantum dot display, or the like. Hereinafter, an organic light-emitting display including a light-emitting device according to an embodiment is described as an example of the display apparatus 2 according to an embodiment, but embodiments are not limited thereto, and various types of display apparatuses as described above may be used.

Referring to FIG. 6A, the display apparatus 2 may be arranged on the center fascia 1500. In an embodiment, the display apparatus 2 may display navigation information. In an embodiment, the display apparatus 2 may display information about audio settings, video settings, or vehicle settings.

Referring to FIG. 6B, the display apparatus 2 may be arranged on the cluster 1400. When the display apparatus 2 is arranged on the cluster 1400, the cluster 1400 may express driving information and the like through the display apparatus 2. For example, the cluster 1400 may digitally implement driving information. The digital cluster 1400 may display vehicle information and driving information as images. For example, a tachometer needle, gauges, and various warning light icons may be displayed by digital signals.

Referring to FIG. 6C, the display apparatus 2 may be arranged on the front passenger seat dashboard 1600. The display apparatus 2 may be embedded in the front passenger seat dashboard 1600 or may be located on the front passenger seat dashboard 1600. In an embodiment, the display apparatus 2 arranged on the front passenger seat dashboard 1600 may display an image related to information displayed on the cluster 1400 and/or related to information displayed on the center fascia 1500. In an embodiment, the display apparatus 2 arranged on the front passenger seat dashboard 1600 may display information that is different from information displayed on the cluster 1400 and/or information displayed on the center fascia 1500.

[Manufacture method]

Respective layers included in the hole transport region, the emission layer, and respective layers included in the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definitions of Terms

The term "$C_3$-$C_{60}$ carbocyclic group" as used herein may be a cyclic group consisting of carbon as the only ring-forming atoms and having three to sixty carbon atoms, and the term "$C_1$-$C_{60}$ heterocyclic group" as used herein may be a cyclic group that has one to sixty carbon atoms and further has, in addition to carbon, at least one heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. In an embodiment, the $C_1$-$C_6$ heterocyclic group may have 3 to 61 ring-forming atoms.

The term "cyclic group" as used herein may include the $C_3$-$C_{60}$ carbocyclic group or the $C_1$-$C_{60}$ heterocyclic group.

The term "π electron-rich $C_3$-$C_{60}$ cyclic group" as used herein may be a cyclic group that has three to sixty carbon atoms and may not include *—N=*' as a ring-forming moiety, and the term "π electron-deficient nitrogen-containing $C_1$-$C_{60}$ cyclic group" as used herein may be a heterocyclic group that has one to sixty carbon atoms and may include *—N=*' as a ring-forming moiety.

In embodiments, the $C_3$-$C_{60}$ carbocyclic group may be a $T_1$ group or a group in which two or more $T_1$ groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_6$ heterocyclic group may be a $T_2$ group, a group in which two or more $T_2$ groups are condensed with each other, or a group in which at least one $T_2$ group and at least one $T_1$ group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be a T1 group, a group in which two or more T1 groups are condensed with each other, a T3 group, a group in which two or more T3 groups are condensed with each other, or a group in which at least one T3 group and at least one T1 group are condensed with each other (for example, a $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), and the π electron-deficient nitrogen-containing $C_1$-$C_{60}$ cyclic group may be a T4 group, a group in which two or more T4 groups are condensed with each other, a group in which at least one T4 group and at least one T1 group are condensed with each other, a group in which at least one T4 group and at least one T3 group are condensed with each other, or a group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group", "$C_3$-$C_{60}$ carbocyclic group", "$C_1$-$C_6$ heterocyclic group", "π electron-rich $C_3$-$C_{60}$ cyclic group", or "π electron-deficient nitrogen-containing $C_1$-$C_{60}$ cyclic group" as used herein may each be a group condensed to any cyclic group, a monovalent group, or a polyvalent group (for example, a divalent group, a trivalent group, a tetravalent group, etc.), depending on the structure of a formula for which the corresponding terms are used. For example, a "benzene group" may be a benzo group, a phenyl group, a phenylene group, or the like, which may be readily understood by those of ordinary skill in the art according to the structure of a formula including the "benzene group."

In an embodiment, examples of a monovalent $C_3$-$C_{60}$ carbocyclic group and a monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_6$ heteroaryl group, a monovalent non-aromatic condensed polycyclic group, and a monovalent non-aromatic condensed heteropolycyclic group. In an embodiment, examples of a divalent $C_3$-$C_{60}$ carbocyclic group and a divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_6$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein may be a linear or branched aliphatic hydrocarbon monovalent group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein may be a divalent group having a same structure as the $C_1$-$C_{60}$ alkyl group.

The term "$C_2$-$C_{60}$ alkenyl group" as used herein may be a monovalent hydrocarbon group having at least one carbon-carbon double bond in the middle or at a terminus of a $C_2$-$C_{60}$ alkyl group, and examples thereof may include an ethenyl group, a propenyl group, and a butenyl group. The term "$C_2$-$C_6$ alkenylene group" as used herein may be a divalent group having a same structure as the $C_2$-$C_{60}$ alkenyl group.

The term "$C_2$-$C_6$ alkynyl group" as used herein may be a monovalent hydrocarbon group having at least one carbon-carbon triple bond in the middle or at a terminus of a $C_2$-$C_{60}$ alkyl group, and examples thereof may include an ethynyl group and a propynyl group. The term "$C_2$-$C_6$ alkynylene group" as used herein may be a divalent group having a same structure as the $C_2$-$C_{60}$ alkynyl group.

The term "$C_1$-$C_6$ alkoxy group" as used herein may be a monovalent group represented by $—O(A_{101})$ (wherein $A_{101}$ may be a $C_1$-$C_6$ alkyl group), and examples thereof may include a methoxy group, an ethoxy group, and an isopropyloxy group.

The term "$C_3$-$C_{10}$ cycloalkyl group" as used herein may be a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein may be a divalent group having a same structure as the $C_3$-$C_{10}$ cycloalkyl group.

The term "$C_1$-$C_{10}$ heterocycloalkyl group" as used herein may be a monovalent cyclic group that further includes, in addition to a carbon atom, at least one heteroatom as a ring-forming atom and has 1 to 10 carbon atoms, and examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein may be a divalent group having a same structure as the $C_1$-$C_{10}$ heterocycloalkyl group.

The term "$C_3$-$C_{10}$ cycloalkenyl group" as used herein may be a monovalent cyclic group that has three to ten carbon atoms and at least one carbon-carbon double bond in the ring thereof and no aromaticity, and examples thereof may include a cyclopentenyl group, a cyclohexenyl group, and a cycloheptenyl group. The term "$C_3$-$C_{10}$ cycloalkenylene group" as used herein may be a divalent group having a same structure as the $C_3$-$C_{10}$ cycloalkenyl group.

The term "$C_1$-$C_{10}$ heterocycloalkenyl group" as used herein may be a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein may be a divalent group having a same structure as the $C_1$-$C_{10}$ heterocycloalkenyl group.

The term "$C_6$-$C_{60}$ aryl group" as used herein may be a monovalent group having a carbocyclic aromatic system of six to sixty carbon atoms, and the term "$C_6$-$C_{60}$ arylene group" as used herein may be a divalent group having a carbocyclic aromatic system of six to sixty carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each independently include two or more rings, the respective rings may be condensed with each other.

The term "$C_1$-$C_6$ heteroaryl group" as used herein may be a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein may be a divalent group having a heterocyclic aromatic system that has, in addition to a carbon atom, at least one heteroatom as a ring-forming atom, and 1 to 60 carbon atoms. Examples of the $C_1$-$C_6$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_6$ heteroaryl group and the $C_1$-$C_6$ heteroarylene group each independently include two or more rings, the respective rings may be condensed with each other.

The term "monovalent non-aromatic condensed polycyclic group" as used herein may be a monovalent group having two or more rings condensed to each other, only carbon atoms (for example, having 8 to 60 carbon atoms) as ring-forming atoms, and non-aromaticity in its molecular structure when considered as a whole. Examples of the monovalent non-aromatic condensed polycyclic group may include an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as used herein may be a divalent group having a same structure as a monovalent non-aromatic condensed polycyclic group.

The term "monovalent non-aromatic condensed heteropolycyclic group" as used herein may be a monovalent group having two or more rings condensed to each other, at least one heteroatom in addition to carbon atoms (for example, having 1 to 60 carbon atoms), as a ring-forming atom, and non-aromaticity in its molecular structure when considered as a whole. Examples of the monovalent non-aromatic condensed heteropolycyclic group may include a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein may be a divalent group having a same structure as a monovalent non-aromatic condensed heteropolycyclic group.

The term "$C_6$-$C_{60}$ aryloxy group" as used herein may be a group represented by —O($A_{102}$) (wherein $A_{102}$ may be a $C_6$-$C_{60}$ aryl group), and the term "$C_6$-$C_6$ arylthio group" as used herein may be a group represented by —S($A_{103}$) (wherein $A_{103}$ may be a $C_6$-$C_{60}$ aryl group).

The term "$C_7$-$C_{60}$ arylalkyl group" as used herein may be a group represented by -($A_{104}$)($A_{105}$) (wherein $A_{104}$ may be a $C_1$-$C_{54}$ alkylene group, and $A_{105}$ may be a $C_6$-$C_{59}$ aryl group), and the term "$C_2$-$C_{60}$ heteroarylalkyl group" as used herein may be a group represented by -($A_{106}$)($A_{107}$) (wherein $A_{106}$ may be a $C_1$-$C_{59}$ alkylene group, and $A_{107}$ may be a $C_1$-$C_{59}$ heteroaryl group).

In the specification, the group $R_{10a}$ may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_6$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, a $C_1$-$C_{60}$ heteroarylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, a $C_1$-$C_{60}$ heteroarylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, a $C_1$-$C_{60}$ heteroarylthio group, a $C_7$-$C_{60}$ arylalkyl group, a $C_2$-$C_{60}$ heteroarylalkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

In the specification, $Q_1$, $Q_2$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_6$ alkoxy group; or a $C_3$-$C_{60}$ carbocyclic group, a $C_1$-$C_6$ heterocyclic group, a $C_7$-$C_6$ arylalkyl group, or a $C_2$-$C_{60}$ heteroarylalkyl group, each unsubstituted or substituted with deuterium, —F, a cyano group, a $C_1$-$C_{60}$ alkyl group, a $C_1$-$C_6$ alkoxy group, a phenyl group, a biphenyl group, or any combination thereof.

The term "heteroatom" as used herein may be any atom other than a carbon atom or a hydrogen atom. Examples of the heteroatom may include O, S, N, P, Si, B, Ge, Se, or any combination thereof.

The term "third-row transition metal" as used herein may include hafnium (Hf), tantalum (Ta), tungsten (W), rhenium (Re), osmium (Os), iridium (Ir), platinum (Pt), gold (Au), or the like.

The term "Ph" as used herein refers to a phenyl group, the term "Me" as used herein refers to a methyl group, the term "Et" as used herein refers to an ethyl group, the terms "tert-Bu" or "$Bu^t$" as used herein each refer to a tert-butyl group, and the term "OMe" as used herein refers to a methoxy group.

The term "biphenyl group" as used herein may be a "phenyl group substituted with a phenyl group." For example, the "biphenyl group" may be a substituted phenyl group having a $C_6$-$C_{60}$ aryl group as a substituent.

The term "terphenyl group" as used herein may be a "phenyl group substituted with a biphenyl group". For example, the "terphenyl group" may be a substituted phenyl group having, as a substituent, a $C_6$-$C_{60}$ aryl group substituted with a $C_6$-$C_{60}$ aryl group.

The symbols * and *' as used herein, unless defined otherwise, each refer to a binding site to a neighboring atom in a corresponding formula or moiety.

Hereinafter, a compound according to an embodiment and a light-emitting device according to an embodiment will each be described in further detail with reference to the following Synthesis Examples and Examples. The wording "B was utilized instead of A," used in describing Synthesis Examples, indicates that an identical molar equivalent of B was utilized in place of A.

EXAMPLES

Synthesis Example 1: Synthesis of Compound BD1

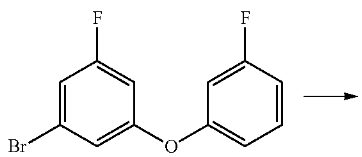

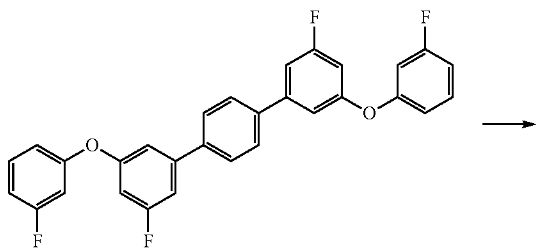

[1-1]

-continued

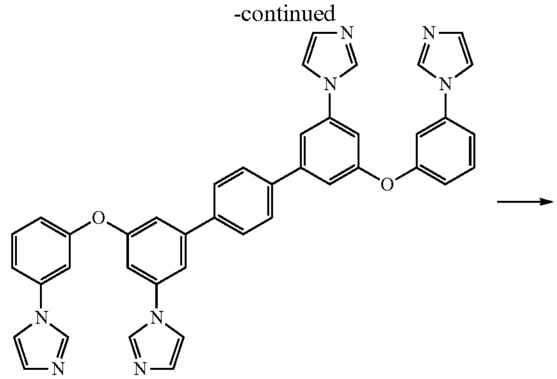

[1-2]

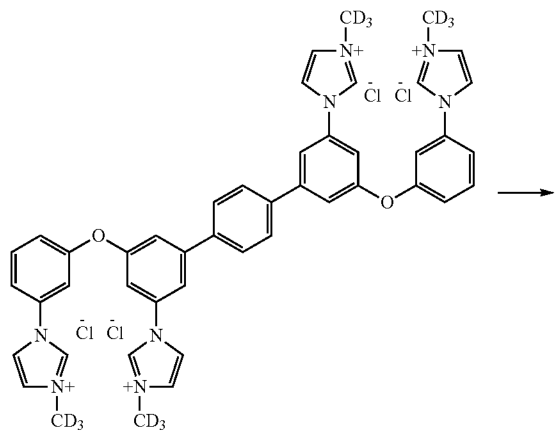

[1-3]

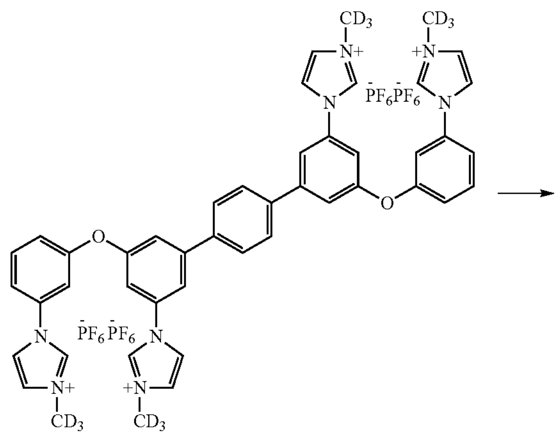

[1-4]

-continued

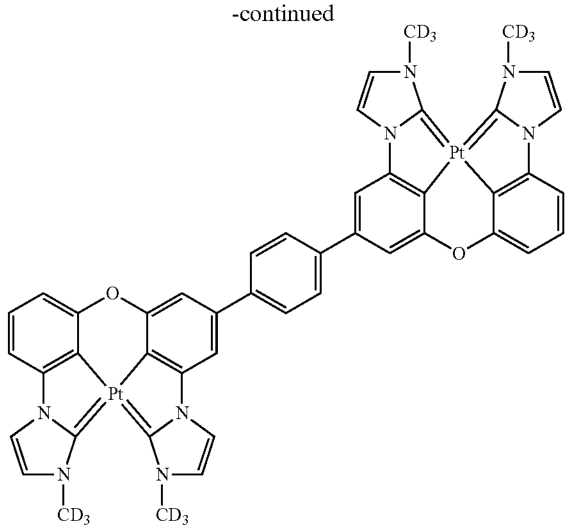

BD1

(1) Synthesis of Intermediate [1-1]

21.0 g (62 mmol) of 1-bromo-3-fluoro-5-(3-fluorophenoxy)benzene, 5.2 g (30 mmol) of 1,4-phenylenediboronic acid, 1.0 g (0.06 mmol) of tetrakis(triphenylphosphine) palladium, and 18.5 g (124 mmol) of potassium phosphate tribasic were added into a reaction vessel and suspended in 650 ml of THF/$H_2O$. The reaction mixture was heated and stirred at 80° C. for 12 hours. After the reaction was completed, the reaction vessel was cooled to room temperature, and an organic layer was extracted by utilizing ethylacetate. The extracted organic layer was washed with a saturated aqueous sodium chloride solution and dried by utilizing sodium sulfate. A residue obtained by removing the solvent therefrom was separated by utilizing column chromatography to obtain 21.2 g (27 mmol) of Intermediate [1-1].

(2) Synthesis of Intermediate [1-2]

21.2 g (27 mmol) of Intermediate [1-1], 12.1 g (120 mmol) of 1H-imidazole, and 18.5 g (120 mmol) of potassium phosphate tribasic were added into a reaction vessel and suspended in 400 ml of dimethylsulfoxide. The reaction mixture was heated and stirred at 160° C. for 24 hours. After the reaction was completed, the reaction vessel was cooled to room temperature, and an organic layer was extracted by utilizing ethylacetate. The extracted organic layer was washed with a saturated aqueous sodium chloride solution and dried by utilizing sodium sulfate. A residue obtained by removing the solvent therefrom was separated by utilizing column chromatography to obtain 13.5 g (25 mmol) of Intermediate [1-2].

(3) Synthesis of Intermediates [1-3] and [1-4]

13.5 g (25 mmol) of Intermediate [1-2] and iodomethane-$d_3$ (excess) were added into a reaction vessel and suspended in 110 ml of dichloromethane. The reaction temperature was raised to 50° C., and the reaction mixture was stirred for 12 hours. After the reaction was completed, the reaction vessel was cooled to room temperature, and an organic layer was extracted by utilizing ethylacetate. The extracted organic layer was washed with a saturated aqueous sodium chloride solution and dried by utilizing sodium sulfate. A residue obtained by removing the solvent therefrom was separated by utilizing column chromatography to obtain 24.1 g (22 mmol) of Intermediate [1-3].

3.3 g (25 mmol) of ammonium hexafluorophosphate was added to the reaction vessel and suspended in a solution containing methanol and water that were mixed at a ratio of 2:1. The reaction mixture was stirred at room temperature for 12 hours. A solid thus produced was filtered, and a residue was separated by utilizing column chromatography to obtain 23.7 g (20 mmol) of Intermediate [1-4].

(4) Synthesis of Compound BD1

23.7 g (20 mmol) of Intermediate [1-4], 1.0 g (4 mmol) of dichloro(1,5-cyclooctadiene)platinum, and 2.4 g (22 mmol) of sodium acetate were suspended in 100 ml of dioxane. The reaction mixture was heated and stirred at 120° C. for 72 hours. After the reaction was completed, the reaction vessel was cooled to room temperature, and an organic layer was extracted by utilizing ethylacetate. The extracted organic layer was washed with a saturated aqueous sodium chloride solution and dried by utilizing sodium sulfate. A residue obtained by removing the solvent therefrom was separated by utilizing column chromatography to obtain 2.1 g (2 mmol) of Compound BD1.

Synthesis Example 2: Synthesis of Compound BD9

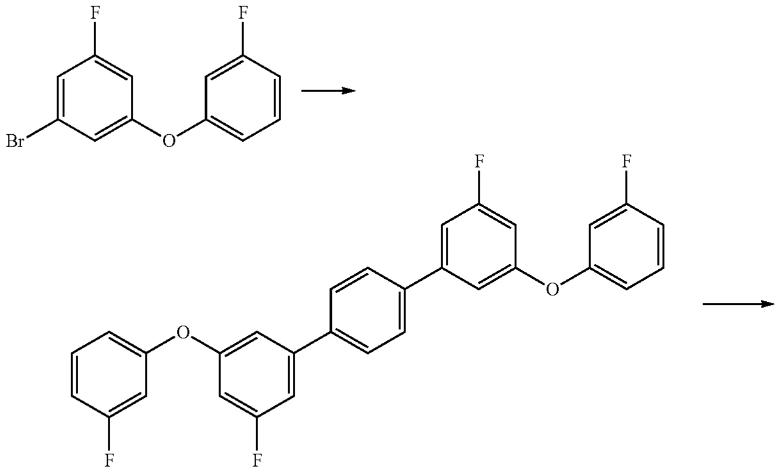

[9-1]

-continued
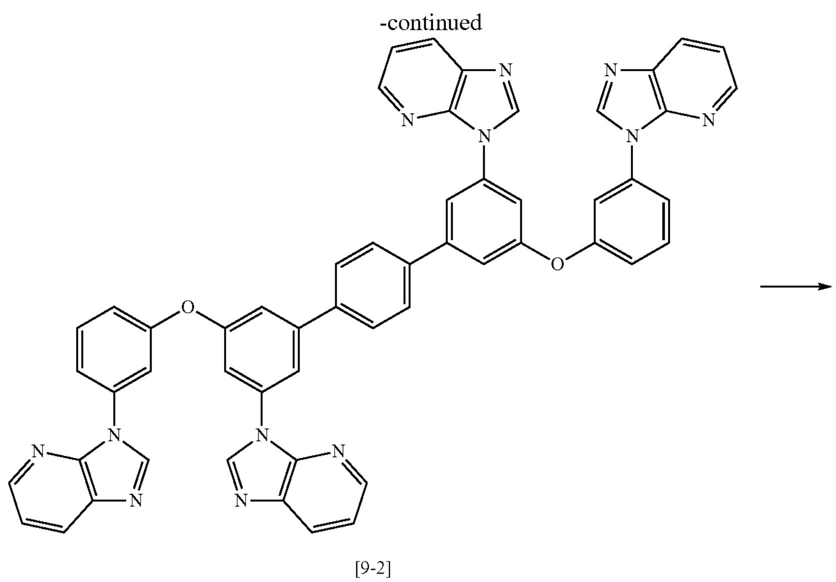
[9-2]
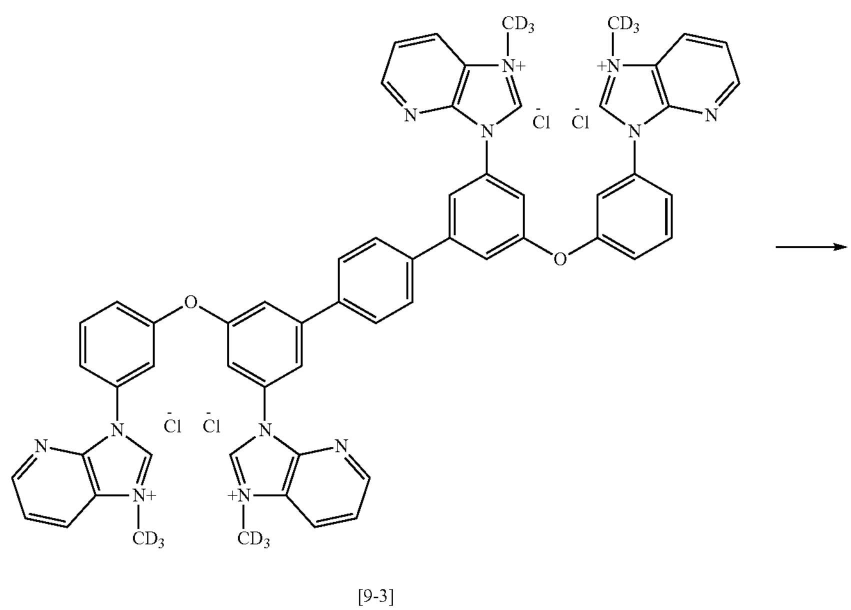
[9-3]

-continued

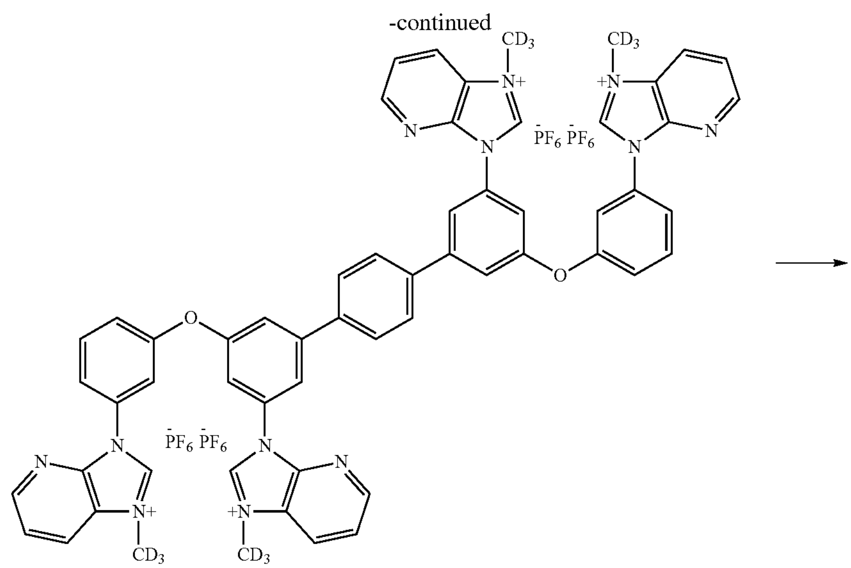

[9-4]

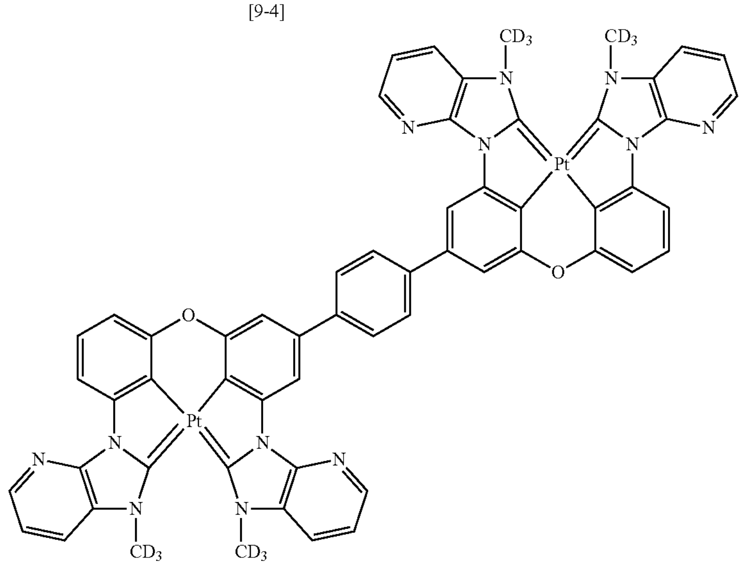

BD9

(1) Synthesis of Intermediate [9-1]

21.0 g (62 mmol) of 1-bromo-3-fluoro-5-(3-fluorophenoxy)benzene, 5.2 g (30 mmol) of 1,4-phenylenediboronic acid, 1.0 g (0.06 mmol) of tetrakis(triphenylphosphine) palladium, and 18.5 g (124 mmol) of potassium phosphate tribasic were added into a reaction vessel and suspended in 650 ml of THF/$H_2O$. The reaction mixture was heated and stirred at 80° C. for 12 hours. After the reaction was completed, the reaction vessel was cooled to room temperature, and an organic layer was extracted by utilizing ethylacetate. The extracted organic layer was washed with a saturated aqueous sodium chloride solution and dried by utilizing sodium sulfate. A residue obtained by removing the solvent therefrom was separated by utilizing column chromatography to obtain 21.2 g (27 mmol) of Intermediate [9-1].

(2) Synthesis of Intermediate [9-2]

21.2 g (27 mmol) of Intermediate [9-1], 14.3 g (122 mmol) of 3H-imidazo[4,5-b]pyridine, and 18.5 g (120 mmol) of potassium phosphate tribasic were added into a reaction vessel and suspended in 400 ml of dimethylsulfoxide. The reaction mixture was heated and stirred at 160° C. for 24 hours. After the reaction was completed, the reaction vessel was cooled to room temperature, and an organic layer was extracted by utilizing ethylacetate. The extracted organic layer was washed with a saturated aqueous sodium chloride solution and dried by utilizing sodium sulfate. A residue obtained by removing the solvent therefrom was separated by utilizing column chromatography to obtain 13.3 g (23 mmol) of Intermediate [9-2].

(3) Synthesis of Intermediates [9-3] and [9-4]

13.3 g (23 mmol) of Intermediate [9-2] and iodomethane-$d_3$ (excess) were added into a reaction vessel and suspended in 110 ml of dichloromethane. The reaction temperature was raised to 50° C., and the reaction mixture was stirred for 12 hours. After the reaction was completed, the reaction vessel was cooled to room temperature, and an organic layer was extracted by utilizing ethylacetate. The extracted organic layer was washed with a saturated aqueous sodium chloride solution and dried by utilizing sodium sulfate. A residue obtained by removing the solvent therefrom was separated by utilizing column chromatography to obtain 24.3 g (21 mmol) of Intermediate [9-3].

3.3 g (25 mmol) of ammonium hexafluorophosphate was added to the reaction vessel and suspended in a solution containing methanol and water that were mixed at a ratio of 2:1. The reaction mixture was stirred at room temperature for 12 hours. A solid thus produced was filtered, and a residue was separated by utilizing column chromatography to obtain 23.9 g (20 mmol) of Intermediate [9-4].

(4) Synthesis of Compound BD9

23.9 g (20 mmol) of Intermediate [9-4], 1.0 g (4 mmol) of dichloro(1,5-cyclooctadiene)platinum, and 2.4 g (22 mmol) of sodium acetate were suspended in 100 ml of dioxane. The reaction mixture was heated and stirred at 120° C. for 72 hours. After the reaction was completed, the reaction vessel was cooled to room temperature, and an organic layer was extracted by utilizing ethylacetate. The extracted organic layer was washed with a saturated aqueous sodium chloride solution and dried by utilizing sodium sulfate. A residue obtained by removing the solvent therefrom was separated by utilizing column chromatography to obtain 2.2 g (2 mmol) of Compound BD9.

Synthesis Example 3: Synthesis of Compound BD17

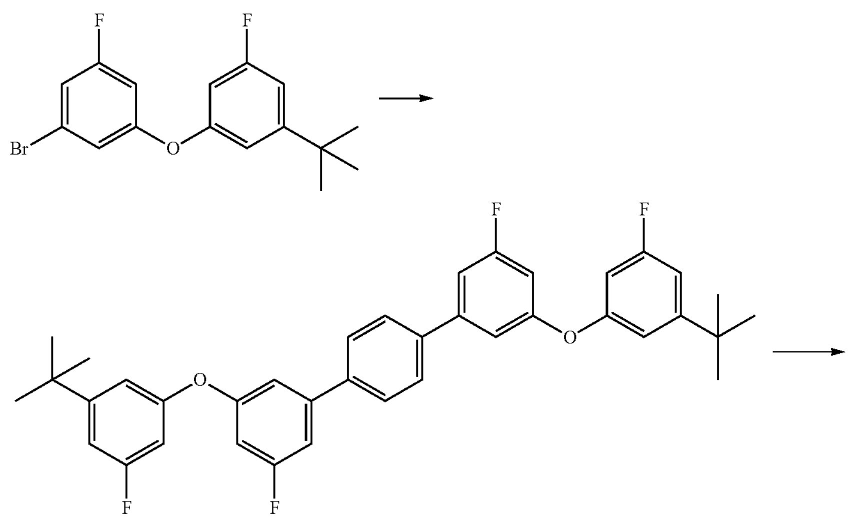

[17-1]

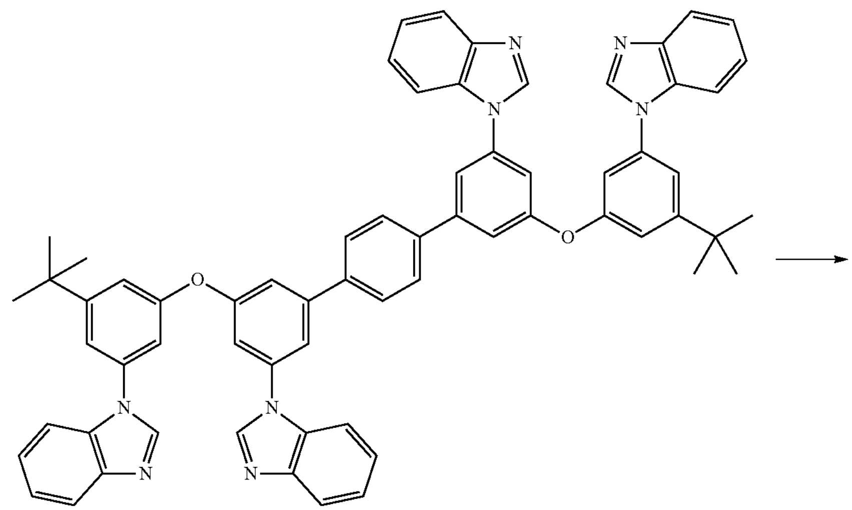

[17-2]

-continued
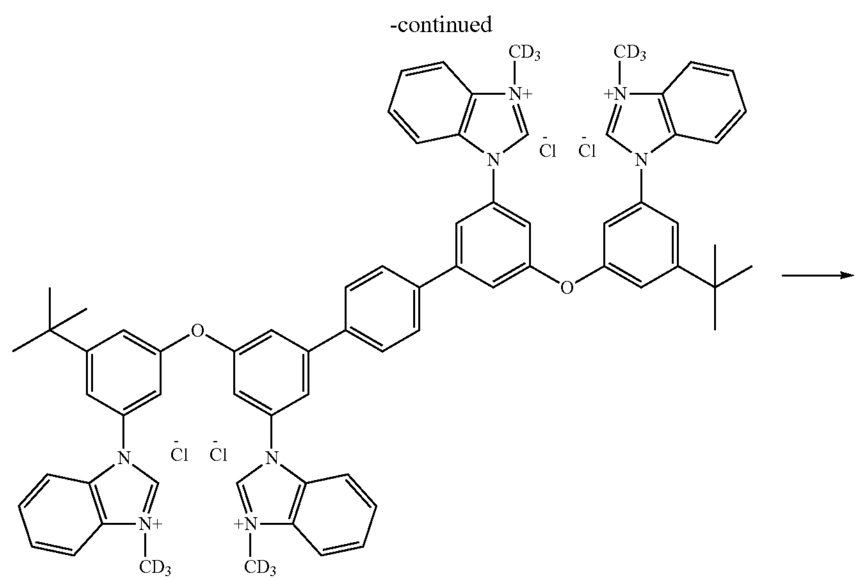
[17-3]
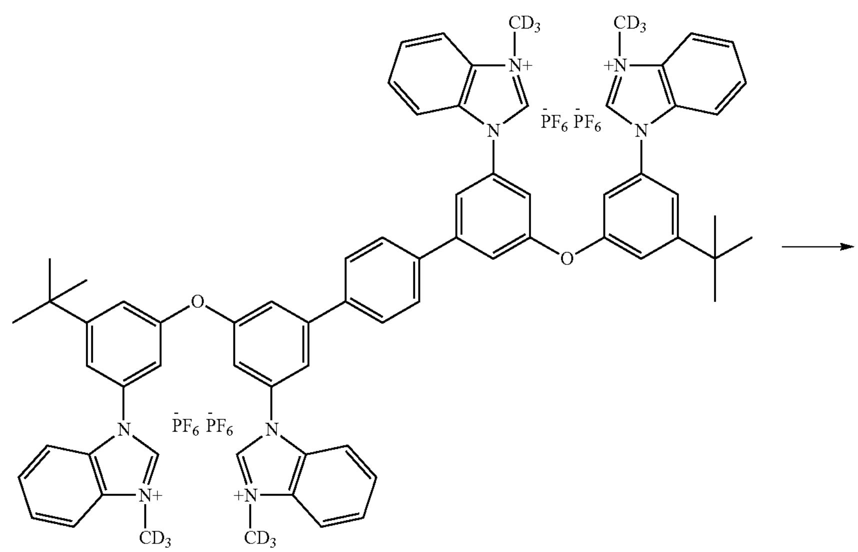
[17-4]

-continued

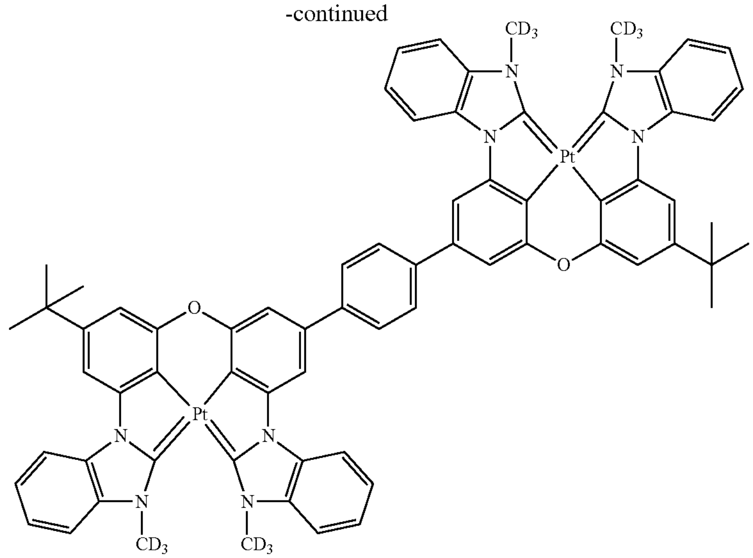

BD17

(1) Synthesis of Intermediate [17-1]

23.0 g (60 mmol) of 1-bromo-3-fluoro-5-(3-fluoro-5-tbutylphenoxy)benzene, 5.0 g (28 mmol) of 1,4-phenylenediboronic acid, 0.8 g (0.06 mmol) of tetrakis(triphenylphosphine)palladium, and 18.5 g (124 mmol) of potassium phosphate tribasic were added into a reaction vessel and suspended in 650 ml of $THF/H_2O$. The reaction mixture was heated and stirred at 80° C. for 12 hours. After the reaction was completed, the reaction vessel was cooled to room temperature, and an organic layer was extracted by utilizing ethylacetate. The extracted organic layer was washed with a saturated aqueous sodium chloride solution and dried by utilizing sodium sulfate. A residue obtained by removing the solvent therefrom was separated by utilizing column chromatography to obtain 20.5 g (25 mmol) of Intermediate [17-1].

(2) Synthesis of Intermediate [17-2]

20.5 g (25 mmol) of Intermediate [17-1], 12.7 g (125 mmol) of benzimidazole, and 18.5 g (120 mmol) of potassium phosphate tribasic were added into a reaction vessel and suspended in 400 ml of dimethylsulfoxide. The reaction mixture was heated and stirred at 160° C. for 24 hours. After the reaction was completed, the reaction vessel was cooled to room temperature, and an organic layer was extracted by utilizing ethylacetate. The extracted organic layer was washed with a saturated aqueous sodium chloride solution and dried by utilizing sodium sulfate. A residue obtained by removing the solvent therefrom was separated by utilizing column chromatography to obtain 13.0 g (20 mmol) of Intermediate [17-2].

(3) Synthesis of Intermediates [17-3] and [17-4]

13.0 g (20 mmol) of Intermediate [17-2] and iodomethane-$d_3$ (excess) were added into a reaction vessel and suspended in 110 ml of dichloromethane. The reaction temperature was raised to 50° C., and the reaction mixture was stirred for 12 hours. After the reaction was completed, the reaction vessel was cooled to room temperature, and an organic layer was extracted by utilizing ethylacetate. The extracted organic layer was washed with a saturated aqueous sodium chloride solution and dried by utilizing sodium sulfate. A residue obtained by removing the solvent therefrom was separated by utilizing column chromatography to obtain 22.1 g (18 mmol) of Intermediate [17-3].

3.3 g (25 mmol) of ammonium hexafluorophosphate was added to the reaction vessel, and suspended in a solution containing methanol and water that were mixed at a ratio of 2:1. The reaction mixture was stirred at room temperature for 12 hours. A solid thus produced was filtered, and a residue was separated by utilizing column chromatography to obtain 20.1 g (16 mmol) of Intermediate [17-4].

(4) Synthesis of Compound BD17

20.1 g (16 mmol) of Intermediate [17-4], 1.0 g (4 mmol) of dichloro(1,5-cyclooctadiene)platinum, and 2.2 g (20 mmol) of sodium acetate were suspended in 100 ml of dioxane. The reaction mixture was heated and stirred at 120° C. for 72 hours. After the reaction was completed, the reaction vessel was cooled to room temperature, and an organic layer was extracted by utilizing ethylacetate. The extracted organic layer was washed with a saturated aqueous sodium chloride solution and dried by utilizing sodium sulfate. A residue obtained by removing the solvent therefrom was separated by utilizing column chromatography to obtain 1.8 g (1.5 mmol) of Compound BD17.

Synthesis Example 4: Synthesis of Compound BD25
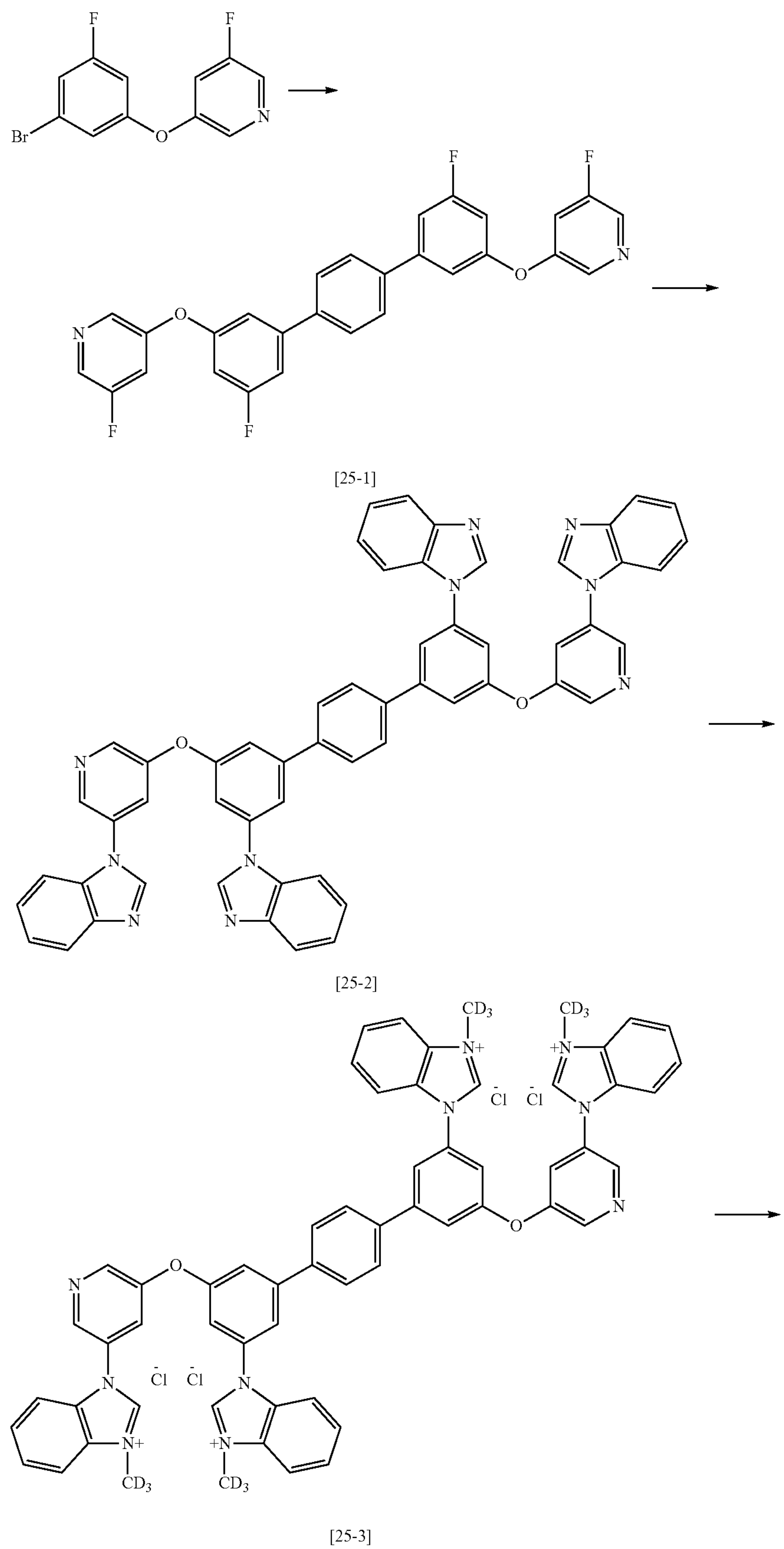
[25-1]
[25-2]
[25-3]

-continued

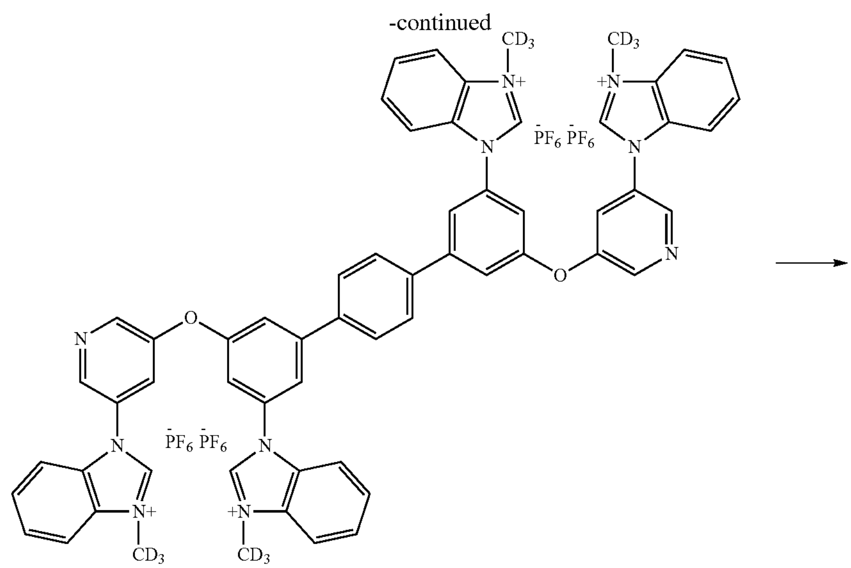

[25-4]

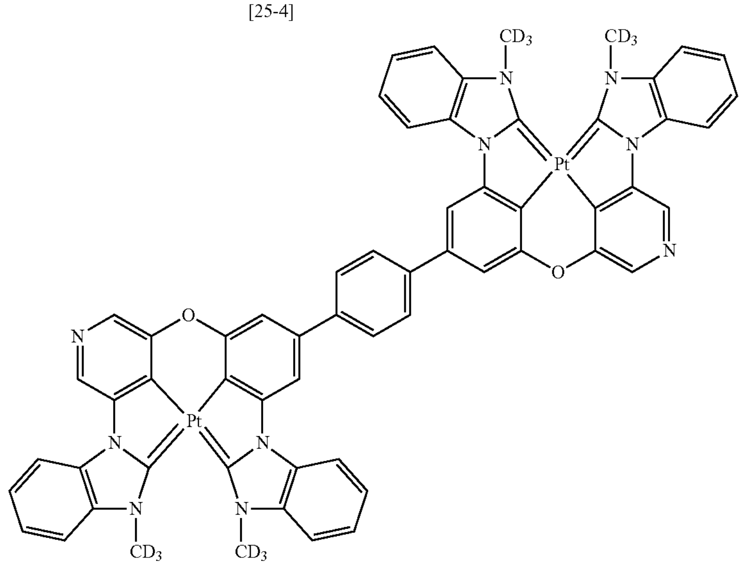

BD25

(1) Synthesis of Intermediate [25-1]

25.1 g (63 mmol) of 3-(3-bromo-5-fluorophenoxy)-5-fluoropyridine, 5.0 g (28 mmol) of 1,4-phenylenediboronic acid, 0.8 g (0.06 mmol) of tetrakis(triphenylphosphine) palladium, and 18.5 g (124 mmol) of potassium phosphate tribasic were added into a reaction vessel and suspended in 650 ml of THF/$H_2O$. The reaction mixture was heated and stirred at 80° C. for 12 hours. After the reaction was completed, the reaction vessel was cooled to room temperature, and an organic layer was extracted by utilizing ethylacetate. The extracted organic layer was washed with a saturated aqueous sodium chloride solution and dried by utilizing sodium sulfate. A residue obtained by removing the solvent therefrom was separated by utilizing column chromatography to obtain 22.5 g (26 mmol) of Intermediate [25-1].

(2) Synthesis of Intermediate [25-2]

22.5 g (26 mmol) of Intermediate [25-1], 12.7 g (125 mmol) of benzimidazole, and 18.5 g (120 mmol) of potassium phosphate tribasic were added into a reaction vessel and suspended in 400 ml of dimethylsulfoxide. The reaction mixture was heated and stirred at 160° C. for 24 hours. After the reaction was completed, the reaction vessel was cooled to room temperature, and an organic layer was extracted by utilizing ethylacetate. The extracted organic layer was washed with a saturated aqueous sodium chloride solution and dried by utilizing sodium sulfate. A residue obtained by removing the solvent therefrom was separated by utilizing column chromatography to obtain 12.7 g (21 mmol) of Intermediate [25-2].

(3) Synthesis of Intermediate [25-3, 25-4]

12.7 g (21 mmol) of Intermediate [25-2] and iodomethane-$d_3$ (excess) were added into a reaction vessel and suspended in 110 ml of dichloromethane. The reaction temperature was raised to 50° C., and the reaction vessel(->mixture) was stirred for 12 hours. After the reaction was completed, the reaction vessel was cooled to room temperature, and an organic layer was extracted by utilizing ethylacetate. The extracted organic layer was washed with a saturated aqueous sodium chloride solution and dried by utilizing sodium sulfate. A residue obtained by removing the solvent therefrom was separated by utilizing column chromatography to obtain 22.0 g (18 mmol) of Intermediate [25-3].

3.3 g (25 mmol) of ammonium hexafluorophosphate was added to the reaction vessel, and suspended in a solution containing methanol and water that were mixed at a ratio of 2:1. The reaction mixture was stirred at room temperature for 12 hours. A solid thus produced was filtered, and a residue was separated by utilizing column chromatography to obtain 20.7 g (17 mmol) of Intermediate [25-4].

(4) Synthesis of Compound BD25

20.7 g (17 mmol) of Intermediate [25-4], 1.0 g (4 mmol) of dichloro(1,5-cyclooctadiene)platinum, and 2.2 g (20 mmol) of sodium acetate were suspended in 100 ml of dioxane. The reaction mixture was heated and stirred at 120° C. for 72 hours. After the reaction was completed, the reaction vessel was cooled to room temperature, and an organic layer was extracted by utilizing ethylacetate. The extracted organic layer was washed with a saturated aqueous sodium chloride solution and dried by utilizing sodium sulfate. A residue obtained by removing the solvent therefrom was separated by utilizing column chromatography to obtain 2.1 g (1.6 mmol) of Compound BD25.

Synthesis Example 5: Synthesis of Compound BD33

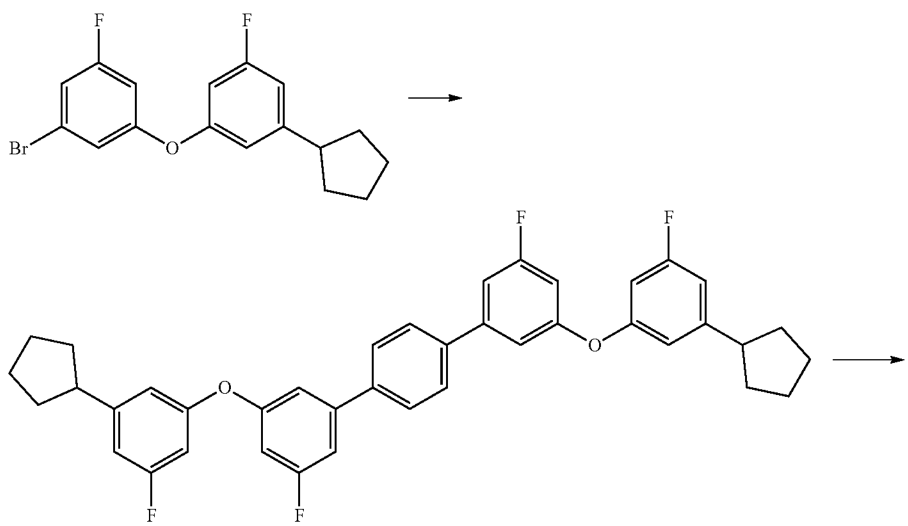

[33-1]

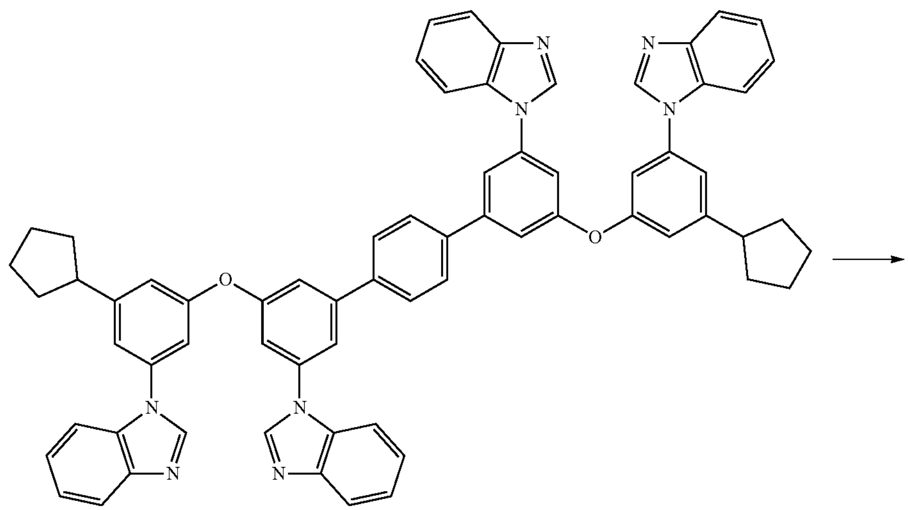

[33-2]

-continued
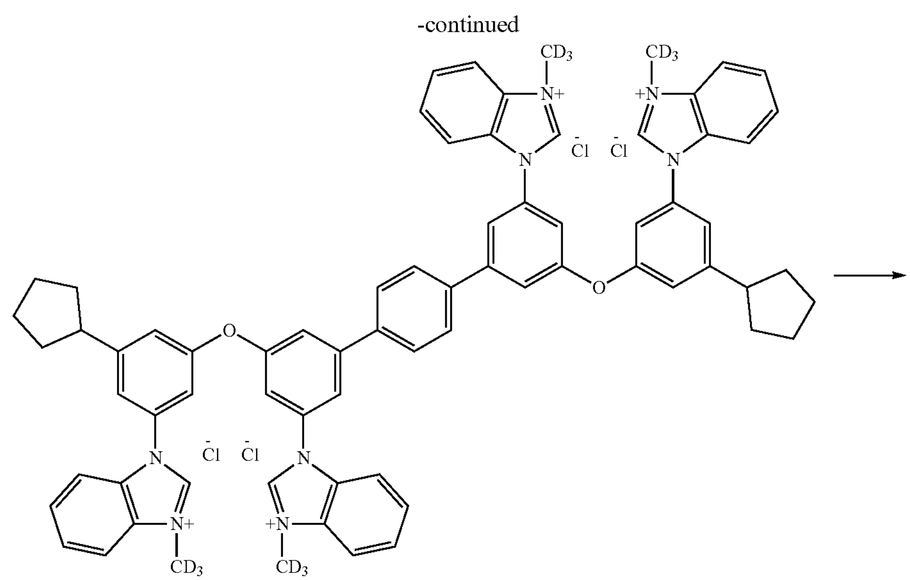
[33-3]
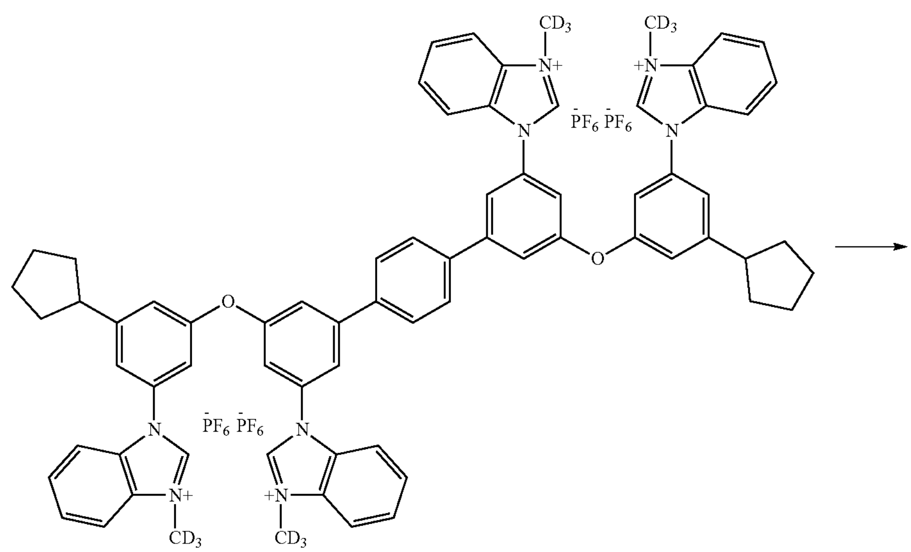
[33-4]

-continued

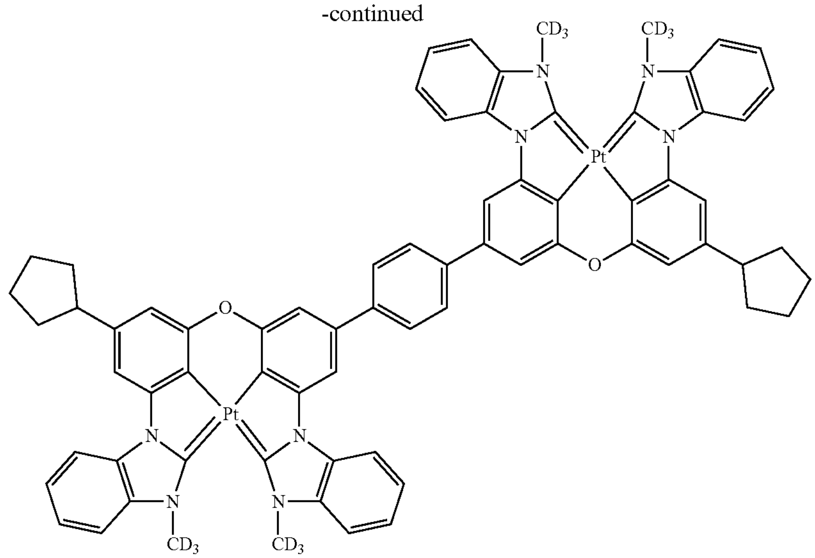

BD33

(1) Synthesis of Intermediate [33-1]

25.0 g (62 mmol) of 1-bromo-3-(3-cyclopentyl-5-fluorophenoxy)-5-fluorobenzene, 5.0 g (28 mmol) of 1,4-phenylenediboronic acid, 0.8 g (0.06 mmol) of tetrakis(triphenylphosphine)palladium, and 18.5 g (124 mmol) of potassium phosphate tribasic were added into a reaction vessel and suspended in 650 ml of THF/$H_2O$. The reaction mixture was heated and stirred at 80° C. for 12 hours. After the reaction was completed, the reaction vessel was cooled to room temperature, and an organic layer was extracted by utilizing ethylacetate. The extracted organic layer was washed with a saturated aqueous sodium chloride solution and dried by utilizing sodium sulfate. A residue obtained by removing the solvent therefrom was separated by utilizing column chromatography to obtain 22.5 g (26 mmol) of Intermediate [33-1].

(2) Synthesis of Intermediate [33-2]

22.5 g (26 mmol) of Intermediate [33-1], 12.7 g (125 mmol) of benzimidazole, and 18.5 g (120 mmol) of potassium phosphate tribasic were added into a reaction vessel and suspended in 400 ml of dimethylsulfoxide. The reaction mixture was heated and stirred at 160° C. for 24 hours. After the reaction was completed, the reaction vessel was cooled to room temperature, and an organic layer was extracted by utilizing ethylacetate. The extracted organic layer was washed with a saturated aqueous sodium chloride solution and dried by utilizing sodium sulfate. A residue obtained by removing the solvent therefrom was separated by utilizing column chromatography to obtain 12.4 g (20 mmol) of Intermediate [33-2].

(3) Synthesis of Intermediate [33-3, 33-4]

12.4 g (21 mmol) of Intermediate [33-2] and iodomethane-$d_3$ (excess) were added into a reaction vessel and suspended in 110 ml of dichloromethane. The reaction temperature was raised to 50° C., and the reaction vessel(->mixture) was stirred for 12 hours. After the reaction was completed, the reaction vessel was cooled to room temperature, and an organic layer was extracted by utilizing ethylacetate. The extracted organic layer was washed with a saturated aqueous sodium chloride solution and dried by utilizing sodium sulfate. A residue obtained by removing the solvent therefrom was separated by utilizing column chromatography to obtain 22.0 g (18 mmol) of Intermediate [33-3].

3.3 g (25 mmol) of ammonium hexafluorophosphate was added to the reaction vessel, and suspended in a solution containing methanol and water that were mixed at a ratio of 2:1. The reaction mixture was stirred at room temperature for 12 hours. A solid thus produced was filtered, and a residue was separated by utilizing column chromatography to obtain 20.6 g (16 mmol) of Intermediate [33-4].

(4) Synthesis of Compound BD33

20.6 g (16 mmol) of Intermediate [33-4], 1.0 g (4 mmol) of dichloro(1,5-cyclooctadiene)platinum, and 2.2 g (20 mmol) of sodium acetate were suspended in 100 ml of dioxane. The reaction mixture was heated and stirred at 120° C. for 72 hours. After the reaction was completed, the reaction vessel was cooled to room temperature, and an organic layer was extracted by utilizing ethylacetate. The extracted organic layer was washed with a saturated aqueous sodium chloride solution and dried by utilizing sodium sulfate. A residue obtained by removing the solvent therefrom was separated by utilizing column chromatography to obtain 2.0 g (1.5 mmol) of Compound BD33.

$^1H$ NMR and MS/FAB of the compounds synthesized according to Synthesis Examples are shown in Table 1.

TABLE 1

| No. | $^1H$ NMR ($CDCl_3$, 400 MHz) | MS/FAB Found | MS/FAB calc. |
|---|---|---|---|
| BD1 | 6.57 (d, 4H), 6.78 (d, 4H), 7.13-7.32 (m, 10H), 7.33-7.42 (m, 4H) | 1133.08 | 1132.26 |
| BD9 | 6.88-6.94 (m, 16H), 7.11-7.30 (m, 10H), 7.30-7.41 (m, 4H) | 1337.31 | 1336.33 |
| BD17 | 1.35 (s, 18H), 6.89-6.97 (m, 16H), 7.12-7.32 (m, 8H), 7.33-7.42 (m, 4H) | 1445.28 | 1444.47 |
| BD25 | 6.84-6.96 (m, 16H), 7.10-7.26 (m, 8H), 7.28-7.40 (m, 4H) | 1335.32 | 1334.34 |
| BD33 | 1.31-1.39 (m, 18H), 6.85-6.97 (m, 16H), 7.10-7.27 (m, 8H), 7.29-7.40 (m, 4H) | 1469.44 | 1468.47 |

Example 1

An ITO anode-deposited substrate was prepared to a size of 50 mm×50 mm×0.7 mm. The substrate was cleaned by sonication with isopropyl alcohol and pure water each for 5 minutes. Ultraviolet rays were irradiated onto the substrate and the substrate was exposed to and cleaned by ozone for 30 minutes. The cleaned substrate was loaded into a vacuum deposition apparatus.

Compound 2-TNATA was vacuum-deposited on the ITO substrate to form a hole injection layer having a thickness of 600 Å. 4,4'-bis[N-(1-naphthyl)-N-phenylamino]biphenyl (NPB) was vacuum-deposited on the hole injection layer to form a hole transport layer having a thickness of 300 Å.

3,3-di(9H-carbazol-9-yl)biphenyl (mCBP) as a host and Compound BD1 as a dopant were co-deposited on the hole transport layer at a weight ratio of 90:10 to form an emission layer having a thickness of 300 Å.

Diphenyl(4-(triphenylsilyl)phenyl)-phosphine oxide (TSPO1) was vacuum-deposited on the emission layer to form a hole blocking layer having a thickness of 50 Å. $Alq_3$ was deposited on the emission layer to form an electron transport layer having a thickness of 300 Å. LiF which is a halogenated alkaline metal was deposited on the electron transport layer to form an electron injection layer having a thickness of 10 Å. Al was vacuum-deposited thereon to form an LiF/Al cathode having a thickness of 3,000 Å, thereby completing the manufacture of a light-emitting device.

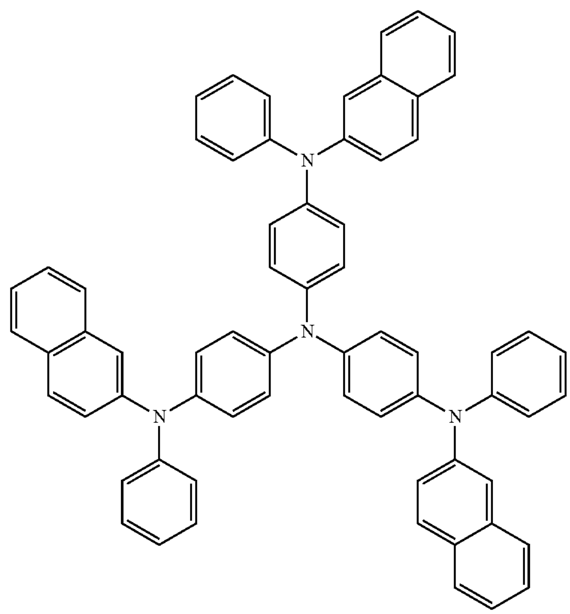

2-TNATA

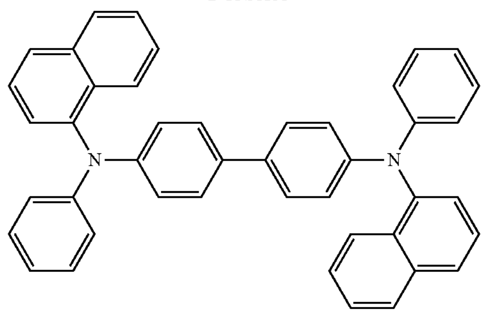

NPB

-continued

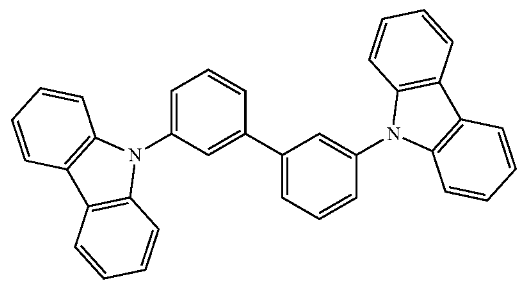

mCBP

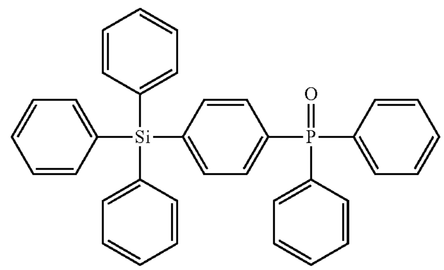

TSPO1

Examples 2 to 5 and Comparative Examples 1 to 4

Light-emitting devices were manufactured in the same manner as in Example 1, except that in forming the emission layer, for use as a dopant, corresponding compounds shown in Table 2 were used instead of Compound BD1.

Evaluation Examples

A voltage was supplied so that the light-emitting devices manufactured according to Examples 1 to 5 and Comparative Examples 1 to 4 had a current density of 50 $mA/cm^2$. The driving voltage (V), current density ($mA/cm^2$), luminance ($cd/m^2$), luminescence efficiency (cd/A), emission color, emission wavelength (nm), and lifespan (T95 @ 50 $mA/cm^2$) were each measured using Keithley MU 236 and luminance meter PR650, and the results are shown in Table 2.

TABLE 2

| | | Emission layer Dopant | Driving voltage (V) | Current density ($mA/cm^2$) | Luminance ($cd/m^2$) | Efficiency (cd/A) | Emission color | Emission wavelength (nm) | Lifespan ($T_{95}$) |
|---|---|---|---|---|---|---|---|---|---|
| Example | 1 | BD1 | 4.56 | 50 | 4018 | 9.55 | Blue | 460 | 45 |
| | 2 | BD9 | 4.20 | 50 | 4001 | 9.27 | Blue | 461 | 42 |
| | 3 | BD17 | 4.27 | 50 | 4010 | 9.26 | Blue | 464 | 41 |
| | 4 | BD25 | 4.73 | 50 | 4001 | 9.47 | Blue | 466 | 39 |
| | 5 | BD33 | 4.85 | 50 | 4002 | 9.28 | Blue | 465 | 40 |
| Comparative Example | 1 | Comparative Compound 1 | 5.12 | 50 | 3863 | 7.73 | Blue | 465 | 37 |
| | 2 | Comparative Compound 2 | 5.49 | 50 | 3522 | 7.37 | Blue-green | 479 | 33 |
| | 3 | Comparative Compound 3 | 5.22 | 50 | 3582 | 7.91 | Blue | 469 | 17 |
| | 4 | Comparative Compound 4 | 5.05 | 50 | 2000 | 8.51 | Green | 482 | 9 |

Structural formulae of Comparative Compounds 1 to 4 of Table 2 are as follows:

Comparative Compound 1

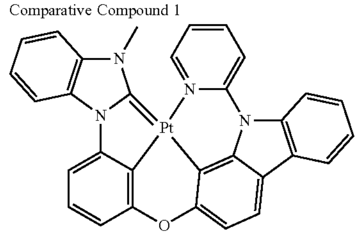

Comparative Compound 2

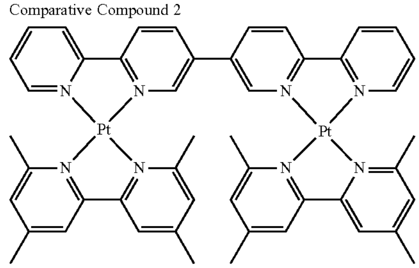

Comparative Compound 3

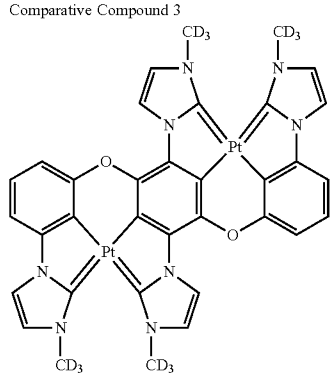

Comparative Compound 4

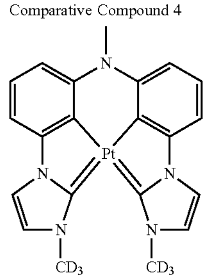

According to Table 2, the light-emitting devices of the Examples had lower driving voltage, higher luminance, higher efficiency, and longer lifespan than those of the light-emitting devices of the Comparative Examples.

According to embodiments, a light-emitting device including an organometallic compound may have a low driving voltage, high luminance and efficiency, and a long lifespan.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. An organometallic compound represented by Formula 1:

[Formula 1]

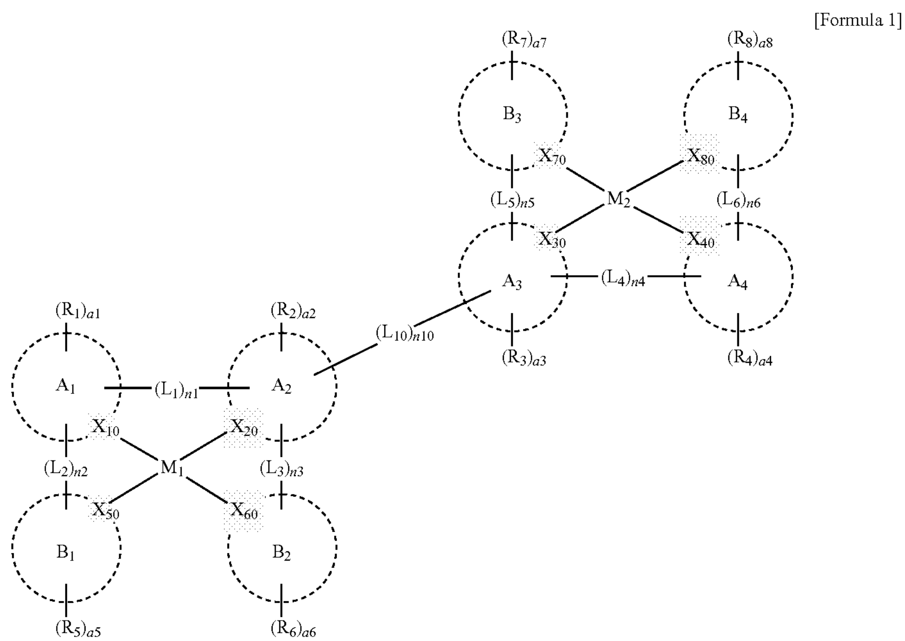

wherein in Formula 1, $M_1$ and $M_2$ are each independently platinum (Pt), palladium (Pd), copper (Cu), silver (Ag), gold (Au), rhodium (Rh), ruthenium (Ru), osmium (Os), titanium (Ti), zirconium (Zr), hafnium (Hf), europium (Eu), terbium (Tb), or thulium (Tm), $A_1$ to $A_4$ and $B_1$ to $B_4$ are each independently a $C_5$-$C_{60}$ carbocyclic group or a $C_1$-$C_{60}$ heterocyclic group, $X_{10}$ to $X_{80}$ are each independently C or N, $L_1$ to $L_6$ are each independently *—O—*', *—S—*', *—C($Q_1$)($Q_2$)-*', *—C($Q_1$)=*', *=C($Q_1$)-*' *—C($Q_1$)=C($Q_2$)-*', *—C(=O)—*' *—C(=S)—*', *—C≡C—*', *—B($Q_1$)-*', *—N($Q_1$)-*' *—P($Q_1$)-*', *—Si($Q_1$)($Q_2$)-*', *—P($Q_1$)($Q_2$)-*', or *—Ge($Q_1$)($Q_2$)-*', $L_{10}$ comprises a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, n1 to n6 and n10 are each independently an integer from 0 to 5, when n1 is 0, *-$(L_1)_{n1}$-*' is a single bond, when n2 is 0, *-$(L_2)_{n2}$-*' is a single bond, when n3 is 0, *-$(L_3)_{n3}$-*' is a single bond, when n4 is 0, *-$(L_4)_{n4}$-*' is a single bond, when n5 is 0, *-$(L_5)_{n5}$-*' is a single bond, when n6 is 0, *-$(L_6)_{n6}$-*' is a single bond, when n10 is 0, *-$(L_{10})_{n10}$-*' is a single bond, $R_1$ to $R_8$ and $R_{10a}$ are each independently:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, a $C_1$-$C_{60}$ heteroarylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, or a $C_1$-$C_{60}$ heteroarylthio group, each unsubstituted or substituted with deuterium, —F, —Cl, —Br, —I, a hydroxyl group, a cyano group, a nitro group, a $C_1$-$C_6$ alkyl group, a $C_2$-$C_{60}$ alkenyl group, a $C_2$-$C_{60}$ alkynyl group, a $C_1$-$C_6$ alkoxy group, a $C_3$-$C_{60}$ carbocyclic group, a $C_1$-$C_6$ heterocyclic group, a $C_6$-$C_{60}$ aryloxy group, a $C_6$-$C_{60}$ arylthio group, a $C_1$-$C_6$ heteroaryloxy group, a $C_1$-$C_{60}$ heteroarylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), a1 to a8 are each independently an integer from 0 to 8,

* and *' each indicate a binding site to a neighboring atom, $Q_1$, $Q_2$, $Q_{11}$ to $Q_{13}$, $Q_{21}$ to $Q_{23}$, and $Q_{31}$ to $Q_{33}$ are each independently: hydrogen; deuterium; —F; —Cl; —Br;

—I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof, and two neighboring substituents among $Q_1$, $Q_2$, $Q_{11}$ to $Q_{13}$, $Q_{21}$ to $Q_{23}$, and $Q_{31}$ to $Q_{33}$ are optionally bonded to each other to form a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$.

2. The organometallic compound of claim 1, wherein $M_1$ and $M_2$ are each independently Pt or Pd.

3. The organometallic compound of claim 1, wherein $A_1$ to $A_4$ are each independently a 5-membered cyclic group, a 5-membered heterocyclic group, a 6-membered cyclic group, a 6-membered heterocyclic group, a polycyclic $C_1$-$C_{30}$ cyclic group comprising a 5-membered cyclic group, a polycyclic $C_1$-$C_{30}$ cyclic group comprising a 6-membered cyclic group, a polycyclic $C_1$-$C_{30}$ heterocyclic group comprising a 5-membered cyclic group, a polycyclic $C_1$-$C_{30}$ heterocyclic group comprising a 6-membered cyclic group, a polycyclic $C_1$-$C_{30}$ heterocyclic group comprising a 5-membered heterocyclic group, or a polycyclic $C_1$-$C_{30}$ heterocyclic group comprising a 6-membered heterocyclic group.

4. The organometallic compound of claim 1, wherein $B_1$ to $B_4$ are each independently a 5-membered heterocyclic group, a polycyclic $C_1$-$C_{30}$ heterocyclic group comprising a 5-membered heterocyclic group, a 6-membered heterocyclic group, or a polycyclic $C_1$-$C_{30}$ heterocyclic group comprising a 6-membered heterocyclic group.

5. The organometallic compound of claim 1, wherein $B_1$ to $B_4$ are each independently a group represented by one of Formulae 3-1 to 3-3:

3-1

3-2

3-3

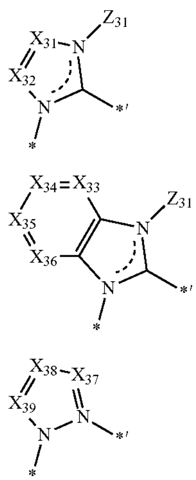

wherein in Formulae 3-1 to 3-3, $X_{31}$ to $X_{39}$ are each independently $C(Z_{32})$ or N, $Z_{31}$ and $Z_{32}$ are each independently the same as described in connection with Rio in Formula 1, and

* and *' each indicate a binding site to a neighboring atom.

6. The organometallic compound of claim 1, wherein at least one of a bond between $M_1$ and $X_{10}$, a bond between $M_1$ and $X_{20}$, a bond between $M_2$ and $X_{30}$, and a bond between $M_2$ and $X_{40}$ is a covalent bond, and at least one of a bond between $M_1$ and $X_{50}$, a bond between $M_1$ and $X_{60}$, a bond between $M_2$ and $X_{70}$, and a bond between $M_2$ and $X_{80}$ is a coordinate bond.

7. The organometallic compound of claim 1, wherein $L_1$ and $L_4$ are each independently *—C($Q_1$)($Q_2$)-*', *—N($Q_1$)-*', *—O—*', or *—S—*', a1 and a4 are each 1, and $Q_1$ and $Q_2$ are each the same as described in Formula 1.

8. The organometallic compound of claim 1, wherein $L_{10}$ comprises a $C_1$-$C_{20}$ alkylene group that is unsubstituted or substituted with at least one $R_{10a}$, a $C_2$-$C_{20}$ alkenylene group that is unsubstituted or substituted with at least one $R_{10a}$, a $C_2$-$C_{20}$ alkynylene group that is unsubstituted or substituted with at least one $R_{10a}$, a $C_3$-$C_{10}$ cycloalkylene group that is unsubstituted or substituted with at least one $R_{10a}$, a $C_1$-$C_{10}$ heterocycloalkylene group that is unsubstituted or substituted with at least one $R_{10a}$, a $C_3$-$C_{10}$ cycloalkenylene group that is unsubstituted or substituted with at least one $R_{10a}$, a $C_1$-$C_{10}$ heterocycloalkenylene group that is unsubstituted or substituted with at least one $R_{10a}$, a $C_6$-$C_{60}$ arylene group that is unsubstituted or substituted with at least one $R_{10a}$, a $C_1$-$C_6$ heteroarylene group that is unsubstituted or substituted with at least one $R_{10a}$, a divalent non-aromatic condensed polycyclic group that is unsubstituted or substituted with at least one $R_{10a}$, or a divalent non-aromatic condensed heterocyclic group that is unsubstituted or substituted with at least one $R_{10a}$.

9. The organometallic compound of claim 1, wherein $L_{10}$ comprises a group represented by one of Formulae 4-1 to 4-3:

4-1

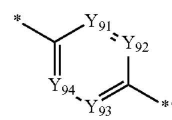

4-2

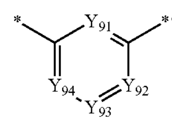

4-3

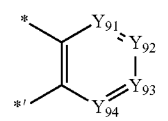

wherein in Formulae 4-1 to 4-3, $Y_{91}$ is $C(R_{91})$ or N, $Y_{92}$ is $C(R_{92})$ or N, $Y_{93}$ is $C(R_{93})$ or N, $Y_{94}$ is $C(R_{94})$ or N, $R_{91}$ to $R_{94}$ are each independently the same as described in connection with $R_{10a}$ in Formula 1, and

* and *' each indicate a binding site to a neighboring atom.

10. The organometallic compound of claim 1, wherein $R_1$ to $R_8$ are each independently:

hydrogen, deuterium, —F, —Cl, —Br, —I, a cyano group, a $C_1$-$C_{20}$ alkyl group, a $C_1$-$C_{20}$ alkoxy group, a $C_3$-$C_{60}$ carbocyclic group, or a $C_1$-$C_6$ heterocyclic group;

a $C_1$-$C_{20}$ alkyl group, a $C_1$-$C_{20}$ alkoxy group, a $C_3$-$C_{60}$ carbocyclic group, or a $C_1$-$C_{60}$ heterocyclic group, each substituted with deuterium, —F, —Cl, —Br, —I, a cyano group, a phenyl group, a biphenyl group, or a combination thereof; or
a group represented by one of Formulae 5-1 to 5-26 and 6-1 to 6-55:
5-1
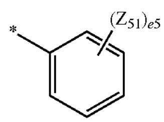
5-2
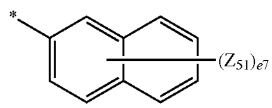
5-3
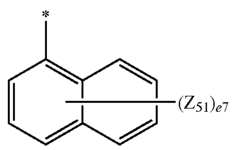
5-4
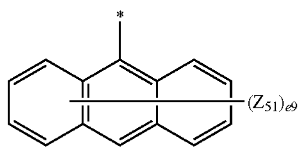
5-5
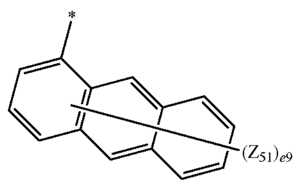
5-6
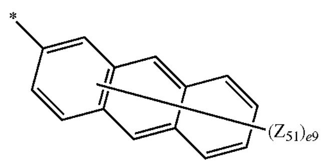
5-7
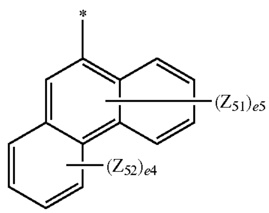
5-8
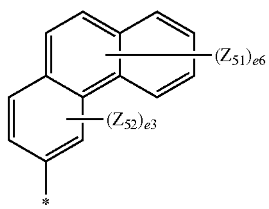
-continued
5-9
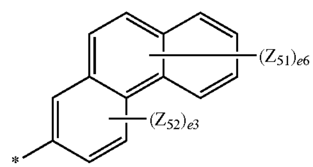
5-10
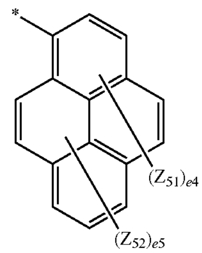
5-11
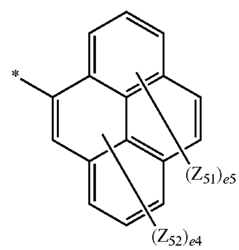
5-12
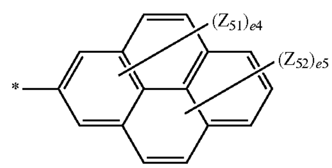
5-13
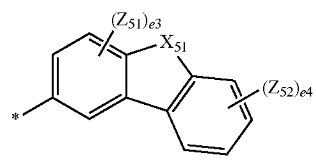
5-14
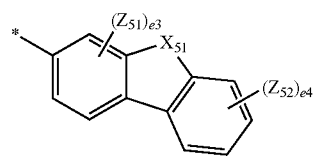
5-15
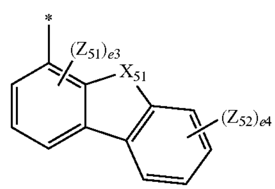
5-16
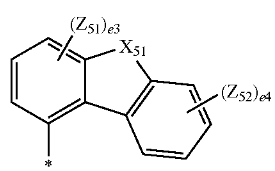

-continued
5-17
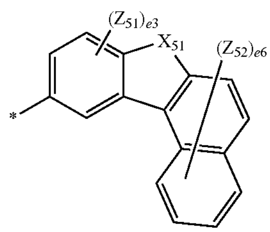
5-18
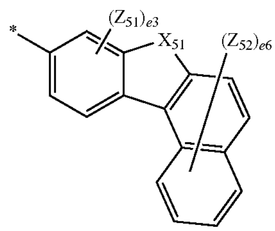
5-19
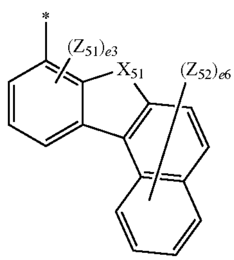
5-20
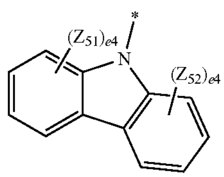
5-21
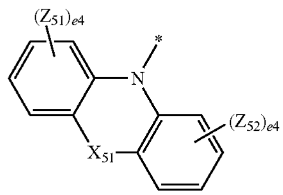
5-22
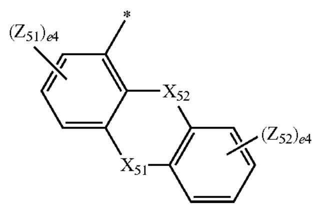
5-23
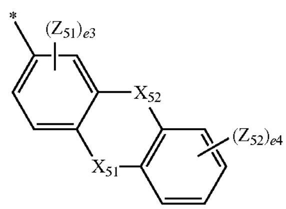
-continued
5-24
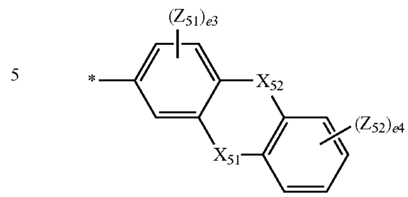
5-25
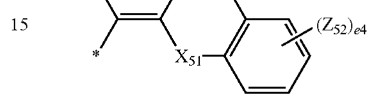
5-26
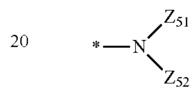
6-1
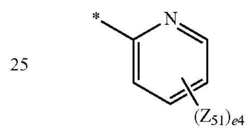
6-2
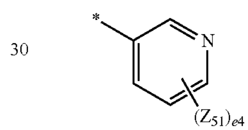
6-3
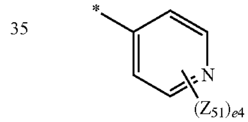
6-4
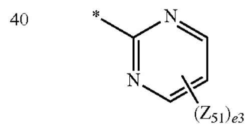
6-5
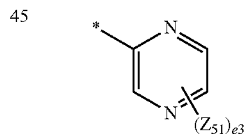
6-6
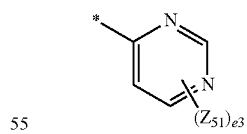
6-7
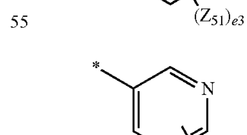
6-8
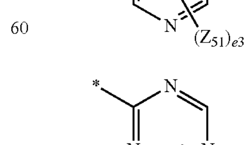
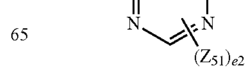

-continued
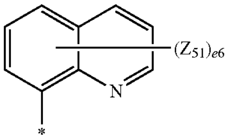
6-9
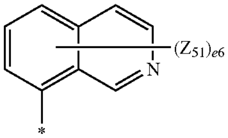
6-10
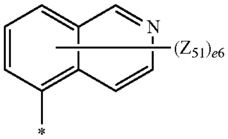
6-11
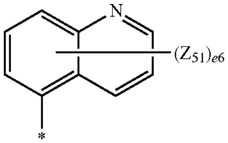
6-12
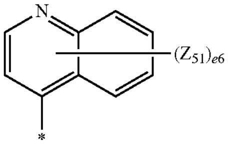
6-13
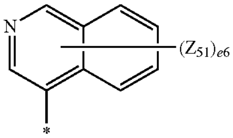
6-14
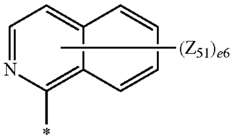
6-15
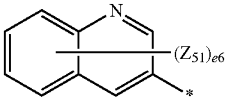
6-16
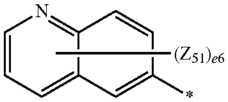
6-17
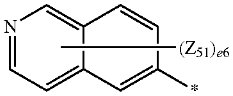
6-18
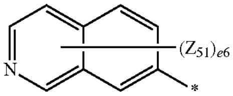
6-19
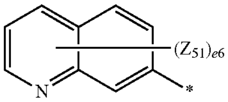
6-20
-continued
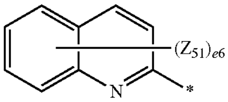
6-21
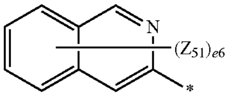
6-22
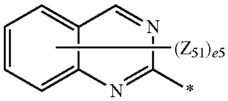
6-23
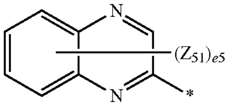
6-24
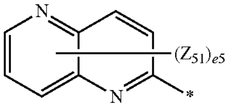
6-25
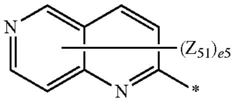
6-26
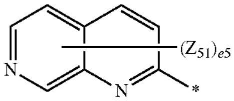
6-27
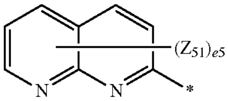
6-28
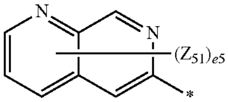
6-29
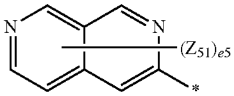
6-30
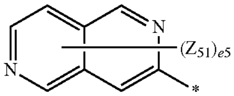
6-31
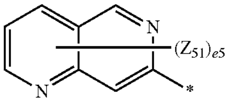
6-32
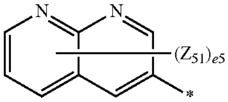
6-33
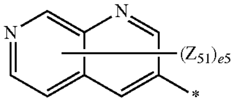
6-34

-continued
6-35
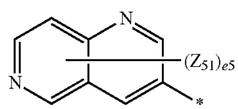
6-36
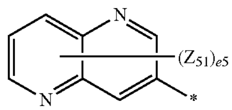
6-37
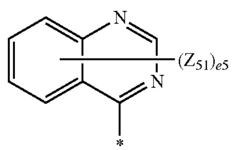
6-38
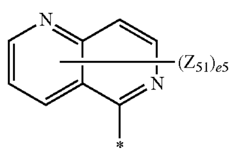
6-39
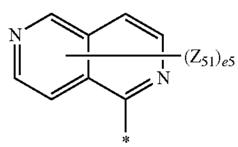
6-40
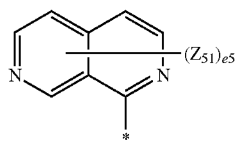
6-41
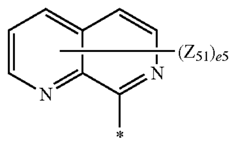
6-42
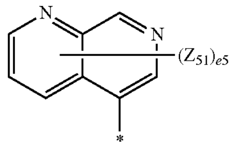
6-43
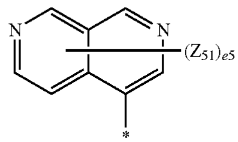
6-44
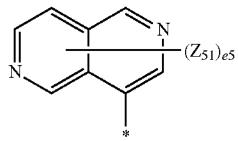
6-45
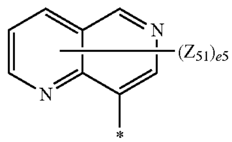
-continued
6-46
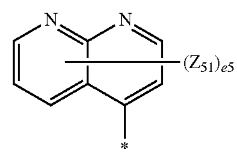
6-47
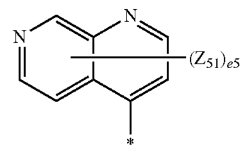
6-48
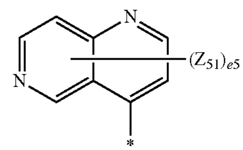
6-49
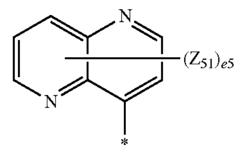
6-50
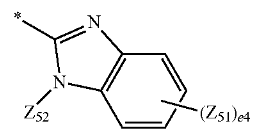
6-51
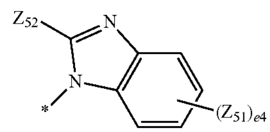
6-52
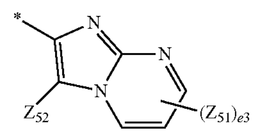
6-53
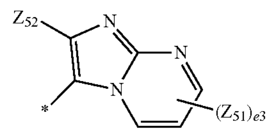
6-54
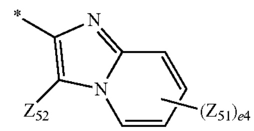
6-55
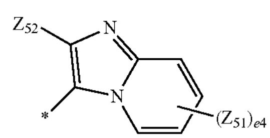
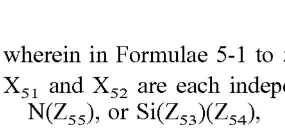
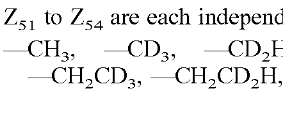
wherein in Formulae 5-1 to 5-26 and 6-1 to 6-55,
$X_{51}$ and $X_{52}$ are each independently O, S, $C(Z_{53})(Z_{54})$, $N(Z_{55})$, or $Si(Z_{53})(Z_{54})$,
$Z_{51}$ to $Z_{54}$ are each independently:
$-CH_3$, $-CD_3$, $-CD_2H$, $-CDH_2$, $-CH_2CH_3$, $-CH_2CD_3$, $-CH_2CD_2H$, $-CH_2CDH_2$, $-CHDCH_3$, —$CHDCD_2H$, —$CHDCDH_2$, —$CHDCD_3$, —$CD_2CD_3$, —$CD_2CD_2H$, or —$CD_2CDH_2$; or hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a biphenyl group, a terphenyl group, a naphthyl group, a fluorenyl group, a spiro-bifluorenyl group, a phenanthrenyl group, an anthracenyl group, a triphenylenyl group, a pyridinyl group, a pyrimidinyl group, a carbazolyl group, or a triazinyl group, e2 is 1 or 2, e3 is 1, 2, or 3, e4 is 1, 2, 3, or 4, e5 is 1, 2, 3, 4, or 5, e6 is 1, 2, 3, 4, 5, or 6, e7 is 1, 2, 3, 4, 5, 6, or 7, e9 is 1, 2, 3, 4, 5, 6, 7, 8, or 9, and

* indicates a binding site to a neighboring atom.

11. The organometallic compound of claim 1, wherein the organometallic compound is electrically neutral.

12. The organometallic compound of claim 1, wherein the organometallic compound represented by Formula 1 is one of Compounds BD1 to BD104:

BD1

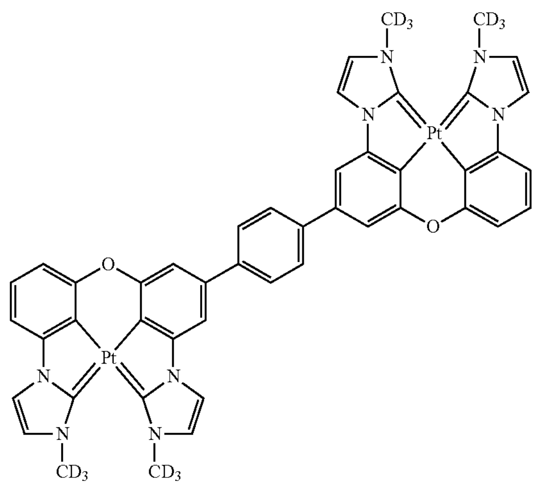

BD2

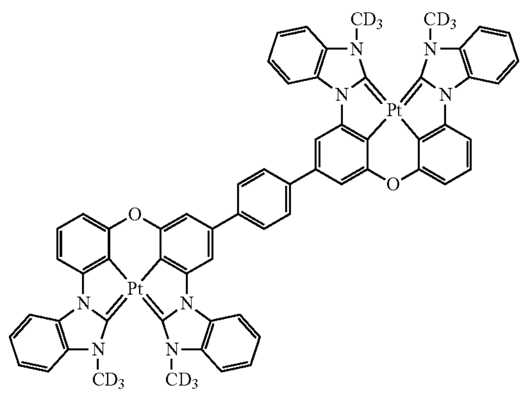

BD3

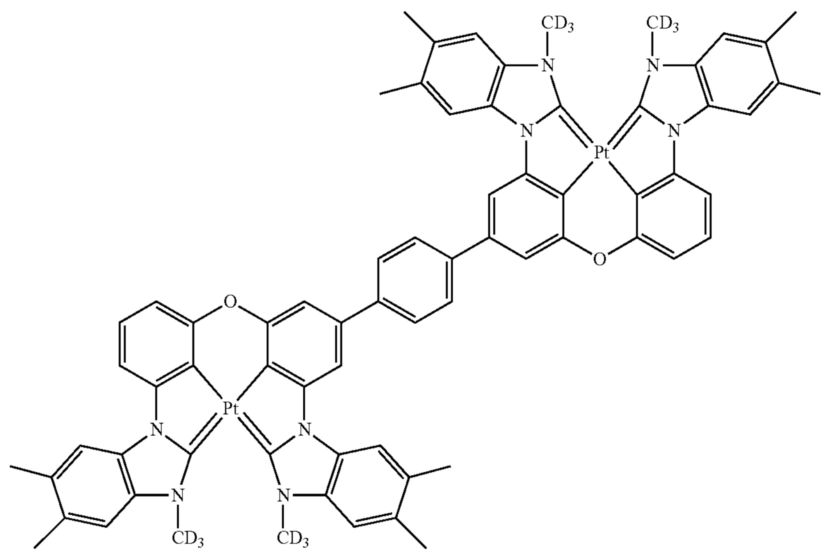

-continued
BD4
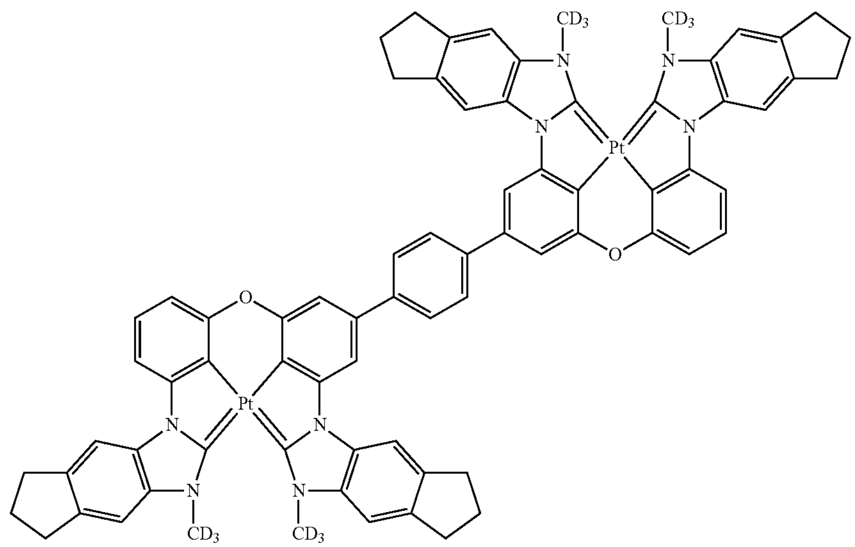
BD5
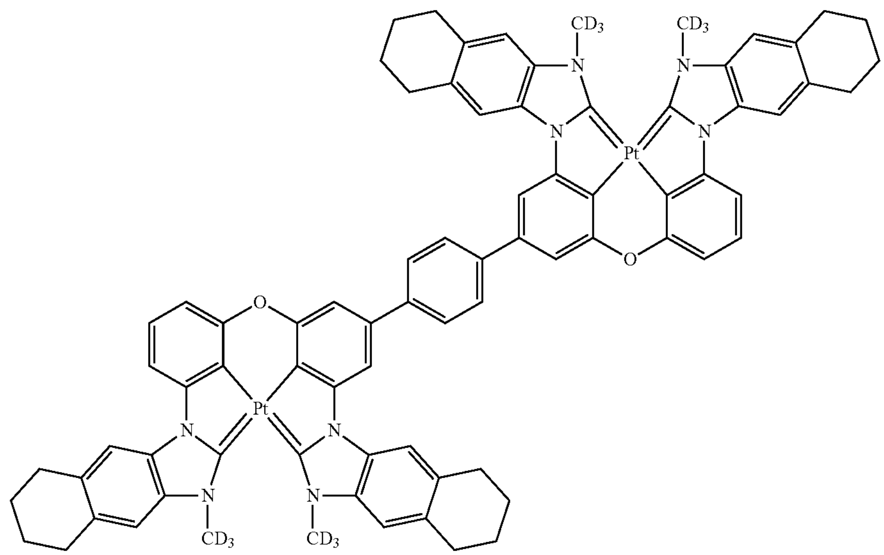

-continued
BD6
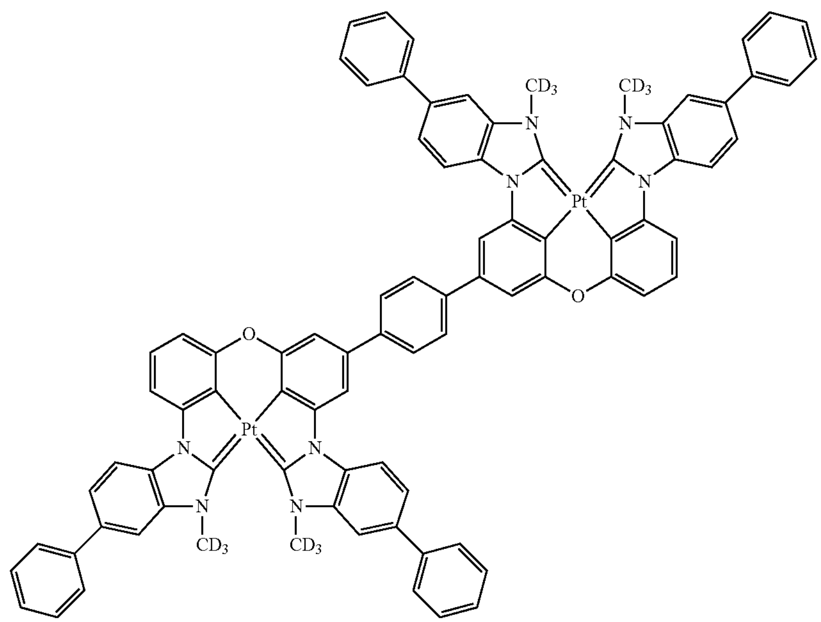
BD7
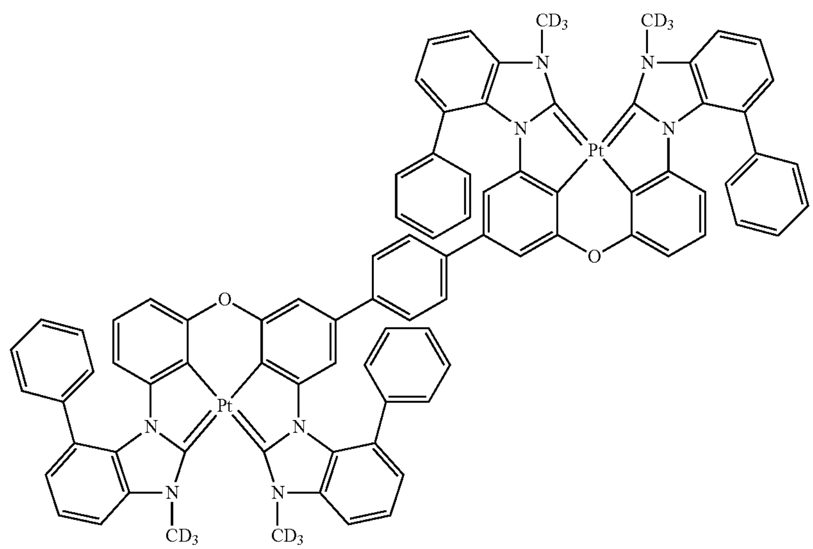

-continued
BD8
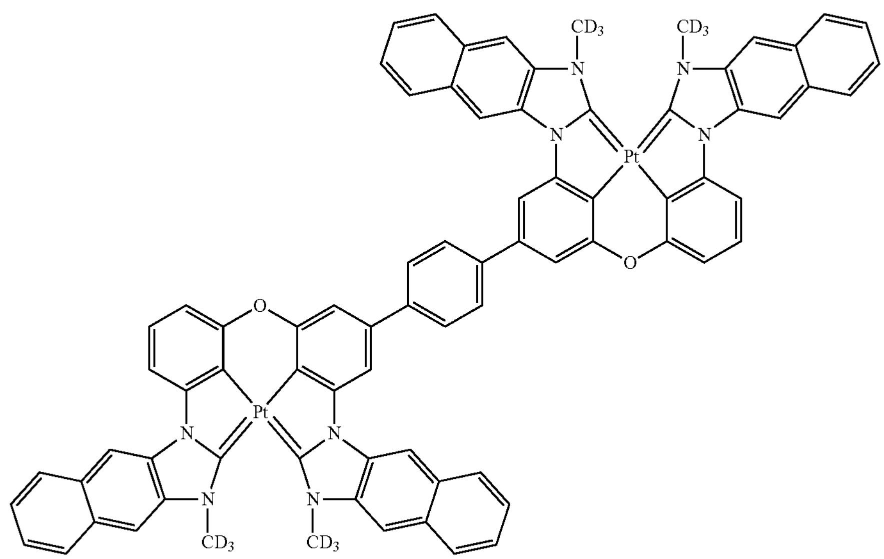
BD9
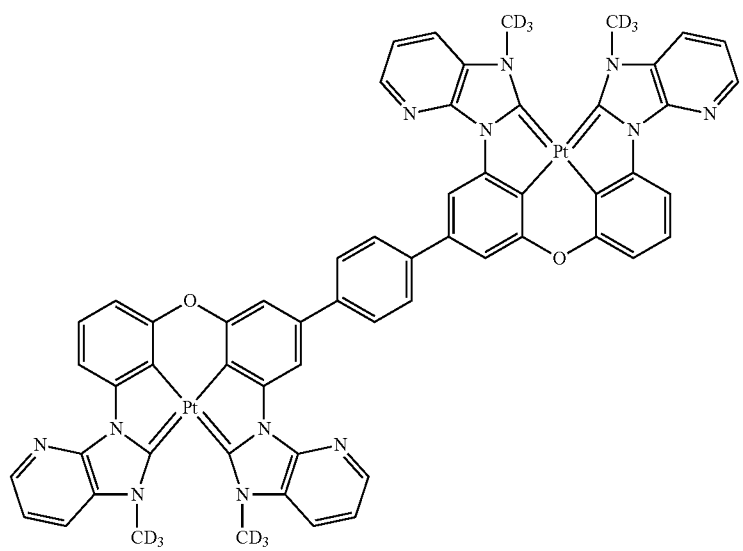
BD10
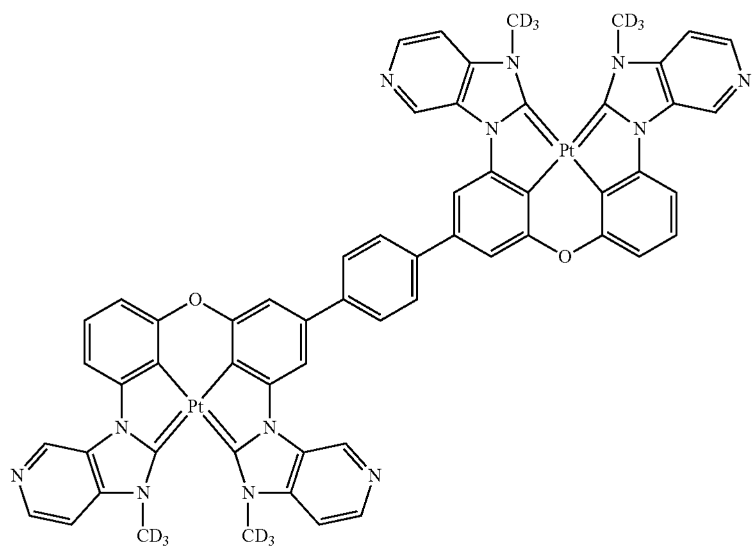

-continued
BD11
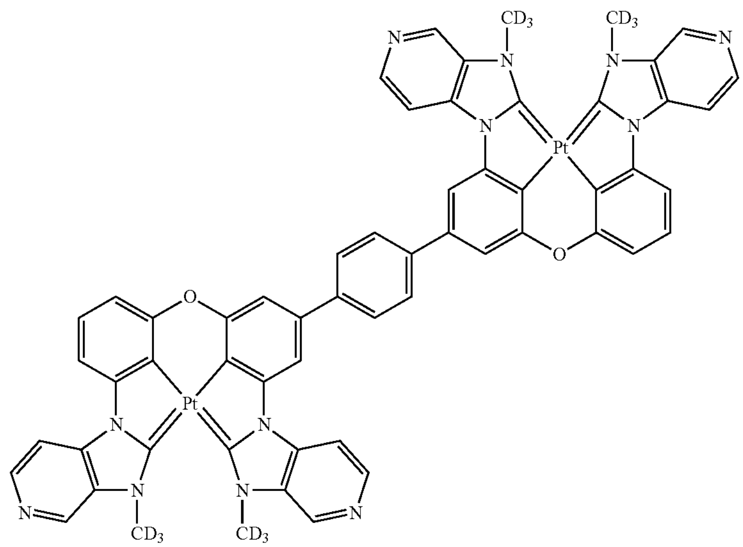
BD12
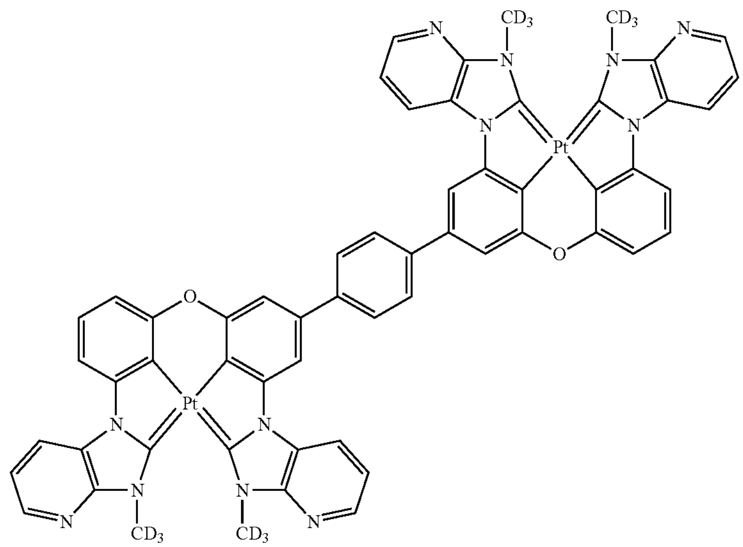
BD13
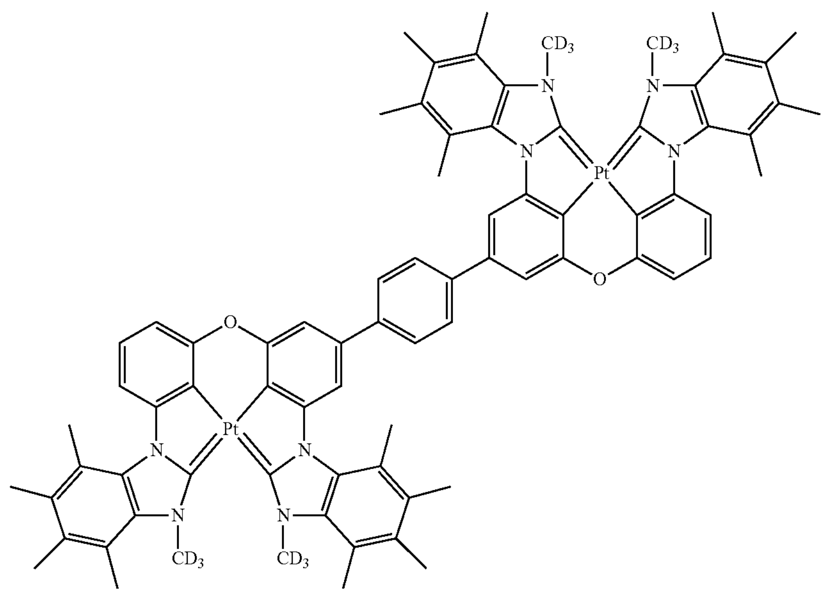

-continued
BD14
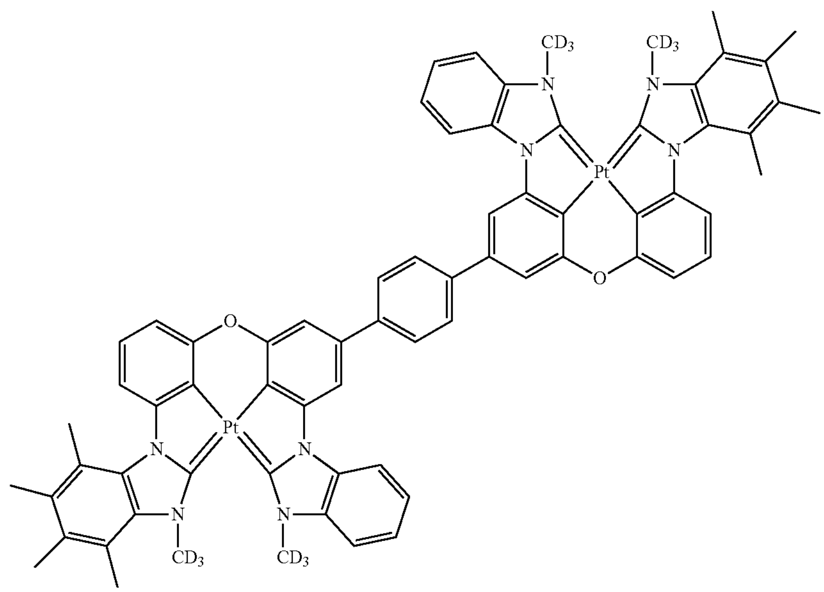
BD15
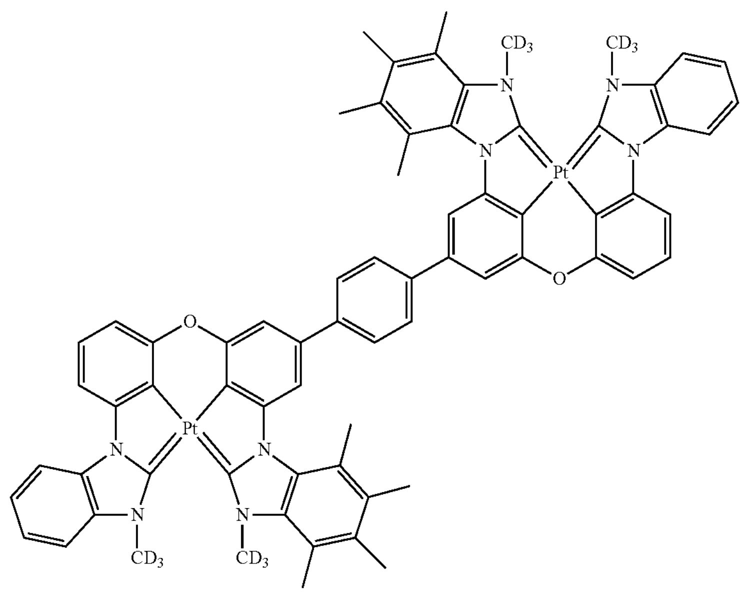

-continued
BD16
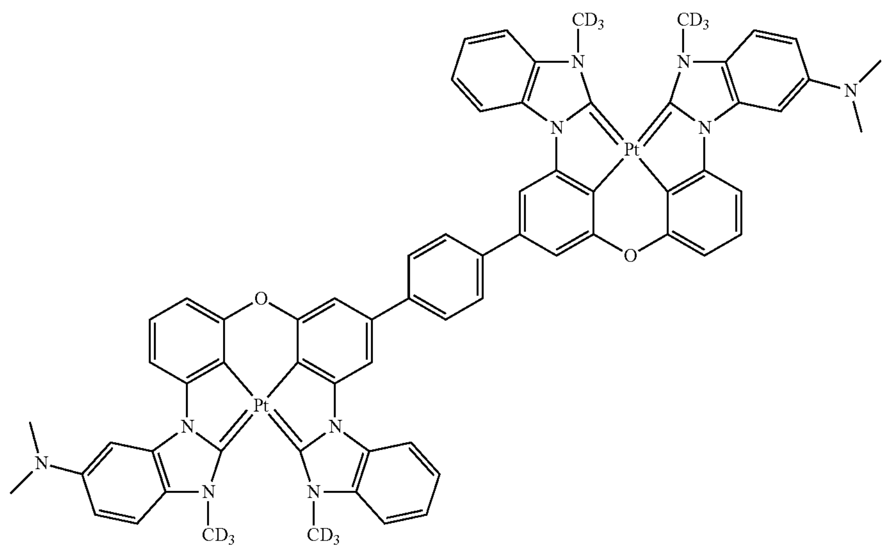
BD17
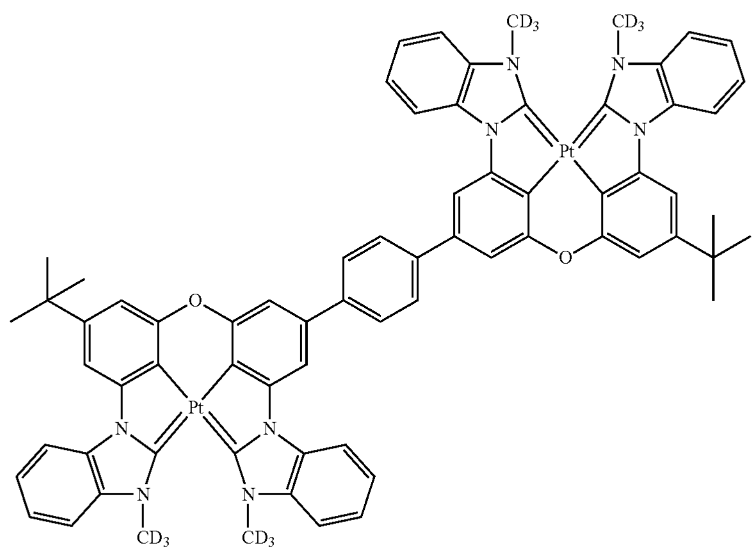
BD18
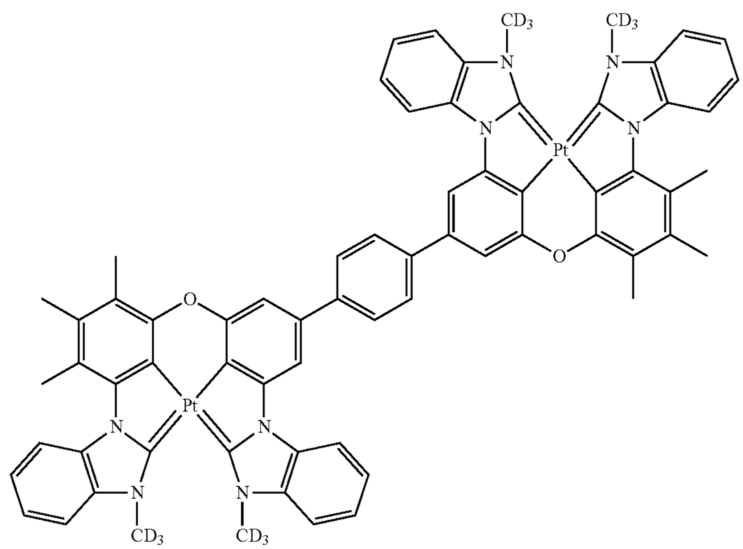

-continued
BD19
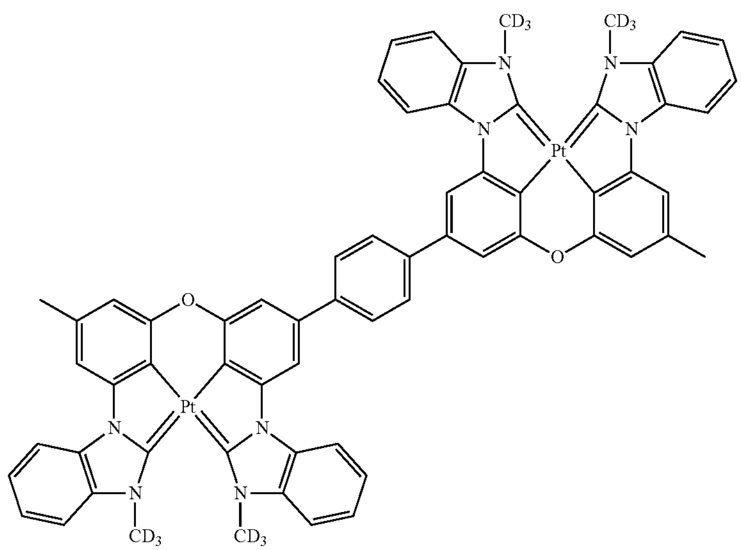
BD20
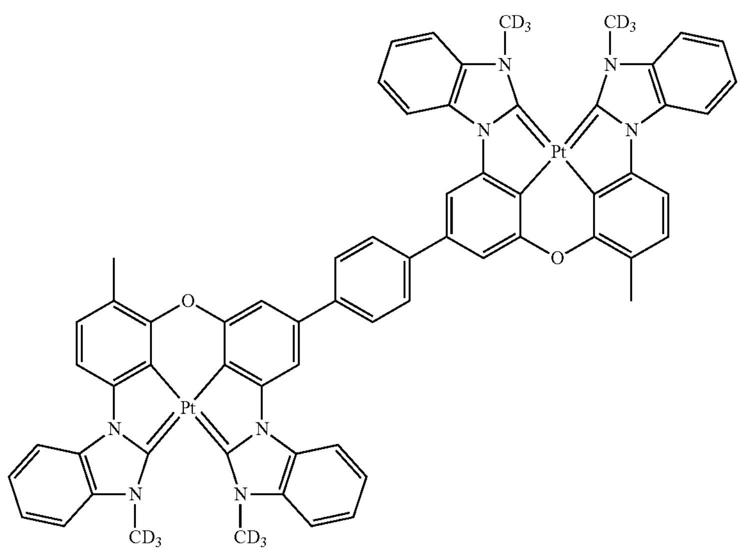
BD21
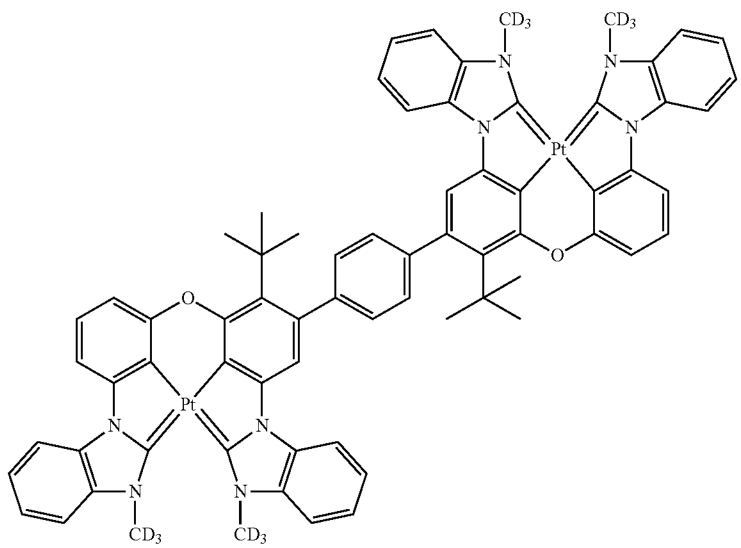

-continued
BD22
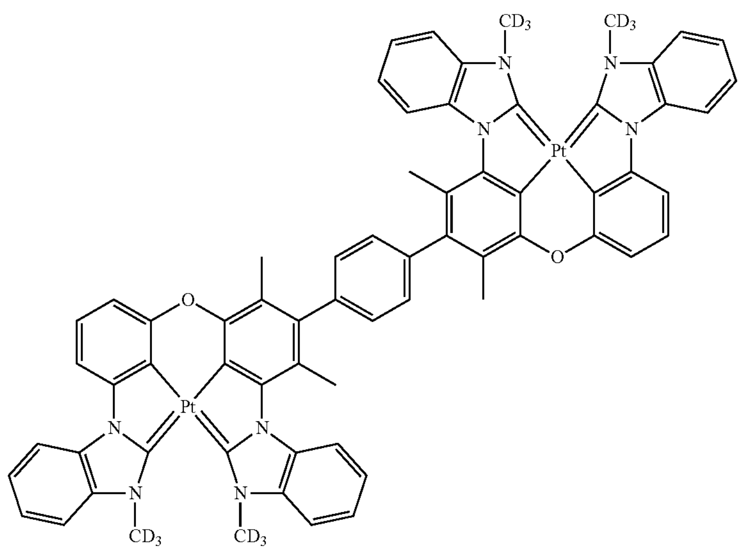
BD23
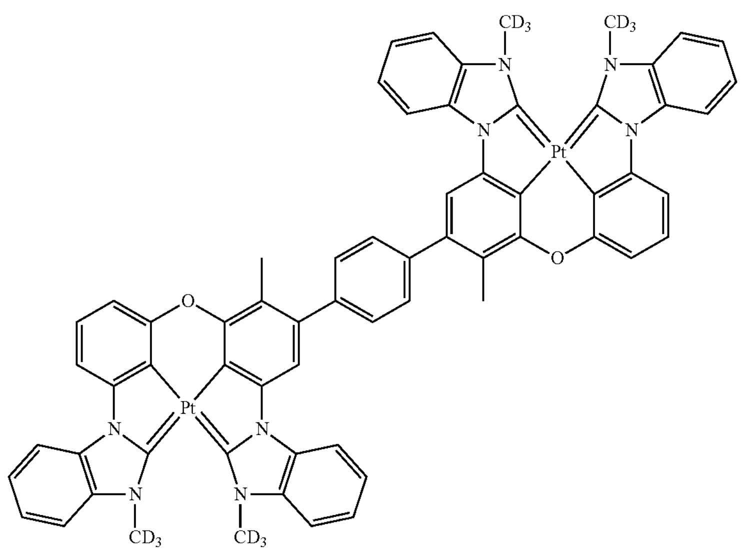
BD24
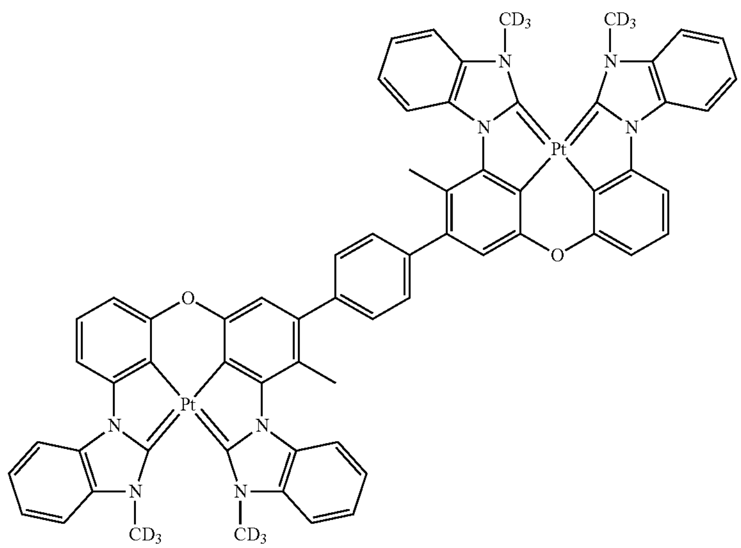

-continued
BD25
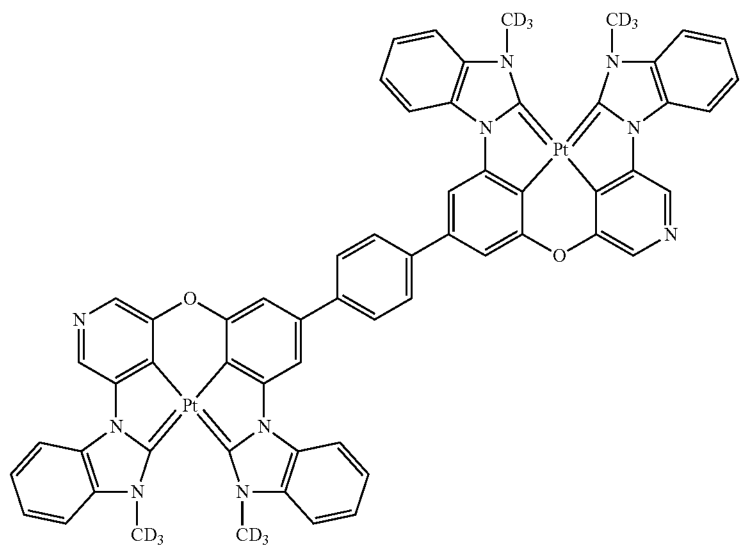
BD26
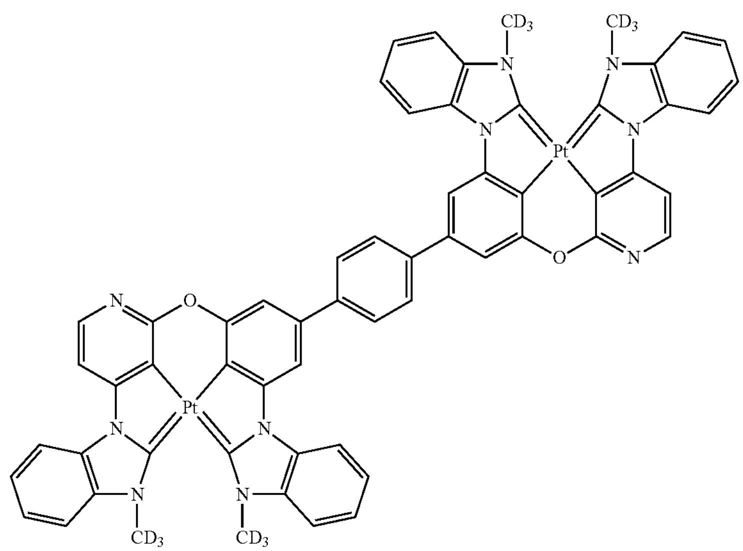
BD27
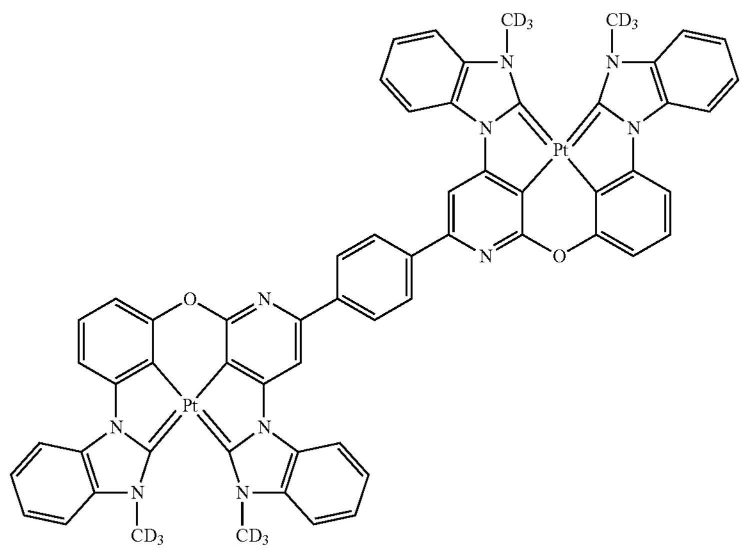

-continued
BD28
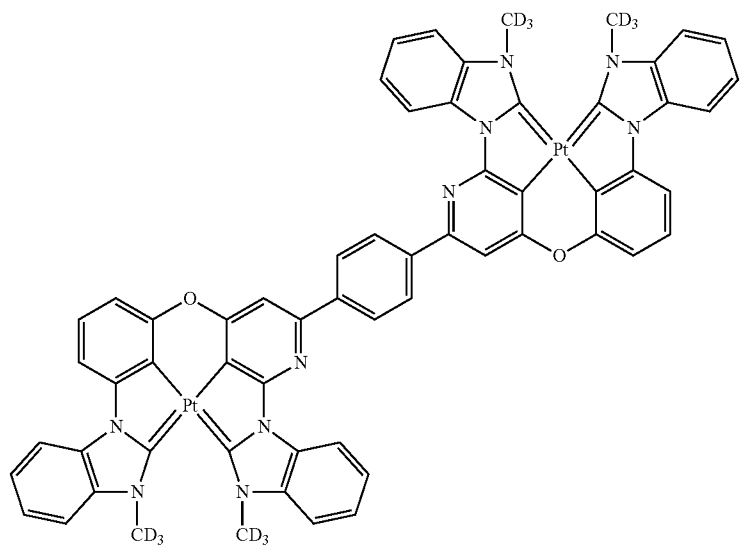
BD29
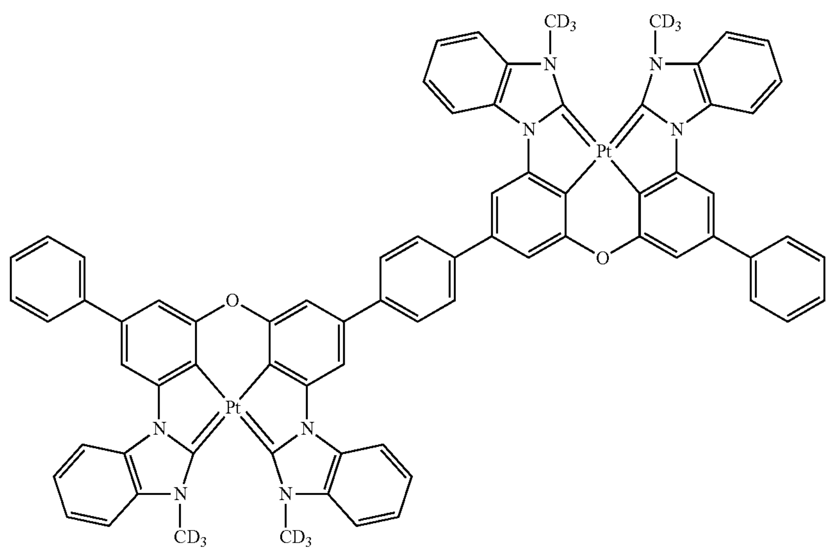
BD30
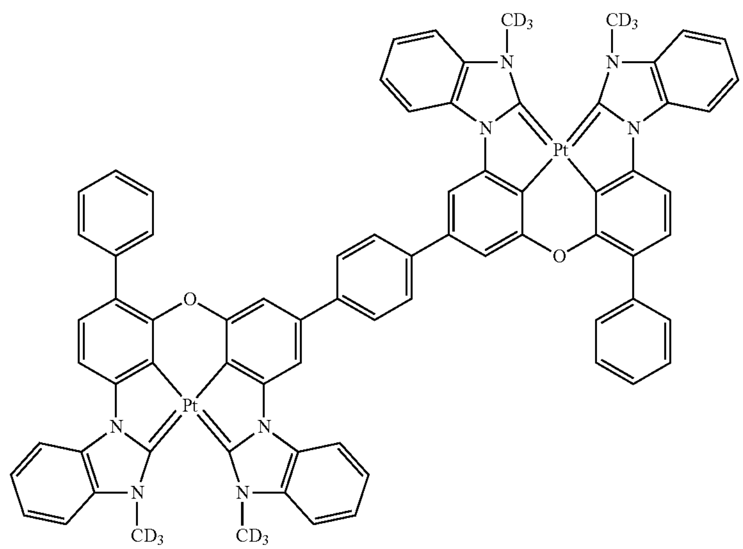

-continued
BD31
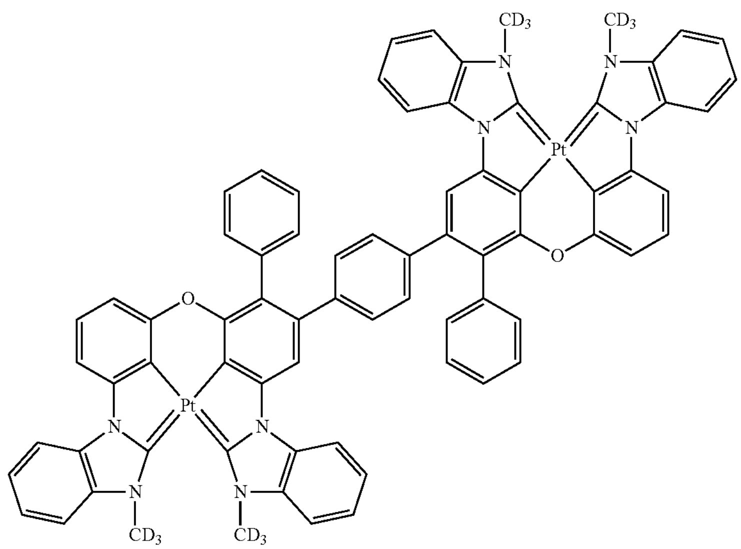
BD32
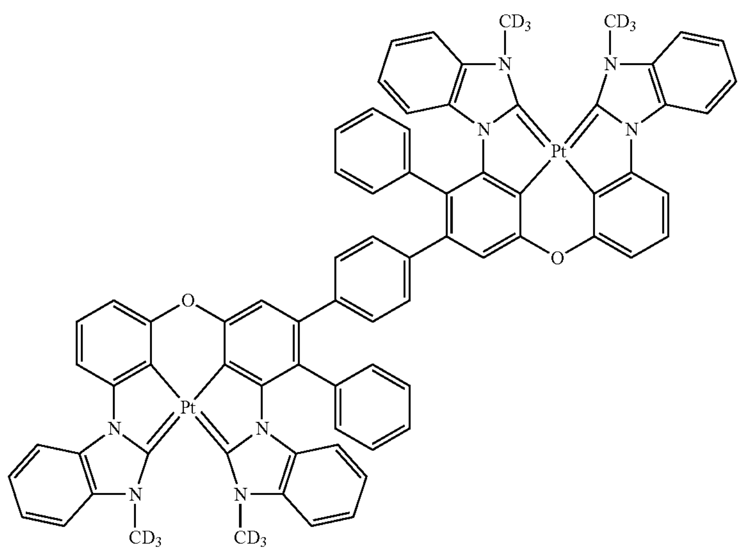
BD33
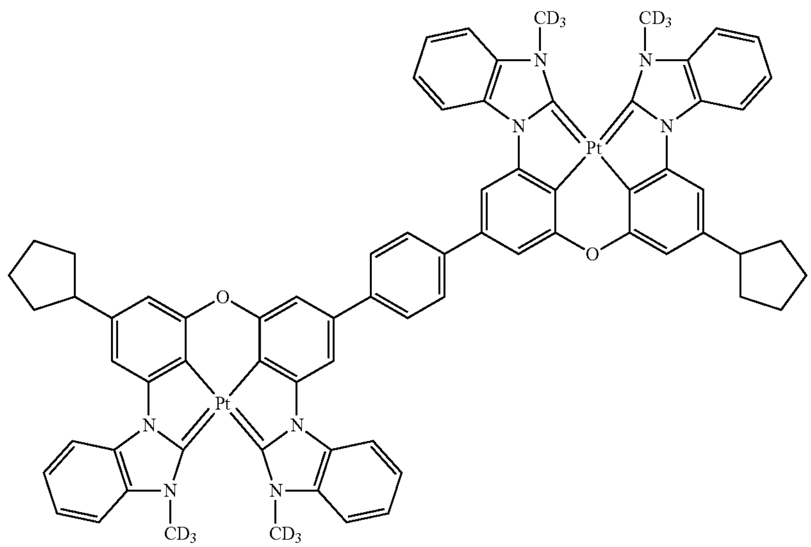

-continued
BD34
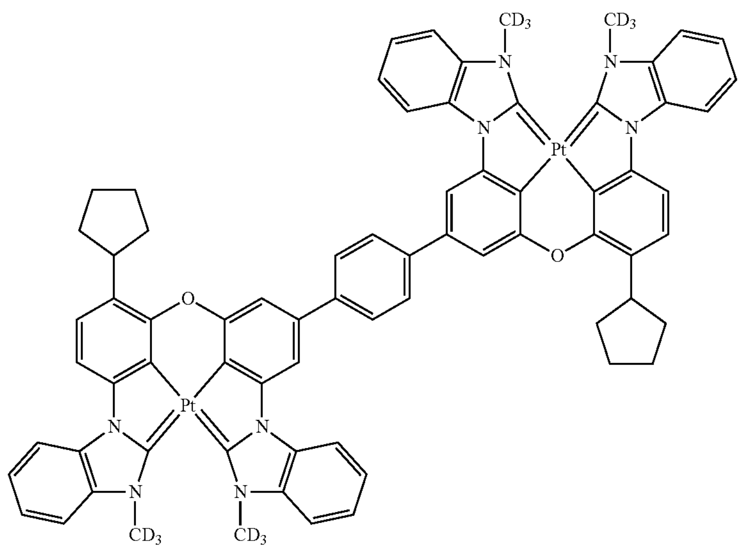
BD35
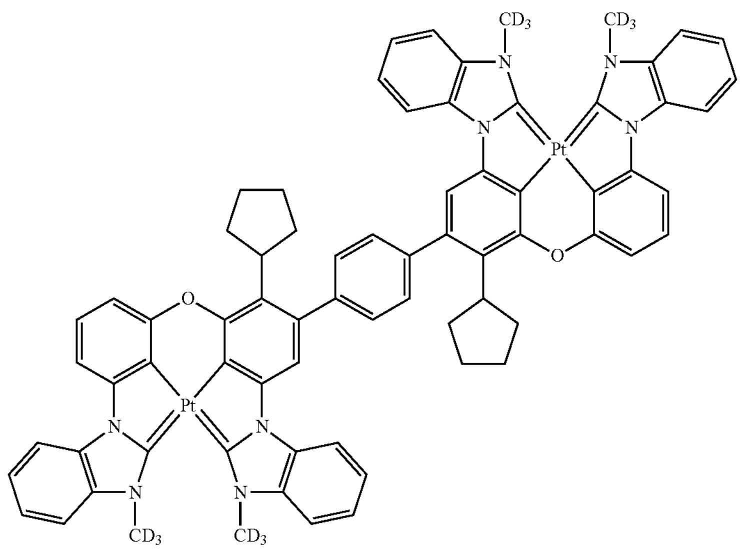
BD36
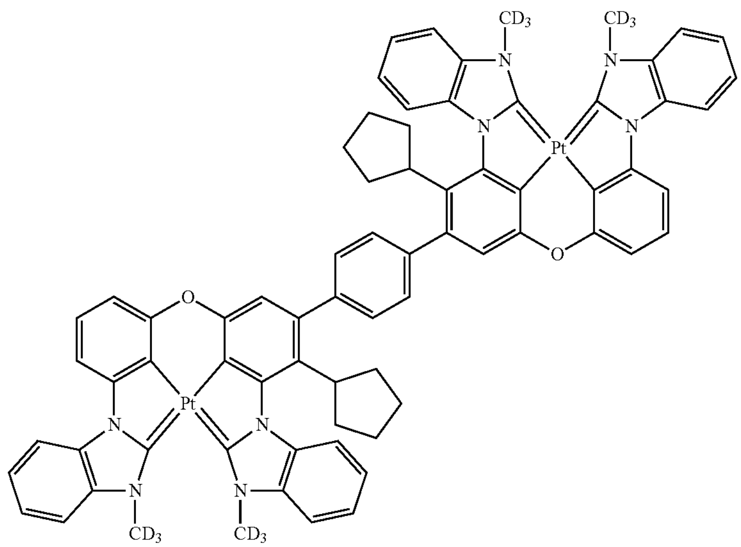

-continued
BD37
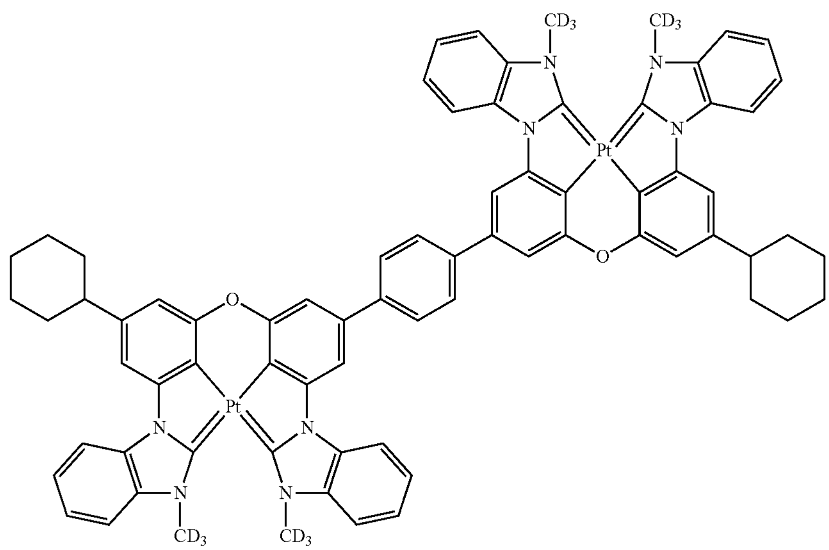
BD38
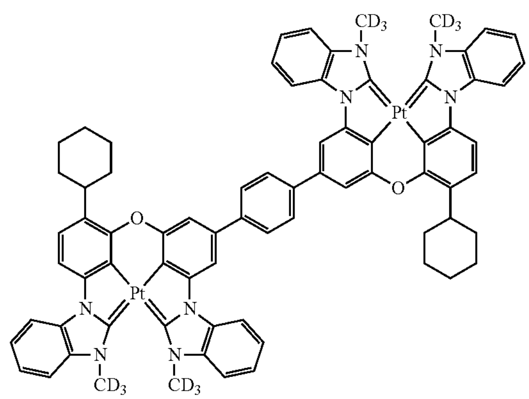
BD39
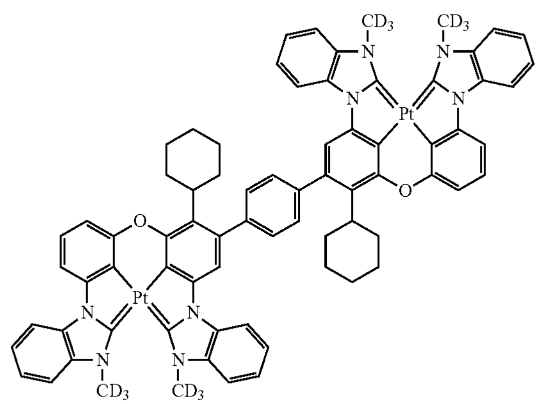
BD40
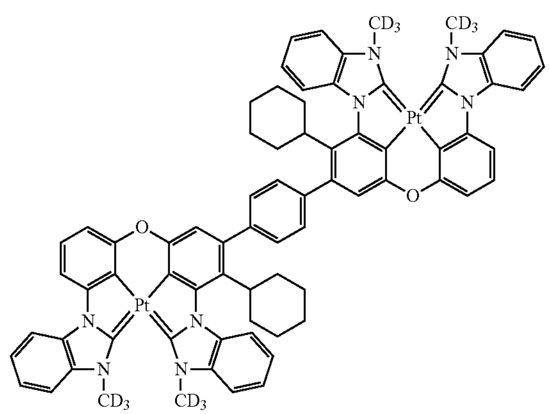
BD41
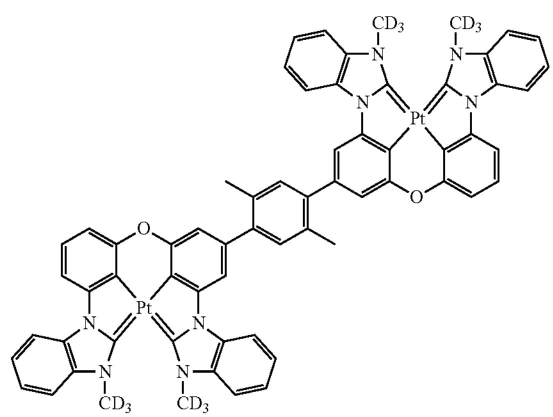

-continued
BD42
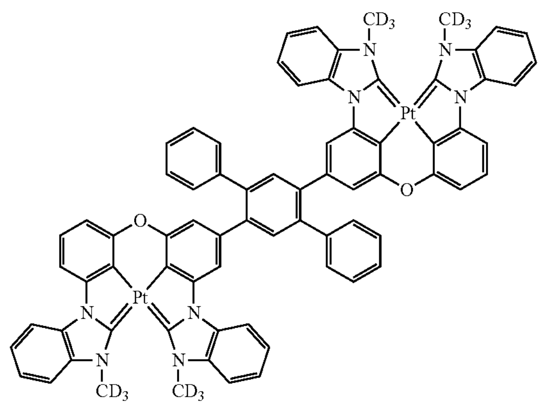
BD43
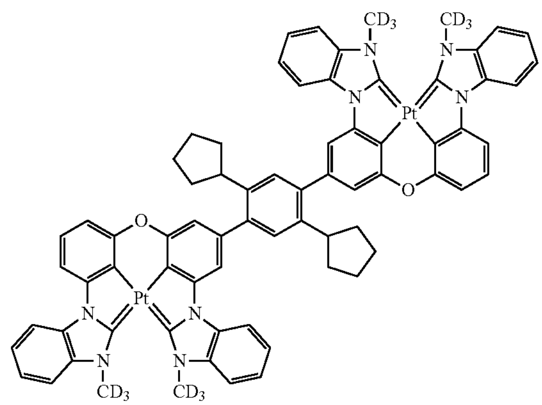
BD44
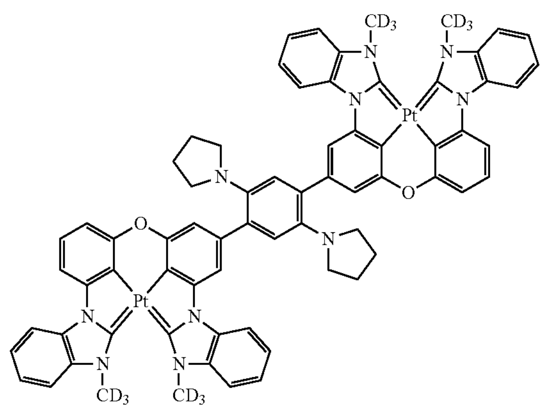
BD45
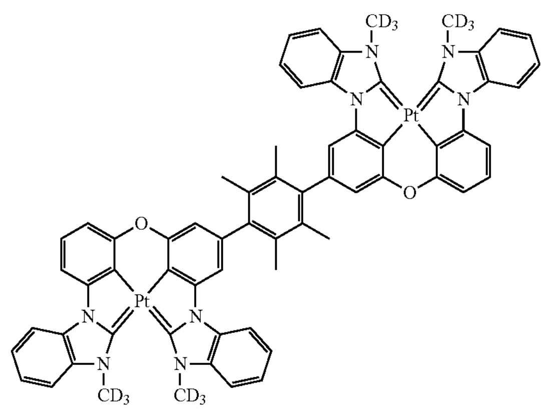
BD46
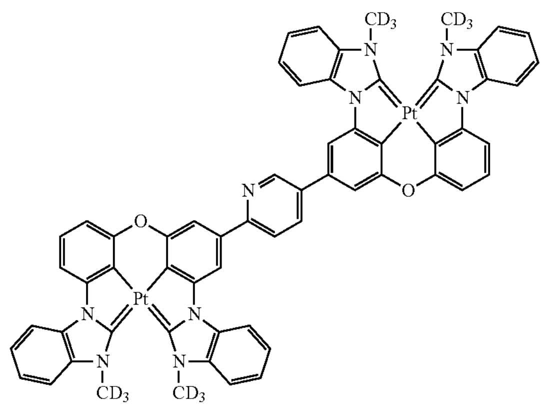
BD47
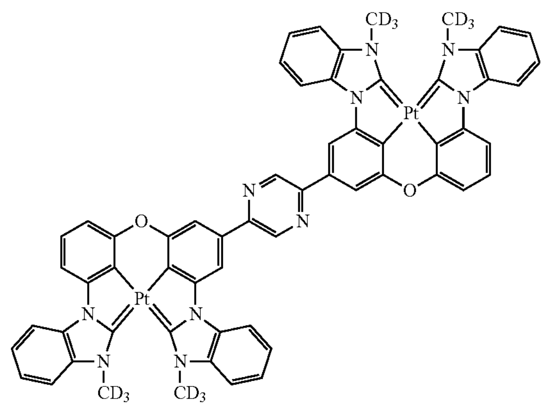

-continued
BD48
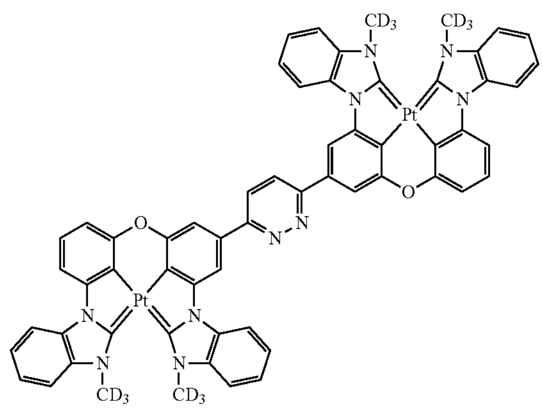
BD49
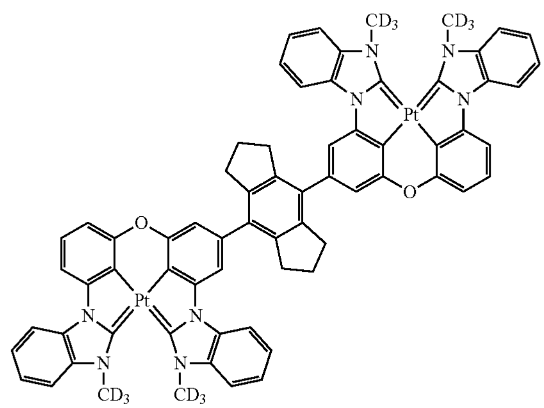
BD50
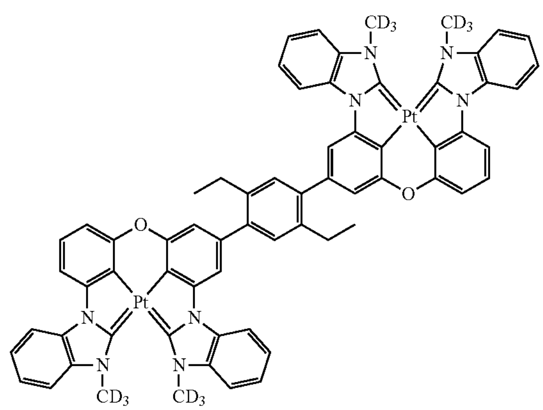
BD51
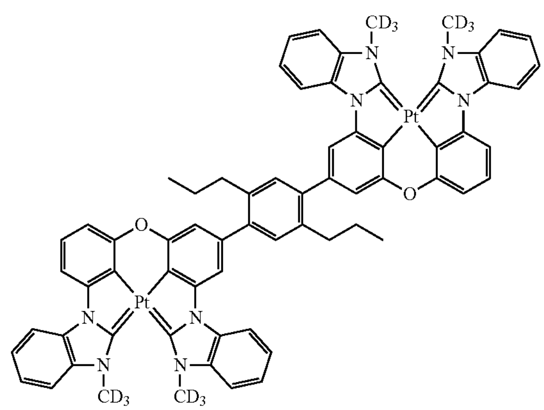
BD52
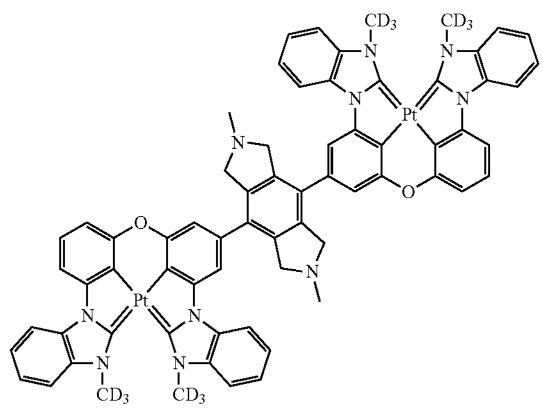
BD53
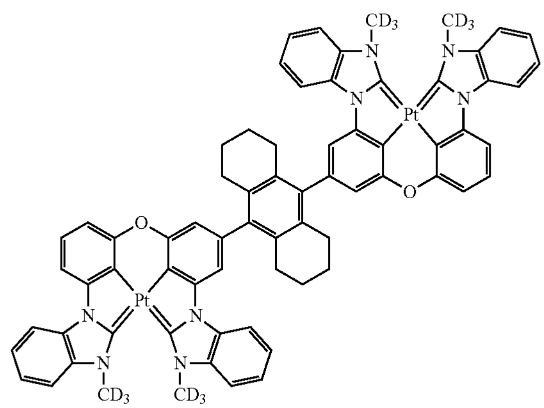

-continued
BD54
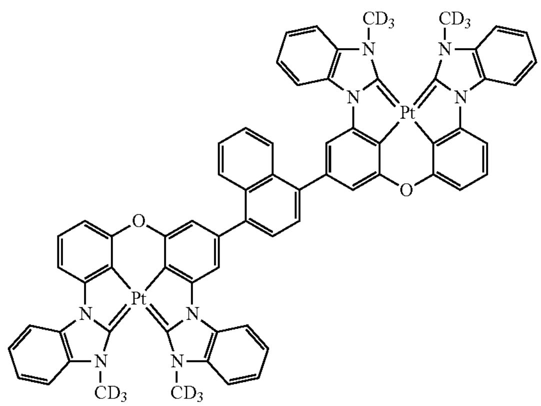
BD55
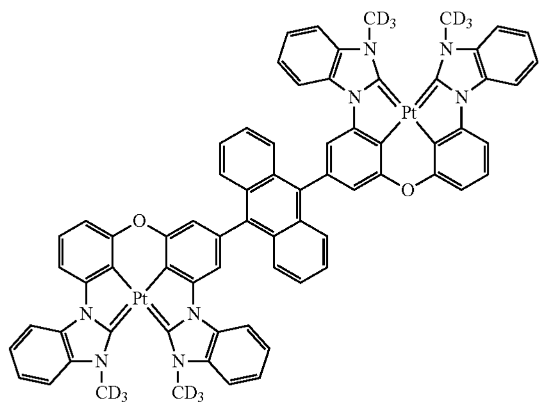
BD56
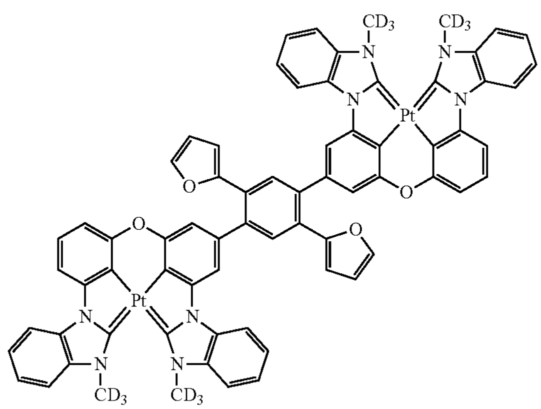
BD57
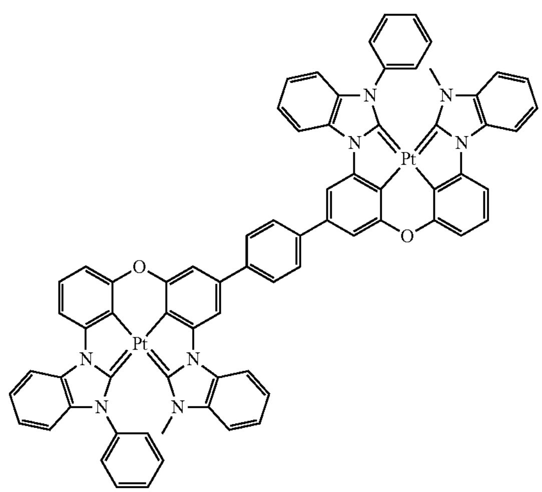
BD58
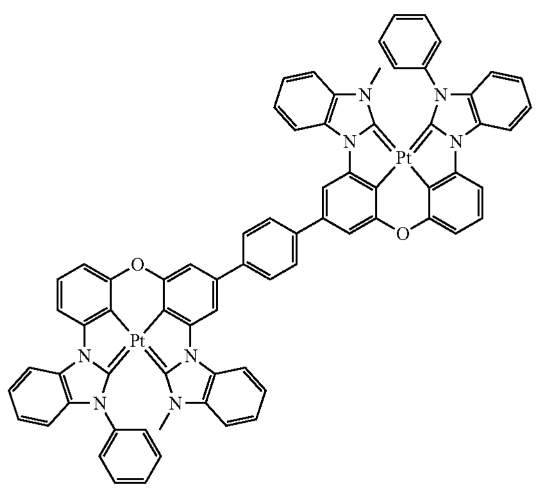
BD59
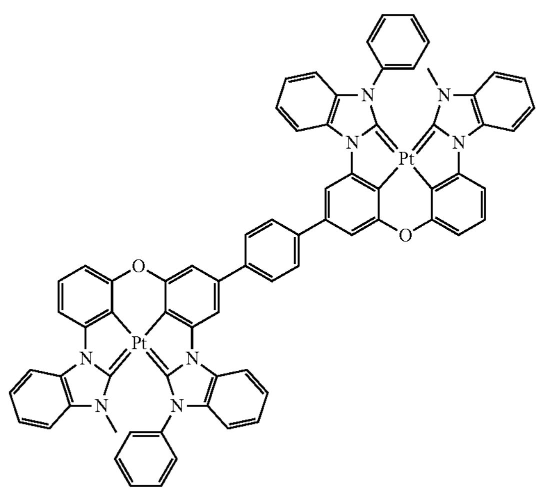

-continued
BD60
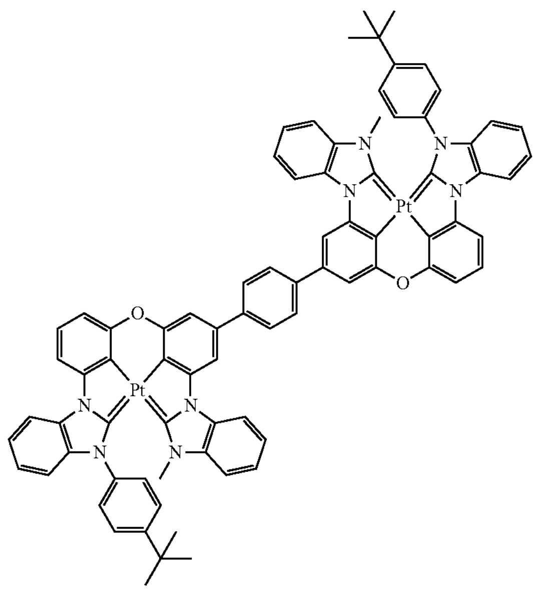
BD61
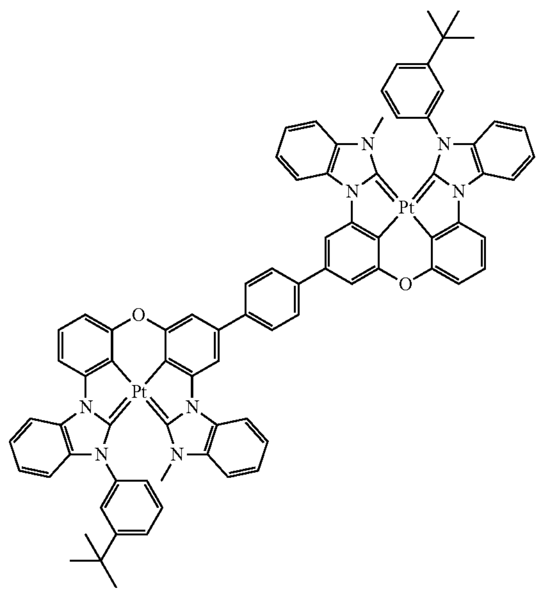
BD62
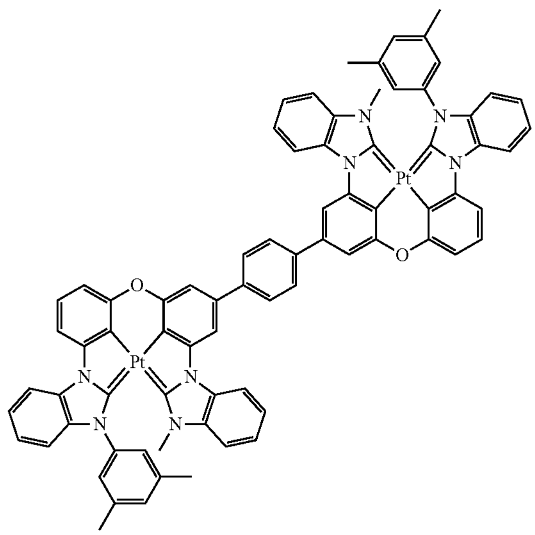
BD63
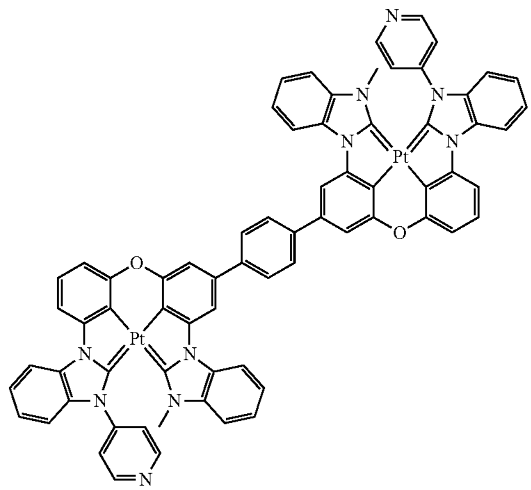
BD64
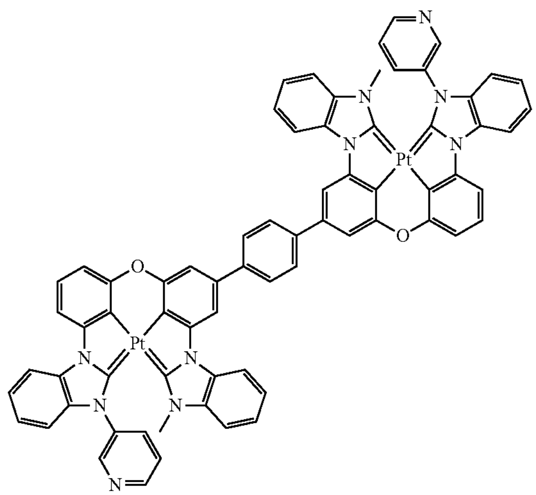
BD65
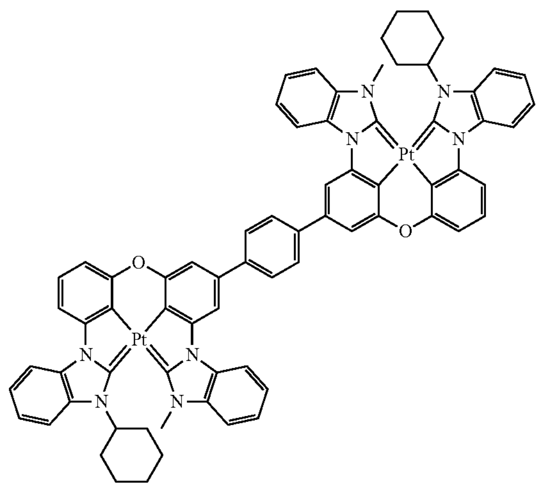

-continued
BD66
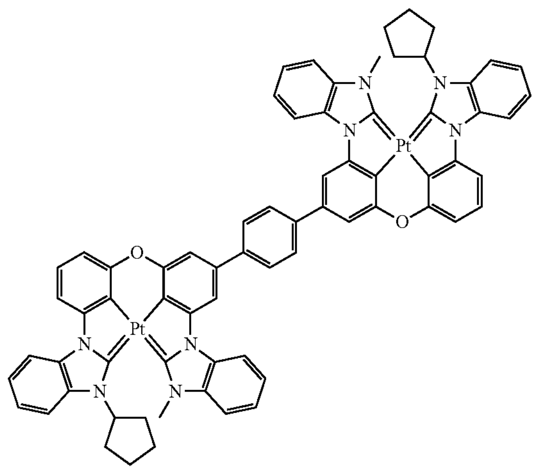
BD67
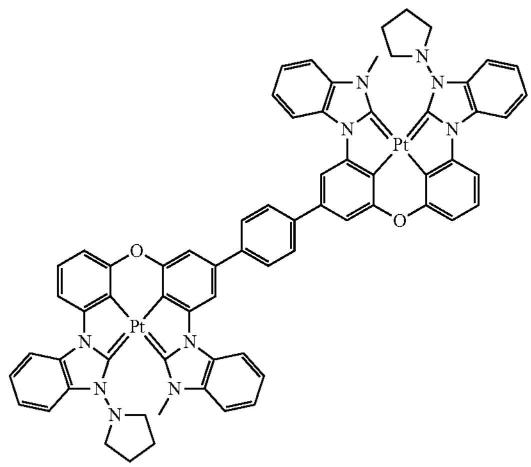
BD68
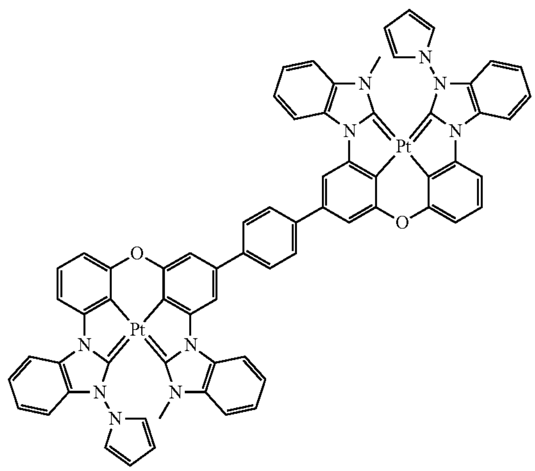
BD69
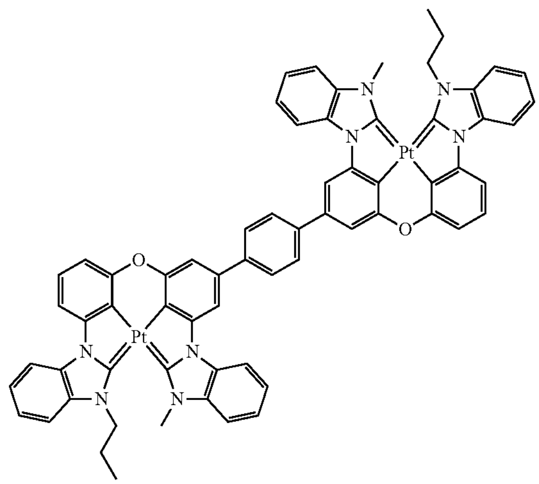
BD70
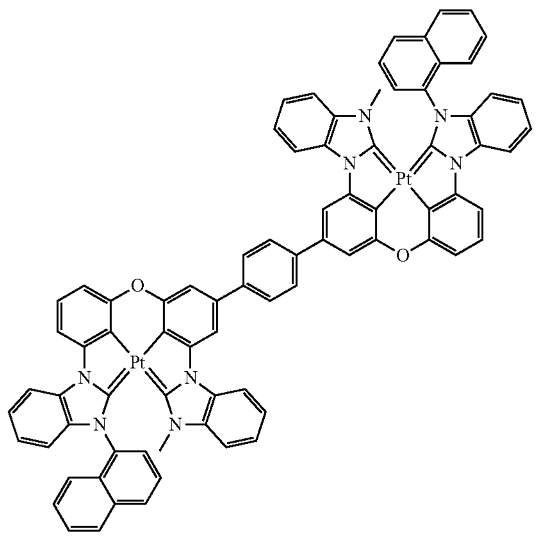
BD71
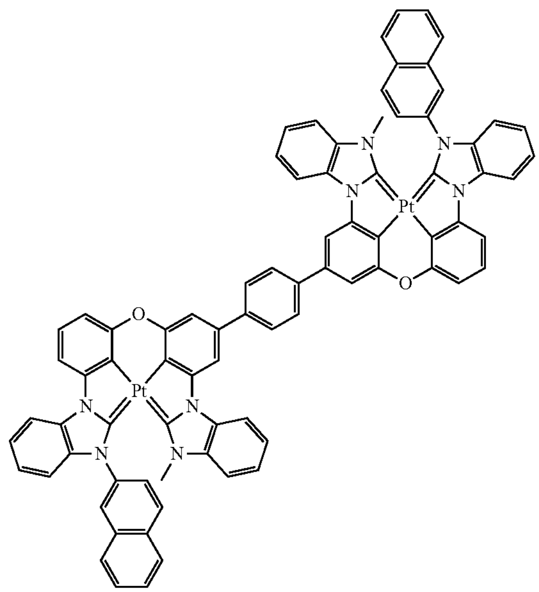

-continued
BD72
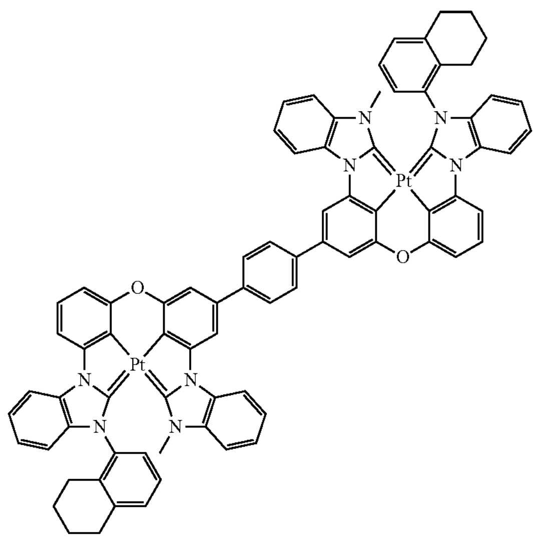
BD73
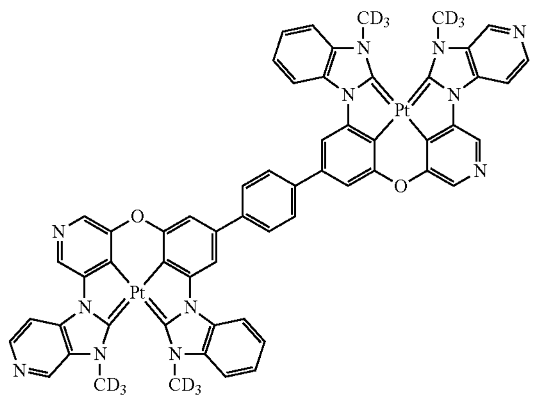
BD74
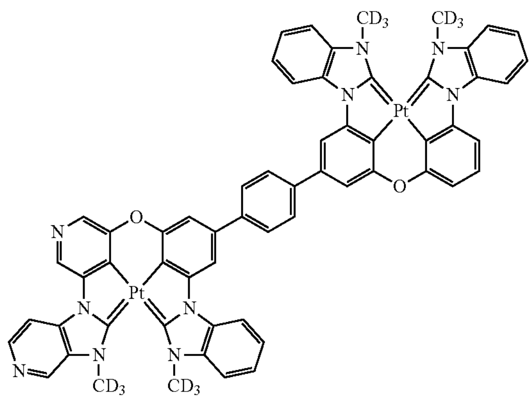
BD75
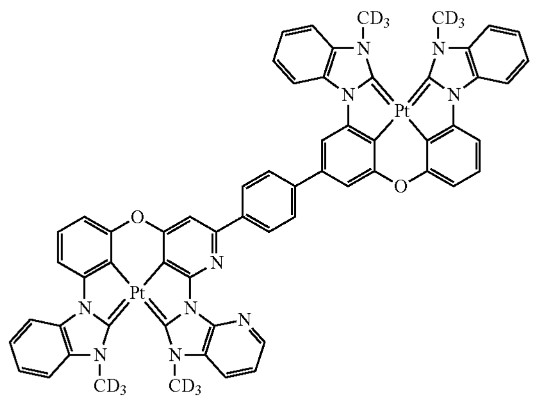
BD76
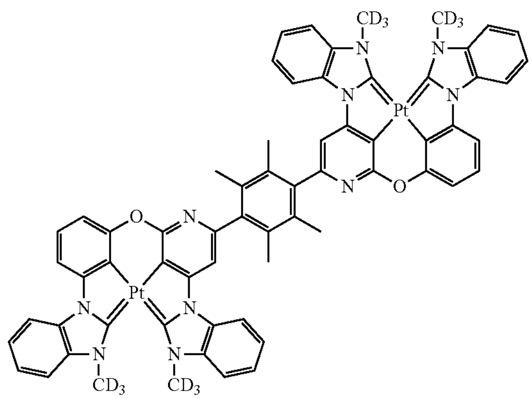
BD77
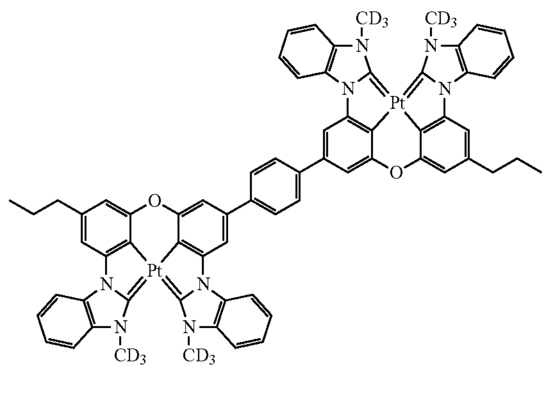

-continued
BD78
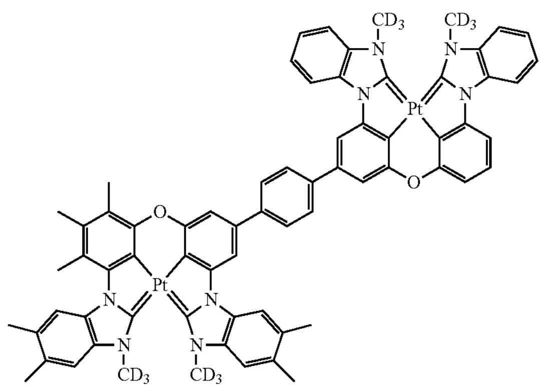
BD79
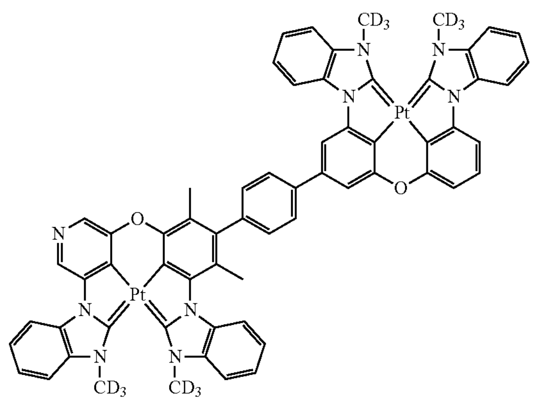
BD80
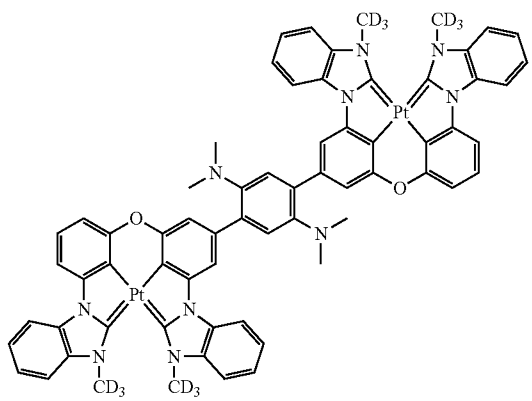
BD81
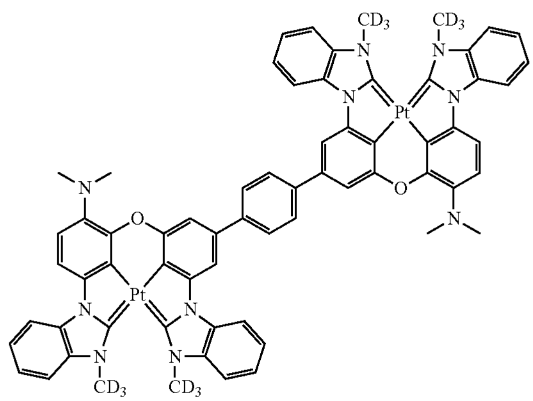
BD82
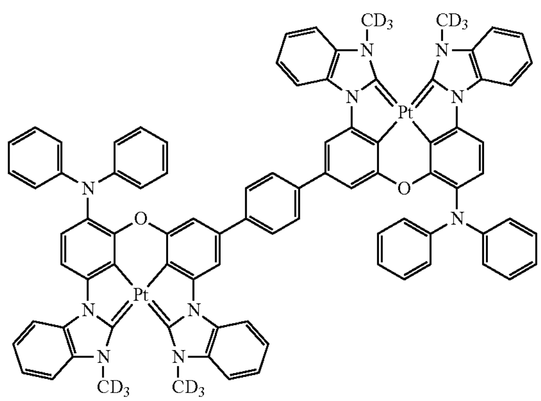
BD83
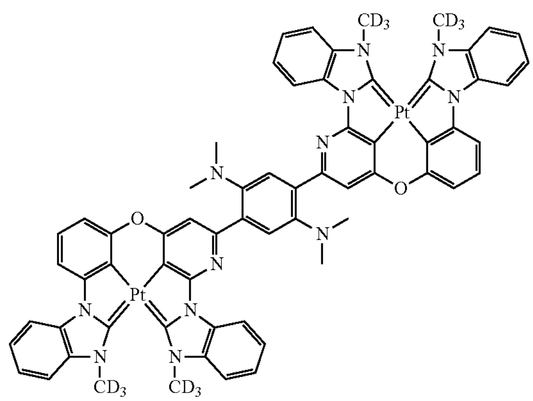

-continued
BD84
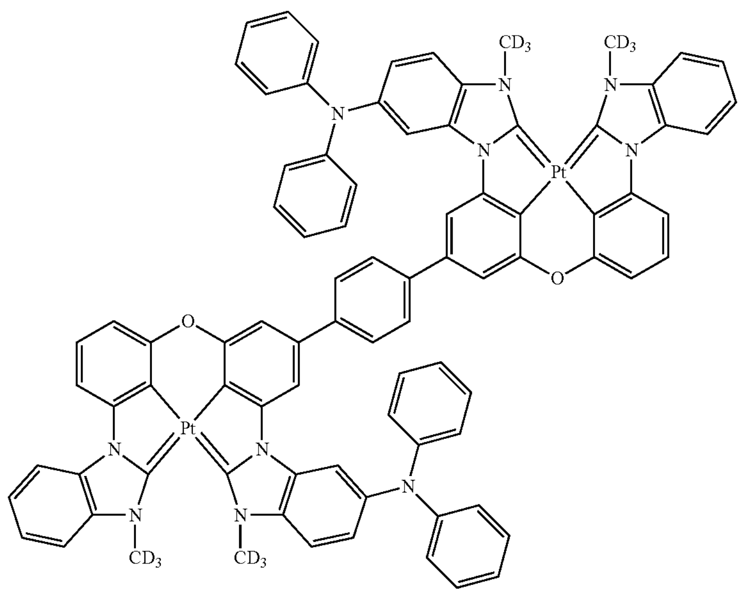
BD85
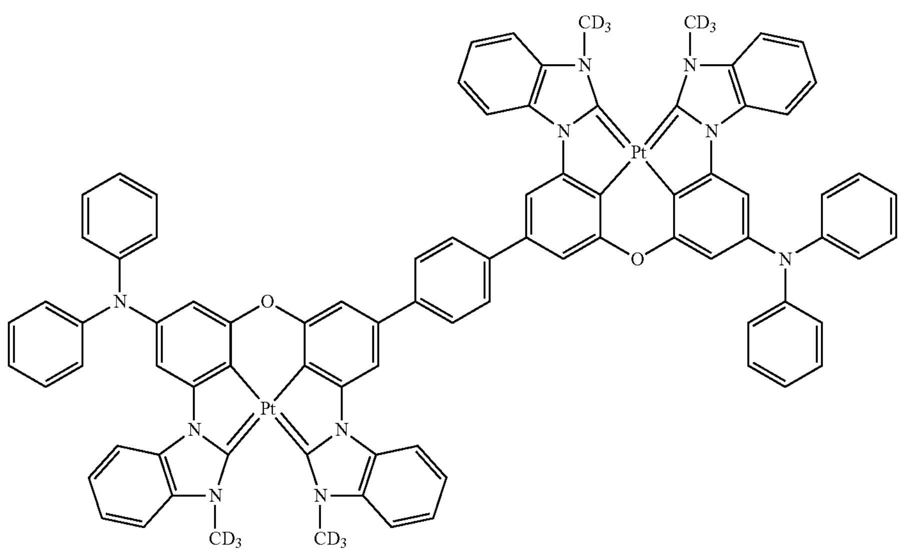
BD86
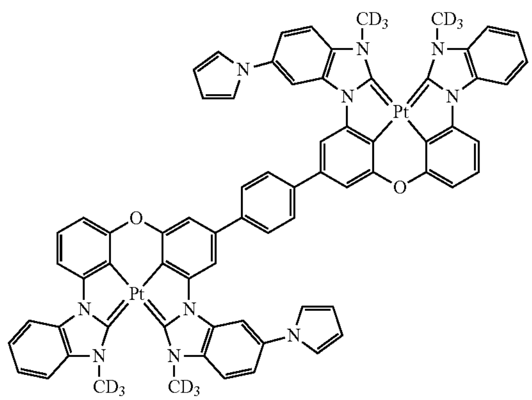
BD87
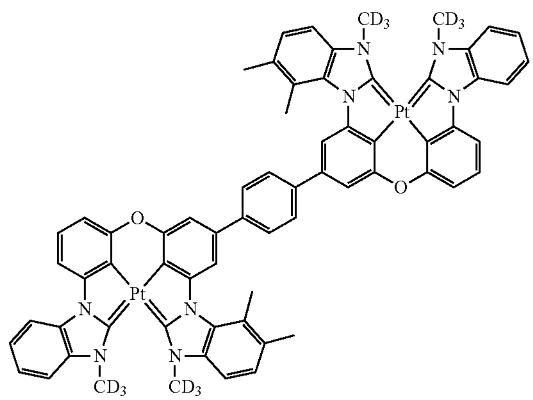

-continued
BD88
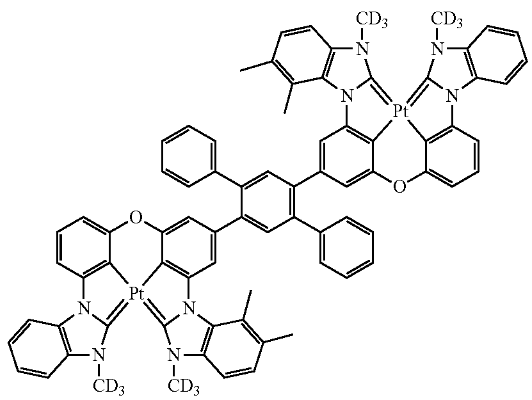
BD89
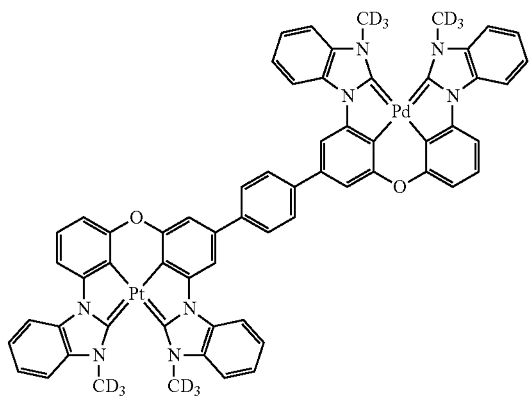
BD90
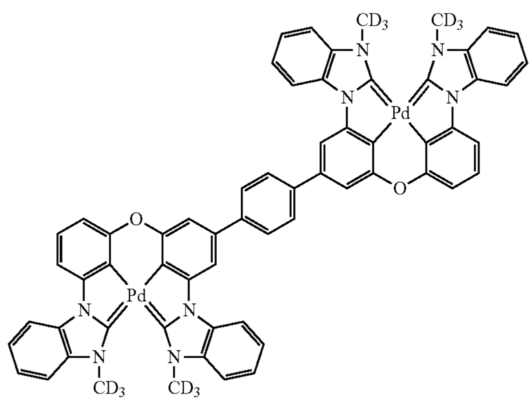
BD91
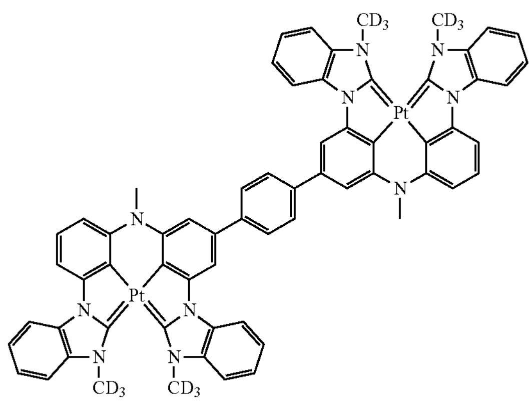
BD92
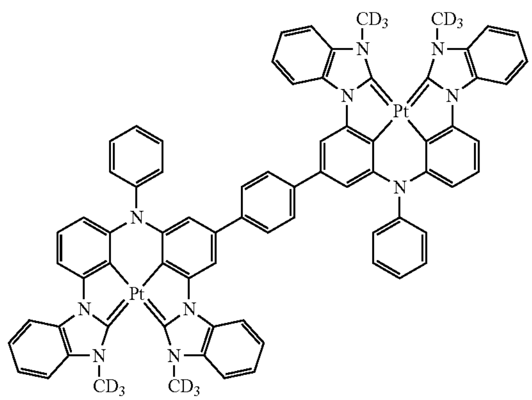
BD93
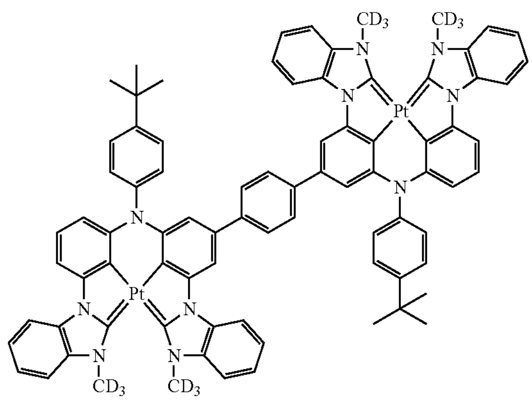

-continued
BD94
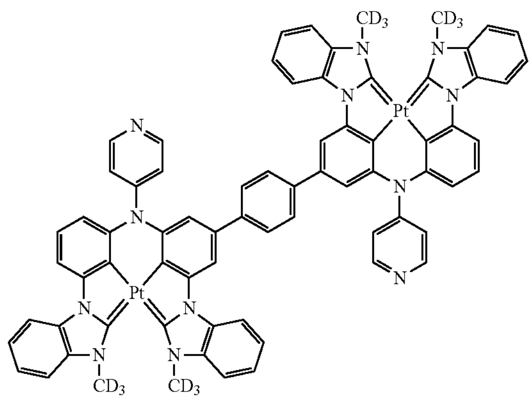
BD95
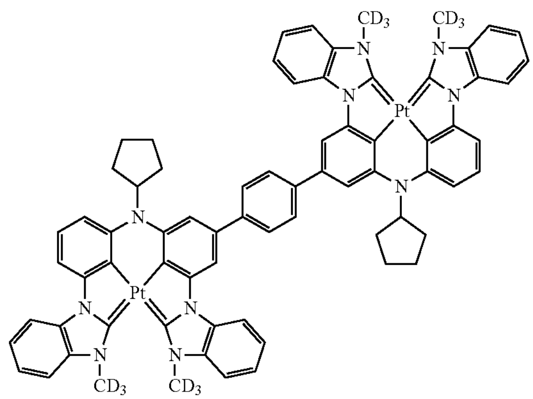
BD96
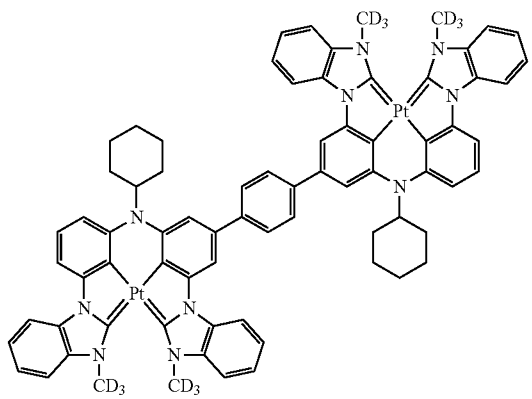
BD97
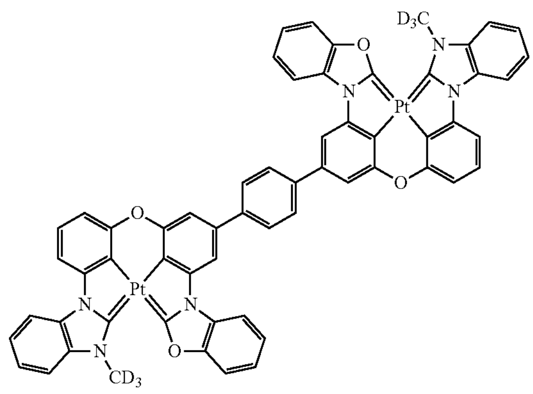
BD98
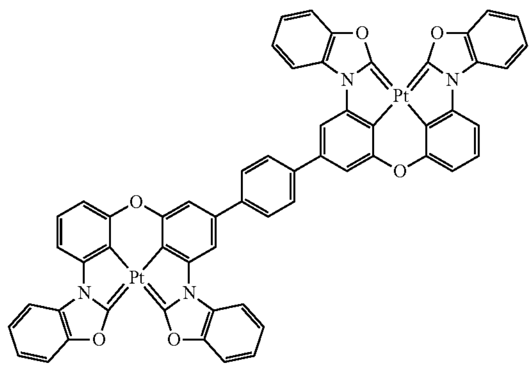
BD99
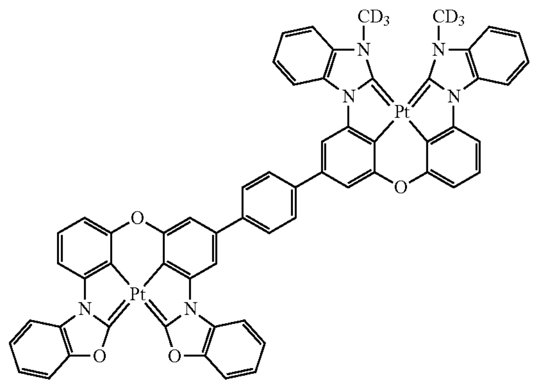
BD100
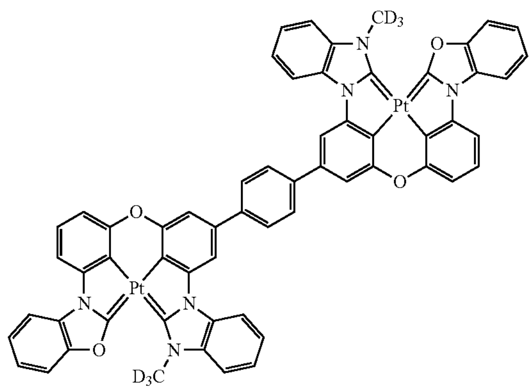
BD101
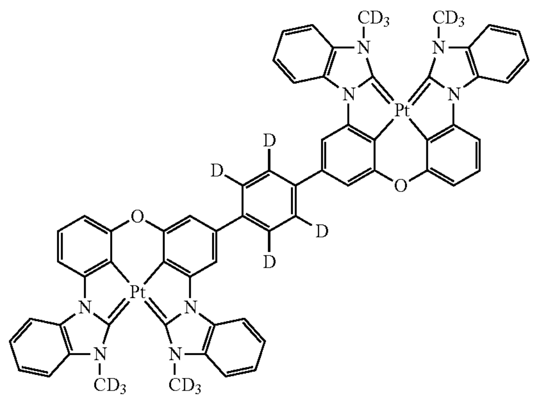

-continued
BD102
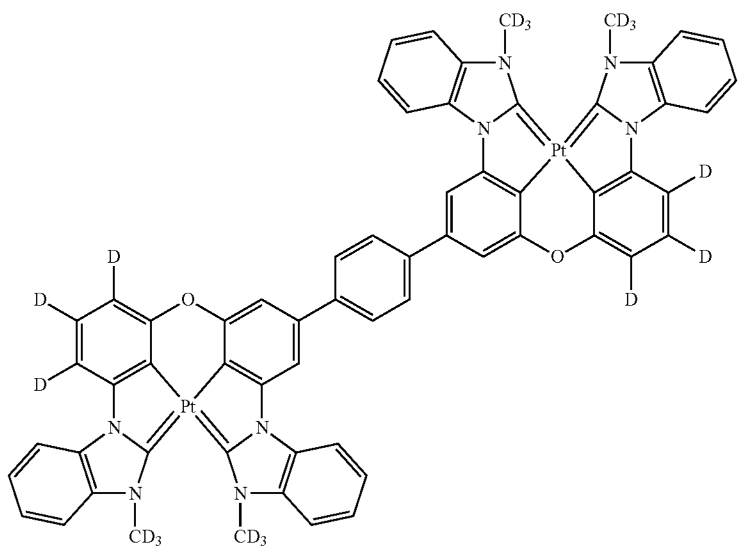
BD103
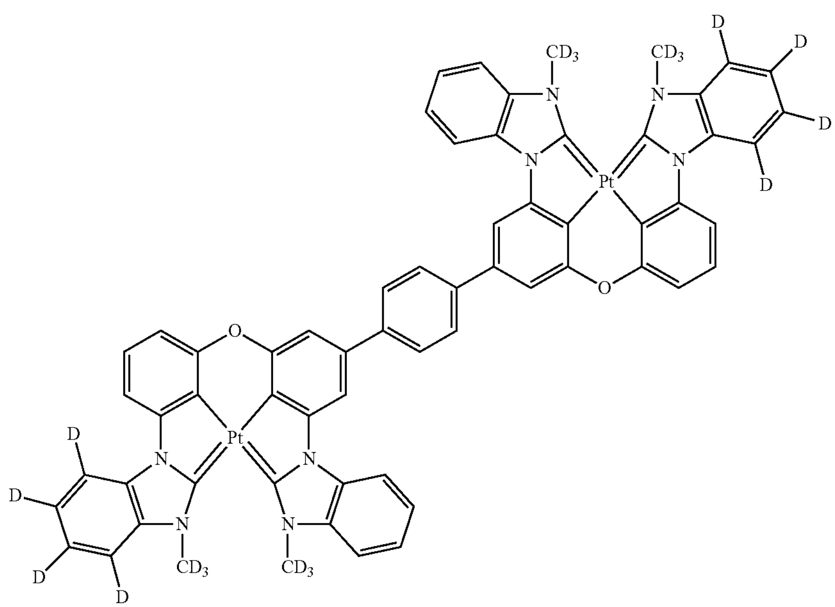

-continued

BD104

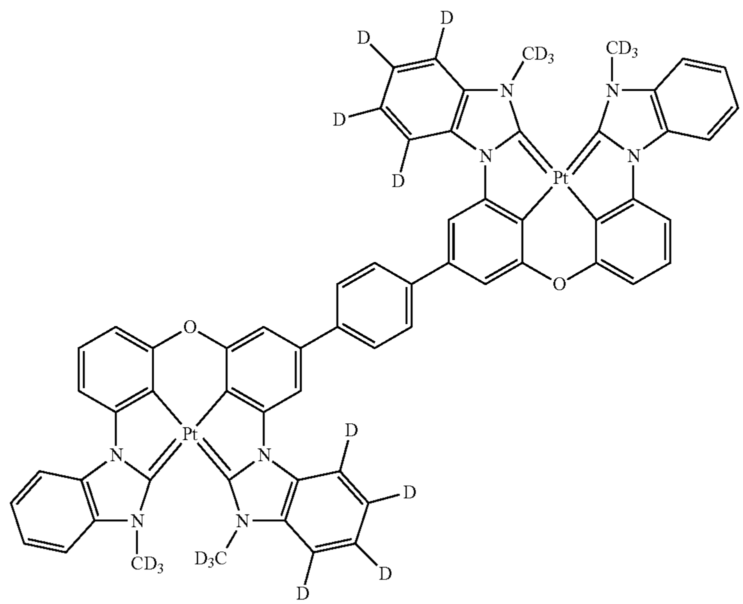

13. A light-emitting device comprising:

a first electrode;

a second electrode facing the first electrode;

an interlayer between the first electrode and the second electrode and comprising an emission layer; and the organometallic compound of claim 1.

14. The light-emitting device of claim 13, wherein the first electrode is an anode, the second electrode is a cathode, and the interlayer further comprises:

a hole transport region between the first electrode and the emission layer and comprising a hole injection layer, a hole transport layer, an emission auxiliary layer, an electron blocking layer, or a combination thereof; and an electron transport region between the emission layer and the second electrode and comprising a hole blocking layer, an electron transport layer, an electron injection layer, or a combination thereof.

15. The light-emitting device of claim 13, wherein the emission layer comprises the organometallic compound.

16. The light-emitting device of claim 13, wherein the emission layer comprises a host and a dopant, and the dopant comprises the organometallic compound.

17. The light-emitting device of claim 13, wherein the emission layer emits blue light.

18. An electronic apparatus comprising the light-emitting device of claim 13.

19. The electronic apparatus of claim 18, further comprising:

a thin-film transistor; and a color filter, a color conversion layer, a touch screen layer, a polarizing layer, or a combination thereof, wherein the thin-film transistor comprises a source electrode and a drain electrode, and the first electrode of the light-emitting device is electrically connected to the source electrode or the drain electrode.

20. An electronic device comprising the light-emitting device of claim 13, wherein the electronic device is a flat panel display, a curved display, a computer monitor, a medical monitor, a television, a billboard, an indoor light, an outdoor light, a signaling light, a head-up display, a fully transparent display, a partially transparent display, a flexible display, a rollable display, a foldable display, a stretchable display, a laser printer, a telephone, a portable phone, a tablet, a phablet, a personal digital assistant (PDA), a wearable device, a laptop computer, a digital camera, a camcorder, a viewfinder, a micro display, a three-dimensional (3D) display, a virtual reality display, an augmented reality display, a vehicle, a video wall with multiple displays tiled together, a theater screen, a stadium screen, a phototherapy device, or a signboard.

* * * * *